(12) United States Patent
Hosaka et al.

(10) Patent No.: US 11,757,007 B2
(45) Date of Patent: *Sep. 12, 2023

(54) METAL OXIDE FILM AND SEMICONDUCTOR DEVICE

(71) Applicant: Semiconductor Energy Laboratory Co., Ltd., Kanagawa-ken (JP)

(72) Inventors: Yasuharu Hosaka, Tochigi (JP); Toshimitsu Obonai, Tochigi (JP); Yukinori Shima, Gunma (JP); Masami Jintyou, Tochigi (JP); Daisuke Kurosaki, Tochigi (JP); Takashi Hamochi, Tochigi (JP); Junichi Koezuka, Tochigi (JP); Kenichi Okazaki, Tochigi (JP); Shunpei Yamazaki, Tokyo (JP)

(73) Assignee: Semiconductor Energy Laboratory Co., Ltd.

( * ) Notice: Subject to any disclaimer, the term of this patent is extended or adjusted under 35 U.S.C. 154(b) by 56 days.

This patent is subject to a terminal disclaimer.

(21) Appl. No.: 17/370,221

(22) Filed: Jul. 8, 2021

(65) Prior Publication Data

US 2021/0343843 A1    Nov. 4, 2021

Related U.S. Application Data

(63) Continuation of application No. 16/739,647, filed on Jan. 10, 2020, now Pat. No. 11,063,125, which is a
(Continued)

(30) Foreign Application Priority Data

Dec. 29, 2015  (JP) .................................. 2015-257710
Jun. 24, 2016  (JP) .................................. 2016-125478

(51) Int. Cl.
*H01L 29/24* (2006.01)
*H01L 29/778* (2006.01)
(Continued)

(52) U.S. Cl.
CPC ............ *H01L 29/24* (2013.01); *C03C 17/245* (2013.01); *C04B 35/01* (2013.01); *C04B 35/453* (2013.01);
(Continued)

(58) Field of Classification Search
CPC . H01L 29/24; H01L 27/1225; H01L 29/7782; H01L 29/7786; H01L 29/78648;
(Continued)

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

CN    102484135 A    5/2012
CN    103500712 A    1/2014
(Continued)

OTHER PUBLICATIONS

International Search Report (Application No. PCT/IB2016/057846) dated Mar. 7, 2017.
(Continued)

*Primary Examiner* — Tong-Ho Kim
(74) *Attorney, Agent, or Firm* — Husch Blackwell LLP

(57) ABSTRACT

A metal oxide film includes indium, M, (M is Al, Ga, Y, or Sn), and zinc and includes a region where a peak having a diffraction intensity derived from a crystal structure is observed by X-ray diffraction in the direction perpendicular to the film surface. Moreover, a plurality of crystal parts is observed in a transmission electron microscope image in the
(Continued)

direction perpendicular to the film surface. The proportion of a region other than the crystal parts is higher than or equal to 20% and lower than or equal to 60%.

16 Claims, 78 Drawing Sheets

Related U.S. Application Data continuation of application No. 16/152,850, filed on Oct. 5, 2018, now Pat. No. 10,535,742, which is a continuation of application No. 15/391,186, filed on Dec. 27, 2016, now Pat. No. 10,096,684.

(51) Int. Cl.
*H01L 29/786* (2006.01)
*H01L 27/12* (2006.01)
*C03C 17/245* (2006.01)
*C04B 35/01* (2006.01)
*C04B 35/453* (2006.01)
*C04B 35/622* (2006.01)
*C23C 14/08* (2006.01)
*C23C 14/58* (2006.01)

(52) U.S. Cl.
CPC ........ *C04B 35/62218* (2013.01); *C23C 14/08* (2013.01); *C23C 14/5853* (2013.01); *H01L 27/1225* (2013.01); *H01L 29/7782* (2013.01); *H01L 29/7786* (2013.01); *H01L 29/7869* (2013.01); *H01L 29/78648* (2013.01); *H01L 29/78696* (2013.01); *C03C 2217/23* (2013.01); *C03C 2218/151* (2013.01); *C04B 2235/3217* (2013.01); *C04B 2235/3225* (2013.01); *C04B 2235/3284* (2013.01); *C04B 2235/3286* (2013.01); *C04B 2235/3293* (2013.01); *C04B 2235/787* (2013.01); *C04B 2235/96* (2013.01)

(58) Field of Classification Search
CPC ........... H01L 29/7869; H01L 29/78696; H01L 21/02172; C03C 17/245; C03C 2217/23; C03C 2218/151; C04B 35/01; C04B 35/453; C04B 35/62218; C04B 2235/3217; C04B 2235/3225; C04B 2235/3284; C04B 2235/3286; C04B 2235/3293; C04B 2235/787; C04B 2235/96; C04B 35/457; C04B 35/50; C23C 14/08; C23C 14/5853
USPC ........................................................ 257/43
See application file for complete search history.

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,669,556 B2 | 3/2014 | Yamazaki et al. |
| 8,680,522 B2 | 3/2014 | Yamazaki et al. |
| 8,994,021 B2 | 3/2015 | Yamazaki et al. |
| 9,209,311 B2 | 12/2015 | Ueda et al. |
| 9,287,352 B2 | 3/2016 | Yamazaki |
| 9,293,598 B2 | 3/2016 | Yamazaki et al. |
| 9,331,208 B2 | 5/2016 | Yamazaki et al. |
| 9,356,098 B2 | 5/2016 | Yamazaki et al. |
| 9,419,146 B2 | 8/2016 | Yamazaki |
| 9,455,349 B2 | 9/2016 | Suzawa et al. |
| 9,496,408 B2 | 11/2016 | Yamazaki et al. |
| 9,537,478 B2 | 1/2017 | Takahashi |
| 9,590,111 B2 | 3/2017 | Yamazaki |
| 9,647,128 B2 | 5/2017 | Yamazaki et al. |
| 9,711,610 B2 | 7/2017 | Yamazaki et al. |
| 9,711,655 B2 | 7/2017 | Yamazaki et al. |
| 9,793,414 B2 | 10/2017 | Yamazaki |
| 9,818,882 B2 | 11/2017 | Takahashi |
| 9,831,347 B2 | 11/2017 | Yamazaki et al. |
| 9,887,295 B2 | 2/2018 | Suzawa et al. |
| 9,905,585 B2 | 2/2018 | Yamazaki et al. |
| 10,096,684 B2 | 10/2018 | Hosaka et al. |
| 10,103,271 B2 | 10/2018 | Suzawa et al. |
| 10,103,277 B2 | 10/2018 | Yamazaki et al. |
| 10,128,378 B2 | 11/2018 | Yamazaki et al. |
| 10,290,720 B2 | 5/2019 | Yamazaki et al. |
| 10,388,520 B2 | 8/2019 | Yamazaki et al. |
| 10,535,742 B2 | 1/2020 | Hosaka et al. |
| 10,741,414 B2 | 8/2020 | Yamazaki et al. |
| 10,770,310 B2 | 9/2020 | Yamazaki et al. |
| 10,818,795 B2 | 10/2020 | Yamazaki et al. |
| 10,916,663 B2 | 2/2021 | Yamazaki et al. |
| 11,063,125 B2 * | 7/2021 | Hosaka ................. H01L 29/24 |
| 11,380,795 B2 | 7/2022 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Theiss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |

(56) References Cited

U.S. PATENT DOCUMENTS

| | | |
|---|---|---|
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0211745 A1 | 8/2012 | Ueda et al. |
| 2015/0107988 A1 | 4/2015 | Yamazaki |
| 2016/0172010 A1 | 6/2016 | Kato |
| 2016/0211266 A1* | 7/2016 | Kurokawa .......... H01L 27/1251 |
| 2016/0260836 A1 | 9/2016 | Okazaki et al. |
| 2016/0351598 A1 | 12/2016 | Yamazaki |
| 2017/0236723 A1 | 8/2017 | Yamazaki et al. |
| 2020/0075637 A1 | 3/2020 | Yamazaki |
| 2020/0402815 A1 | 12/2020 | Yamazaki et al. |
| 2021/0159345 A1 | 5/2021 | Yamazaki et al. |
| 2022/0293795 A1 | 9/2022 | Yamazaki et al. |

FOREIGN PATENT DOCUMENTS

| | | |
|---|---|---|
| CN | 103904088 A | 7/2014 |
| CN | 105324509 A | 2/2016 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 11-213763 A | 8/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-175716 A | 9/2013 |
| JP | 2014-007399 A | 1/2014 |
| JP | 2014-14341 | 8/2014 |
| JP | 2015-109429 A | 6/2015 |
| JP | 2015-111667 A | 6/2015 |
| JP | 2015-130482 A | 7/2015 |
| JP | 2015-142047 A | 8/2015 |
| JP | 2015-144250 A | 8/2015 |
| JP | 2015-181229 A | 10/2015 |
| KR | 2012-0046302 A | 5/2012 |
| TW | 201529876 | 8/2015 |
| WO | WO-2004/114391 | 12/2004 |
| WO | WO-2011/027467 | 3/2011 |
| WO | WO 2012/073844 A1 | 6/2012 |
| WO | WO 2014/203984 A1 | 12/2014 |
| WO | WO-2015/053378 | 4/2015 |
| WO | WO 2015/059842 A1 | 4/2015 |
| WO | WO-2015/097588 | 7/2015 |
| WO | WO 2015/097597 A1 | 7/2015 |

OTHER PUBLICATIONS

Written Opinion (Application No. PCT/IB2016/057846) dated Mar. 7, 2017.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

(56) References Cited

OTHER PUBLICATIONS

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

(56) References Cited

OTHER PUBLICATIONS

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Chinese Office Action (Application No. 201680077344.X) dated Jul. 3, 2020.

Chinese Office Action (Application No. 202110187768.4), dated Apr. 27, 2022.

\* cited by examiner

Sample1

Sample2

Sample3

FIG. 7A1
Sample 1
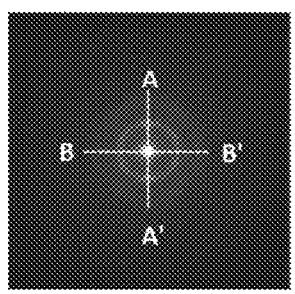
FIG. 7A2
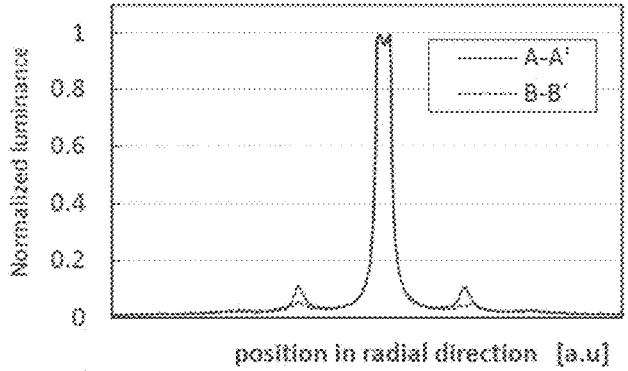
FIG. 7B1
Sample 2
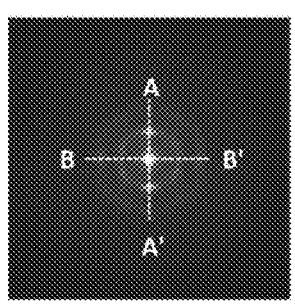
FIG. 7B2
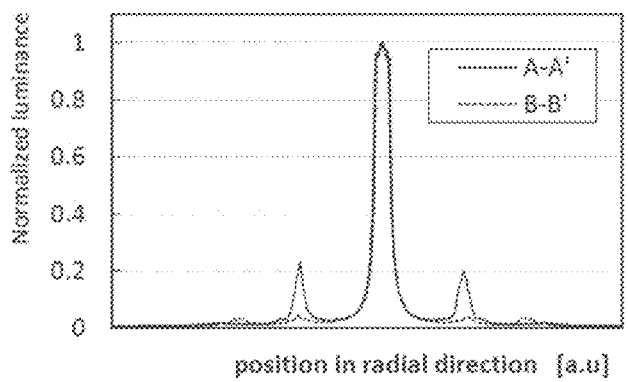
FIG. 7C1
Sample 3
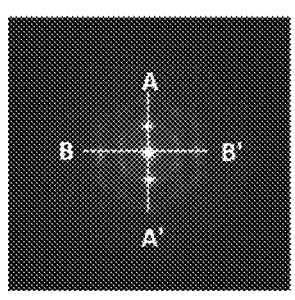
FIG. 7C2
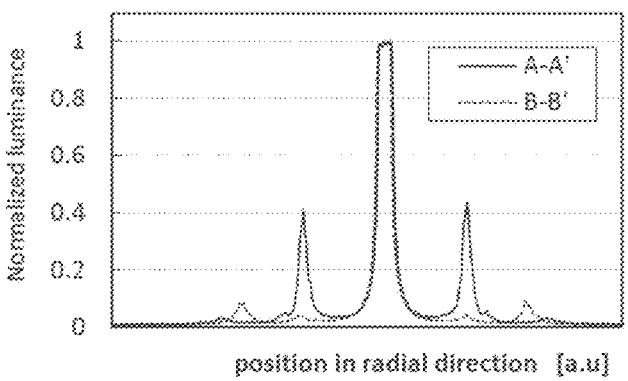
FIG. 7D1
Sample 4
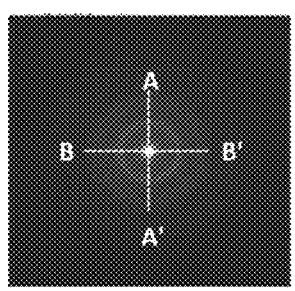
FIG. 7D2
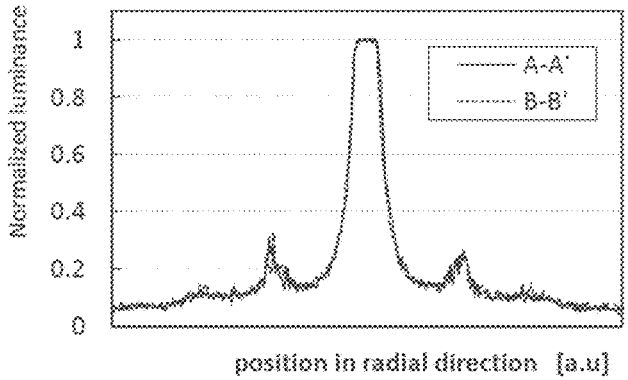

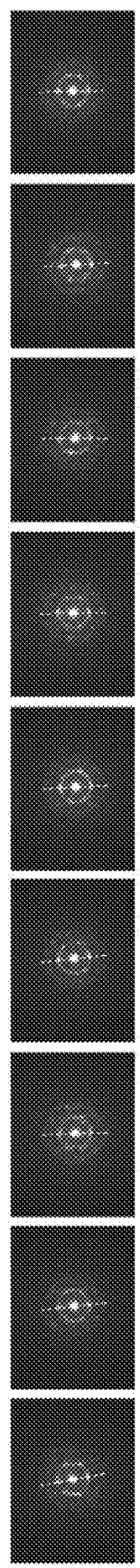
FIG. 9A Sample1 1nmϕ
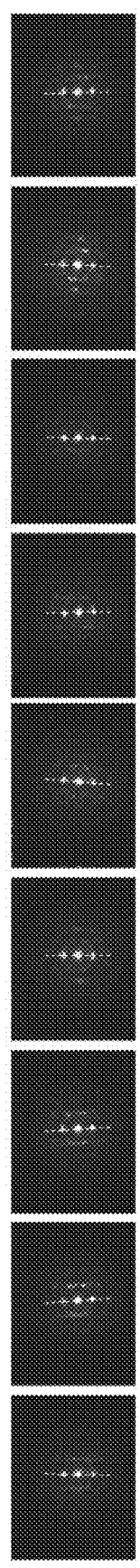
FIG. 9B Sample2 1nmϕ
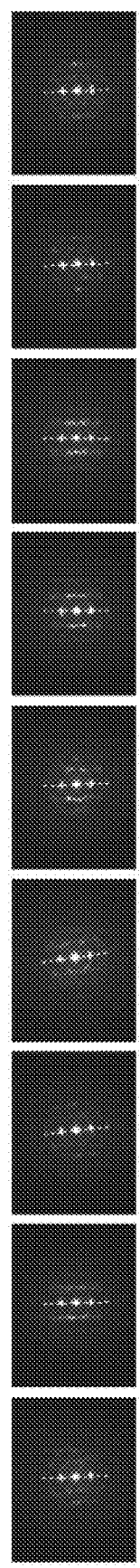
FIG. 9C Sample3 1nmϕ

Sample A1 : L/W=6/50 μm

Sample A2 : L/W=6/50 μm

SampleE1

SampleE2

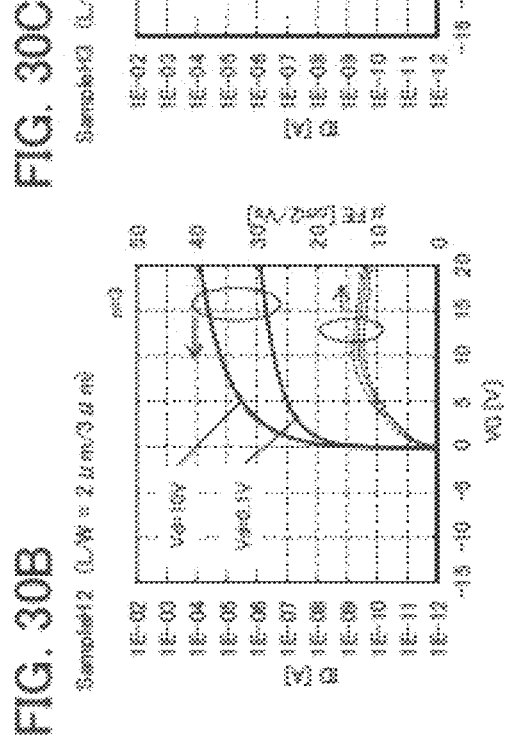
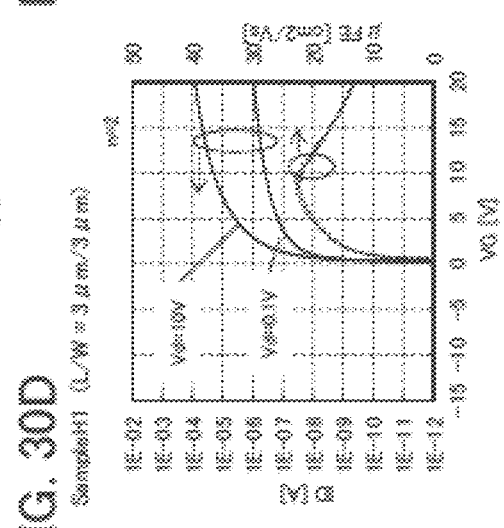

9100

9200

9101

9102

9201

9201

9201

METAL OXIDE FILM AND SEMICONDUCTOR DEVICE

This application is a continuation of copending U.S. application Ser. No. 16/739,647, filed on Jan. 10, 2020 which is a continuation of U.S. application Ser. No. 16/152,850, filed on Oct. 5, 2018 (now U.S. Pat. No. 10,535,742 issued Jan. 14, 2020) which is a continuation of U.S. application Ser. No. 15/391,186, filed on Dec. 27, 2016 (now U.S. Pat. No. 10,096,684 issued Oct. 9, 2018) which are all incorporated herein by reference.

TECHNICAL FIELD

One embodiment of the present invention relates to a metal oxide film and a method for forming the metal oxide film. One embodiment of the present invention relates to a semiconductor device including a metal oxide film.

In this specification or the like, a semiconductor device means all types of devices that can function by utilizing semiconductor characteristics, and a transistor, a semiconductor circuit, and the like are embodiments of semiconductor devices. An arithmetic device, a memory device, an imaging device, an electro-optical device, a power generation device (e.g., a thin film solar cell and an organic thin film solar cell), and an electronic appliance each may include a semiconductor device.

BACKGROUND ART

An oxide semiconductor has attracted attention as a semiconductor material applicable to the transistor. For example, Patent Document 1 discloses a semiconductor device achieving high field-effect mobility (simply referred to as mobility or μFE in some cases) with such a structure that a plurality of oxide semiconductor layers are stacked, the oxide semiconductor layers functioning as a channel in the plurality of oxide semiconductor layers contains indium and gallium, and the proportion of indium is higher than the proportion of gallium.

Non-Patent Document 1 discloses that an oxide semiconductor containing indium, gallium, and zinc has a homologous series represented by $In_{1-x}Ga_{1+x}O_3(ZnO)_m$ (x is a number which satisfies $-1 \leq x \leq 1$, and m is a natural number). Furthermore, Non-Patent Document 1 discloses a solid solution range of a homologous series. For example, in the case of a solid solution range of a homologous series when m is 1, x is within a range from −0.33 to 0.08, and in the case of a solid solution range of a homologous series when m is 2, x is within a range from −0.68 to 0.32.

REFERENCE

Patent Document

[Patent Document 1] Japanese Published Patent Application No. 2014-007339

Non-Patent Document

[Non-Patent Document 1]
M. Nakamura, N. Kimizuka, and T. Mohri, "The Phase Relations in the $In_2O_3$—$Ga_2ZnO_4$—ZnO System at 1350° C.," *J Solid State Chem.*, 1991, Vol. 93, pp. 298-315.

DISCLOSURE OF INVENTION

One object of one embodiment of the present invention is to provide a metal oxide film including a crystal part. Another object is to provide a metal oxide film having highly stable physical properties. Another object is to provide a metal oxide film with improved electrical characteristics. Another object is to provide a metal oxide film with which field-effect mobility can be increased. Another object is to provide a novel metal oxide film. Another object is to provide a highly reliable semiconductor device including a metal oxide film.

Another object of one embodiment of the present invention is to provide a metal oxide film having highly stable physical properties which can be formed at low temperatures. Another object is to provide a highly reliable semiconductor device which can be formed at low temperature.

Another object of one embodiment of the present invention is to provide a flexible power storage device with use of a metal oxide film.

Note that the descriptions of these objects do not disturb the existence of other objects. In one embodiment of the present invention, there is no need to achieve all the objects. Note that other objects can be derived from the description of the specification, the drawings, the claims, and the like.

One embodiment of the present invention is a metal oxide film including indium, M, (M is Al, Ga, Y, or Sn), and zinc. The metal oxide film also includes a region where a peak having a diffraction intensity derived from a crystal structure is observed by X-ray diffraction in the direction perpendicular to the film surface. In addition, a plurality of crystal parts is observed in a transmission electron microscope image in the direction perpendicular to the film surface. The proportion of a region other than the crystal parts is more than or equal to 20% and less than or equal to 60% or more than or equal to 25% and less than 100%.

It is preferable that the plurality of crystal parts have a higher proportion of crystal parts in which c-axes are aligned in the thickness direction than crystal parts aligned in other directions.

A first image is an image obtained by subjecting a cross-sectional TEM image to fast Fourier transform. The first image is subjected to mask treatment by which only a periodic region remains and then to inverse fast Fourier transform, whereby a second image is obtained. Here, the proportion of the remaining area subtracted from the original image is preferably more than or equal to 20% and less than 60%, or more than or equal to 25% and less than 100%.

When electron diffraction with a probe diameter of 50 nm or more is performed on a slice of the metal oxide film having a thickness of greater than or equal to 10 nm and less than or equal to 50 nm in the direction perpendicular to its cross section, a first electron diffraction pattern that includes a ring-like diffraction pattern and two first spots overlapping with the ring-like diffraction pattern is preferably observed. In addition, when electron diffraction with a probe diameter of greater than or equal to 0.3 nm and less than or equal to 5 nm is performed thereon, a second electron diffraction pattern that includes the first spots and a plurality of second spots distributed in the circumferential direction is preferably observed.

The two first spots are preferably symmetric with respect to the center. The angle formed by a first straight line and the direction of a normal vector of the film surface is preferably more than or equal to 0° and less than or equal to 10°. The first straight line passes through the center and a point at which the luminance of the first spots is the highest.

In the first electron diffraction pattern, the luminance of the ring-like diffraction pattern is preferably lower than that of the first spots at a point of intersection of the ring-like pattern and a second straight line that intersects with the first straight line.

The luminance of the first spots is preferably greater than 1 time and less than or equal to 9 times the luminance of the ring-like diffraction pattern at the point of intersection of the ring-like pattern and the second straight line.

One embodiment of the present invention is a metal oxide film including indium, M, (M is Al, Ga, Y, or Sn), and zinc. The metal oxide film also includes a region where a peak having a diffraction intensity derived from a crystal structure is observed by X-ray diffraction in the direction perpendicular to the film surface. When electron diffraction with a probe diameter of 50 nm or more is performed on a slice of the metal oxide film having a thickness of greater than or equal to 10 nm and less than or equal to 50 nm in the direction perpendicular to its cross section, a first electron diffraction pattern that includes a ring-like diffraction pattern and two first spots overlapping with the ring-like diffraction pattern is observed. In addition, when electron diffraction with a probe diameter of greater than or equal to 0.3 nm and less than or equal to 5 nm is performed thereon, a second electron diffraction pattern that includes the first spots and a plurality of second spots distributed in the circumferential direction is observed.

In addition, the first spots are preferably distributed in the circumferential direction. The angle formed by two straight lines passing through an end portion of the spot in a circumferential direction and the center of the electron diffraction pattern is preferably less than or equal to 45°.

Another embodiment of the present invention is a semiconductor device including a semiconductor layer, a gate insulating layer, and a gate. The semiconductor layer is characterized by including the above-described metal oxide film.

One embodiment of the present invention can provide a metal oxide film including a crystal part. One embodiment of the present invention can provide a metal oxide film having highly stable physical properties. One embodiment of the present invention can provide a novel metal oxide film. One embodiment of the present invention can provide a highly reliable semiconductor device to which a metal oxide film is employed.

One embodiment of the present invention can provide a metal oxide film having highly stable physical properties which can be formed at low temperature. One embodiment of the present invention can provide a highly reliable semiconductor device which can be formed at low temperature.

One embodiment of the present invention can provide a flexible device to which a metal oxide film is employed.

BRIEF DESCRIPTION OF THE DRAWINGS

FIGS. 7A1 to 7D2 are electron diffraction patterns and luminance profiles of metal oxide films.

FIGS. 9A to 9C are electron diffraction patterns of metal oxide films.

FIGS. 30A to 30 F show electrical characteristics of transistors.

BEST MODE FOR CARRYING OUT THE INVENTION

Figure 1A:
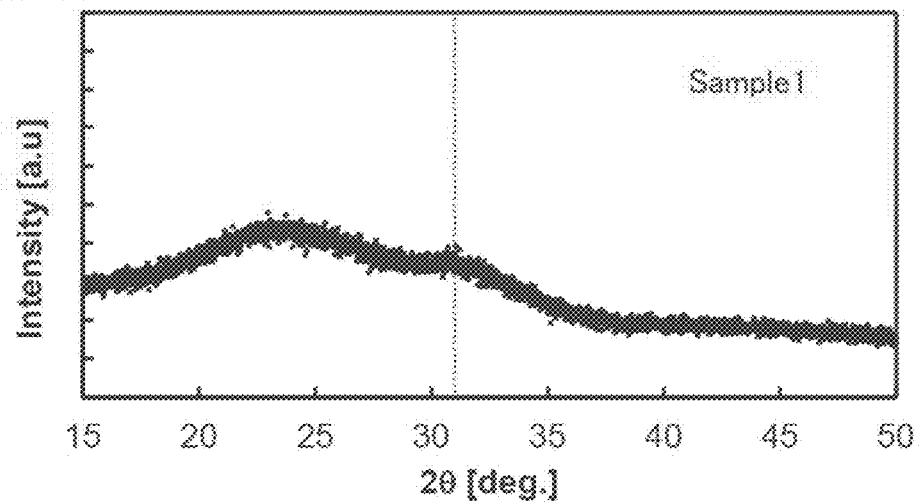
FIGS. 1A to 1C show the results of XRD measurement of metal oxide films.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and a description thereof is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first," "second," and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is referred to as an oxide semiconductor in some cases. In other words, an OS FET is a transistor including a metal oxide or an oxide semiconductor.

In this specification and the like, a metal oxide including nitrogen is also referred a metal oxide in some cases. Furthermore, a metal oxide including nitrogen may be referred to as a metal oxynitride.

In this specification and the like, "c-axis aligned crystal (CAAC)" or "cloud-aligned composite (CAC)" may be stated in some cases. CAAC refers to an example of a crystal structure, and CAC refers to an example of a function or a material composition.

In this specification and the like, CAC-OS or CAC-metal oxide has a function of a conductor in a part of the material and has a function of a dielectric (or insulator) in another part of the material; as a whole, CAC-OS or CAC-metal oxide has a function of a semiconductor. In the case where CAC-OS or CAC-metal oxide is used in an active layer of a transistor, the conductor has a function of letting electrons (or holes) serving as carriers flow, and the dielectric has a function of not letting electrons serving as carriers flow. By the complementary action of the function as a conductor and the function as a dielectric, CAC-OS or CAC-metal oxide can have a switching function (on/off function). In the CAC-OS or CAC-metal oxide, separation of the functions can maximize each function.

In this specification and the like, CAC-OS or CAC-metal oxide includes conductor regions and dielectric regions. The conductor regions have the above-described function of the conductor, and the dielectric regions have the above-described function of the dielectric. In some cases, the conductor regions and the dielectric regions in the material are separated at the nanoparticle level. In some cases, the conductor regions and the dielectric regions are unevenly distributed in the material. When observed, the conductor regions are coupled in a cloud-like manner with their boundaries blurred, in some cases.

In other words, CAC-OS or CAC-metal oxide can be referred to as a matrix composite or a metal matrix composite.

Furthermore, in the CAC-OS or CAC-metal oxide, each of the conductor regions and the dielectric regions has a size of more than or equal to 0.5 nm and less than or equal to 10 nm, preferably more than or equal to 0.5 nm and less than or equal to 3 nm and is dispersed in the material, in some cases.

Embodiment 1

One embodiment of the present invention is a metal oxide film including two kinds of crystal parts. One is a crystal part (also referred to as a first crystal part) including crystals aligned in the thickness direction (also referred to as a film-plane direction, or a direction perpendicular to a formation surface or film surface). The other is a crystal part (also referred to as a second crystal part) including crystals with a random orientation. The metal oxide film of one embodiment of the present invention includes these two kinds of crystal parts.

Although crystal parts are divided into the two categories: the first crystal part with a particular orientation and the second crystal part with a random orientation for simplicity, the first crystal part and the second crystal part cannot be distinguished from each other in some case because there is not much difference in crystallinity, crystal size, and the like. Therefore, the oxide metal film of one embodiment of the present invention can be described without a distinction between the first crystal part and the second crystal part. In other words, the metal oxide film of one embodiment of the present invention can be referred to as a metal oxide film including a plurality of crystal parts in which the proportion of crystal parts aligned in the direction perpendicular to the film surface is higher than the proportion of crystal parts aligned in other directions.

In the first crystal part, particular crystal planes are aligned in the thickness direction. Accordingly, when an X-ray diffraction (XRD) measurement is performed in a direction substantially perpendicular to the top surface of the metal oxide film including the first crystal parts, a diffraction peak derived from the first crystal parts is observed at a predetermined diffraction angle (2θ). Note that the higher the proportion of the first crystal parts in a film is, the higher the diffraction peak becomes; thus, the height (intensity) of the diffraction peak can be an indicator of crystallinity of the film.

A plurality of crystal parts is observed in a transmission electron microscope image of a cross section of the metal oxide film which is one embodiment of the present invention in the thickness direction. In the plurality of crystal parts, the first crystal parts where crystal planes perpendicular to the c-axes are aligned in the thickness direction are observed at a higher proportion than the crystal parts aligned in other directions.

It is preferable that the proportion of a region in the metal oxide film except the crystal parts observed by a transmission electron microscope be higher than or equal to 20% and lower than 100%, preferably higher than or equal to 20% and lower than or equal to 80%, more preferably higher than or equal to 20% and lower than or equal to 60%. Alternatively, it is preferable that the proportion of a region except the first crystal parts where c-axes are aligned in the thickness direction be higher than or equal to 20% and lower than or equal to 60%, preferably higher than or equal to 30% and lower than or equal to 50%. The metal oxide film including the regions other than the clear crystal parts at such a proportion can have oxygen permeability. Therefore, an effect of reducing oxygen vacancies as a result of treatment for supplying oxygen to the metal oxide film can be enhanced. Thus, application of the metal oxide film to a semiconductor device, such as a transistor, can provide an extremely highly reliable semiconductor device.

The field-effect mobility of a transistor using the metal oxide film in which the first crystal part having alignment and the second crystal part having no alignment exist together can be more increased than that of a transistor using a metal oxide film including extremely high proportion (e.g., more than or equal to 75% or 80%) of the first crystal part having alignment, particularly when the gate voltage is low. Therefore, the use of the transistor can make driving voltage of a device low and can make high-frequency driving easy, for example. In addition, such a metal oxide film has a low property of anisotropy of current flow compared with a metal oxide film with extremely high crystallinity, whereby variation in electrical characteristics of a semiconductor device including the metal oxide film can be reduced.

When an electron diffraction measurement is performed to the metal oxide film of one embodiment of the present invention in the direction perpendicular to its cross section, a diffraction pattern including an electron diffraction pattern derived from the first crystal part and an electron diffraction pattern derived from the second crystal part is obtained.

Obvious spots derived from crystallinity are observed in the electron diffraction pattern derived from the first crystal part. The spots have an alignment in the thickness direction.

The second crystal part is a crystal part that exists in the film and has a random orientation. Therefore, different images are obtained, as described below, depending on a diameter of electron beam (a probe diameter) used for electron diffraction, that is, the area of an observation region.

A ring-like pattern is observed in a selected-area electron diffraction (SAED) pattern obtained by using a sufficiently large diameter of electron beam (probe diameter) (e.g., larger than or equal to 25 nm φ, or larger than or equal to 50 nm φ). The ring-like pattern has a luminance distribution in a radial direction in some cases. Selected area electron diffraction is electron diffraction in which a selected microscopic region is subjected to a parallel electron beam.

In a nano beam electron diffraction (NBED) pattern obtained by using a sufficiently small diameter of electron beam (probe diameter) (e.g., larger than or equal to 0.3 nm and smaller than or equal to 10 nm φ or smaller than or equal to 5 nm), a plurality of spots distributed in a circumferential direction (also referred to as in θ direction) is observed at the position of the ring-like pattern that is observed in the selected-area electron diffraction pattern. In other words, the ring-like pattern observed in the selected-area electron diffraction pattern is formed from an aggregate of the spots. Nano beam electron diffraction is one of convergent beam electron diffraction in which a sample is subjected to a convergent electron beam.

In the selected-area electron diffraction pattern of the cross-section of the metal oxide film which is one embodiment of the present invention, a first spot derived from the first crystal part and the ring-like pattern derived from the second crystal part exist together. In the nano beam electron diffraction pattern of the cross-section of the metal oxide film, the first spot derived from the first crystal part and a plurality of second spots distributed in the circumferential direction derived from the second crystal part exist together.

The first spot is positioned to overlap with the ring in a radial direction in the selected-area electron diffraction pattern of the metal oxide film. In addition, the first spot is positioned to overlap with the second spot in the radial direction in the nano beam electron diffraction pattern.

In addition, the first spot derived from the first crystal part is a diffraction spot derived from a crystal plane perpendicular to the c-axis of a crystal. In the case where a crystal structure has two-hold symmetry in a direction perpendicular to the c-axis, two first spots are symmetric with respect to the center of an electron diffraction pattern. Note that a spot derived from a crystal plane perpendicular to the c-axis other than the first spot and spots derived from planes other than the crystal plane perpendicular to the c-axis may be observed in the electron diffraction pattern.

In the case where the ring overlaps with the first spot in a radial direction, a plurality of second spots which is a composition of the ring is assumed to be diffraction spots derived from crystal planes perpendicular to the c-axes of crystal parts with alignment in different directions.

In a selected-area electron diffraction pattern of the metal oxide film, two ring-like patterns having different diameters (referred to as a first ring and a second ring in order from the inside) may be observed. In that case, the first spot derived from the first crystal part is positioned to overlap with the ring that is positioned on the inner side (i.e., the first ring). Furthermore, other spots derived from the first crystal part may be observed in a position overlapping with the second ring.

When the proportion of the first crystal parts with a particular orientation in the metal oxide film is high, an electron diffraction pattern in which a high anisotropic pattern is more dominant is obtained. For example, the luminance of the first ring and that of the second ring are relatively lower than the luminance of the first spot derived from the first crystal part in a selected-area electron diffraction pattern. At that time, a different spot (a third spot) derived from the first crystal part may be observed in a position overlapping with the second ring that is positioned on the outer side. Each of the third spot and the second ring can be presumed to be derived from the diffraction of the same crystal plane because the third spot overlaps with the second ring in a radial direction.

Here, in a nano beam electron diffraction pattern, the luminance of the second spot (diffraction intensity) derived from the second crystal part is lower than that of the first spot derived from the first crystal part described above. A difference in luminance between the two spots becomes larger as the proportion of the first crystal parts in the metal oxide film is increased and thus indicates the crystallinity of the metal oxide film. For example, it is preferable that the luminance of the first spot with respect to the luminance of the second spot be greater than 1 time and less than or equal to 10 times, preferably greater than 1 time and less than or equal to 9 times, more preferably greater than 1 time and less than or equal to 8 times, still more preferably greater than or equal to 1.5 times and less than κ times, still more preferable greater than or equal to 2 times and less than 4 times.

The metal oxide film of one embodiment of the present invention is an oxide film including indium, M (M is Al, Ga, Y, or Sn) and zinc. Such an oxide film is characterized by crystal structure including a stacked-layer structure along the c-axis. Moreover, such an oxide film is characterized by the semiconductor characteristics.

The metal oxide film of one embodiment of the present invention can be used for a semiconductor where a channel of a transistor is formed.

Compared with a transistor using a metal oxide film which only includes the second crystal part having no particular alignment, a transistor using the metal oxide film in which the first crystal part having alignment and the second crystal part having no particular alignment exist together is characterized by, as described above, higher stability of electrical characteristics, ease of reducing the channel length, and the like.

A more specific example of one embodiment of the present invention is described below.

[Metal Oxide]

The metal oxide film of one embodiment of the present invention includes indium (In), M (M is Al, Ga, Y, or Sn), and zinc (Zn). Specifically, M is preferably gallium (Ga).

A metal oxide film including In has high carrier mobility (electron mobility), for example. A metal oxide film has high energy gap (Eg) by including Ga, for example. Note that Ga is an element having high bonding energy with oxygen, which is higher than the bonding energy of In with oxygen. In addition, a metal oxide film including Zn is easily crystallized.

Accordingly, the metal oxide film of one embodiment of the present invention preferably has a crystal structure exhibiting a single phase, particularly, homologous series. For example, the metal oxide film has a composition of $In_{1+x}M_{1-x}O_3(ZnO)_y$ structure (x satisfies 0<x<0.5, and y is approximately 1) where the content of In is higher than that of M, so that the carrier density (electron mobility) of the metal oxide film can be high.

In particular, the metal oxide film of one embodiment of the present invention preferably has a composition in the neighborhood of the $In_{1+x}M_{1-x}O_3(ZnO)_y$ structure (x satisfies 0<x<0.5, and y is approximately 1), specifically a composition in the neighborhood of a structure where In:M: Zn=1.33:0.67:1 (approximately In:M:Zn=4:2:3). The metal oxide film having such a composition can have high carrier mobility and high film stability.

Note that the composition of the metal oxide film is not limited to the above-mentioned composition, and other compositions with which the film can have a layered crystal structure may be used.

In this specification and the like, "neighborhood" means a range of ±1, preferably ±0.5 with respect to the proportion of atoms of the metal element M. For example, in the case where the oxide semiconductor film has a composition in the neighborhood of In:Ga:Zn=4:2:3, the proportion of In is 4, the proportion of Ga may be greater than or equal to 1 and less than or equal to 3 (1≤Ga≤3) and the proportion of Zn is greater than or equal to 2 and less than or equal to 4 (2≤Zn≤4), preferably the proportion of Ga is greater than or equal to 1.5 and less than or equal to 2.5 (1.5≤Ga≤2.5) and the proportion of Zn is greater than or equal to 2 and less than or equal to 4 (2≤Zn≤4).

[Formation of Metal Oxide Film]

Samples each including a metal oxide film were formed. Three kinds of metal oxide films were formed in different conditions. First, methods for forming Samples 1 to 4 are described.

[Sample 1]

Sample 1 is a sample in which an approximately 100-nm-thick metal oxide film including indium, gallium, and zinc is formed over a glass substrate. The metal oxide film used for Sample 1 was formed under the following conditions: the substrate temperature was 130° C.; an argon gas with a flow rate of 180 sccm and an oxygen gas with a flow rate of 20 sccm were introduced into a chamber of the sputtering apparatus; the pressure was set to 0.6 Pa; and an AC power of 2.5 kw was applied to a metal oxide target containing indium, gallium, and zinc (with an atomic ratio of In:Ga:Zn=4:2:4.1). The proportion of gas flow rate may be represented by an oxygen flow rate percentage which indicates the oxygen flow rate with respect to the total gas flow rate. In that case, the oxygen flow rate percentage under the formation conditions for Sample 1 was 10%.

[Sample 2]

Sample 2 is a sample in which an approximately 100-nm-thick metal oxide film is formed over a glass substrate. The metal oxide film used for Sample 2 was formed under the conditions similar to the conditions for Sample 1 except that the substrate temperature was 170° C. The oxygen flow rate percentage under the formation conditions for Sample 2 was 10%.

[Sample 3]

Sample 3 is a sample in which an approximately 100-nm-thick metal oxide film is formed over a glass substrate. The metal oxide film used for Sample 3 was formed under the conditions similar to the conditions for Sample 1 except that the substrate temperature was 170° C. and an argon gas with a flow rate of 140 sccm and an oxygen gas with a flow rate of 60 sccm were introduced into a chamber of the sputtering apparatus. The oxygen flow rate percentage under the formation conditions for Sample 3 was 30%.

[Sample 4]

Sample 4 is a sample in which an approximately 100-nm-thick metal oxide film is formed over a glass substrate. The metal oxide film used for Sample 4 was formed under the following conditions: the substrate was not heated; an argon gas with a flow rate of 20 sccm and an oxygen gas with a flow rate of 10 sccm were introduced into a chamber of the sputtering apparatus; the pressure was set to 0.4 Pa; and an AC power of 0.2 kw was applied to a metal oxide target containing indium, gallium, and zinc (with an atomic ratio of In:Ga:Zn=1:1:1). The oxygen flow rate percentage under the formation conditions for Sample 4 was 33%.

[X-Ray Diffraction Measurement]

Figure 1B:
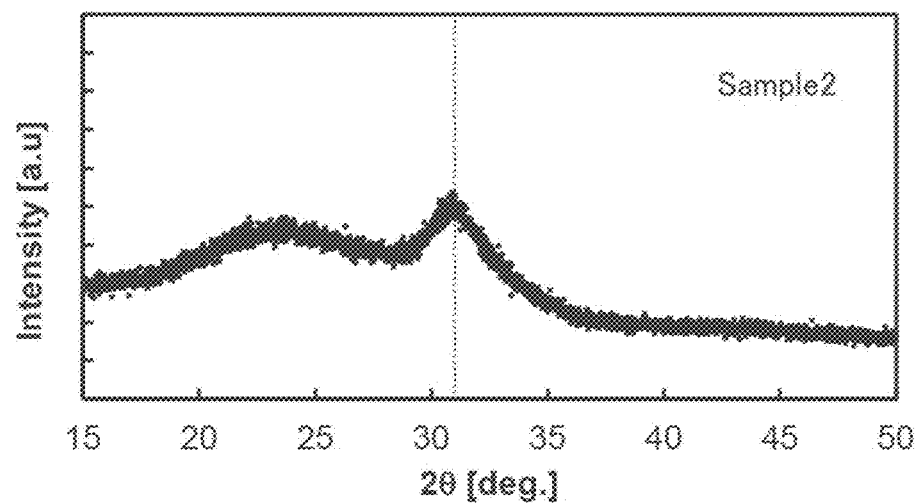
Figure 1C:
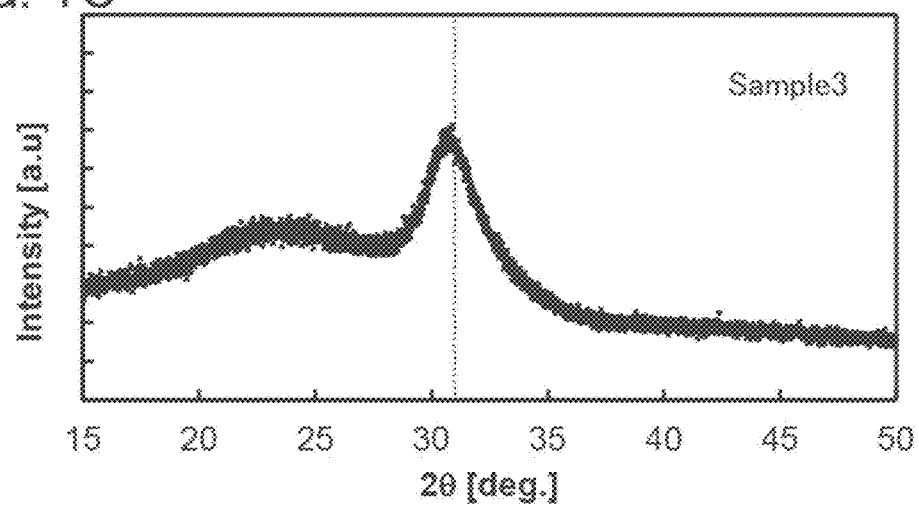

FIGS. 1A to 1C show results of XRD measurement for Sample 1 to Sample 3. A powder method (also referred to as a θ-2θ method) which is a kind of an out-of-plane method was used. Note that in a θ-2θ method, X-ray diffraction intensity is measured while an incident angle of an X-ray is changed and the angle of a detector facing an X-ray source is equal to the incident angle. Note that a grazing-incidence XRD (GIXRD) method (also referred to as a thin film method or a Seemann-Bohlin method) may be used. The GIXRD method is a kind of an out-of-plane method for measuring X-ray diffraction intensity in which X-ray is incident at an angle approximately 0.40° from a film surface with use of a variable-angle detector. In each of FIGS. 1A to 1C, the horizontal axis represents the diffraction angle 2θ and the vertical axis represents diffraction intensity (any unit).

As shown in FIGS. 1A to 1C, a peak of diffraction intensity was observed around at 2θ=31° in each sample. The highest peak intensity was observed from Sample 3, followed by Sample 2 and Sample 1.

The diffraction angle (around at 2θ=31°) at which the peak of the diffraction intensity was observed corresponds to a diffraction angle on the (009) plane of the structure model of single crystal $InGaZnO_4$. Accordingly, the observed peaks indicate that each sample includes a crystal part where the c-axes are aligned in the thickness direction (hereinafter also referred to as crystal part having alignment or a first crystal part). The comparison of the intensities shows that Sample 3 has the highest proportion of crystal parts with a particular orientation, followed by Sample 2 and Sample 1.

The above results show that there is a tendency that the higher the substrate temperature at the deposition time and the oxygen flow rate percentage are, the larger the proportion of crystal parts is.

[Cross-Sectional Observation]

Figure 2A:
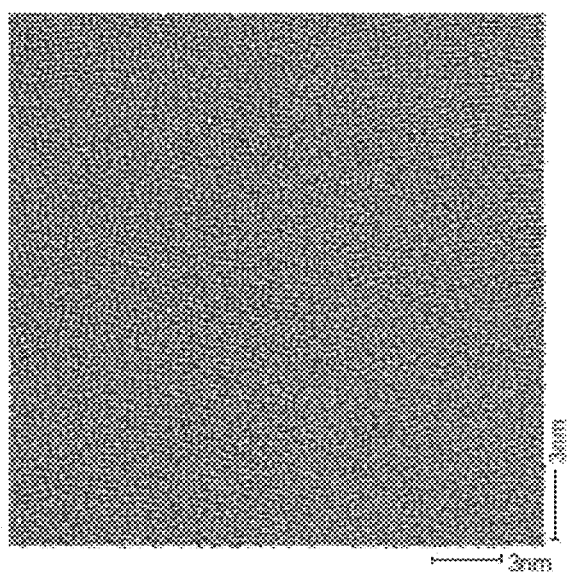
FIGS. 2A to 2C are cross-sectional observation images of metal oxide films.
Figure 2B:
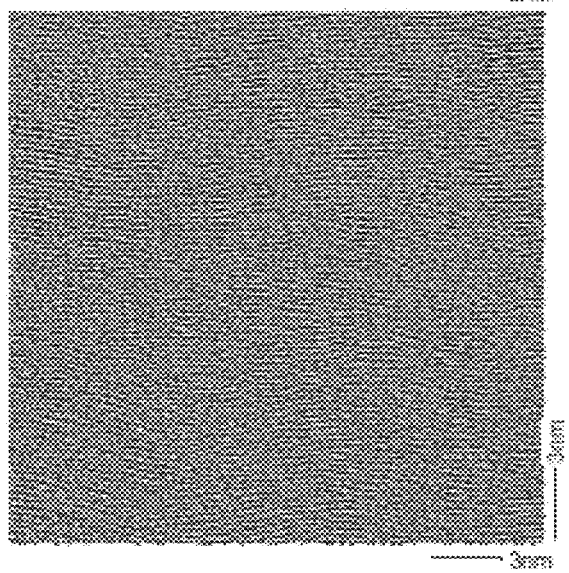
Figure 2C:
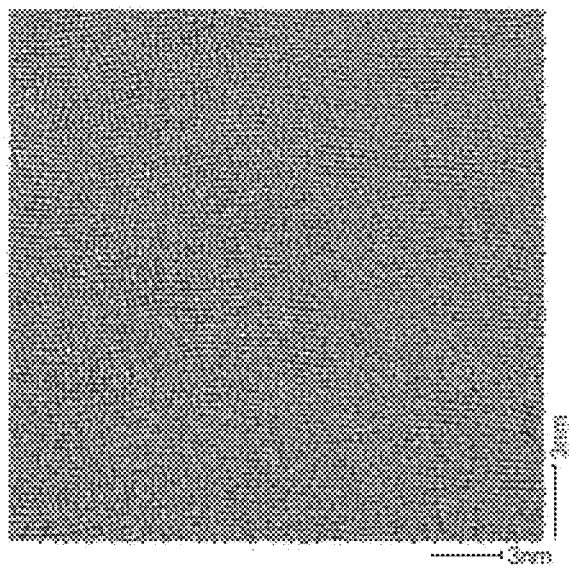

FIGS. 2A to 2C are transmission electron microscopy (TEM) images of Sample 1 to Sample 3.

The crystal parts in which atoms are aligned in a layered manner in the thickness direction are observed in Sample 2 and Sample 3. The proportion of regions where atoms are arranged in the thickness direction of Sample 2 appears to be larger than that of Sample 3. Although Sample 1 also includes the region where atoms are periodically arranged, the proportion of crystal parts aligned in the thickness direction is not large compared to Sample 2 and Sample 3.

[Electron Diffraction]

Next, electron diffraction measurement results of Sample 1 to Sample 4 are described below. In the electron diffraction measurement, a diffraction pattern was obtained in such a manner that the sample was irradiated with an electron beam incident in a direction perpendicular to its cross-section. In the measurement, the diameter of electron beam was varied from 1 nm to 100 nm. The thickness of each sample was about 50 nm.

The electron diffraction pattern of each sample is shown below. Note that the contrast of each electron diffraction pattern shown here is adjusted for simplicity. However, in luminance analysis of diffraction patterns described later, image data with contrast adjustment shown in figures are not used but image data without contrast adjustment are used.

Here, the thickness of samples used for electron diffraction is described. As the diameter of incident electron beam used in electron diffraction is larger and the thickness of sample is larger, information of the sample in the thickness direction is likely to be shown in the electron diffraction pattern. Therefore, the information of local regions can be obtained by reducing not only the diameter of electron beam (a probe diameter) but also the thickness of the sample. In contrast, when the thickness of sample is too small, for example, less than or equal to 5 nm, information of only submicroscopic region is obtained. Therefore, an electron diffraction pattern obtained when a submicroscopic crystal part exists in the region is similar to an electron diffraction pattern of a single crystal. When the aim is not to analyze the submicroscopic region, the thickness of sample is preferably greater than or equal to 10 nm and less than or equal to 100 nm, typically greater than or equal to 10 nm and less than or equal to 50 nm.

[Sample 1]

Figure 3A:
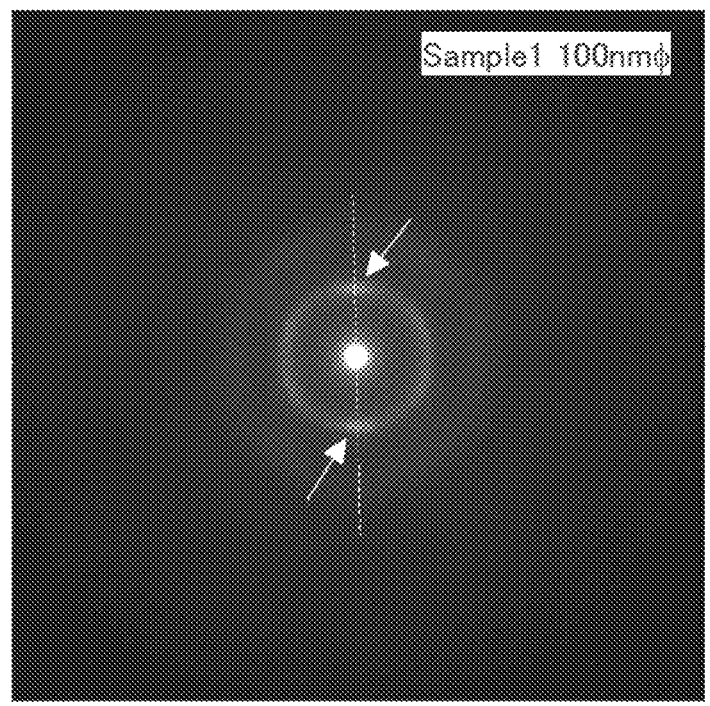
FIGS. 3A and 3B are electron diffraction patterns of a metal oxide film.
Figure 3B:
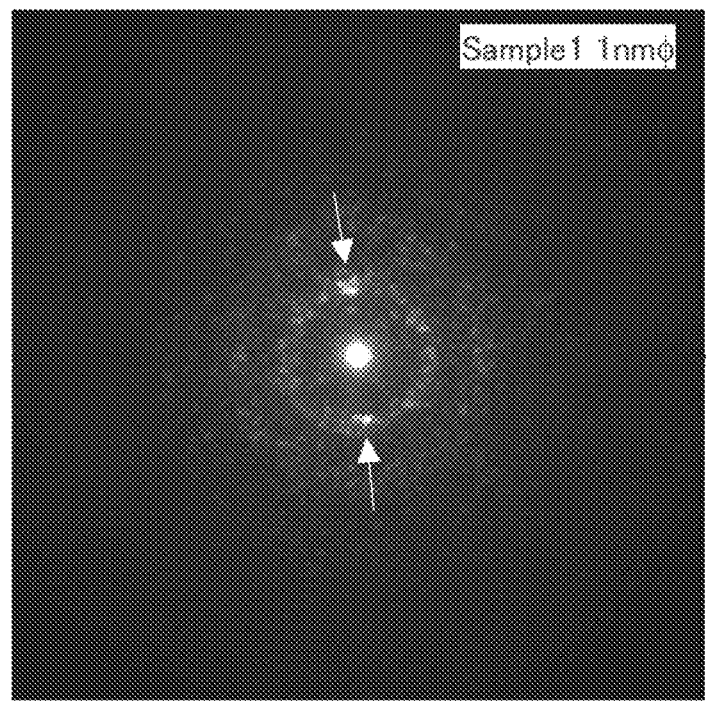

FIGS. 3A and 3B are electron diffraction patterns of Sample 1. FIGS. 3A and 3B are electron diffraction patterns with an electron-beam diameter of 100 nm and 1 nm, respectively. In FIGS. 3A and 3B, the brightest luminescent spot at the center of the pattern is derived from the incident electron beam and is the center of the electron diffraction pattern (also referred to as direct spot).

Two ring-like diffraction pattern with different radii are observed in FIG. 3A. The rings are referred to as a first ring and a second ring in ascending order of radius. It is observed that the luminance of the first ring is higher than that of the second ring. In addition, two spots (referred to as first spot) indicated by arrows are observed at a position overlapping with the first ring.

The distance from the center to the first ring and the distance from the center to the two first spots in a radial direction substantially correspond to the distance from the center to a diffraction spot on the (009) plane of the structure model of single crystal $InGaZnO_4$.

The observations of the ring-like diffraction patterns indicate that crystal parts with a random orientation (hereinafter also referred to as crystal parts without a particular orientation or second crystal parts) exist in the metal oxide film.

In addition, the crystal part derived from the first spots is presumed to have two-hold symmetry because the two first spots are disposed symmetrically with respect to the center point of the electron diffraction pattern and the luminance of the two first spots are substantially equal to each other. As described above, since the two first spots are diffraction spots which are derived from a crystal plane perpendicular to the c-axis, the orientation of a straight line (a straight line denoted by a dashed line) which passes through the two first spots and the center is aligned with the c-axis of the crystal part. The thickness direction is the vertical direction of FIG. 3A, which suggest the presence of crystal part in which the c-axis is oriented in the thickness direction in the metal oxide film.

In FIG. 3B, a plurality of spots (second spots) circumferentially distributed is observed at the position of the first ring shown in FIG. 3A. Moreover, two first spots can be observed.

As shown in FIG. 3B, when the diameter of electron beam which enters the sample is extremely small, a plurality of second spots circumferentially distributed can be observed. This indicates that the metal oxide film contains a plurality of submicroscopic crystal parts with a random surface orientation. It is also found that the first ring observed in FIG. 3A results from a sequence of a plurality of diffraction spots derived from the submicroscopic crystal parts with averaged luminance caused by increasing the observation area.

As described above, the metal oxide film of Sample 1 is confirmed to be a film including both crystal parts with a particular orientation and crystal parts with a random orientation. In addition, the luminance of the first spots derived from crystal parts with a particular orientation is higher than the luminance of the second spots, which indicates that the proportion of crystal parts with a particular orientation is high among crystal parts that exist in the film.

[Sample 2 and Sample 3]

Figure 4A:
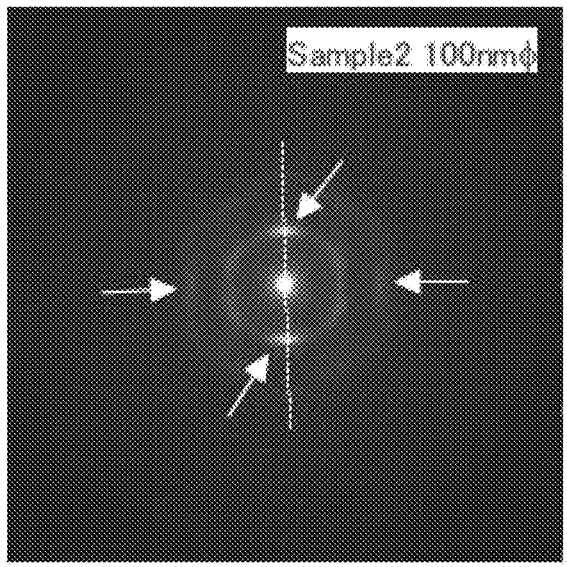
FIGS. 4A to 4D are electron diffraction patterns of metal oxide films.
Figure 4B:
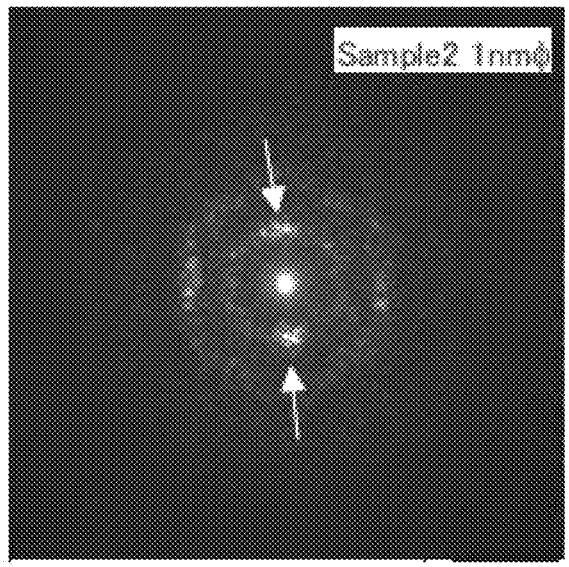
Figure 4C:
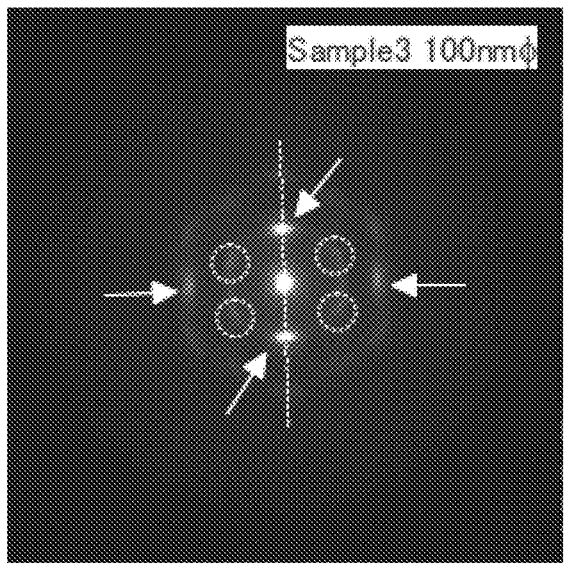
Figure 4D:
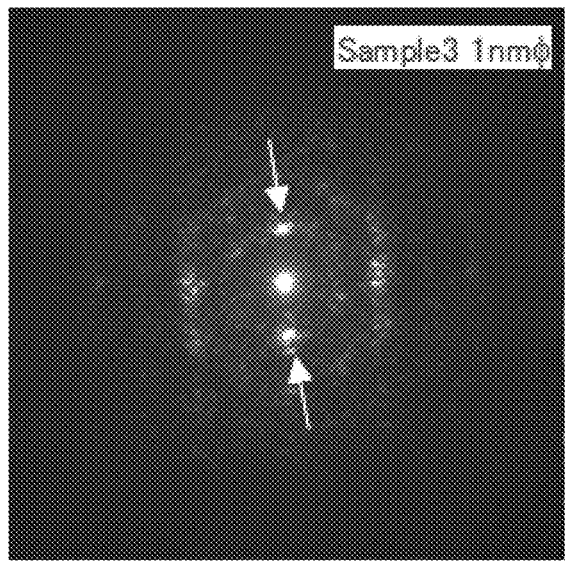

FIGS. 4A and 4B show electron diffraction patterns of Sample 2. FIGS. 4C and 4D show electron diffraction patterns of Sample 3. The beam diameter is 100 nm in FIGS. 4A and 4C. The beam diameter is 1 nm in FIGS. 4B and 4D.

As shown in FIGS. 4A and 4C, two first spots derived from crystal parts with a particular orientation can be observed more clearly than those in Sample 2 and Sample 3. The luminance of the spots is high in the following order: Sample 3, Sample 2 and Sample 1. This indicates that the proportion of crystal parts with a particular orientation is high in that order.

As shown in FIGS. 4A and 4C, two spots (third spots) whose brightness is lower than the first spot are observed in a position overlapping with the second ring in each of Sample 2 and Sample 3. Note that the luminance of the third spot cannot be distinguished from that of the second ring in Sample 1 as shown in FIG. 3A. Two third spots are observed at positions rotated 90 degrees with respect to the first spots. The third spot is a diffraction spot which is derived from a plane other than crystal plane which is perpendicular to the c-axis.

In addition, high luminance regions are observed at positions rotated 30 degrees and positions rotated 60 degrees with respect to the first spots, which are surrounded by a dashed line in FIG. 4C. Since the diffraction spots other than the first spots are observed more obviously, Sample 3 is a film in which the proportion of crystal parts with a particular orientation is higher, in other words, the crystallinity is higher.

The second spots are observed at the position of the first ring as shown in FIGS. 4B and 4D obtained with an extremely small beam diameter. In addition, the third spots are also observed in Sample 2 and Sample 3, which do not appear in Sample 1.

[Sample 4]

Figure 5:
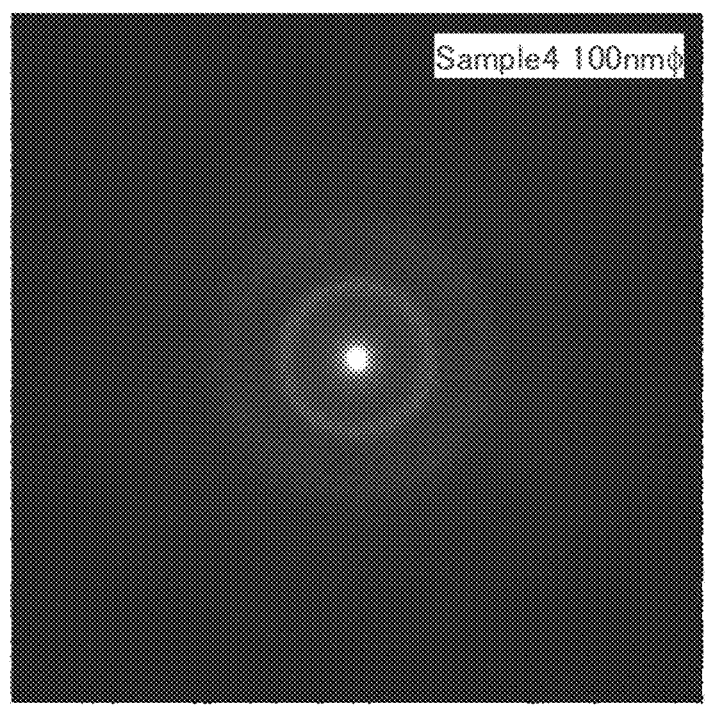
FIG. 5 is an electron diffraction pattern of a metal oxide film.

FIG. 5 is an electron diffraction pattern of Sample 4 obtained with a beam diameter of 100 nm.

In Sample 4, although the first ring was observed, the first spots which were observed in Sample 1 to Sample 3 were not observed. This indicates that Sample 4 includes a plurality of crystal parts derived from the first ring and that the proportion of crystal parts with a particular orientation is equivalent to the proportion of crystal parts with a random orientation.

[Luminance of Spot in Electron Diffraction Pattern]

A difference in luminance between the first ring and the first spots is important information to presume the proportion of crystal parts with a particular orientation.

Figure 6A:
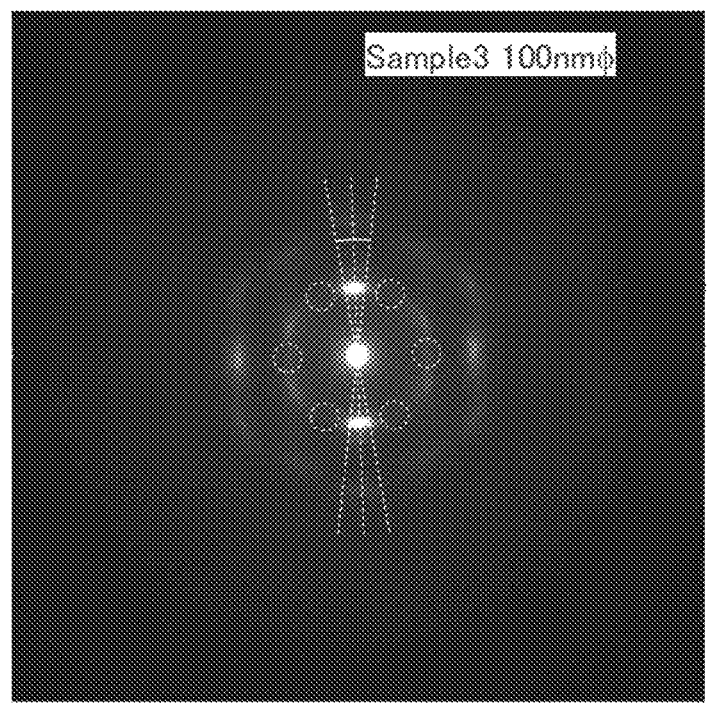
FIGS. 6A and 6B are electron diffraction patterns of metal oxide films.

FIG. 6A is an enlarged view of FIG. 4C. Here, it is known that in an ideal electron diffraction pattern of a single-crystal $InGaZnO_4$, a diffraction spot is not observed at positions (regions surrounded by a dashed line in FIG. 6A) rotated 30, 90, and 120 degrees with respect to the first spot that is the center of the electron diffraction pattern and overlapping with the first ring in a radius direction. In other words, the luminance of the regions is assumed to be derived from an electron diffracted from crystal parts other than crystal parts with a particular orientation, or from an electron scattered from a region in the film other than crystal parts or a substrate. Note that the latter scattered electron can be negligible here because scattered electrons at the position with the same radius are presumed to be observed to have a comparable intensity. Therefore, the difference in luminance between, for example, the first spot and the position rotated by 90 degrees with respect to the first spot is important information to understand the proportion of crystal parts with a particular orientation.

The difference in luminance between the first spots and the positions rotated predetermined degrees with respect to the first spots can be obtained by normalizing the luminance of the spots using the luminance of the direct spot as a reference. Note that the direct spot appears at the center of an electron diffraction pattern. In addition, the samples can be relatively compared.

FIG. 7A1 shows the electron diffraction pattern of Sample 1 (same as that in FIG. 3A). FIG. 7A2 shows the profiles of normalized luminance with respect to a radial direction along lines A-A' and B-B'. The line A-A' passes through the first spots and the direct spot, and the line B-B' intersects with the line A-A'. As shown in FIG. 7A2, two peaks between which the peak of the direct spot is sandwiched are observed. There is an obvious difference in luminance of the two peaks between A-A' and B-B'.

FIGS. 7B1 and 7B2 are an electron diffraction pattern of Sample 2 and the profiles of normalized luminance, respectively. FIGS. 7C1 and 7C2 are an electron diffraction pattern of Sample 3 and the profiles of normalized luminance, respectively. A difference in luminance of Sample 2 between a peak of the first spots and a peak at the positions rotated 90 degrees with respect to the first spots is larger than that of Sample 1. Furthermore, the difference is larger in Sample 3 than Sample 2.

Moreover, in B-B' direction of Sample 2 and Sample 3, peaks at the position corresponding to the second ring are observed, which are not observed in Sample 1. This obviously shows that Sample 2 and Sample 3 have higher crystallinity than Sample 1.

FIGS. 7D1 and 7D2 are an electron diffraction pattern of Sample 4 and the profiles of normalized luminance, respectively. In Sample 4, the profiles in both directions substantially agree with each other. In other words, Sample 4 includes few crystal parts with a particular orientation and includes a plurality of crystal parts with a random orientation of crystal planes.

Figure 6B:
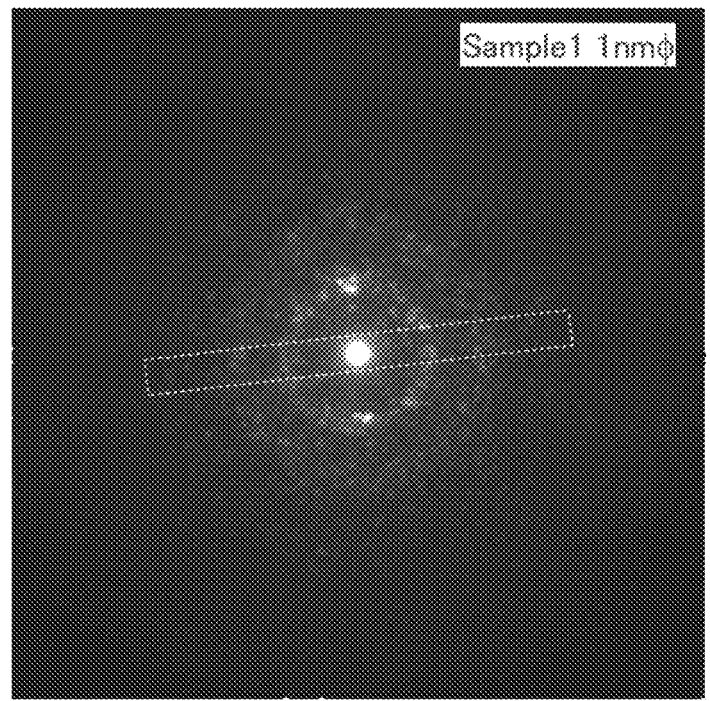

When the beam diameter is small, the first ring appears as a group of discrete luminescent spots in the electron diffraction pattern. Therefore, the luminance of the first ring cannot be accurately obtained by comparison with the local luminance at some position. In that case, luminance at a predetermined position in a rectangular region denoted by a dashed line in FIG. 6B which has a particular width and whose long-side direction corresponds to a radial direction, can be obtained from the profile of the luminance in a radial direction by using the figure of averaged luminance in a width direction of the rectangle (in a short-side direction of the rectangle in FIG. 6B).

When the profile of the luminance in a radial direction is calculated, a component of the luminance derived from inelastic scatterings and the like from a sample is subtracted as the background, in which case comparison with higher accuracy can be performed. Because the component of the luminance derived from inelastic scatterings shows an extremely broad profile in a radial direction, the luminance of the background may be obtained by a linear approximation. For example, a straight line is drawn along the tails of a target peak, and a region positioned on the luminance side lower than the straight line can be subtracted as the background.

Here, the luminance of the first spots and the luminance at the positions rotated 90 degrees with respect to the first spots are calculated from data in which the background is subtracted by the method described above. Then, the luminance of the first spots is divided by the luminance of the positions rotated 90 degrees with respect to the first spots, whereby a relative luminance R was obtained.

Figure 8:
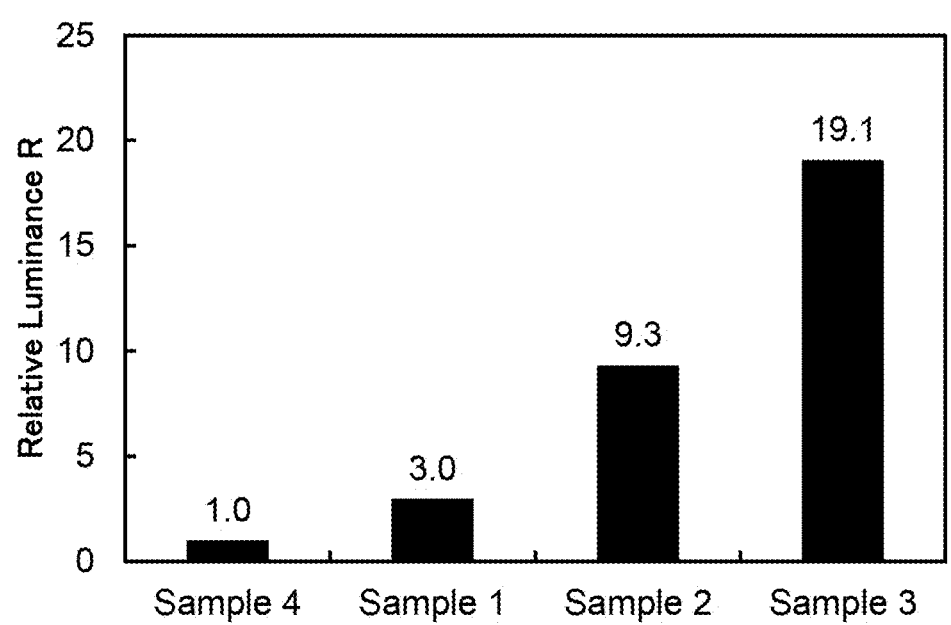
FIG. 8 shows relative luminance estimated from electron diffraction patterns of metal oxide films.

FIG. 8 shows the results of relative luminance R estimated from the electron diffraction patterns of Sample 1 to Sample 4 that were observed with a beam diameter of 100 nm.

In Sample 4, the difference in luminance cannot be observed between two positions and thus the relative luminance R is 1. The relative intensity is higher from Sample 3, Sample 2, and Sample 1 in this order.

When a metal oxide film is used for a semiconductor film in which a channel of a transistor is formed, the relative luminance R is in the following range: greater than 1 time and less than or equal to 10 times, preferably greater than 1 time and less than or equal to 9 times, more preferably greater than 1 time and less than or equal to 8 times, more preferably greater than or equal to 1.2 times and less than or equal to 8 times, further preferably greater than or equal to 1.5 times and less than or equal to 6 times, further preferably greater than or equal to 2 times and less than or equal to 6 times, and further preferably greater than or equal to 2 times and less than or equal to 4 times. With use of such a metal oxide film as a semiconductor layer, both high stability of electrical characteristics and high field-effect mobility in a low-gate-voltage region can be achieved.

[Variation in Orientation]

Crystal parts with a particular orientation included in a metal oxide film do not have a complete alignment and have a variation in orientation. The variation in orientation is described below.

The variation in orientation can be evaluated as follows. First, electron diffraction pattern images of a cross-section of a metal oxide film are obtained from a plurality of different regions. Then, the slope of a straight line passing through the center of the electron diffraction pattern and the first spots with respect to the thickness direction of the metal oxide film is measured in each of the obtained images. In this manner, variation in orientation of crystal parts included in each region can be estimated.

In this analysis, the electron diffraction patterns were obtained as moving images while scanning an electron beam with a diameter of 1 nm in a direction parallel to the thickness direction. A distance of approximately 250 nm was scanned for 100 seconds.

FIGS. 9A to 9C show some electron diffraction patterns of a captured moving image of each Sample 1, Sample 2, and Sample 3. FIGS. 9A to 9C each show nine electron diffraction patterns. An interval between each pattern is approximately 10 seconds.

In FIGS. 9A to 9C, a straight line passing through the first spots and the center of the electron diffraction pattern is denoted by a dotted line. It is found from FIGS. 9A to 9C that there is variation in orientation of crystal parts between observation regions.

Figure 10:
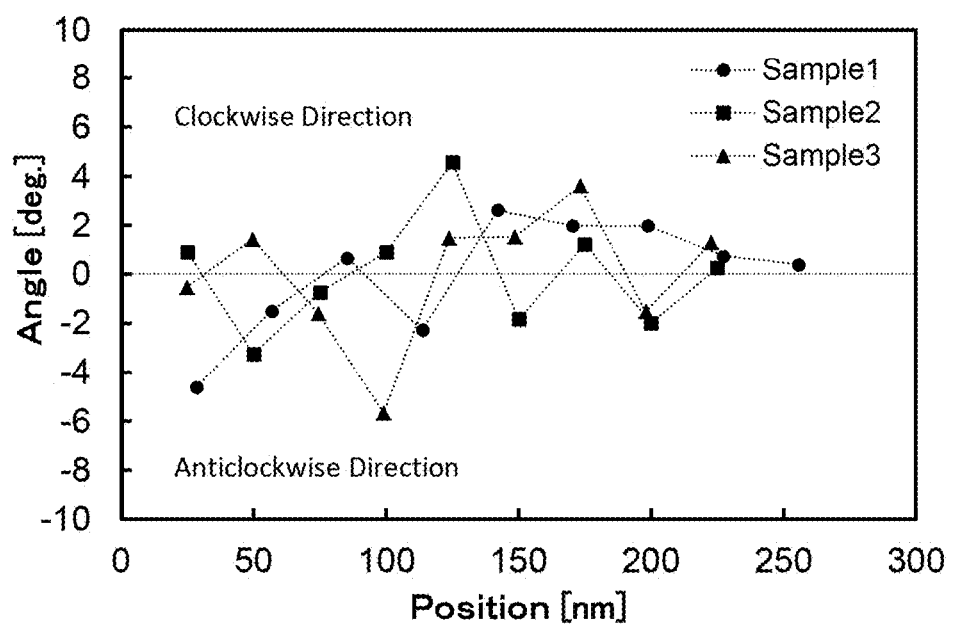
FIG. 10 shows the results of variation in orientation of crystal parts in metal oxide films.

FIG. 10 shows distribution of orientation estimated from the electron diffraction patterns shown in FIGS. 9A to 9C. The horizontal axis represents distance (an imaging-start position is the origin of measurement). The vertical axis represents orientation degree when an average of orientation angles measured at a respective distance is assumed to be 0 degree. In FIG. 10, the clockwise direction is positive. As shown in FIG. 10, there is little difference in orientation angle between the samples, and the variation falls within a range of less than 10 degrees in each sample.

The orientation of crystal parts in the metal oxide film can be estimated also from the extension of spots in a circumferential direction in an electron diffraction pattern obtained with a larger electron beam diameter. When the electron beam diameter is increased to extend the observation area, an electron diffraction pattern in which information of crystal parts existing in the measurement area is averaged can be obtained. Thus, as the variation in orientation of crystal parts is increased, the extension of spots in a circumferential direction is increased. In addition, the distribution of luminance in a circumferential direction reflects the proportion of crystal parts with a particular orientation.

For example, as shown in FIG. 6A, the first spot does not have a perfect-dot or -round shape but has a near-elliptical shape extended in a circumferential direction. The angle between two straight lines each connecting an end portion of the spot in a circumferential direction and the center of the electron diffraction pattern indicates variation in orientation of crystal parts. In the case where the end portions of the first spot are not obvious, the position of $1\sigma$ or $2\sigma$ when a point with the brightest luminance of the first spot is used as a reference may serve as the end portion, for example. In the case where a difference in luminance between the first ring and the first spot, for example, variation in orientation of crystal parts can be estimated from the luminance distribution where the luminance of the first ring is subtracted from the luminance of the first spot. Note that when the above method is used, there is a case where the extension of spot is larger as the luminance is increased depending on the observation conditions of electron diffraction pattern; as a result, variation in orientation is sometimes estimated larger than the actual one.

For example, the central angle of the end portion of the first spot in which the center of an electron diffraction pattern is assumed to be the center is preferably greater than or equal to 0 degree and less than or equal to 45 degrees, preferably greater than or equal to 0 degree and less than or equal to 40 degrees, more preferably greater than or equal to 0 degree and less than or equal to 35 degrees, still more preferably greater than or equal to 0 degree and less than or equal to 30 degrees. The higher the proportion of crystal parts with a particular orientation is, the better the electrical characteristics of the metal oxide film.

[Proportion of Crystal Part]

The proportion of crystal parts in a metal oxide film can be estimated by analyzing its cross-sectional observation image.

A method for analyzing the image is described. An image processing is performed as follows. First, a high-resolution TEM image is subjected to two-dimensional fast Fourier transform (FFT), whereby an FFT image is obtained. The obtained FET image is subjected to a mask processing so that a region other than a region having a periodic structure is removed. After the mask processing, the FFT image is subjected to two-dimensional inverse fast Fourier transform (IFFT), whereby an FFT filtering image is obtained.

In this manner, a real-space image in which only crystal parts are extracted can be obtained. Then, the proportion of crystal parts can be estimated from the proportion of area of the remaining image. Moreover, the proportion of area other than the crystal parts can be estimated by subtracting the remaining region from the area of region used for image processing (also referred to as the area of original image).

Figure 11A:
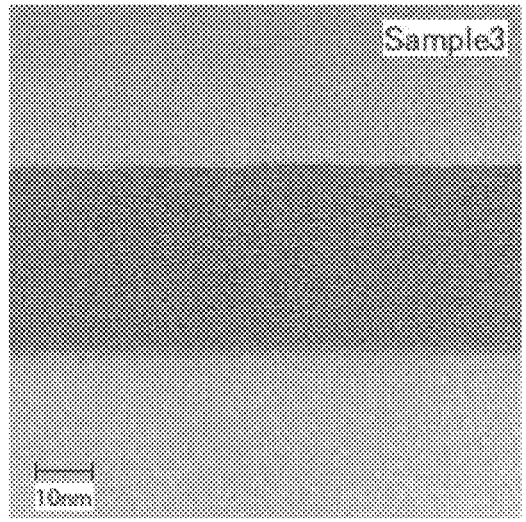
FIGS. 11A to 11D are cross-sectional observation images of metal oxide films and cross-sectional observation images obtained through analysis thereof.
Figure 11B:
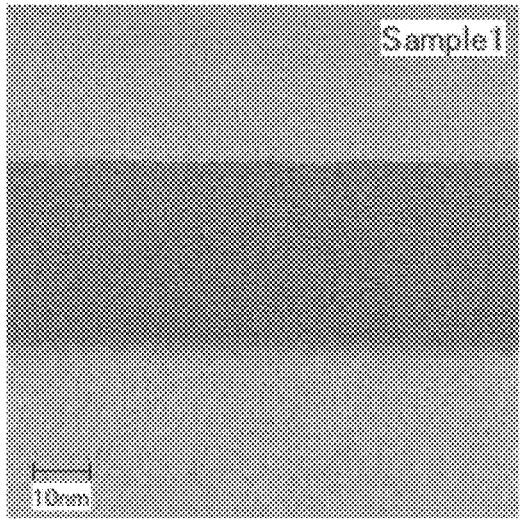
Figure 11C:
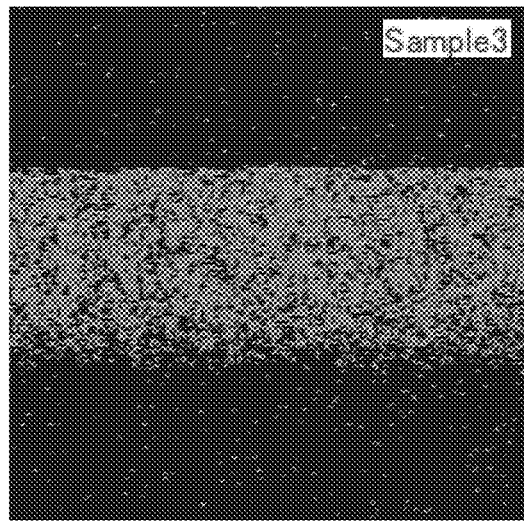
Figure 11D:
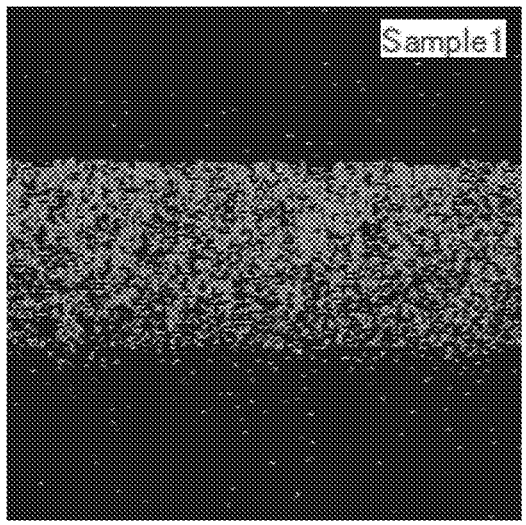

FIGS. 11A and 11B show cross-sectional TEM observation images of Sample 3 and Sample 1 before the image processing. FIGS. 11C and 11D show the images after the image processing. White regions in the images after the image processing correspond to regions including crystal parts.

FIG. 11C indicates that the proportion of the area other than the region including crystal parts was about 21.0% in Sample 3. The proportion of the area other than the region including crystal parts with a particular orientation was about 39.8% in Sample 1, which was estimated from FIG. 11D.

When the proportion of the region other than crystal parts in a metal oxide film, which was estimated in the above manner, is greater than or equal to 5% and less than 20%, the metal oxide film has extremely high crystallinity and high stability of electrical characteristics and thus is preferable. In addition, when the proportion of the region other than crystal parts in a metal oxide film is higher than or equal to 20% and lower than 100%, preferably higher than or equal to 20% and lower than or equal to 90%, more preferably higher than or equal to 20% and lower than or equal to 80%, still more preferably higher than 20% and lower than or equal to 60%, still more preferably higher than or equal to 30% and lower than or equal to 50%, the metal oxide film includes both crystal parts with a particular orientation and the crystal parts with a random orientation at an appropriate ratio and thus can achieve both high stability of electrical characteristics and high mobility.

Here, a cross-sectional image or a region other than crystal parts that can be easily observed by the above image analysis can be referred to as Lateral Growth Buffer Region (LGBR). In addition, in a cross-sectional TEM observation image, a dense portion and a sparse portion are observed in the LGBR. The sparse portion appears to connect the dense portions with each other by the lateral growth. In particularly, the LGBR is a region where a plurality of crystal parts whose surface orientations are random and whose sizes are extremely minute and different from each other. The crystal part is not observed as a spot in an electron diffraction pattern with a large beam diameter (probe dimeter) (e.g., greater than or equal to 25 nm $\varphi$ or greater than or equal to 50 nm $\varphi$), but can be barely observed as a spot in an electron diffraction pattern with an extremely small beam diameter (probe diameter) (e.g., greater than or equal to 0.3 nm and less than or equal to 10 nm $\varphi$ or less than or equal to 5 nm), which indicates that the crystal part is extremely minute. In this manner, the presence of crystal parts can be found.

A high-resolution TEM image can be obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

[Electrical Characteristics 1 of Transistor]

Results of fabrication of transistors using the metal oxides of Sample 1 and Sample 3 and measurement of their electrical characteristics are described below.

Figure 36A:
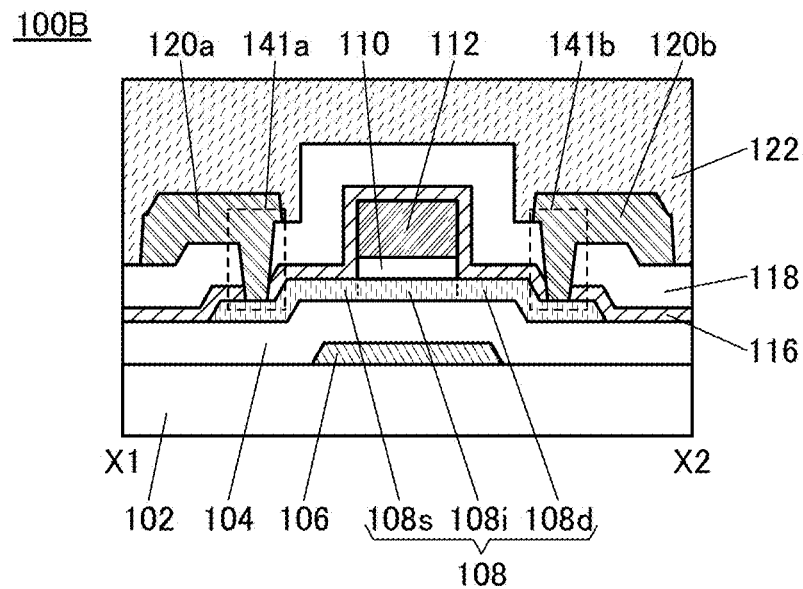
FIGS. 36A and 36B are cross-sectional views illustrating a semiconductor device.
Figure 36B:
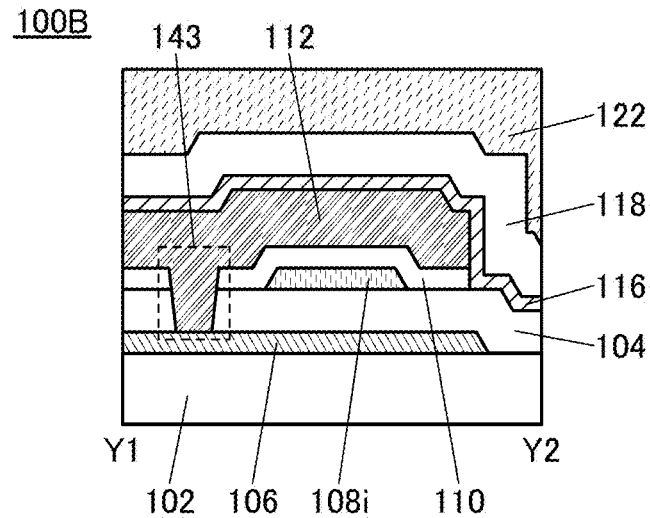

The transistor structure illustrated in FIGS. 36A and 36B in Embodiment 2 was used. Two kinds of samples, Sample A1 and Sample A2 whose semiconductor layers were formed in different conditions were fabricated.

[Fabrication of Transistor]

First, a 10-nm-thick titanium film and a 100-nm-thick copper film were formed over a glass substrate with a sputtering apparatus. Next, the conductive film was processed by a photolithography method.

A stack including four insulating films was formed over the substrate and the conductive film. The insulating films were formed in succession in a vacuum with a plasma-enhanced chemical deposition (PECVD) apparatus. As the insulating films, a 50-nm-thick silicon nitride film, a 300- nm-thick silicon nitride film, a 50-nm-thick silicon nitride film, and a 50-nm-thick silicon oxynitride film were used and stacked in this order.

Next, an oxide semiconductor film was formed over the insulating film and was processed into an island shape, whereby a semiconductor layer was formed. A 40-nm-thick oxide semiconductor film was formed as the oxide semiconductor film 108.

The formation conditions of a metal oxide film for Sample A1 which was used for an oxide semiconductor film were similar to those for Sample 1. In other words, the metal oxide film used for Sample A1 was formed under the following conditions: the substrate temperature was 130° C.; an argon gas with a flow rate of 180 sccm and an oxygen gas with a flow rate of 20 sccm were introduced into a chamber of the sputtering apparatus; the pressure was set to 0.6 Pa; and an AC power of 2.5 kw was applied to a metal oxide target containing indium, gallium, and zinc (with an atomic ration of In:Ga:Zn=4:2:4.1). Note that the oxygen flow rate percentage was 10%. The thickness of the metal oxide film was approximately 40 nm.

The formation conditions of a metal oxide film for Sample A2 which was used for an oxide semiconductor film were similar to those for Sample 3. In other words, the metal oxide film used for Sample A2 was formed under the following conditions: the substrate temperature was 170° C.; an argon gas with a flow rate of 140 sccm and an oxygen gas with a flow rate of 60 sccm were introduced into a chamber of the sputtering apparatus; the pressure was set to 0.6 Pa; and an AC power of 2.5 kw was applied to a metal oxide target containing indium, gallium, and zinc (with an atomic ration of In:Ga:Zn=4:2:4.1). Note that the oxygen flow rate percentage was 30%. The thickness of the metal oxide film was approximately 40 nm.

Next, an insulating film was formed over the insulating film and the oxide semiconductor layer. As the insulating film, a 150-nm-thick silicon oxynitride film was formed with a PECVD apparatus.

Next, heat treatment was performed. The heat treatment was performed at 350° C. for one hour in a mixed gas atmosphere of nitrogen and oxygen.

An opening was formed in a desired region of the insulating film. The opening was formed by a dry etching method.

Then, a 100-nm-thick oxide semiconductor film was formed over the insulating film and in the opening and the oxide semiconductor film was processed into an island shape, whereby a conductive film was formed. In addition, the insulating film in contact with the bottom surface of the conductive film was processed in succession after the formation of the conductive film, whereby the insulating film was formed.

A 100-nm-thick oxide semiconductor film was formed as the conductive film. The oxide semiconductor film had a stacked-layer structure including two layers. A layer deposited first of the oxide semiconductor film was formed under the following conditions: the substrate temperature was 170° C.; an oxygen gas with a flow rate of 200 sccm was introduced into a chamber of the sputtering apparatus; the pressure was set to 0.6 Pa; an AC power of 2.5 kw was applied to a metal oxide target containing indium, gallium, and zinc (with an atomic ratio of In:Ga:Zn=4:2:4.1); and the thickness of the oxide semiconductor film was 10 nm. A layer deposited second of the oxide semiconductor film was formed under the following conditions: the substrate temperature was 170° C.; an argon gas with a flow rate of 180 sccm and an oxygen gas with a flow rate of 20 sccm were introduced into a chamber of the sputtering apparatus; the pressure was set to 0.6 Pa; an AC power of 2.5 kw was applied to a metal oxide target containing indium, gallium, and zinc (with an atomic ratio of In:Ga:Zn=4:2:4.1); and the thickness of the oxide semiconductor film was 90 nm.

Next, plasma treatment was performed from above the oxide semiconductor film, the insulating film, and the conductive film. The plasma treatment was performed with a PECVD apparatus at a substrate temperature 220° C. in a mixed gas atmosphere containing an argon gas and a nitrogen gas.

Next, an insulating film was formed over the oxide semiconductor film, the insulating film, and the conductive film. The insulating film was formed by stacking a 100-nm-thick silicon nitride film and a 300-nm-thick silicon oxynitride film with a PECVD apparatus.

Then, a mask was formed over the formed insulating film and an opening was formed in the insulating film with use of the mask.

A conductive film was formed to fill the opening and was processed into an island shape, whereby the conductive film serving as a source electrode and a drain electrode was formed. For the conductive films, a 10-nm-thick titanium film and a 100-nm-thick copper film were formed with a sputtering apparatus.

After that, an insulating film was formed over the insulating film and the conductive film. A 1.5-μm-thick acrylic-based photosensitive resin was used for the insulating film.

In the above manner, two types of transistors were fabricated.

[Electrical Characteristics of Transistor]

Next, Id-Vg characteristics of the fabricated transistors of Samples A1 and A2 were measured.

As conditions for measuring the Id-Vg characteristics of each transistor, a voltage applied to the conductive film serving as a first gate electrode of each transistor (hereinafter the voltage is also referred to as gate voltage (Vg)) and a voltage applied to the conductive film serving as the second gate electrode of each transistor (hereinafter the voltage is also referred to as back gate voltage (Vbg)) changed from −15 V to +20 V in increments of 0.25 V. A voltage applied to the conductive film serving as a source electrode (the voltage is also referred to as source voltage (Vs)) was 0 V (comm), and a voltage applied to the conductive film serving as a drain electrode (the voltage is also referred to as drain voltage (Vd)) was 0.1 V and 20 V.

Figure 12A:
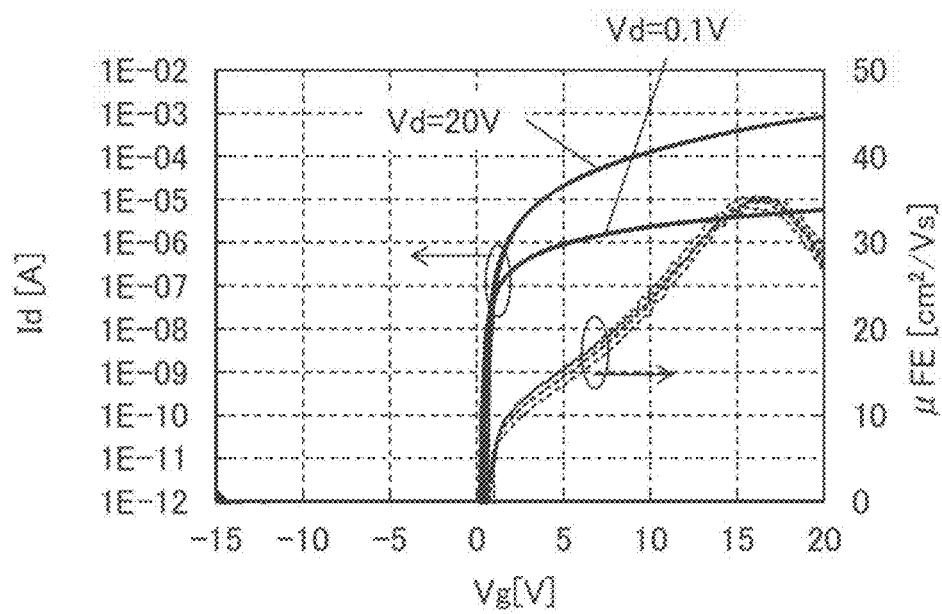
FIGS. 12A and 12B illustrate electrical characteristics of transistors.
Figure 12B:
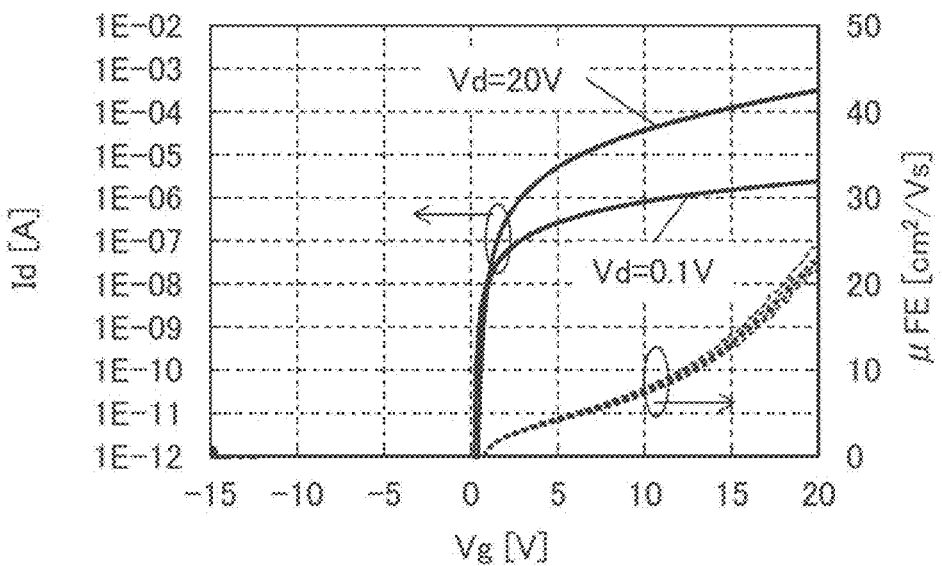

FIGS. 12A and 12B show the results of Id-Vg characteristics of Sample A1 and Sample A2. In FIGS. 12A and 12B, the first vertical axis represents Id(A), the second vertical axis represents field-effect mobility (μFE) (cm$^2$/Vs), and the horizontal axis represents Vg(V). FIGS. 12A and 12B each show superimposed Id-Vg characteristics of five transistors.

As shown in FIGS. 12A and 12B, it is confirmed that Sample A1 and Sample A2 has favorable electrical characteristics. The field-effect mobility of Sample A1 is higher than that of Sample A2. Such a tendency is apparent particularly in a low Vg range (e.g., Vg is lower than or equal to 10 V).

In other words, the transistor in which the metal oxide film containing both a crystal part having alignment and a crystal part having no alignment was used for a semiconductor layer where a channel was formed showed high field-effect mobility. In particular, the transistor showed high field-effect mobility and high drain current under the low-gate-voltage conditions.

[Evaluation of Oxygen-Transmitting Property]

The result of evaluating oxygen-transmitting property of a metal oxide film is described.

The below-described three samples (Sample Ref, Sample B1, and Sample B2) were fabricated. Note that Sample B1 is a sample which includes a metal oxide film similar to that of Sample 1 and Sample B2 is a sample which includes a metal oxide film similar to that of Sample 3.

[Sample Ref]

Sample Ref is a sample in which a silicon oxynitride film that releases oxygen by heating is formed over a glass substrate.

First, the silicon oxynitride film was formed over the glass substrate. The silicon oxide film was formed under the following conditions: a mixed gas of $SiH_4$ at a flow rate of 160 sccm and $N_2O$ at a flow rate of 4000 sccm was used as a deposition gas; the pressure was 200 Pa; the power was 1500 W; the substrate temperature was 220° C.; and a plasma CVD method was used. The thickness of the silicon oxynitride film was approximately 400 nm.

Then, heat treatment was performed at 350° C. for one hour in a nitrogen atmosphere.

Next, an indium tin oxide film containing silicon (ITSO film) was formed by a sputtering method. The thickness of the ITSO film was approximately 5 nm.

Then, oxygen was added to the silicon oxynitride film. The oxygen addition treatment was performed with an ashing apparatus under the conditions where the substrate temperature was 100° C., an oxygen gas at a flow rate of 300 sccm was introduced into a chamber, the pressure was 25.06 Pa, and an RF power of 4750 W was supplied between parallel-plate electrodes provided in the ashing apparatus so that a bias would be applied to the substrate side.

After that, the indium tin oxide film was removed by a wet etching method, whereby Sample Ref was formed.

[Sample B1]

Sample B1 was formed in a manner similar to that of Sample Ref as follows: a silicon oxynitride film was formed and subjected to heat treatment, and an indium tin oxide film was formed and then removed.

In addition, an approximately 5-nm-thick IGZO film was formed in a manner similar to those of Sample 1 over the silicon oxynitride film, and then Sample B1 was manufactured.

[Sample B2]

Sample B2 was manufactured in a manner similar to that of Sample Ref as follows: a silicon oxynitride film was formed and subjected to heat treatment, and an indium tin oxide film was formed and then removed.

In addition, an approximately 5-nm-thick IGZO film was formed over the silicon oxynitride film in a manner similar to that of Sample 3, whereby Sample B2 was formed.

[TDS Measurement]

The number of released oxygen molecules (mass-to-charge ration (M/z) of 32) of the three samples were compared by thermal desorption spectroscopy (TDS).

Figure 13A:
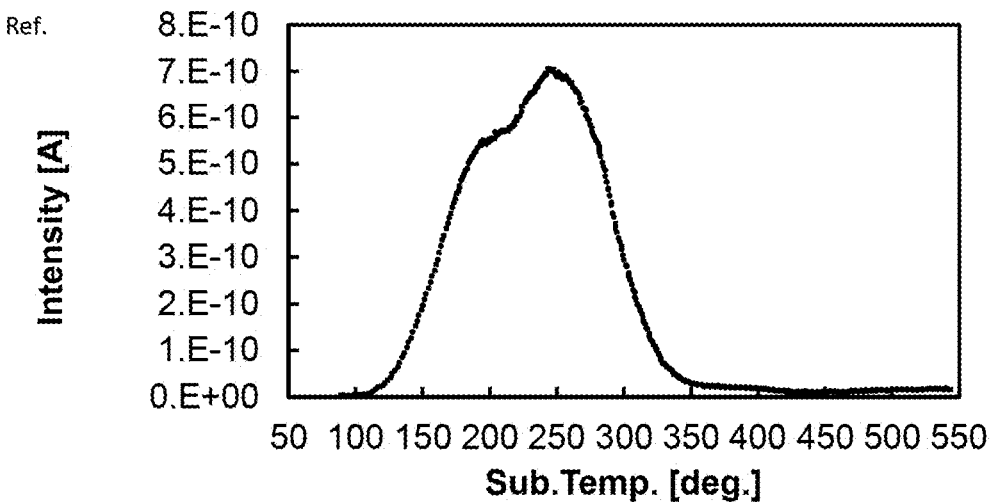
FIGS. 13A to 13C show TDS measurement results of metal oxide films.
Figure 13B:
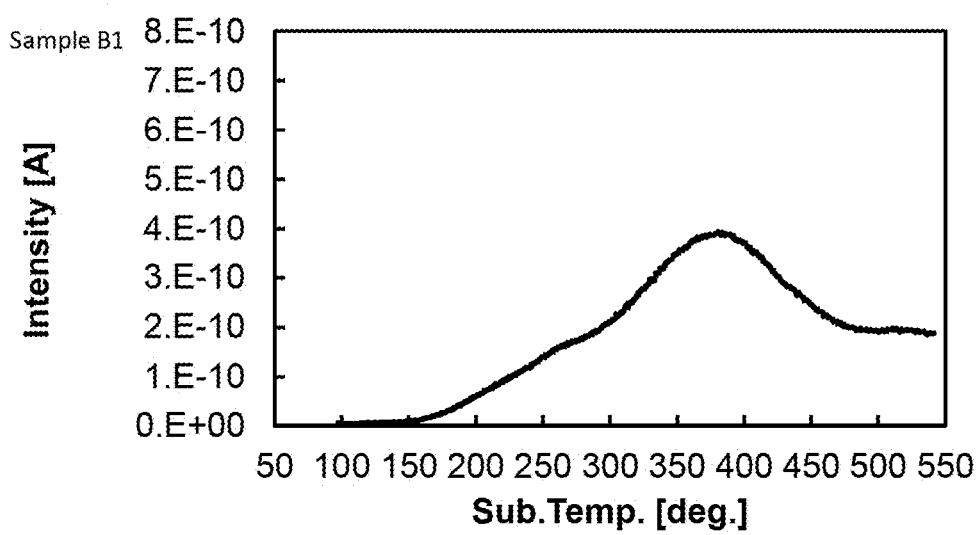
Figure 13C:
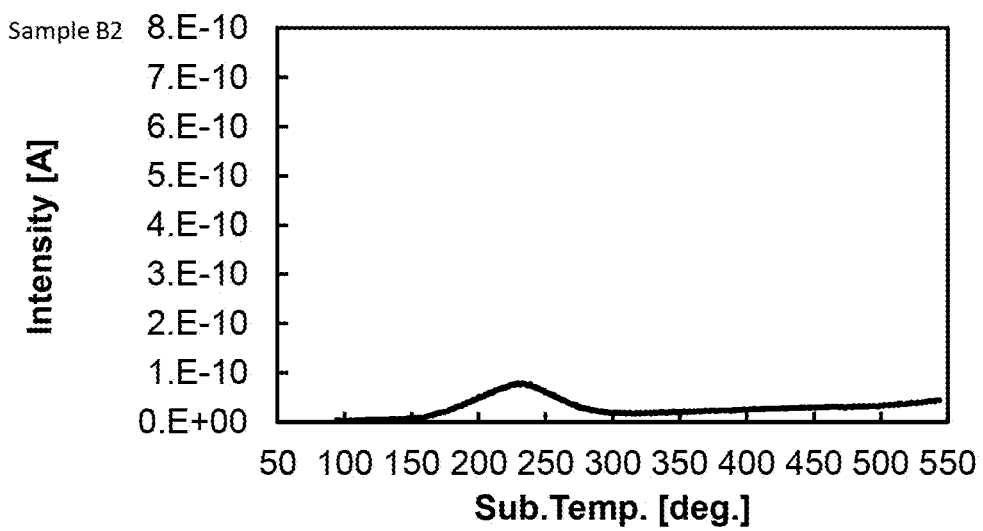

FIGS. 13A to 13C show measurement results of Sample Ref, Sample B1, and Sample B2, respectively. The vertical axis represents detection intensity and the horizontal axis represents substrate temperature in each graph.

The results of Sample Ref shown in FIG. 13A suggested that oxygen molecules were released at about 100° C. to about 350° C. Furthermore, Sample Ref has a peak at around 250° C.

As shown in FIG. 13B, Sample B1 started to release oxygen at about 150° C., had a peak at about 350° C., and kept releasing oxygen even at higher temperatures. In other words, the metal oxide film used for Sample B1 is a film which easily transmits oxygen.

As shown in FIG. 13C, the amount of released oxygen of Sample B2 was considerably smaller than that of Sample B1 even though the profile of released oxygen which had a peak at around 200° C. was observed.

According to the above results, a metal oxide film which includes both crystal parts with a particular orientation and crystal parts with a random orientation and in which the proportion of crystal parts with a particular orientation is lower is a film which easily transmits oxygen, in other words, a film in which oxygen is easily diffused.

[Evaluation of Oxygen Diffusion]

The evaluation results of ease of oxygen diffusion to metal oxide films are described below.

The following two samples (Sample C1 and Sample C2) were fabricated.

[Sample C1]

First, an approximately 50-nm-thick metal oxide film was formed over a glass substrate in a manner similar to that of Sample 1.

Next, an approximately 30-nm-thick silicon oxynitride film, an approximately 100-nm-thick silicon oxynitride film, and an approximately 20-nm-thick silicon oxynitride film were stacked over the metal oxide film by a plasma CVD method.

After that, heat treatment was performed at 350° C. for one hour in a nitrogen atmosphere.

Next, a 5-nm-thick indium tin oxide film was formed by a sputtering method.

Next, oxygen was added to the silicon oxynitride film. The oxygen addition treatment was performed with an ashing apparatus under the conditions where the substrate temperature was 40° C., an oxygen gas ($^{16}O$) at a flow rate of 150 sccm and an oxygen gas ($^{18}O$) at a flow rate of 100 sccm were introduced into a chamber, the pressure was 15 Pa, and an RF power of 4500 W was supplied for 600 sec. between parallel-plate electrodes provided in the ashing apparatus so that a bias would be applied to the substrate side. Since the silicon oxynitride film contained oxygen ($^{16}O$) at a main component level when deposited, an oxygen gas ($^{18}O$) was used to exactly measure the amount of oxygen added by the oxygen addition treatment.

Then, an approximately 100-nm-thick silicon nitride film was formed by a plasma CVD method.

After that, heat treatment was performed at 450° C. for one hour in a nitrogen atmosphere, whereby Sample C1 was fabricated.

[Sample C2]

Sample C2 is a sample whose metal oxide film was formed in different conditions from those of Sample C1. In Sample C2, an approximately 50-nm-thick metal oxide film was formed in a manner similar to that of Sample 3.

[SIMS Analysis]

Figure 14:
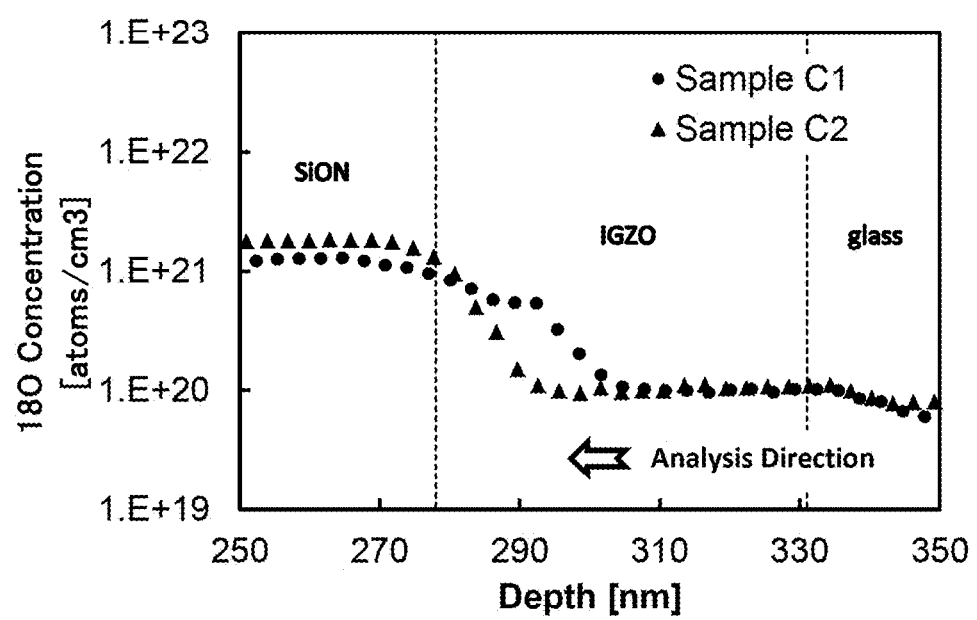
FIG. 14 shows SIMS measurement results of metal oxide films.

The concentration of $^{18}O$ in Sample C1 and Sample C2 were measured by secondary ion mass spectrometry (SIMS) analysis. FIG. 14 shows the results. FIG. 14 shows the analysis results in a region including the glass substrate (expressed as glass), the metal oxide film (expressed as IGZO), and the silicon oxynitride film (expressed as SiON). Note that the analysis results shown here are results analyzed from the substrate side (also referred to as substrate side depth profile (SSDP)-SIMS).

In each Sample C1 and Sample C2, it is found that $^{18}O$ was diffused to the silicon oxynitride film and also to the metal oxide film. When comparing with Sample C1 and Sample C2, $^{18}$O was more deeply diffused into Sample C2 than Sample C1. In Sample C1, $^{18}$O was diffused to a depth of approximately 25 nm.

The above results showed that a metal oxide film including both crystal parts with a particular orientation and crystal parts with a random orientation and having a low proportion of crystal parts with a particular orientation is a film which easily transmits oxygen, in other words, a film in which oxygen is easily diffused.

[Concept of Oxygen Supply to Oxide Semiconductor Film]

Next, the concept of the oxygen supply to the metal oxide film is described below based on the model diagrams illustrated in FIGS. 15A to 15C, FIGS. 16A to 16C, FIGS. 17A to 17C, FIGS. 18A to 18C, FIG. 19, FIGS. 20A to 20C, FIGS. 21A to 21C, and FIG. 22.

Here, taking an IGZO film as an example of the metal oxide film, the movement easiness of excess oxygen (oxygen more than that in the stoichiometric composition) and oxygen vacancies are described.

In this embodiment, models in which either one excess oxygen atom or one oxygen vacancy existed on one In—O plane of an IGZO film with an atomic ratio of In:Ga:Zn=3:1:2 were made by geometry optimization, and energy corresponding to an intermediate structure along a minimum energy path in each model was calculated by a nudged elastic band (NEB) method.

The calculation was performed using calculation program software "OpenMX" based on the density functional theory (DFT). As a basis function used as a parameter in the calculation, a pseudo-atomic localized basis function was used. Note that the basis function is categorized into polarized basis sets of slater type orbital (STO). As a functional, generalized-gradient-approximation/Perdew-Burke-Ernzerhof (GGA/PBE) was used. The cut-off energy was set to 200 Ry. The number of sampling k points was 5×5×3.

In the calculation of the movement easiness of excess oxygen, the number of atoms which existed in the calculation model was set to 85. In the calculation of the movement easiness of an oxygen vacancy, the number of atoms which existed in the calculation model was set to 83.

The movement easiness of excess oxygen and the movement easiness of an oxygen vacancy were evaluated by calculation of a height of energy barrier Eb which is required for excess oxygen or an oxygen vacancy to go over in moving to respective sites. That is, when the height of energy barrier Eb which is gone over in moving is high, excess oxygen or oxygen vacancy hardly moves, and when the height of the energy barrier Eb is low, excess oxygen or oxygen vacancy easily moves.

(Excess Oxygen Transfer)

First, excess oxygen transfer is described. The models in which one excess oxygen atom exists in one In—O plane of the IGZO film with an atomic ratio of In:Ga:Zn=3:1:2 are shown in FIGS. 15A to 15C, FIGS. 16A to 16C, FIGS. 17A to 17C, and FIGS. 18A to 18C.

[(1) First Transition of Excess Oxygen]

Figure 15A:
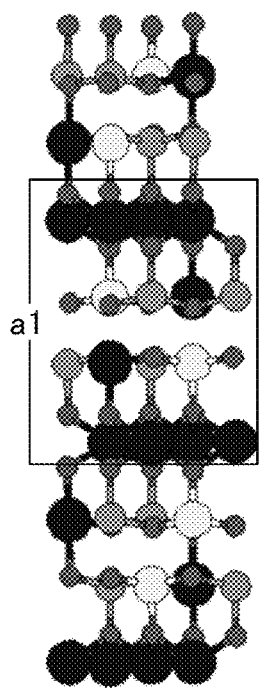
FIGS. 15A to 15C are model diagrams used for calculation of movement of excessive oxygen.
Figure 15B:
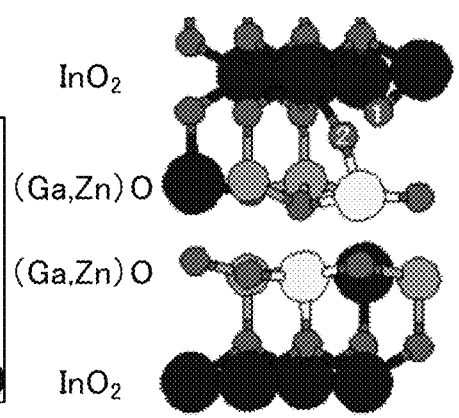
Figure 15C:
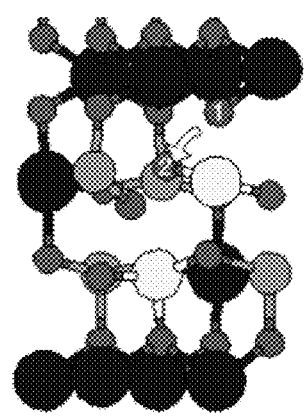

FIG. 15A is a model diagram of the IGZO film. FIG. 15B is an enlarged model diagram showing a region a1 in FIG. 15A. FIG. 15C is a model diagram showing the transition of excess oxygen from the site shown in the model diagram of FIG. 15B. The transition from FIG. 15B to FIG. 15C is referred to as a first transition of excess oxygen. In the first transition of excess oxygen, excess oxygen diffuses from an InO$_2$ layer to a (Ga, Zn)O layer.

[(2) Second Transition of Excess Oxygen]

Figure 16A:
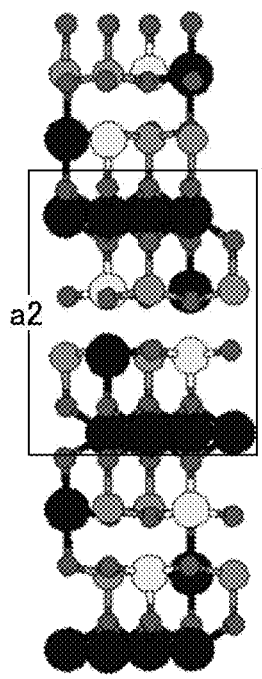
FIGS. 16A to 16C are model diagrams used for calculation of movement of excess oxygen.
Figure 16B:
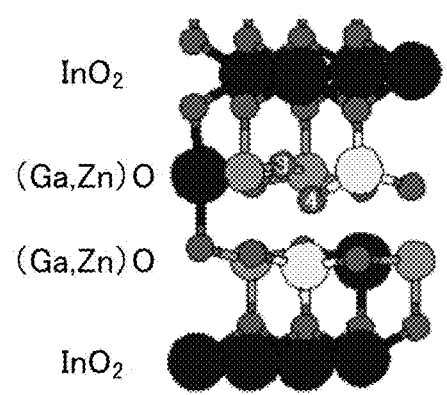
Figure 16C:
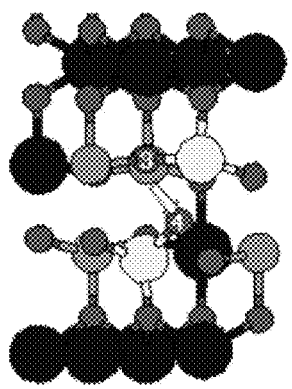

FIG. 16A is a model diagram of the IGZO film. FIG. 16B is an enlarged model diagram showing a region a2 in FIG. 16A. FIG. 16C is a model diagram showing the transition of excess oxygen from the site shown in the model diagram of FIG. 16B. The transition from FIG. 16B to FIG. 16C is referred to as a second transition of excess oxygen. In the second transition of excess oxygen, excess oxygen diffuses from a first (Ga, Zn)O layer to a second (Ga, Zn)O layer.

[(3) Third Transition of Excess Oxygen]

Figure 17A:
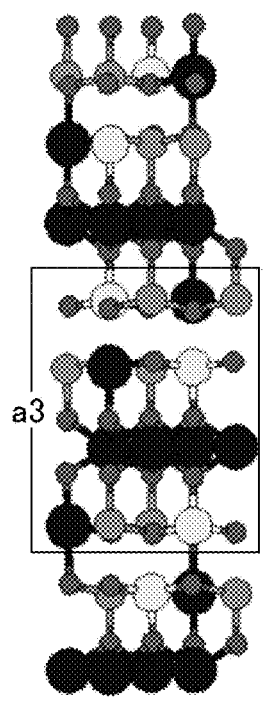
FIGS. 17A to 17C are model diagrams used for calculation of movement of excess oxygen.
Figure 17B:
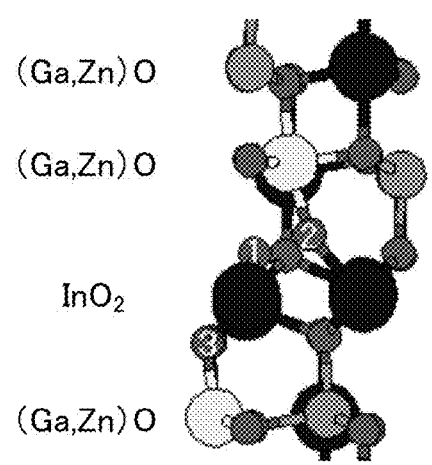
Figure 17C:
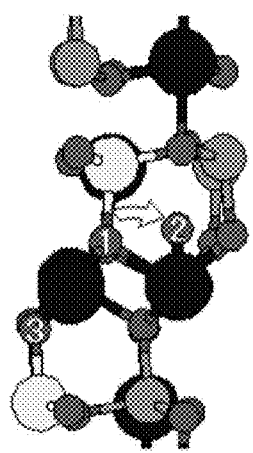

FIG. 17A is a model diagram of the IGZO film. FIG. 17B is an enlarged model diagram showing a region a3 in FIG. 17A. FIG. 17C is a model diagram showing the transition of excess oxygen from the site shown in the model diagram of FIG. 17B. The transition from FIG. 17B to FIG. 17C is referred to as a third transition of excess oxygen. In the third transition of excess oxygen, excess oxygen diffuses along an In layer.

[(4) Fourth Transition of Excess Oxygen]

Figure 18A:
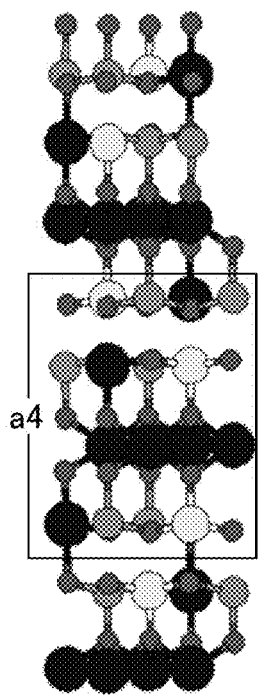
FIGS. 18A to 18C are model diagrams used for calculation of movement of excess oxygen.
Figure 18B:
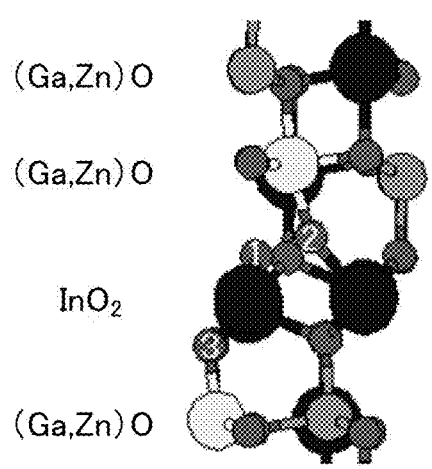
Figure 18C:
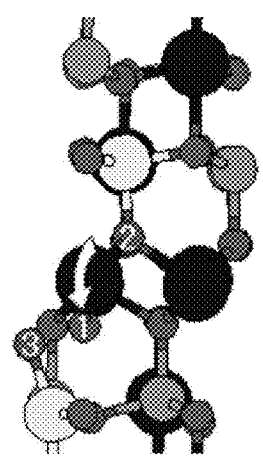

FIG. 18A is a model diagram of the IGZO film. FIG. 18B is an enlarged model diagram showing a region a4 in FIG. 18A. FIG. 18C is a model diagram showing the transition of excess oxygen from the site shown in the model diagram of FIG. 18B. The transition from FIG. 18B to FIG. 18C is referred to as a fourth transition of excess oxygen. In the fourth transition of excess oxygen, excess oxygen diffuses by moving across an In layer.

In FIGS. 15B and 15C, FIGS. 17B and 17C, and FIGS. 18B and 18C, an oxygen atom numbered "1" is referred to as a first oxygen atom. In FIGS. 15B and 15C, FIGS. 17B and 17C, and FIGS. 18B and 18C, an oxygen atom numbered "2" is referred to as a second oxygen atom. In FIGS. 16B and 16C, FIGS. 17B and 17C, and FIGS. 18B and 18C, an oxygen atom numbered "3" is referred to as a third oxygen atom. In FIGS. 16B and 16C, an oxygen atom numbered "4" is referred to as a fourth oxygen atom.

Figure 19:
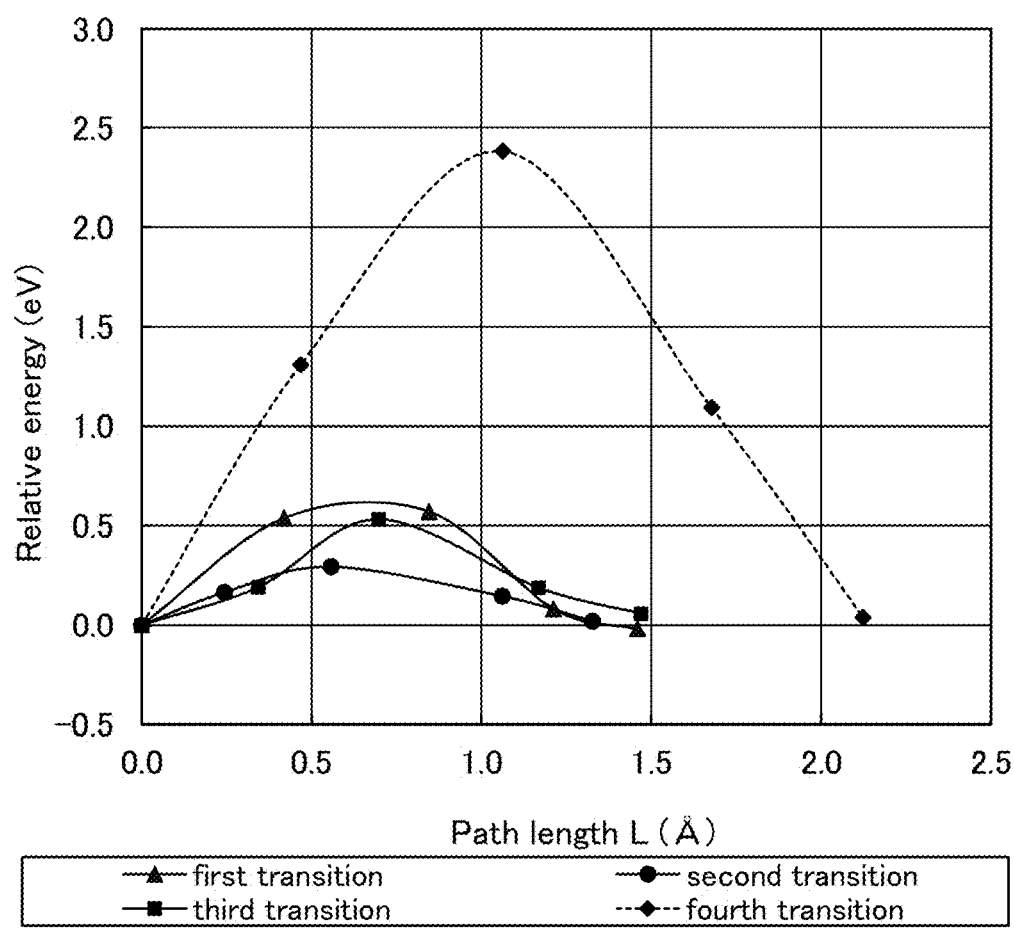
FIG. 19 shows calculation results for demonstrating the movement easiness of excess oxygen.

FIG. 19 shows calculation results showing the movement easiness of excess oxygen in the cases of the above-described four transition patterns. In FIG. 19, the horizontal axis represents the path length of the excess oxygen's movement, and the vertical axis represents energy required for the movement relative to the energy in the state shown in FIGS. 15A to 15C, FIGS. 16A to 16C, FIGS. 17A to 17C, and FIGS. 18A to 18C.

As shown in FIG. 19, the maximum height of the energy barrier Eb (Eb$_{max}$) in the first transition of excess oxygen is 0.62 eV, and the maximum height of the energy barrier Eb (Eb$_{max}$) in the second transition of excess oxygen is 0.29 eV. The maximum height of the energy barrier Eb (Eb$_{max}$) in the third transition of excess oxygen is 0.53 eV, and the maximum height of the energy barrier Eb (Eb$_{max}$) in the fourth transition of excess oxygen is 2.38 eV. Thus, the maximum heights of the energy barrier Eb (Eb$_{max}$) in the first to third transitions of excess oxygen are lower than that in the fourth transition of excess oxygen. This means that the energies required for the first to third transitions of excess oxygen are lower than that required for the fourth transition of excess oxygen and the first to third transitions of excess oxygen are more likely to occur than the fourth transition of excess oxygen does.

In other words, the first oxygen atom in the model shown in FIG. 15B, FIG. 17B, and FIG. 18B is more likely to move in the direction of pushing out the second oxygen atom shown in FIGS. 15B and 15C and FIGS. 17B and 17C than in the direction of pushing out the third oxygen atom shown in FIGS. 18B and 18C.

The third oxygen atom in the model shown in FIG. 16B is likely to move in the direction of pushing out the fourth oxygen atom shown in FIG. 16C. This shows that an oxygen atom moves along the layer of indium atoms more easily than across the layer of indium atoms. Further, an oxygen atom moves from the $InO_2$ layer to the (Ga, Zn)O layer and from the first (Ga, Zn)O layer to the second (Ga, Zn)O layer more easily than across the layer of indium atoms.

[Oxygen Vacancy Transfer]

Next, oxygen vacancy transfer is described. The models in which one oxygen vacancy exists in one In—O plane of an IGZO film with an atomic ratio of In:Ga:Zn=3:1:2 are shown in FIGS. 20A to 20C and FIGS. 21A to 21C.

[(5) First Transition of Oxygen Vacancy]

Figure 20A:
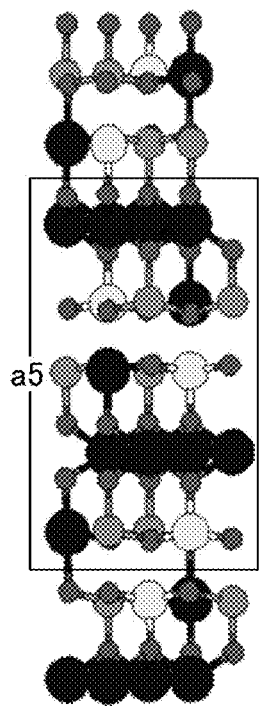
FIGS. 20A to 20C are model diagrams used for calculation of movement of an oxygen vacancy.
Figure 20B:
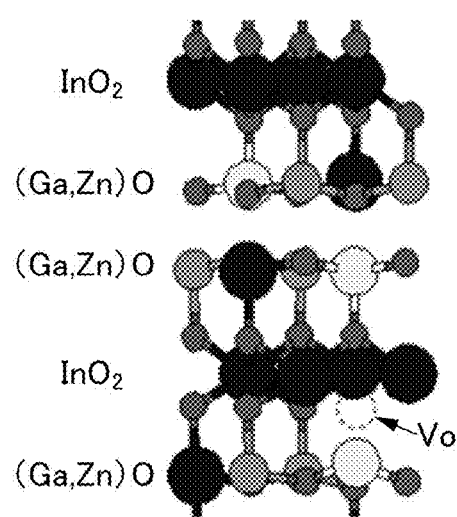
Figure 20C:
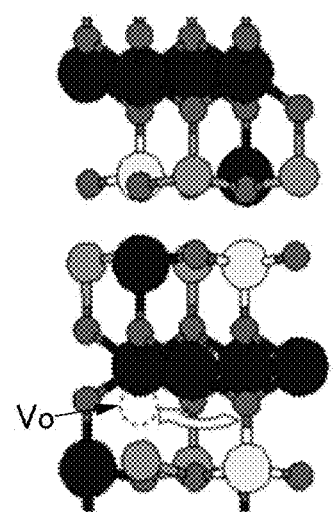

FIG. 20A is a model diagram of the IGZO film. FIG. 20B is an enlarged model diagram showing a region a5 in FIG. 20A. FIG. 20C is a model diagram showing the transition of an oxygen vacancy from the site shown in the model diagram of FIG. 20B. The transition from FIG. 20B to FIG. 20C is referred to as a first transition of an oxygen vacancy. In the first transition of an oxygen vacancy, an oxygen vacancy diffuses along an In layer.

[(6) Second Transition of Oxygen Vacancy]

Figure 21A:
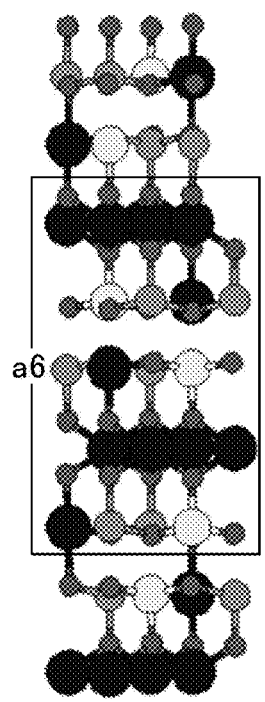
FIGS. 21A to 21C are model diagrams used for calculation of movement of an oxygen vacancy.
Figure 21B:
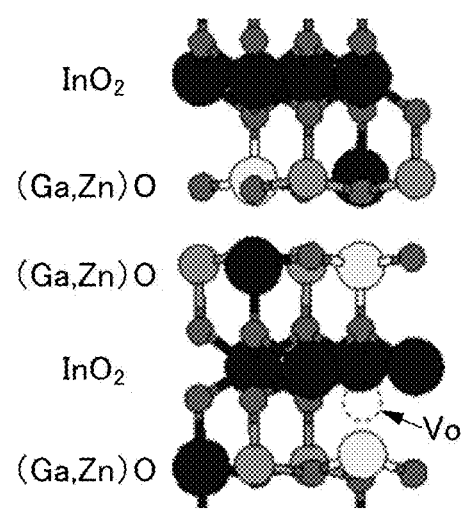
Figure 21C:
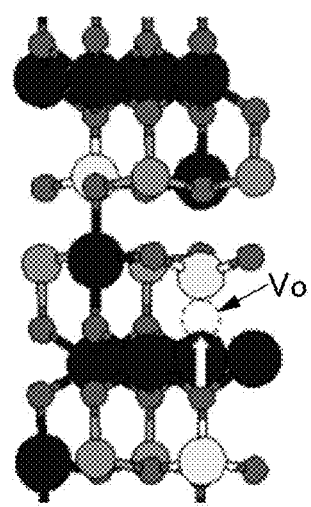

FIG. 21A is a model diagram of the IGZO film. FIG. 21B is an enlarged model diagram showing a region a6 in FIG. 21A. FIG. 21C is a model diagram showing the transition of an oxygen vacancy from the site shown in the model diagram of FIG. 21B. The transition from FIG. 21B to FIG. 21C is referred to as a second transition of an oxygen vacancy. In the second transition of an oxygen vacancy, an oxygen vacancy diffuses by moving across an In layer.

In FIGS. 20B and 20C and FIGS. 21B and 21C, a dotted circle represents an oxygen vacancy.

Figure 22:
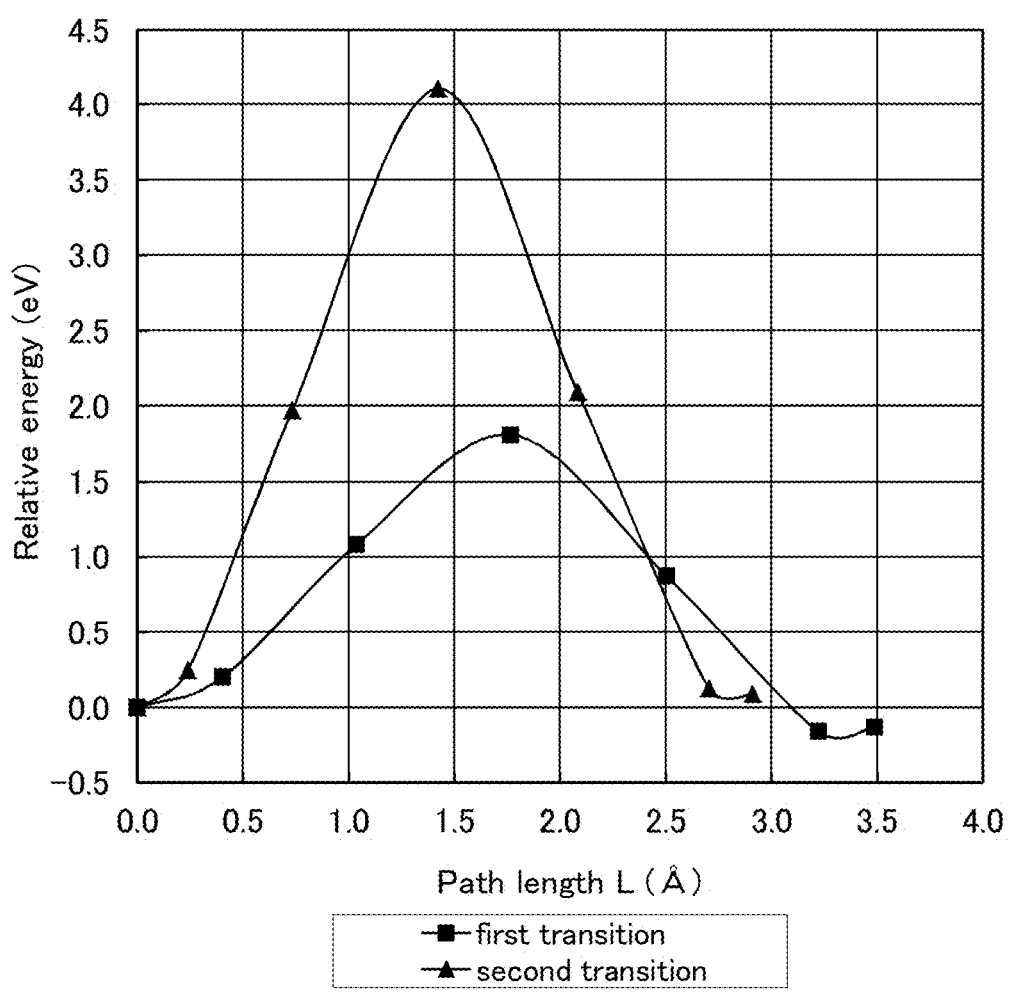
FIG. 22 shows calculation results for demonstrating the movement easiness of an oxygen vacancy.

FIG. 22 shows calculation results showing the movement easiness of an oxygen vacancy in the cases of the above-described two transition patterns. In FIG. 22, the horizontal axis represents the path length of the oxygen vacancy's movement, and the vertical axis represents energy required for the movement relative to the energy in the state shown in FIG. 20B and FIG. 21B.

As shown in FIG. 22, the maximum height of the energy barrier Eb ($Eb_{max}$) in the first transition of an oxygen vacancy is 1.81 eV, and the maximum height of the energy barrier Eb ($Eb_{max}$) in the second transition of an oxygen vacancy is 4.10 eV. The maximum height of the energy barrier Eb ($Eb_{max}$) in the first transition of an oxygen vacancy is lower than that in the second transition of an oxygen vacancy. This means that the energy required for the first transition of an oxygen vacancy is lower than that required for the second transition of an oxygen vacancy. In other words, the first transition of an oxygen vacancy is more likely to occur than the second transition of an oxygen vacancy does.

This shows that like the movement of excess oxygen described above, an oxygen vacancy moves along the layer of indium atoms more easily than across the layer of indium atoms.

[Temperature Dependence of Transition]

Next, in order to compare probabilities of occurrence of the above-described six transition patterns from another perspective, temperature dependence of these transitions is described below.

Temperature dependence of these transitions is compared based on the movement frequency per unit time. Here, the movement frequency Z (times per second) at certain temperature is represented by the following formula using the number of vibrations Zo (times per second) of an oxygen atom in a position where the oxygen atom is chemically stable.

$$Z = Zo \cdot \exp\left(-\frac{Eb_{max}}{kT}\right) \quad \text{[Formula 1]}$$

Note that in Formula 1, $Eb_{max}$ represents the maximum height of the energy barrier Eb in each transition, k represents Boltzmann constant, T represents the absolute temperature, and Zo represents the number of vibrations of an atom in a stable position. In this embodiment, calculation is performed on the assumption that Zo is $1.0 \times 10^{13}$ (times per second), which is a typical Debye frequency.

In the case where T is 300K (27° C.), Z is as follows.
(1) First Transition of Excess Oxygen
In the case where T is 300K, Z is $3.9 \times 10^2$ (times per second).
(2) Second Transition of Excess Oxygen
In the case where T is 300K, Z is $1.2 \times 10^8$ (times per second).
(3) Third Transition of Excess Oxygen
In the case where T is 300K, Z is $1.2 \times 10^4$ (times per second).
(4) Fourth Transition of Excess Oxygen
In the case where T is 300K, Z is $1.0 \times 10^{-27}$ (times per second).
(5) First Transition of Oxygen Vacancy
In the case where T is 300K, Z is $4.3 \times 10^{-18}$ (times per second).
(6) Second Transition of Oxygen Vacancy
In the case where T is 300K, Z is $1.4 \times 10^{-56}$ (times per second).

In the case where T is 723K (450° C.), Z is as follows.
(1) First Transition of Excess Oxygen
In the case where T is 723K, Z is $4.8 \times 10^8$ (times per second).
(2) Second Transition of Excess Oxygen
In the case where T is 723K, Z is $9.2 \times 10^{10}$ (times per second).
(3) Third Transition of Excess Oxygen
In the case where T is 723K, Z is $2.0 \times 10^9$ (times per second).
(4) Fourth Transition of Excess Oxygen
In the case where T is 723K, Z is $2.5 \times 10^{-4}$ (times per second).
(5) First Transition of Oxygen Vacancy
In the case where T is 723K, Z is 2.5 (times per second).
(6) Second Transition of Oxygen Vacancy
In the case where T is 723K, Z is $2.5 \times 10^{-16}$ (times per second).

In view of the above-described calculation results, excess oxygen, in the case of either T=300 K or T=723 K, moves along the layer of indium atoms more easily than across the layer of indium atoms. Moreover, an oxygen vacancy also, in the case where either T=300 K or T=723 K, moves along the layer of indium atoms more easily than across the layer of indium atoms.

At T=300 K, the movement of excess oxygen along the layer of indium atoms, the movement of excess oxygen from the $InO_2$ layer to the (Ga, Zn)O layer, and the movement of excess oxygen from the first (Ga, Zn)O layer to the second (Ga, Zn)O layer are likely to occur; in contrast, the other transitions are unlikely to occur. At T=723 K, the movement of an oxygen vacancy along the layer of indium atoms as well as the above-mentioned movements of excess oxygen is likely to occur; in contrast, the movements of both excess oxygen and an oxygen vacancy across the layer of indium atoms are difficult.

Note that although the movement of excess oxygen or an oxygen vacancy across the layer of indium atoms is described above, the same can apply to the movement of excess oxygen or an oxygen vacancy across metals other than indium which are contained in an oxide semiconductor film.

As described above, it is difficult for both excess oxygen and an oxygen vacancy to move across the layer of indium atoms, in other words, to move in the c-axis direction.

[Ease of Oxygen Diffusion to Metal Oxide Film and Method for Reducing Impurities in Film]

The above result indicates that the higher the proportion (density) of crystal parts with a particular orientation is, the more difficult oxygen is diffused in the thickness direction, and the lower the density is, the easier oxygen is diffused in the thickness direction. The ease of oxygen diffusion to the metal oxide film can be considered as follows.

In other words, in a metal oxide film containing both crystal parts with a particular orientation and submicroscopic crystal parts with a random orientation, a region other than the crystal parts which can be obviously observed in a cross-section image (LGBR) can be a region in which oxygen is easily diffused, that is, can serve as oxygen diffusion paths. As a result, oxygen can be easily supplied through the LGBR to the crystal parts with a particular orientation, and the amount of oxygen vacancy in the film can be reduced.

For example, an oxide film which easily releases oxygen is formed to be in contact with the metal oxide film and heat treatment is performed, so that oxygen released from the oxide film is diffused to the metal oxide film in the thickness direction through the LGBR. Through the LGBR, oxygen can be supplied laterally to crystal parts with a particular orientation. Accordingly, oxygen is easily supplied sufficiently to the crystal parts with a particular orientation and a region other than the crystal parts in the metal oxide film, which leads to an effective reduction of oxygen vacancy in the film.

When a hydrogen atom which is not bonded to a metal atom exists in the metal oxide film, an oxygen atom is bonded to the hydrogen atom, and then OH is formed and fixed. The state in which a certain amount (e.g., approximately $1 \times 10^{17}$ cm$^{-3}$) of hydrogen trapped in oxygen vacancy (Vo) in the metal oxide film (such hydrogen is referred to as VoH) is formed in the deposition at low temperature, whereby generation of OH is inhibited. A certain amount of carrier exists in the metal oxide film because VoH generates a carrier. Thus, the metal oxide film with an increased carrier concentration can be formed. Although oxygen vacancy is formed concurrently with the deposition, the oxygen vacancy can be reduced by introducing oxygen through the LGBR as described above. In this manner, the metal oxide film with a relatively high carrier concentration and a sufficiently reduced oxygen vacancy can be formed.

A clear grain boundary cannot be observed in the metal oxide film because submicroscopic crystal parts with a random orientation at the time of the deposition is formed in a region other than crystal parts with a particular orientation. The minute crystal part is positioned between a plurality of crystal parts with a particular orientation. The submicroscopic crystal part is bonded to an adjacent crystal part with a particular orientation by growing in the lateral direction with heat at the time of the deposition. The submicroscopic crystal part functions as a region where a carrier is generated. The metal oxide film with such a structure is expected to improve field-effect mobility when applied to a transistor.

In addition, plasma treatment in an oxygen atmosphere is preferably performed after the metal oxide film is formed and an oxide insulating film such as a silicon oxide film is formed over the metal oxide film. The treatment can reduce the hydrogen concentration as well as can supply oxygen to the film. For example, during plasma treatment, fluorine which remains in the chamber is doped at the same time to the metal oxide film in some cases. Fluorine exists as a fluorine atom with negative charges and is bonded to a hydrogen atom with positive charges by Coulomb force, and then HF is generated. HF is released to the outside of the metal oxide film during plasma treatment, and as a result, the hydrogen concentration in the metal oxide film can be reduced. In plasma treatment, H$_2$O in which an oxygen atom and a hydrogen atom are bonded is released to the outside of the film in some case.

A structure in which a silicon oxide film (or a silicon oxynitride film) is stacked over the metal oxide film is considered. A halogen element such as fluorine in the silicon oxide film does not affect electrical characteristics of the metal oxide film because the halogen element is bonded to hydrogen in the film and can exist as HF which is electrically neutral. Note that Si—F bond is generated in some cases, which is also electrically neutral. Furthermore, HF in the silicon oxide film does not affect the diffusion of oxygen.

According to the above mechanism, oxygen vacancy in the metal oxide film can be reduced and hydrogen which is not bonded to a metal atom in the film can be reduced, which leads to the improvement of reliability. The electrical characteristics are expected to be improved because the carrier density of the metal oxide film is greater than or equal to a certain amount.

[Measurement by ESR]

The measurement results of defect states in the metal oxide film by electron spin resonance (ESR) are described below.

Defect states of the metal oxide film are measured by ESR. The ESR analysis is performed by generating a magnetic field in a space in which a specimen is placed and irradiating the specimen with microwaves. The magnetic flux density (H$_0$) and/or the microwave frequency (v) are varied. The frequency (v) and magnetic flux density (H$_0$) values of the microwave absorbed by the specimen are used in the equation $g = hv/\mu_B H_0$ to give the parameter g-factor. Note that h and $\mu_B$ represent the Planck constant and the Bohr magneton, respectively, and both are constants.

The spin density corresponding to a signal at a g-factor of around 1.93 (greater than or equal to 1.89 and less than or equal to 1.96) among signals observed by ESR represents the number of oxygen vacancies (V$_O$).

The following two kinds of samples (Sample D1 and Sample D2) were fabricated and measured. ESR measurement was performed three times after the steps of forming the metal oxide film.

[Fabrication of Samples]

First, a metal oxide film was formed over a quartz substrate. In Sample D1, an approximately 40-nm-thick metal oxide film was formed in a manner similar to that of Sample 1. In Sample D2, an approximately 40-nm-thick metal oxide film was formed in a manner similar to that of Sample 2.

At this step, first ESR measurement was performed.

Next, an approximately 30-nm-thick silicon oxynitride film, an approximately 100-nm-thick silicon oxynitride film, and an approximately 20-nm-thick silicon oxynitride film were stacked over the metal oxide film by a plasma CVD method.

At this step, second ESR measurement was performed.

After that, heat treatment was performed at 350° C. for one hour in a nitrogen atmosphere.

Next, a 100-nm-thick oxide semiconductor film was formed. The oxide semiconductor film has a stacked-layer including two layers. A lower layer deposited first of the oxide semiconductor film was formed under the following conditions: the substrate temperature was 170° C.; an oxygen gas with a flow rate of 200 sccm was introduced into a chamber of the sputtering apparatus; the pressure was set to 0.6 Pa; an AC power of 2.5 kw was applied to a metal oxide target containing indium, gallium, and zinc (with an atomic ratio of In:Ga:Zn=4:2:4.1); and the thickness was 10 nm. A layer deposited second of the oxide semiconductor film was formed under the following conditions: the substrate temperature was 170° C.; an argon gas with a flow rate of 180 sccm and an oxygen gas with a flow rate of 20 sccm were introduced into a chamber of the sputtering apparatus; the pressure was set to 0.6 Pa; an AC power of 2.5 kw was applied to a metal oxide target containing indium, gallium, and zinc (with an atomic ratio of In:Ga:Zn=4:2:4.1); and the thickness was 90 nm.

An approximately 100-nm-thick silicon nitride film was formed by a plasma CVD method.

After that, heat treatment was performed at 250° C. for one hour in a nitrogen atmosphere.

The silicon nitride film and the two-layered oxide semiconductor film directly under the silicon nitride film were removed by wet etching.

At this step, third ESR measurement was performed.

[Results of ESR Measurement]

Figure 23:
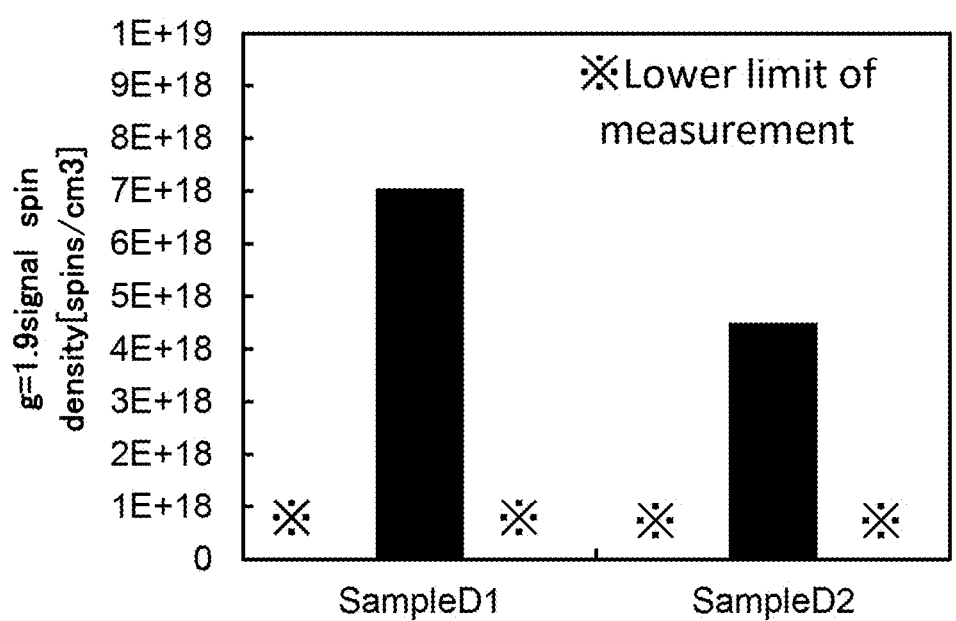
FIG. 23 shows ESR measurement results of metal oxide films.

FIG. 23 shows the results of spin density obtained from a signal appearing at a g-factor of around 1.9. The results of the first measurement, the second measurement, and the third measurement for each sample are shown from the left.

According to the results of first measurement that was performed immediately after forming the metal oxide film, the spin density was below the lower limit of measurement in each sample. The spin density was increased at the second measurement that was performed immediately after forming the silicon oxynitride film. The results suggest that the damage of the metal oxide film increase the oxygen vacancies in the metal oxide film at the time of the deposition of the silicon oxynitride film. However, the spin density is below the lower limit of measurement again after forming the oxide semiconductor film and heat treatment. This indicates that the oxygen vacancies in the metal oxide film are reduced by the formation of the oxide semiconductor film and the heat treatment after the formation.

When Sample D1 is compared with Sample D2, the spin density of Sample D1 that is measured immediately after forming the silicon oxynitride film is higher than that of Sample D2. However, oxygen vacancies are sufficiently reduced by the formation of the oxide semiconductor film and the heat treatment in Sample D1 as well.

[Measurement by CPM]

Defect states in the metal oxide film were measured by constant photocurrent method (CPM).

In CPM measurement, the amount of light with which a surface of a sample between terminals is irradiated is adjusted in the state where voltage is applied between two electrodes included in the sample so that a photocurrent value is kept constant, and then an absorption coefficient is derived from the amount of the irradiation light in each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby the density of deep defect states (also referred to as dDOS) of the sample can be obtained.

A part of the absorption coefficient which is referred to as an urbach tail due to the band tail is removed from a curve of the absorption coefficient obtained by the CPM measurement, whereby the absorption coefficient due to the defect levels can be calculated from the following formula. Here, $\alpha(E)$ indicates the absorption coefficient at each energy level and $\alpha_u$ indicates the absorption coefficient due to the urbach tail.

$$\int \frac{\alpha(E) - \alpha_u}{E} dE \qquad \text{[Formula 2]}$$

[Fabrication of Sample]

The following two kinds of samples (Sample E1 and Sample E2) were fabricated and measured.

A metal oxide film was formed over a glass substrate. In Sample E1, an approximately 100-nm-thick metal oxide film was formed in a manner similar to that in Sample 1. In Sample E2, an approximately 100-nm-thick metal oxide film was formed in a manner similar to that in Sample 2.

First, an approximately 30-nm-thick silicon oxynitride film, an approximately 100-nm-thick silicon oxynitride film, and an approximately 20-nm-thick silicon oxynitride film were stacked over the metal oxide film by a plasma CVD method.

After that, heat treatment was performed at 350° C. for one hour in a nitrogen atmosphere.

Next, a 100-nm-thick oxide semiconductor film was formed. The oxide semiconductor film has a stacked-layer including two layers. A layer deposited first of the oxide semiconductor film was formed under the following conditions: the substrate temperature was 170° C.; an oxygen gas with a flow rate of 200 sccm was introduced into a chamber of the sputtering apparatus; the pressure was set to 0.6 Pa; an AC power of 2.5 kw was applied to a metal oxide target containing indium, gallium, and zinc (with an atomic ratio of In:Ga:Zn=4:2:4.1); and the thickness was 10 nm. A layer deposited second of the oxide semiconductor film was formed under the following conditions: the substrate temperature was 170° C.; an argon gas with a flow rate of 180 sccm and an oxygen gas with a flow rate of 20 sccm were introduced into a chamber of the sputtering apparatus; the pressure was set to 0.6 Pa; an AC power of 2.5 kw was applied to a metal oxide target containing indium, gallium, and zinc (with an atomic ratio of In:Ga:Zn=4:2:4.1); and the thickness was 90 nm.

The heat treatment was then performed at 350° C. for one hour in a mixed gas atmosphere of nitrogen and oxygen.

Then, the oxide semiconductor film was removed by a wet etching method.

A silicon oxynitride film was formed. The silicon oxynitride film was formed under the following conditions: a mixed gas of $SiH_4$ at a flow rate of 160 sccm and $N_2O$ at a flow rate of 4000 sccm was used as a deposition gas; the pressure was 200 Pa; the power was 1500 W; the substrate temperature was 220° C.; and a plasma CVD method was used. The thickness of the silicon oxynitride film was about 400 nm.

An opening was formed in the silicon oxynitride film by a photolithography method.

A stacked film including an approximately 50-nm-thick Ti film, an approximately 400-nm-thick Al film, and an approximately 100-nm-thick Ti film was formed by a sputtering method. Then, the stacked film was processed by a photolithography method, whereby an electrode was formed.

After that, a second heat treatment was performed at 250° C. for one hour in a nitrogen atmosphere.

Through the above steps, Sample E1 and Sample E2 were fabricated.

[Result of CPM Measurement]

Figure 24A:
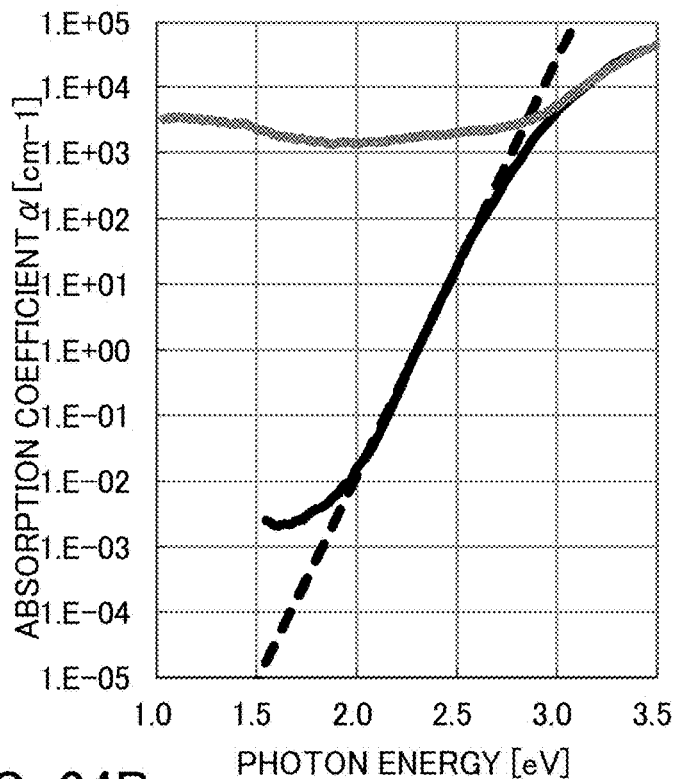
FIGS. 24A and 24B show CPM measurement results of metal oxide films.
Figure 24B:
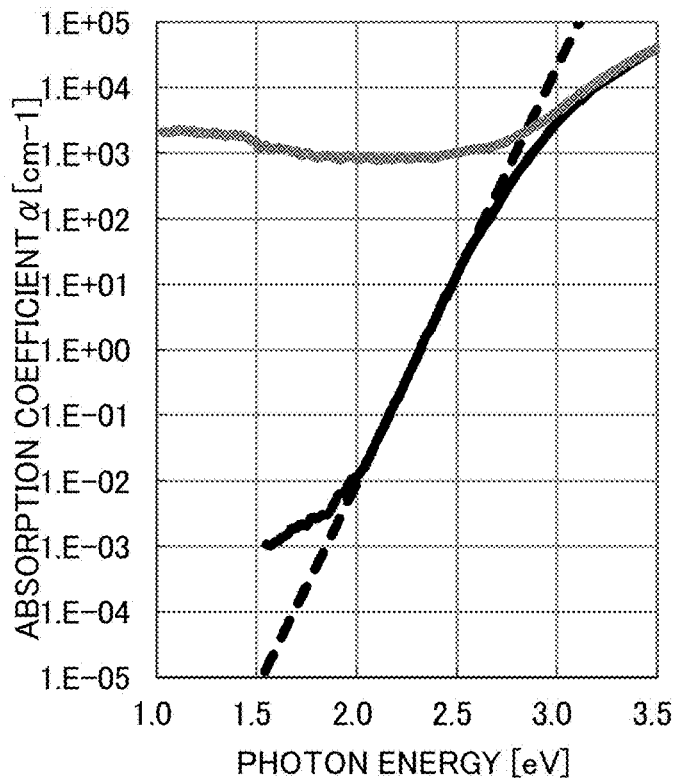

FIGS. 24A and 24B show the results of CPM measurement on each of Sample E1 and Sample E2. The horizontal axis indicates photon energy, and the vertical axis indicates absorption coefficient. A thick line in FIGS. 24A and 24B indicates a curve of the absorption coefficient of each sample, a dotted line is a tangent line, and a thin line indicates the absorption coefficient optically measured.

The value of the urbach tail of Sample E1 was estimated at 68.63 meV from FIG. 24A. The absorption coefficient obtained by removing the absorption coefficient due to the urbach tail from the curve of the absorption coefficient, that is, the value of the absorption coefficient due to a defect was $1.36\times10^{-3}$ cm$^{-1}$. The value of the urbach tail of Sample E2 was estimated at 68.70 meV from FIG. 24B and the value of the absorption coefficient due to a defect was $1.21\times10^{-3}$ cm$^{-1}$.

The above results show that there was no clear difference in defect states between the metal oxide film of Sample 1 and the metal oxide film of Sample 2.

[Measurement of Defect State Using Transistor Characteristics]

Defect states of a metal oxide film can be estimated from electrical characteristics of a transistor in which the metal oxide film was used as a semiconductor layer. In the description below, the density of interface states of the transistor was measured. In addition, a method for estimating subthreshold leakage current in consideration of the density of interface state and the number of electrons trapped by the interface state, $N_{trap}$ is described.

The number of electrons trapped by the interface state, $N_{trap}$, can be measured by comparing drain current-gate voltage (Id-Vg) of the transistor that was actually measured and drain current-gate voltage (Id-Vg) characteristics that was calculated.

Figure 25:
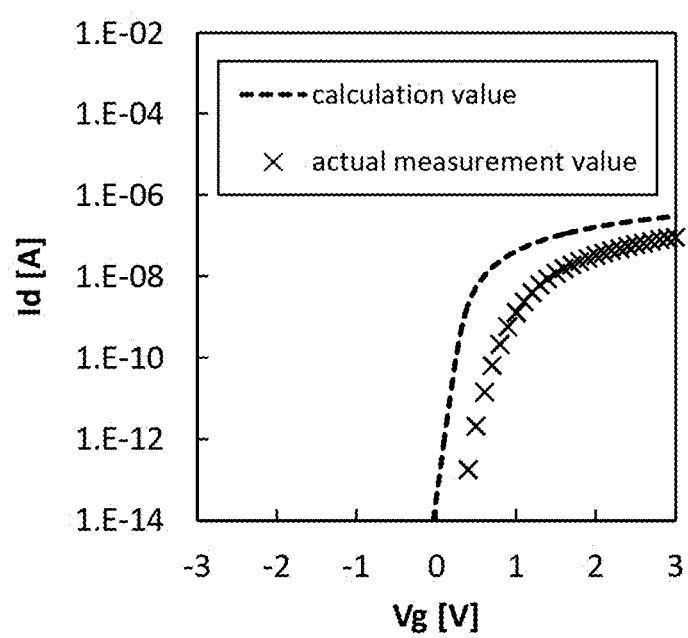
FIG. 25 shows Id-Vg characteristics of transistors.

FIG. 25 illustrates ideal Id-Vg characteristics obtained by calculation and the actually measured Id-Vg characteristics of the transistor when a source voltage Vs is 0 V and a drain voltage Vd is 0.1 V. Note that only values more than or equal to $1\times10^{-13}$ A at which drain voltage Id can be easily measured were plotted among the measurement results of the transistor.

A change of the drain current Id with respect to the gate voltage Vg is more gradual in the actually measured Id-Vg characteristics than in the ideal Id-Vg characteristics obtained by calculation. This is probably because an electron is trapped by a shallow interface state positioned near energy at the bottom of the conduction band (represented as Ec). In this measurement, the density of interface surface $N_{it}$ can be estimated more accurately in consideration of the number of electrons (per unit area and unit energy) trapped by a shallow interface state, $N_{trap}$, with use of the Fermi distribution function.

Figure 26:
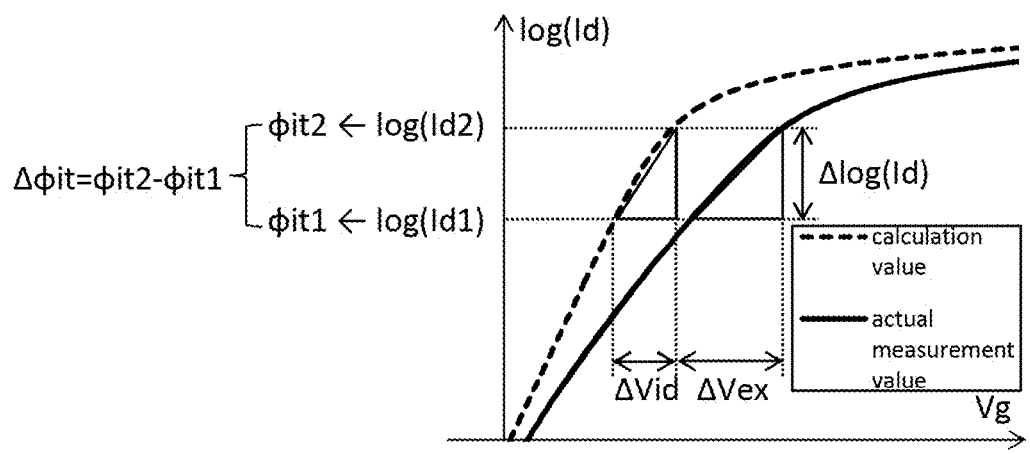
FIG. 26 shows Id-Vg characteristics of transistors.

First, a method for evaluating the number of electrons trapped by an interface trap state, $N_{trap}$, by using schematic Id-Vg characteristics illustrated in FIG. 26 is described. The dashed line indicates ideal Id-Vg characteristics without trap state and is obtained by the calculation. On the dashed line, a change in gate voltage Vg when the drain current changes from Id1 to Id2 is represented by $\Delta V_{id}$. The solid line indicates the actually measured Id-Vg characteristics. On the solid line, a change in gate voltage Vg when the drain current changes from Id1 to Id2 is represented by $\Delta V_{ex}$. The potential at the target interface when the drain current is Id1, the potential at the target interface when the drain current is Id2, and the amount of change are represented by $\phi_{it1}$, $\phi_{it2}$, and $\Delta\phi_{it}$, respectively.

The slope of the actually measured values is smaller than that of the calculated values in FIG. 26, which indicates that $\Delta V_{ex}$ is always larger than $\Delta V_{id}$. Here, a difference between $\Delta V_{ex}$ and $\Delta V_{id}$ corresponds to a potential difference that is needed for trapping of an electron in a shallow interface state. Therefore, $\Delta Q_{trap}$ which the amount of change in charge due to trapped electrons can be expressed by Formula (1) shown below.

[Formula 3]

$$\Delta Q_{trap} = -C_{tg}(\Delta V_{ex} - \Delta V_{id}) \tag{1}$$

$C_{tg}$ is combined capacitance of an insulator and a semiconductor per unit area. In addition, $\Delta Q_{trap}$ can be expressed by Formula (2) by using the number of trapped electrons $N_{trap}$ (per unit area and per unit energy). Note that q represents elementary charge.

[Formula 4]

$$\Delta Q_{trap} = -qN_{trap}\Delta\phi_{it} \tag{2}$$

Simultaneously solving the formulae (1) and (2) gives Formula (3).

[Formula 5]

$$-C_{tg}(\Delta V_{ex} - \Delta V_{id}) = -qN_{trap}\Delta\phi_{it} \tag{3}$$

Then, taking the limit zero of $\Delta\phi_{it}$ in Formula (3) gives Formula (4).

[Formula 6]

$$N_{trap} = \frac{C_{tg}}{q} \lim_{\Delta\phi_{it}\to 0}\left(\frac{\Delta V_{ex}}{\Delta\phi_{it}} - \frac{\Delta V_{id}}{\Delta\phi_{it}}\right) = C_{tg}\left(\frac{\partial V_{ex}}{\partial\phi_{it}} - \frac{\partial V_{id}}{\partial\phi_{it}}\right) \tag{4}$$

In other words, the number of electrons trapped by an interface surface, $N_{trap}$, can be estimated by using the ideal Id-Vg characteristics, the actually measured Id-Vg characteristics, and Formula (4). Note that the relationship between the drain current and the potential at the interface surface can be obtained by calculation with the device simulator described above.

The relationship between the number of electrons $N_{trap}$ per unit area and per unit energy and the density of interface surface $N_{it}$ is expressed by Formula (5).

[Formula 7]

$$N_{trap} = \frac{\partial}{\partial\phi_{it}}\int_{-\infty}^{\infty}N_{it}(E)f(E)dE \tag{5}$$

Here, f(E) is Fermi distribution function. The $N_{trap}$ obtained from Formula (4) is fitted with Formula (5) to determine $N_{it}$. The conduction characteristics including Id<0.1 pA can be obtained by the device simulator to which the $N_{it}$ is set.

Figure 27:
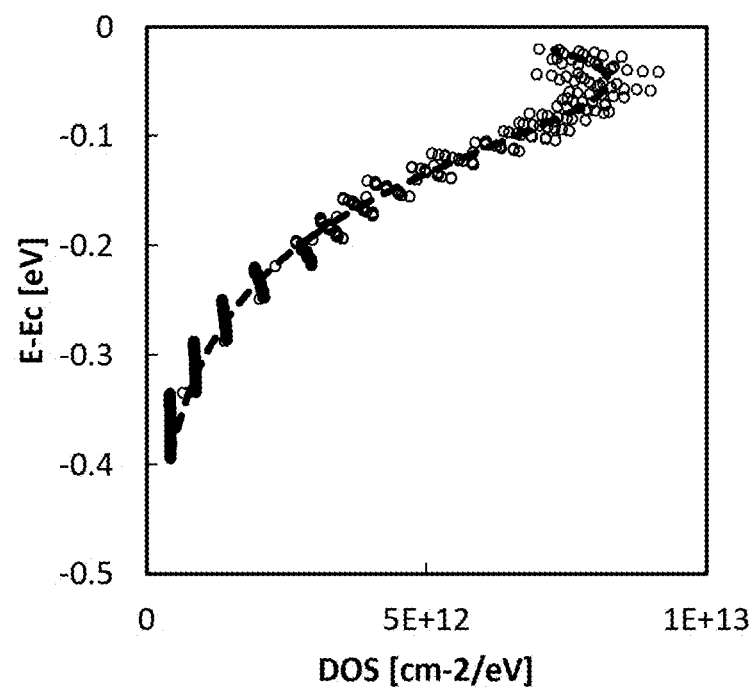
FIG. 27 shows the density of interface states.

The actually measured Id-Vg characteristics in FIG. 25 is applied to Formula (4) and the results of extracting $N_{trap}$ are plotted as white dots in FIG. 27. The vertical axis in FIG. 27 represents Fermi energy Ef at the bottom of the conduction band Ec of a semiconductor. The maximum value is positioned on the dashed line just under Ec. When tail distribution of Formula (6) is assumed as $N_{it}$ of Formula (5), $N_{trap}$ can be fitted well like the dashed line in FIG. 27. As a result, the peak value $N_{ta}=1.67\times10^{13}$ cm$^{-2}$/eV and the characteristic width $W_{ta}=0.105$ eV are obtained as the fitting parameters.

[Formula 8]

$$N_{it}(E) = N_{ta}\exp\left[\frac{E - E_c}{W_{ta}}\right] \quad (6)$$

Figure 28A:
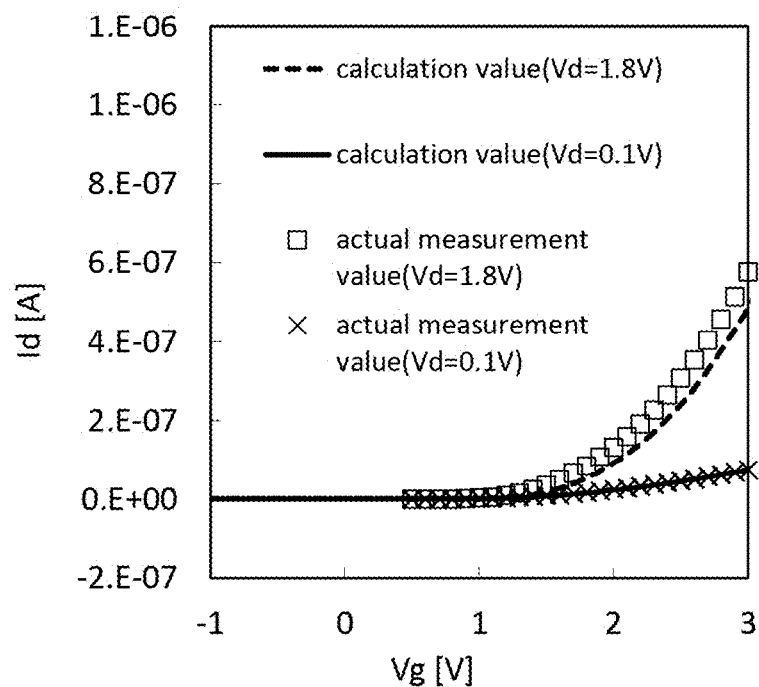
FIGS. 28A and 28B show Id-Vg characteristics of transistors.
Figure 28B:
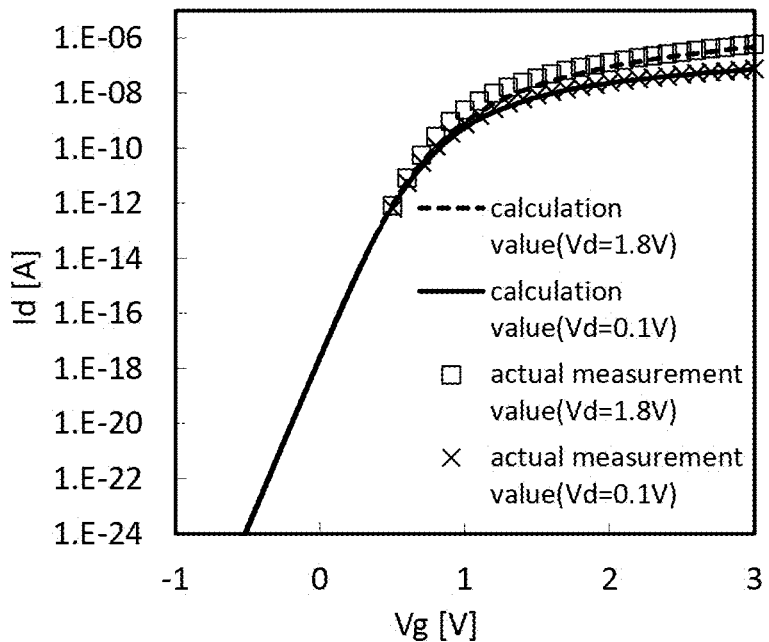

FIGS. 28A and 28B show the inverse calculation results of Id-Vg characteristics by feeding back the obtained fitting curve of interface state to the calculation using the device simulator. FIG. 28A shows the calculated Id-Vg characteristics when the drain voltage Vd is 0.1 V and 1.8V and the actually measured Id-Vg characteristics when the drain voltage Vd is 0.1 V and 1.8V. FIG. 28B is a graph in which the drain current Id is a logarithm in FIG. 28A.

The curve obtained by the calculation substantially matches with the plot of the actually measured values, which suggests that the calculated values and the measured values are highly reproducible. Accordingly, the above method is quite appropriate as a method for calculating the density of shallow defect states.

[Fabrication of Samples]

Four samples (samples F1 to F4) were fabricated, and density of defect states in their metal oxide films was measured.

The above-described fabrication method of the sample A1 can be referred to for the fabrication methods of the samples except the deposition conditions of the metal oxide films (oxide semiconductor films).

The formation conditions of a metal oxide film for Sample F1 which was used for an oxide semiconductor film were similar to those for Sample 1. In other words, the metal oxide film used for Sample F1 was formed under the following conditions: the substrate temperature was 130° C.; an argon gas with a flow rate of 180 sccm and an oxygen gas with a flow rate of 20 sccm were introduced into a chamber of the sputtering apparatus; the pressure was set to 0.6 Pa; and an AC power of 2.5 kw was applied to a metal oxide target containing indium, gallium, and zinc (with an atomic ratio of In:Ga:Zn=4:2:4.1). Note that the oxygen flow rate percentage was 10%. The thickness of the metal oxide film was approximately 40 nm.

A metal oxide film for Sample F2 which was used for an oxide semiconductor film was formed under the following conditions: the substrate temperature was 130° C.; an argon gas with a flow rate of 140 sccm and an oxygen gas with a flow rate of 60 sccm were introduced into a chamber of the sputtering apparatus; the pressure was set to 0.6 Pa; and an AC power of 2.5 kw was applied to a metal oxide target containing indium, gallium, and zinc (with an atomic ratio of In:Ga:Zn=4:2:4.1). Note that the oxygen flow rate percentage was 10%. The thickness of the metal oxide film was approximately 40 nm.

The formation conditions of a metal oxide film for Sample F3 which was used for an oxide semiconductor film were similar to those for Sample 2. In other words, the metal oxide film used for Sample F3 was formed under the following conditions: the substrate temperature was 170° C.; an argon gas with a flow rate of 180 sccm and an oxygen gas with a flow rate of 20 sccm were introduced into a chamber of the sputtering apparatus; the pressure was set to 0.6 Pa; and an AC power of 2.5 kw was applied to a metal oxide target containing indium, gallium, and zinc (with an atomic ratio of In:Ga:Zn=4:2:4.1). Note that the oxygen flow rate percentage was 10%. The thickness of the metal oxide film was approximately 40 nm.

The formation conditions of a metal oxide film for Sample F4 which was used for an oxide semiconductor film were similar to those for Sample 3. In other words, the metal oxide film used for Sample F4 was formed under the following conditions: the substrate temperature was 170° C.; an argon gas with a flow rate of 140 sccm and an oxygen gas with a flow rate of 60 sccm were introduced into a chamber of the sputtering apparatus; the pressure was set to 0.6 Pa; and an AC power of 2.5 kw was applied to a metal oxide target containing indium, gallium, and zinc (with an atomic ratio of In:Ga:Zn=4:2:4.1). Note that the oxygen flow rate percentage was 30%. The thickness of the metal oxide film was approximately 40 nm.

Each of the fabricated transistors has a channel length of approximately 6 μm and a channel width of approximately 50 μm.

[Density of Defect States]

Figure 29A:
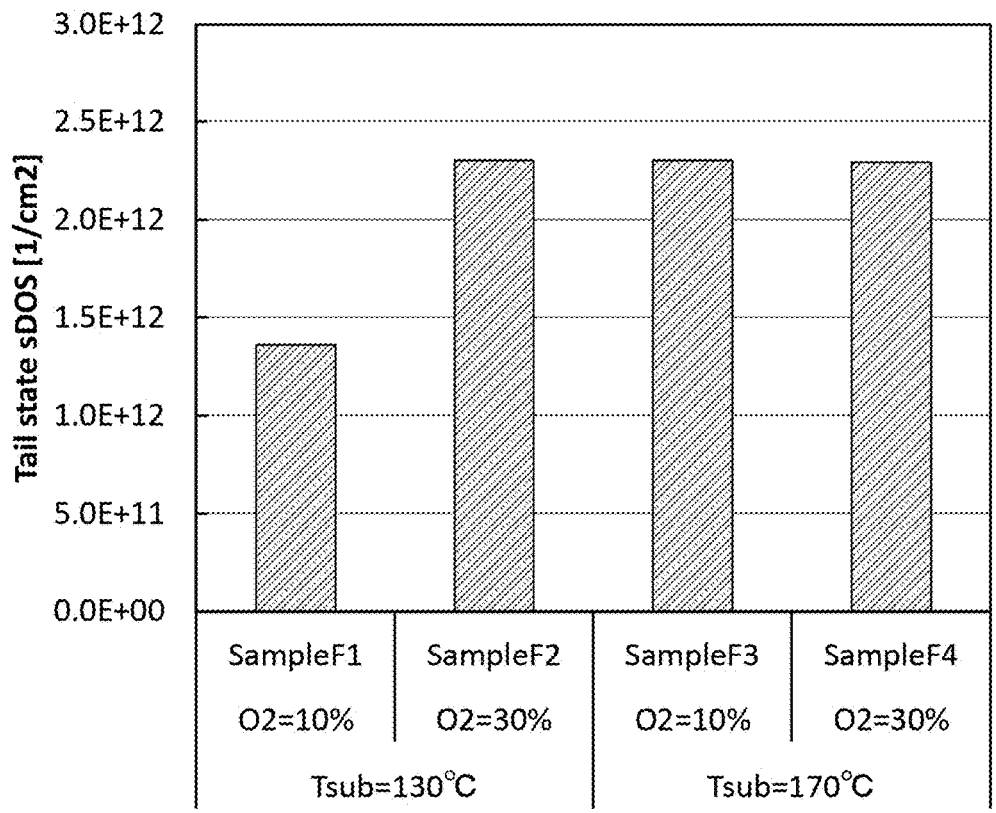
FIGS. 29A and 29B show calculation results for defect states of transistors and electrical characteristics of transistors.

FIG. 29A shows calculation results of density of defect states of the samples F1 to F4 by comparing measured electrical characteristics with ideal calculation values according to the above-described method.

The results showed that density of defect states of the sample F1 was reduced to about half those of the samples F2 to F4.

The above results indicated that the oxygen-transmitting property was improved because the metal oxide film was formed at a low temperature and low oxygen flow ratio, and that the amount of diffused oxygen in the fabrication process of the transistor was increased, whereby the amount of defects such as oxygen vacancies in the metal oxide film and at the interface between the metal oxide film and the insulating film was reduced.

[Electrical Characteristics 2 of Transistor]

Transistors in which large current can flow were fabricated, and their on-state currents were compared.

The transistor structure described in Embodiment 2 and shown in FIG. 36 was used. Four kinds of samples G1, G2, G3, and G4 were fabricated in different formation conditions of semiconductor layers.

[Fabrication of Transistors]

The transistor sample G1 was fabricated by a method similar to that of the sample F1. Similarly, the sample G2, the sample G3, and the sample G4 were fabricated by methods similar to those of the sample F2, the sample F3, and the sample F4, respectively.

Each of the fabricated transistors has a channel length of approximately 2 μm and a channel width of approximately 20 μm.

[On-State Current of Transistors]

Figure 29B:
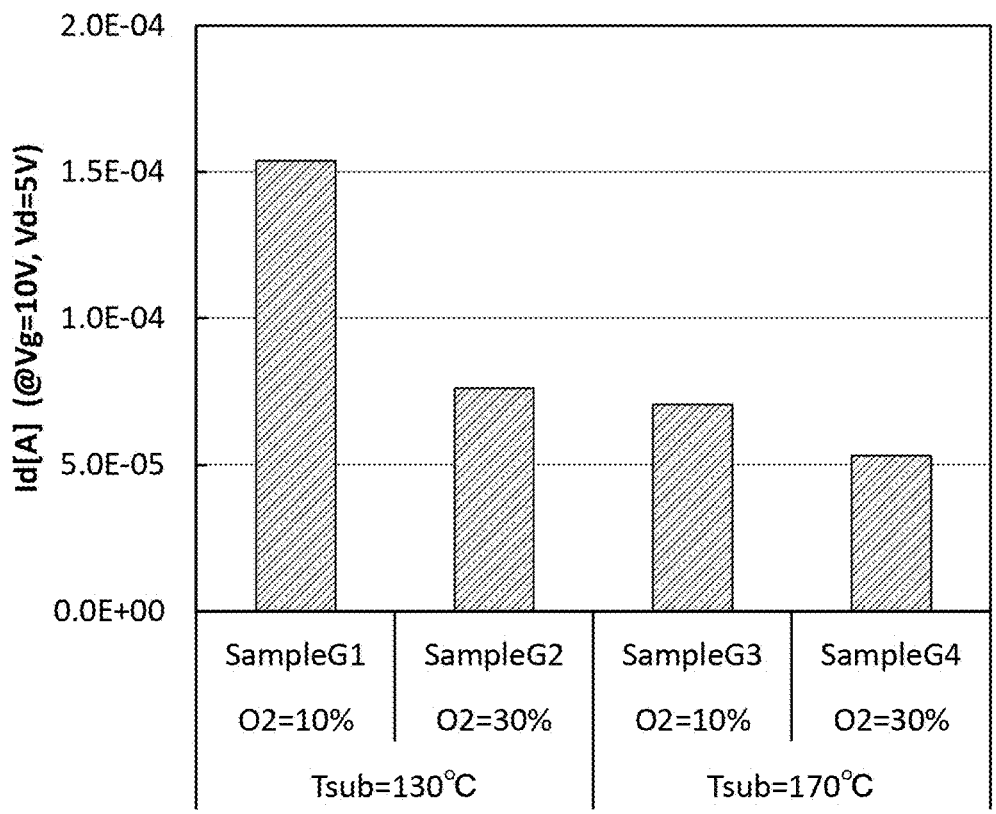

FIG. 29B shows the on-state currents of the transistor samples. The drain currents were measured when the gate voltage Vg and the drain voltage Vd were 10 V and 5 V, respectively.

As shown in FIG. 29B, the on-state current of the sample G1 was extremely higher than those of the other samples.

The above results indicated that the oxygen-transmitting property was improved because the metal oxide film was formed at a low temperature and low oxygen flow ratio, and that the amount of diffused oxygen in the fabrication process of the transistor was increased, whereby the amount of defects such as oxygen vacancies in the metal oxide film and at the interface between the metal oxide film and the insulating film was reduced. In addition, density of defect states was reduced owing to such an effect, so that the on-stage current of the transistor was largely increased.

A transistor with such improved on-state current is suitably used for a switch that can be used for rapid charging and discharging of a capacity. As a typical example, the transistor is suitably used for a demultiplexer circuit.

A demultiplexer circuit is a circuit that divides one input signal into two or more signals and outputs the signals. When a demultiplexer circuit including the above transistor is provided between a signal line driver circuit and a signal line of a display device, the number of terminals in the case of mounting the signal line driver circuit in a form of an IC can be reduced, leading to a display device with a narrow frame that can operate at a higher speed.

[Electrical Characteristics 3 of Transistors]

Miniaturized transistors were fabricated and their electrical characteristics were compared.

The transistor structure described in Embodiment 2 and shown in FIG. 36 was used. Three kinds of samples H1, H2, and H3 were fabricated in different formation conditions of semiconductor layers.

[Fabrication of Transistors]

The above-described fabrication method of the sample A1 can be referred to for the fabrication methods of the samples H1, H2, and H3 except the deposition conditions of the metal oxide films (oxide semiconductor films).

The formation conditions of a metal oxide film for Sample H1 which was used for an oxide semiconductor film were similar to those for Sample 1. In other words, the metal oxide film used for Sample H1 was formed under the following conditions: the substrate temperature was 130° C.; an argon gas with a flow rate of 180 sccm and an oxygen gas with a flow rate of 20 sccm were introduced into a chamber of the sputtering apparatus; the pressure was set to 0.6 Pa; and an AC power of 2.5 kw was applied to a metal oxide target containing indium, gallium, and zinc (with an atomic ratio of In:Ga:Zn=4:2:4.1). Note that the oxygen flow rate percentage was 10%. The thickness of the metal oxide film was approximately 40 nm.

The formation conditions of a metal oxide film for Sample H2 which was used for an oxide semiconductor film were similar to those for Sample 3. In other words, the metal oxide film used for Sample H2 was formed under the following conditions: the substrate temperature was 170° C.; an argon gas with a flow rate of 140 sccm and an oxygen gas with a flow rate of 60 sccm were introduced into a chamber of the sputtering apparatus; the pressure was set to 0.6 Pa; and an AC power of 2.5 kw was applied to a metal oxide target containing indium, gallium, and zinc (with an atomic ratio of In:Ga:Zn=4:2:4.1). Note that the oxygen flow rate percentage was 30%. The thickness of the metal oxide film was approximately 40 nm.

A metal oxide film for Sample H3 which was used for an oxide semiconductor film was formed under the following conditions: the substrate temperature was 170° C.; an argon gas with a flow rate of 100 sccm and an oxygen gas with a flow rate of 100 sccm were introduced into a chamber of the sputtering apparatus; the pressure was set to 0.6 Pa; and an AC power of 2.5 kw was applied to a metal oxide target containing indium, gallium, and zinc (with an atomic ratio of In:Ga:Zn=1:1:1.2). Note that the oxygen flow rate percentage was 50%. The thickness of the metal oxide film was approximately 40 nm.

Two transistors which differ in size were formed using each of the samples. One was a transistor having a channel length L of 2 μm and a channel width W of 3 μm, and the other was a transistor having a channel length L of 3 μm and a channel width W of 3 μm.

[Electrical Characteristics of Transistor]

As conditions for measuring the Id-Vg characteristics of each transistor, a voltage applied to a conductive film functioning as the first gate electrode of each transistor (hereinafter the voltage is also referred to as gate voltage (Vg)) and a voltage applied to the conductive film functioning as the second gate electrode of each transistor (hereinafter the voltage is also referred to as back gate voltage (Vbg)) changed from −15 V to +20 V in increments of 0.25 V. A voltage applied to a conductive film functioning as a source electrode (hereinafter the voltage is also referred to as source voltage (Vs)) was 0 V (comm), and a voltage applied to a conductive film functioning as a drain electrode (hereinafter the voltage is also referred to as drain voltage (Vd)) was 1 V and 10 V.

The Id-Vg characteristics of the transistors having a channel length L of 2 μm and a channel width of 3 μm included in the samples H1, H2, and H3 are shown in FIGS. 30A, 30B, and 30C, respectively. The Id-Vg characteristics of the transistors having a channel length L of 3 μm and a channel width of 3 μm included in the samples H1, H2, and H3 are shown in FIGS. 30D, 30E, and 30F, respectively. The measurement number of the samples H1, H2, and H3 were 2, 3, and 3, respectively.

The results shown in FIGS. 30A to 30F indicated that favorable transistor characteristics were obtained from each sample including the miniaturized transistor having a channel length of 2 μm.

When attention is focused on field-effect mobility, Sample H1 shows the highest value, followed by Samples H2 and H3. When the maximum figures of field-effect mobility were compared between the transistors each having a channel length L of 2 μm, Sample H1 was approximately twice as high as Sample H2 and Sample H1 was approximately six times as high as Sample H3.

When attention is focused on a profile of field-effect mobility, Sample H1 has a steeper rising at low gate voltages (e.g., 5 V or lower).

The results indicate that a higher proportion of indium in the composition of a metal oxide film increases field-effect mobility and that the deposition conditions of the metal oxide film at low temperature and low oxygen flow rate significantly increases field-effect mobility. For example, the field-effect mobility of 30 cm$^2$/Vs or higher which is shown in FIG. 30A is comparable to the figure obtained from a p-channel transistor formed using low-temperature polysilicon and thus is a non-conventional ultrahigh figure for a transistor formed using an oxide semiconductor.

[Deposition Method of Metal Oxide Film]

A deposition method of the metal oxide film which is one embodiment of the present invention is described below.

The metal oxide film used in one embodiment of the present invention can be formed by a sputtering method while the substrate is heated in an atmosphere containing oxygen.

The substrate temperature during the deposition of the metal oxide film is higher than or equal to 80° C. and lower than or equal to 150° C., preferably higher than or equal to 100° C. and lower than or equal to 150° C., typified by 130°

C. High substrate temperature can result in a large number of crystal parts with orientation.

The oxygen flow rate ratio (partial pressure of oxygen) during the deposition is preferably higher than or equal to 1% and lower than 33%, further preferably higher than or equal to 5% and lower than or equal to 30%, still further preferably higher than or equal to 5% and lower than or equal to 20%, and yet still further preferably higher than or equal to 5% and lower than or equal to 15%, typified by 10%. Low oxygen flow rate can result in a large number of crystal parts with a random orientation in the film.

Accordingly, setting the substrate temperature and the oxygen flow rate during the deposition within the above ranges can result in a metal oxide film containing both crystal parts with a particular orientation and crystal parts with a random orientation. Furthermore, the proportions of crystal parts with a particular orientation and crystal parts with a random orientation can be adjusted by optimization of the substrate temperature and the oxygen flow rate within the above ranges.

An oxide target that can be used for forming the metal oxide film of this embodiment is not limited to an In—Ga—Zn-based oxide; for example, an In-M-Zn-based oxide (M is Al, Ga, Y, or Sn) can be used.

When a metal oxide film containing crystal parts is formed as the metal oxide film using a sputtering target containing a polycrystalline oxide having a plurality of crystal grains, a metal oxide film with crystallinity can be obtained easier than the case of using a sputtering target not containing a polycrystalline oxide.

The consideration of the deposition mechanism of the metal oxide film is made below. In the case where a sputtering target contains a plurality of crystal grains each of which has a layered structure and an interface at which the crystal grain is easily cleaved, ion collision with the sputtering target might cleave crystal grains to make plate-like or pellet-like sputtering particles. The obtained plate-like or pellet-like sputtering particles are deposited on a substrate, which probably results in formation of a metal oxide film containing nanocrystals. A metal oxide film containing crystal parts with a particular orientation is likely to be formed when the substrate is heated because the nanocrystals are then bonded to each other or rearranged at a substrate surface.

Note that the above consideration is made on the assumption that a sputtering method is used; a sputtering method is particularly preferable because the crystallinity can be easily adjusted. Note that instead of a sputtering method, a pulsed laser deposition (PLD) method, a plasma-enhanced chemical vapor deposition (PECVD) method, a thermal chemical vapor deposition (CVD) method, an atomic layer deposition (ALD) method, a vacuum evaporation method, or the like may be used. As an example of the thermal CVD method, an MOCVD method can be given.

[Composition and Structure of Metal Oxide Film]

A metal oxide film of one embodiment of the present invention can be applied to a semiconductor device such as a transistor. A metal oxide film which particularly has semiconductor characteristics (hereinafter referred to as an oxide semiconductor film) will be described.

[Composition]

First, the composition of an oxide semiconductor film is described below.

As described above, the oxide semiconductor film includes indium (In), M (M is Al, Ga, Y, or Sn), and zinc (Zn).

Note that the element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

Next, preferred ranges of the atomic ratio of indium, the element M, and zinc contained in an oxide semiconductor film according to an embodiment of the present invention are described with reference to FIGS. 31A to 31C. Note that the proportion of oxygen atoms is not shown. The terms of the atomic ratio of indium, the element M, and zinc contained in the oxide semiconductor film are denoted by [In], [M], and [Zn], respectively.

Figure 31A:
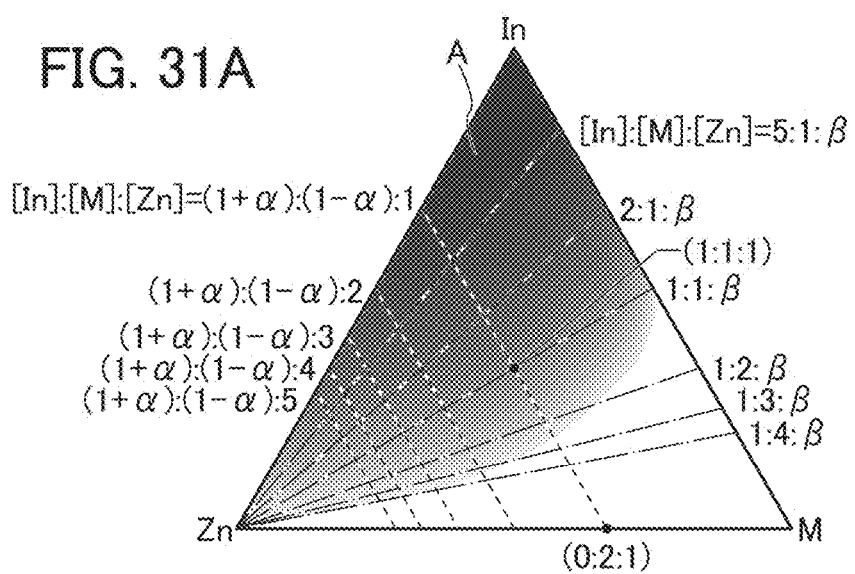
FIGS. 31A to 31C each illustrate the range of an atomic ratio of an oxide semiconductor film.
Figure 31B:
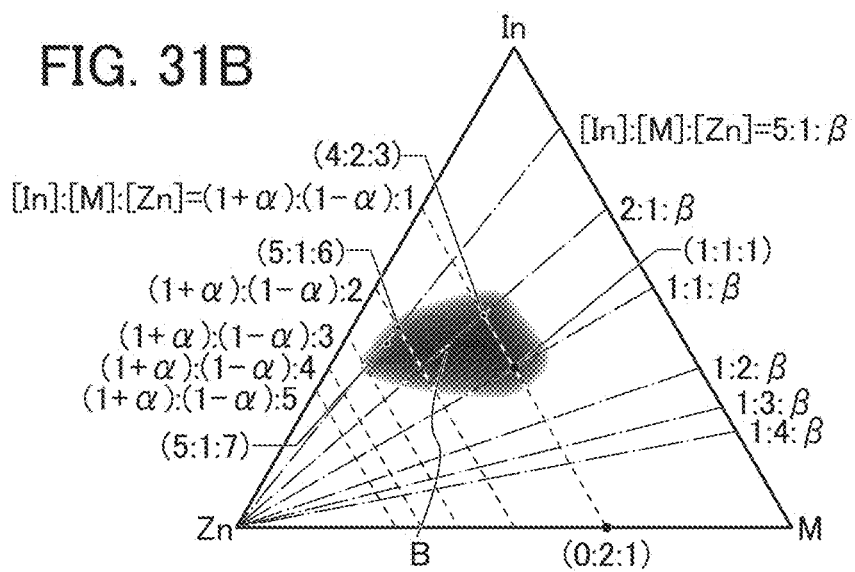
Figure 31C:
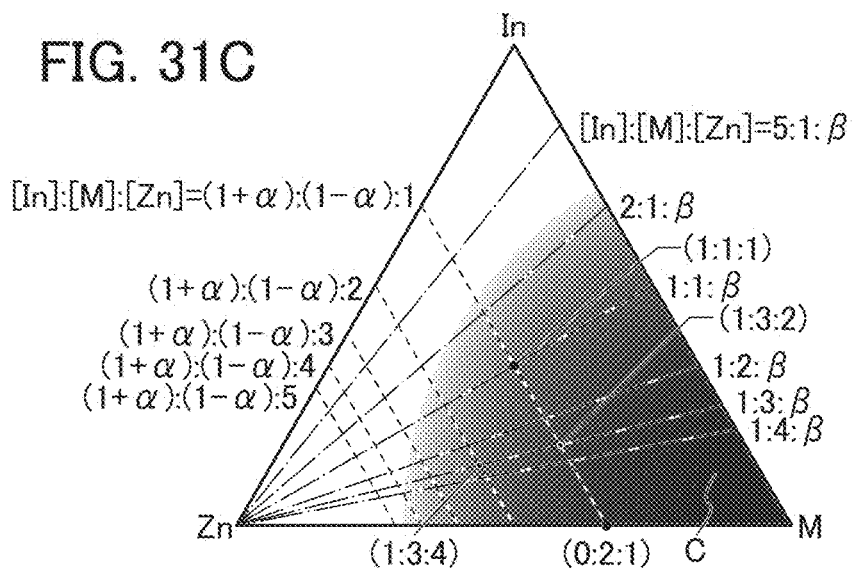

In FIGS. 31A to 31C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \geq 0$, a line where the atomic ratio [In]:[M]:[Zn] is $1:2:13$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:13$.

The oxide semiconductor film shown in FIGS. 31A to 31C with an atomic ratio of [In]:[M]:[Zn]=0:2:1 or an atomic ratio that is in the neighborhood thereof is likely to have a spinel crystal structure.

FIGS. 31A and 31B show examples of the preferred ranges of the atomic ratio of indium, the element M, and zinc contained in an oxide semiconductor film in one embodiment of the present invention.

Figure 32:
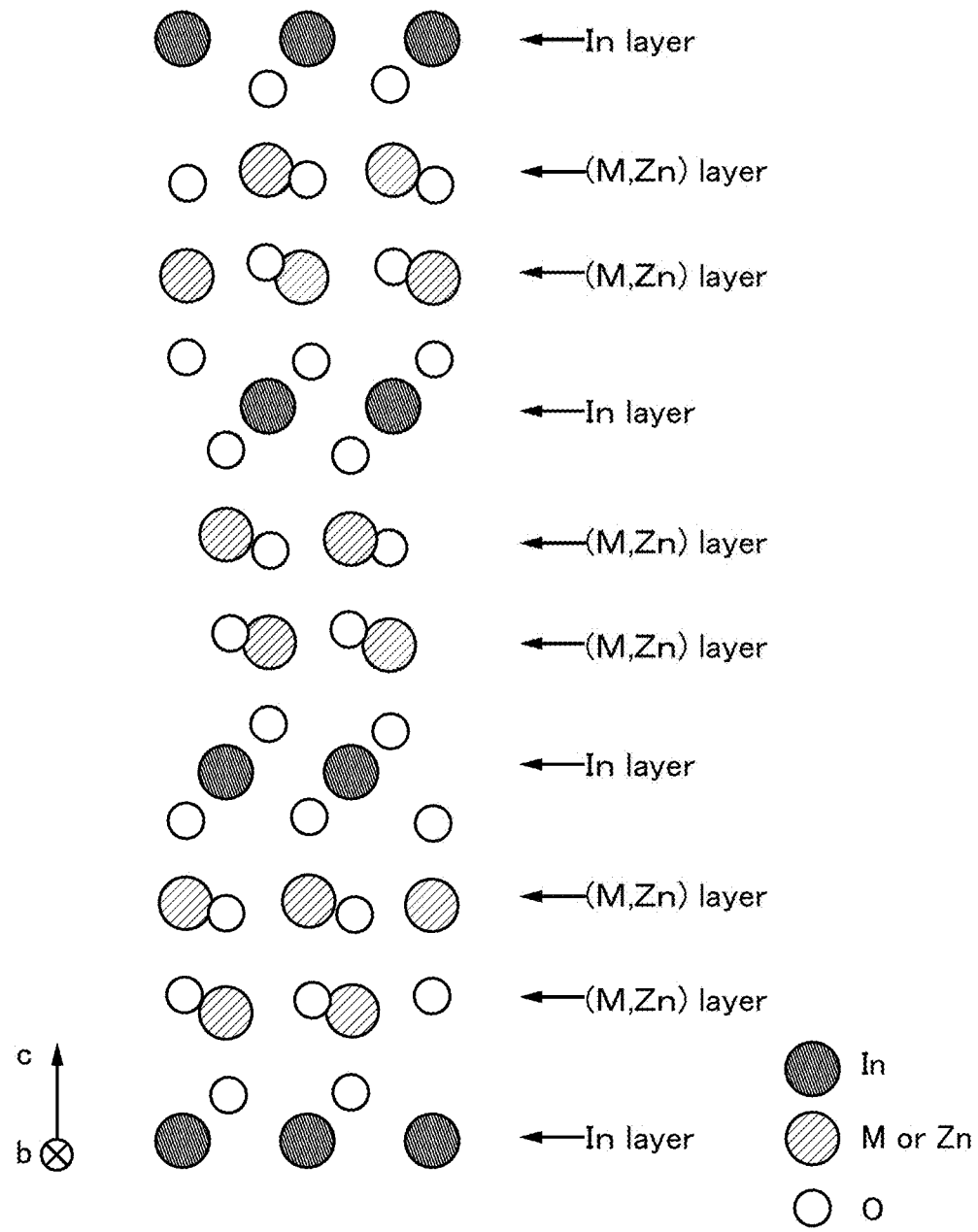
FIG. 32 illustrates an $InMZnO_4$ crystal.

FIG. 32 shows an example of the crystal structure of $InMZnO_4$ whose atomic ratio [In]:[M]:[Zn] is 1:1:1. The crystal structure shown in FIG. 32 is $InMZnO_4$ observed from a direction parallel to a b-axis. Note that a metal element in a layer that contains M, Zn, and oxygen (hereinafter, this layer is referred to as an "(M,Zn) layer") in FIG. 32 represents the element M or zinc. In that case, the proportion of the element M is the same as the proportion of zinc. The element M and zinc can be replaced with each other, and their arrangement is random.

$InMZnO_4$ has a layered crystal structure (also referred to as a layered structure) and includes one layer that contains indium and oxygen (hereinafter referred to as an In layer) for every two (M,Zn) layers that contain the element M, zinc, and oxygen, as shown in FIG. 32.

Indium and the element M can be replaced with each other. Thus, when the element M in the (M,Zn) layer is replaced with indium, the layer can also be referred to as an (In,M,Zn) layer. In that case, a layered structure that contains one In layer for every two (In,M,Zn) layers is obtained.

An oxide whose atomic ratio [In]:[M]:[Zn] is 1:1:2 has a layered structure that contains one In layer for every three (M,Zn) layers. In other words, if [Zn] is higher than [In] and [M], the proportion of the (M,Zn) layer to the In layer becomes higher when the oxide is crystallized.

Note that in the case where the number of (M,Zn) layers with respect to one In layer is not an integer in the oxide, the oxide might have a plurality of kinds of layered structures where the number of (M,Zn) layers with respect to one In layer is an integer. For example, in the case of [In]:[M]:[Zn]

=1:1:1.5, the oxide may have a mix of a layered structure including one In layer for every two (M,Zn) layers and a layered structure including one In layer for every three (M,Zn) layers.

For example, in the case where the oxide semiconductor film is formed with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exists in the oxide semiconductor film in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor film, a grain boundary might be formed between different crystal structures.

In contrast, when the indium content and the zinc content in an oxide semiconductor film become lower, carrier mobility becomes lower. Thus, with atomic ratios of [In]:[M]:[Zn] =0:1:0 and in the vicinity thereof (e.g., a region C in FIG. 31C), insulation performance becomes better.

Accordingly, an oxide semiconductor in one embodiment of the present invention preferably has an atomic ratio represented by a region A in FIG. 31A. With the atomic ratio, a layered structure with high carrier mobility and a few grain boundaries is easily obtained.

A region B in FIG. 31B represents an atomic ratio of [In]:[M]:[Zn]=4:2:3 or 4:2:4.1 and the vicinity thereof. The vicinity includes an atomic ratio of [In]:[M]:[Zn]=5:3:4. An oxide semiconductor film with an atomic ratio represented by the region B is an excellent oxide semiconductor film that has particularly high crystallinity and high carrier mobility.

Note that a condition where an oxide semiconductor film forms a layered structure is not uniquely determined by an atomic ratio. There is a difference in the degree of difficulty in forming a layered structure among atomic ratios. Even with the same atomic ratio, whether a layered structure is formed or not depends on a formation condition. Thus, the illustrated regions each represent an atomic ratio with which an oxide semiconductor film has a layered structure, and boundaries of the regions A to C are not clear.

[Structure in which Oxide Semiconductor Film is Used in Transistor]

Next, a structure in which the oxide semiconductor film is used in a transistor is described.

Note that when the oxide semiconductor film is used for a transistor, carrier scattering or the like at a grain boundary can be reduced as compared with a transistor using polycrystalline silicon in a channel region; thus, the transistor can have high field-effect mobility.

The oxide semiconductor film of one embodiment of the present invention is a film containing both crystal parts with a particular orientation and crystal parts with a random orientation. With the use of the oxide semiconductor film having such crystallinity, a transistor having both high field-effect mobility and high reliability can be fabricated.

[Carrier Density of Oxide Semiconductor]

The carrier density of an oxide semiconductor film will be described below.

Examples of a factor affecting the carrier density of an oxide semiconductor film include oxygen vacancy ($V_O$) and impurities in the oxide semiconductor film.

As the amount of oxygen vacancy in the oxide semiconductor film increases, the density of defect states increases when hydrogen is bonded to the oxygen vacancy (this state is also referred to as $V_OH$). The density of defect states also increases with an increase in the amount of impurity in the oxide semiconductor film. Hence, the carrier density of an oxide semiconductor film can be controlled by controlling the density of defect states in the oxide semiconductor film.

A transistor using the oxide semiconductor film in a channel region will be described below.

The carrier density of the oxide semiconductor film is preferably reduced in order to inhibit the negative shift of the threshold voltage of the transistor or reduce the off-state current of the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor film is lower than $8 \times 10^{15}$ cm$^{-3}$, preferably lower than $1 \times 10^{11}$ cm$^{-3}$, and further preferably lower than $1 \times 10^{10}$ cm$^{-3}$ and is higher than or equal to $1 \times 10^{-9}$ cm$^{-3}$.

In contrast, the carrier density of the oxide semiconductor film is preferably increased in order to improve the on-state current of the transistor or improve the field-effect mobility of the transistor. In order to increase the carrier density of the oxide semiconductor film, the impurity concentration or the density of defect states in the oxide semiconductor film is slightly increased. Alternatively, the bandgap of the oxide semiconductor film is preferably narrowed. For example, an oxide semiconductor film that has a slightly high impurity concentration or a slightly high density of defect states in the range where a favorable on/off ratio is obtained in the Id-Vg characteristics of the transistor can be regarded as substantially intrinsic. Furthermore, an oxide semiconductor film that has a high electron affinity and thus has a narrow bandgap so as to increase the density of thermally excited electrons (carriers) can be regarded as substantially intrinsic. Note that a transistor using an oxide semiconductor film with higher electron affinity has lower threshold voltage.

The oxide semiconductor film with an increased carrier density has somewhat n-type conductivity; thus, it can be referred to as a "slightly-n" oxide semiconductor film.

The carrier density of a substantially intrinsic oxide semiconductor film is preferably higher than or equal to $1 \times 10^5$ cm$^{-3}$ and lower than $1 \times 10^{18}$ cm$^{-3}$, further preferably higher than or equal to $1 \times 10^7$ cm$^{-3}$ and lower than or equal to $1 \times 10^{17}$ cm$^{-3}$, still further preferably higher than or equal to $1 \times 10^9$ cm$^{-3}$ and lower than or equal to $5 \times 10^{16}$ cm$^{-3}$, yet further preferably higher than or equal to $1 \times 10^{10}$ cm$^{-3}$ and lower than or equal to $1 \times 10^{16}$ cm$^{-3}$, and yet still preferably higher than or equal to $1 \times 10^{11}$ cm$^{-3}$ and lower than or equal to $1 \times 10^{15}$ cm$^{-3}$.

Figure 33:
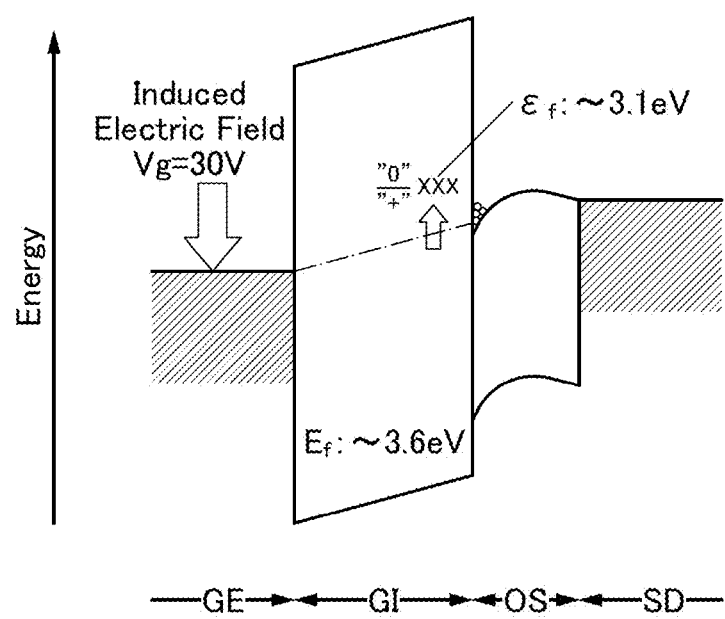
FIG. 33 illustrates an energy band of a transistor in which an oxide semiconductor film is used for its channel region.

The use of the substantially intrinsic oxide semiconductor film may improve the reliability of a transistor. Here, the reason for the improvement in the reliability of a transistor which uses the oxide semiconductor film in its channel region is described with reference to FIG. 33. FIG. 33 is an energy band diagram of the transistor which used the oxide semiconductor film in its channel region.

In FIG. 33, GE, GI, OS, and SD refer to a gate electrode, a gate insulating film, an oxide semiconductor film, and a source/drain electrode, respectively. In other words, FIG. 33 shows an example of energy bands of the gate electrode, the gate insulating film, the oxide semiconductor film, and the source/drain electrode in contact with the oxide semiconductor film.

In FIG. 33, a silicon oxide film and an In—Ga—Zn oxide are used as the gate insulating film and the oxide semiconductor film, respectively. The transition level (cf) of a defect that might be formed in the silicon oxide film is assumed to be formed at a position approximately 3.1 eV away from the conduction band minimum of the gate insulating film. Furthermore, the Fermi level (Ef) of the silicon oxide film at the interface between the oxide semiconductor and the silicon oxide film when the gate voltage (Vg) is 30 V is assumed to be formed at a position approximately 3.6 eV away from the conduction band minimum of the gate insulating film. Note that the Fermi level of the silicon oxide film changes depending on the gate voltage. For example, the Fermi level (Ef) of the silicon oxide film at the interface between the oxide semiconductor film and the silicon oxide film is lowered as the gate voltage is increased. A white circle and x in FIG. 33 represent an electron (carrier) and a defect state in the silicon oxide film, respectively.

As shown in FIG. 33, when thermal excitation of carriers occurs during the application of a gate voltage, the carriers are trapped by the defect states (x in the diagram) and the charge state of each of the defect states is changed from positive ("+") to neutral ("0"). In other words, when the value obtained by adding the thermal excitation energy to the Fermi level (Ef) of the silicon oxide film becomes greater than the transition level (ef) of the defect, the charge state of the defect states in the silicon oxide film is changed from positive to neutral, so that the threshold voltage of the transistor shifts in the positive direction.

When an oxide semiconductor film with a different electron affinity is used, the Fermi level of the interface between the gate insulating film and the oxide semiconductor film might be changed. When an oxide semiconductor film with a higher electron affinity is used, the conduction band minimum of the gate insulating film becomes relatively high at the interface between the gate insulating film and the oxide semiconductor film or in the vicinity of the interface. In that case, the defect state (x in FIG. 33) which might be formed in the gate insulating film also becomes relatively high, so that the energy difference between the Fermi level of the gate insulating film and the Fermi level of the oxide semiconductor film is increased. The increase in energy difference leads to a reduction in the amount of charge trapped in the gate insulating film. For example, a change in the charge state of the defect states which might be formed in the silicon oxide film becomes smaller, so that a change in the threshold voltage of the transistor by gate bias temperature (GBT) stress can be reduced.

Charge trapped by the defect states in the oxide semiconductor film takes a long time to be released and may behave like fixed charge. Thus, the transistor in which a channel region is formed in the oxide semiconductor film and which has a high impurity concentration and a high density of defect states might have unstable electrical characteristics.

To obtain stable electrical characteristics of the transistor, it is effective to reduce the concentration of impurities in the oxide semiconductor film. In order to reduce the concentration of impurities in the oxide semiconductor film, the concentration of impurities in a film which is adjacent to the oxide semiconductor film is preferably reduced. As examples of the impurities, hydrogen, nitrogen, alkali metal, alkaline earth metal, iron, nickel, silicon, and the like are given.

Here, the influence of impurities in the oxide semiconductor film is described.

When silicon or carbon that is one of Group 14 elements is contained in the oxide semiconductor, defect states are formed. Thus, the concentration of silicon or carbon in the oxide semiconductor film and around an interface with the oxide semiconductor film (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor film contains alkali metal or alkaline earth metal, defect states are formed and carriers are generated, in some cases. Thus, a transistor including an oxide semiconductor film that contains alkali metal or alkaline earth metal is likely to be normally-on. Therefore, it is preferable to reduce the concentration of alkali metal or alkaline earth metal in the oxide semiconductor. Specifically, the concentration of alkali metal or alkaline earth metal in the oxide semiconductor film measured by SIMS is set lower than or equal to $1\times10^{18}$ atoms/cm$^3$, and preferably lower than or equal to $2\times10^{16}$ atoms/cm$^3$.

When the oxide semiconductor film contains nitrogen, the oxide semiconductor film easily becomes n-type by generation of electrons serving as carriers and an increase of carrier density. Thus, a transistor whose semiconductor includes an oxide semiconductor film that contains nitrogen is likely to be normally-on. For example, the concentration of nitrogen in the oxide semiconductor, which is measured by SIMS, can be lower than $5\times10^{19}$ atoms/cm$^3$, further preferably lower than or equal to $5\times10^{18}$ atoms/cm$^3$, still further preferably lower than or equal to $1\times10^{18}$ atoms/cm$^3$, further preferably lower than or equal to $5\times10^{17}$ atoms/cm$^3$.

Hydrogen contained in an oxide semiconductor film reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally-on. Accordingly, it is preferable that hydrogen in the oxide semiconductor film be reduced as much as possible. Specifically, the hydrogen concentration of the oxide semiconductor film measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor film with sufficiently reduced impurity concentration is used for a channel formation region in a transistor, the transistor can have stable electrical characteristics.

The energy gap of the oxide semiconductor film is preferably 2 eV or more, 2.5 eV or more, or 3 eV or more.

The thickness of the oxide semiconductor film is greater than or equal to 3 nm and less than or equal to 200 nm, preferably greater than or equal to 3 nm and less than or equal to 100 nm, further preferably greater than or equal to 3 nm and less than or equal to 60 nm.

When the oxide semiconductor film is an In-M-Zn oxide, as the atomic ratio of metal elements in a sputtering target used for formation of the In-M-Zn oxide, In:M:Zn=1:1:0.5, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, In:M:Zn=5:1:7, or the like is preferable.

At least part of this embodiment can be implemented in combination with any of the other embodiments described in this specification as appropriate.

Embodiment 2

In this embodiment, a transistor that can be used for the semiconductor device of one embodiment of the present invention will be described.

In this embodiment, a top-gate transistor will be described with reference to FIGS. 34A to 34C, FIGS. 35A to 35C, FIGS. 36A and 36B, FIGS. 37A and 37B, FIGS. 38A and 38B, FIGS. 39A and 39B, FIGS. 40A and 40B, FIGS. 41A and 41B, FIGS. 42A and 42B, FIGS. 43A and 43B, FIGS. 44A and 44B, and FIGS. 45A to 45C.

[Structure Example 1 of Transistor]

Figure 34A:
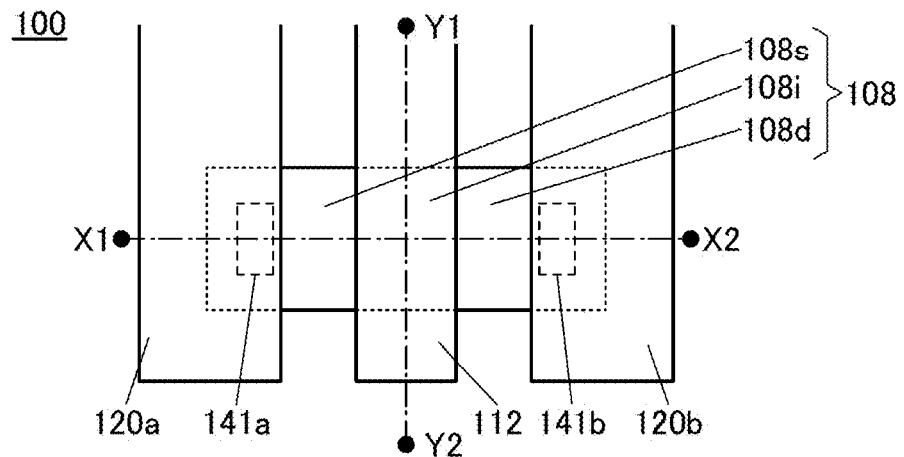
FIGS. 34A to 34C are a top view and cross-sectional views illustrating a semiconductor device.
Figure 34B:
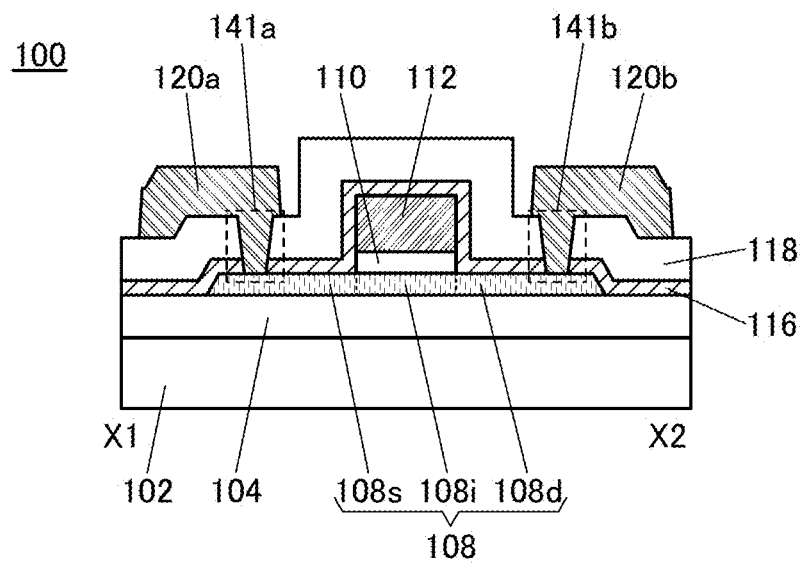
Figure 34C:
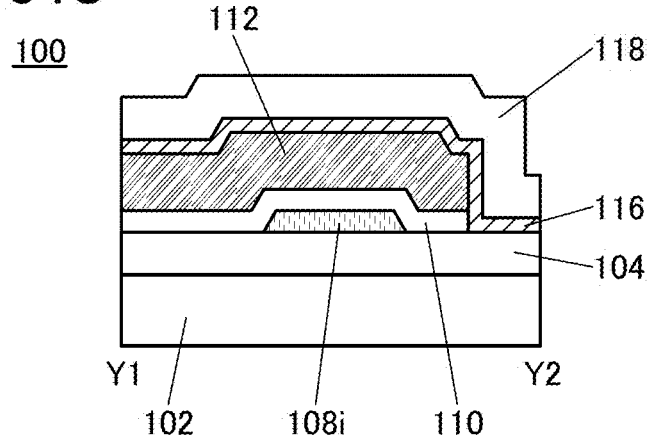

FIG. 34A is a top view of a transistor 100. FIG. 34B is a cross-sectional view taken along the dashed-dotted line X1-X2 in FIG. 34A. FIG. 34C is a cross-sectional view taken along the dashed-dotted line Y1-Y2 in FIG. 34A. For clarity, some components such as an insulating film 110 are not illustrated in FIG. 34A. As in FIG. 34A, some components are not illustrated in some cases in top views of transistors described below. In addition, the direction of the dashed-dotted line X1-X2 may be referred to as the channel length (L) direction, and the direction of the dashed-dotted line Y1-Y2 may be referred to as the channel width (W) direction.

The transistor 100 illustrated in FIGS. 34A to 34C includes an insulating film 104 over a substrate 102, an oxide semiconductor film 108 over the insulating film 104, the insulating film 110 over the oxide semiconductor film 108, a conductive film 112 over the insulating film 110, and an insulating film 116 over the insulating film 104, the oxide semiconductor film 108, and the conductive film 112. The oxide semiconductor film 108 includes a channel region 108*i* overlapping with the conductive film 112, a source region 108*s* in contact with the insulating film 116, and a drain region 108*d* in contact with the insulating film 116.

The insulating film 116 contains nitrogen or hydrogen. The insulating film 116 is in contact with the source region 108*s* and the drain region 108*d*, so that nitrogen or hydrogen that is contained in the insulating film 116 is added to the source region 108*s* and the drain region 108*d*. The source region 108*s* and the drain region 108*d* each have a high carrier density when nitrogen or hydrogen is added thereto.

The transistor 100 may further include an insulating film 118 over the insulating film 116, a conductive film 120*a* electrically connected to the source region 108*s* through an opening 141*a* provided in the insulating films 116 and 118, and a conductive film 120*b* electrically connected to the drain region 108*d* through an opening 141*b* provided in the insulating films 116 and 118.

In this specification and the like, the insulating film 104 may be referred to as a first insulating film, the insulating film 110 may be referred to as a second insulating film, the insulating film 116 may be referred to as a third insulating film, and the insulating film 118 may be referred to as a fourth insulating film. The conductive film 112 functions as a gate electrode. The conductive film 120*a* and the conductive film 120*b* function as a source electrode and a drain electrode, respectively.

The insulating film 110 functions as a gate insulating film. The insulating film 110 includes an excess oxygen region. Since the insulating film 110 includes the excess oxygen region, excess oxygen can be supplied to the channel region 108*i* included in the oxide semiconductor film 108. As a result, oxygen vacancies that might be formed in the channel region 108*i* can be filled with excess oxygen, which can provide a highly reliable semiconductor device.

To supply excess oxygen to the oxide semiconductor film 108, excess oxygen may be supplied to the insulating film 104 that is formed under the oxide semiconductor film 108. In that case, excess oxygen contained in the insulating film 104 might also be supplied to the source region 108*s* and the drain region 108*d* included in the oxide semiconductor film 108. When excess oxygen is supplied to the source region 108*s* and the drain region 108*d*, the resistance of the source region 108*s* and the drain region 108*d* might be increased.

In contrast, in the structure in which the insulating film 110 formed over the oxide semiconductor film 108 contains excess oxygen, excess oxygen can be selectively supplied only to the channel region 108*i*. Alternatively, the carrier density of the source and drain regions 108*s* and 108*d* can be selectively increased after excess oxygen is supplied to the channel region 108*i* and the source and drain regions 108*s* and 108*d*, in which case an increase in the resistance of the source and drain regions 108*s* and 108*d* can be prevented.

Furthermore, each of the source region 108*s* and the drain region 108*d* included in the oxide semiconductor film 108 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and a rare gas. Typical examples of the rare gas element include helium, neon, argon, krypton, and xenon. The element that forms an oxygen vacancy is diffused from the insulating film 116 to the source region 108*s* and the drain region 108*d* in the case where the insulating film 116 contains one or more such elements. In addition or alternatively, the element that forms an oxygen vacancy is added to the source region 108*s* and the drain region 108*d* by impurity addition treatment.

An impurity element added to the oxide semiconductor film cuts a bond between a metal element and oxygen in the oxide semiconductor film, so that an oxygen vacancy is formed. Alternatively, when an impurity element is added to the oxide semiconductor film, oxygen bonded to a metal element in the oxide semiconductor film is bonded to the impurity element and detached from the metal element, so that an oxygen vacancy is formed. As a result, the oxide semiconductor film has a higher carrier density, and thus, the conductivity thereof becomes higher.

Next, details of the components of the semiconductor device in FIGS. 34A to 34C will be described.

[Substrate]

The substrate 102 can be formed using a material having heat resistance high enough to withstand heat treatment in the manufacturing process.

Specifically, non-alkali glass, soda-lime glass, potash glass, crystal glass, quartz, sapphire, or the like can be used. Alternatively, an inorganic insulating film may be used. Examples of the inorganic insulating film include a silicon oxide film, a silicon nitride film, a silicon oxynitride film, and an aluminum oxide film.

The non-alkali glass may have a thickness of greater than or equal to 0.2 mm and less than or equal to 0.7 mm, for example. The non-alkali glass may be polished to obtain the above thickness.

As the non-alkali glass, a large-area glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, as the substrate 102, a single-crystal semiconductor substrate or a polycrystalline semiconductor substrate made of silicon or silicon carbide, a compound semiconductor substrate made of silicon germanium or the like, an SOI substrate, or the like may be used.

For the substrate 102, an inorganic material such as a metal may be used. Examples of the inorganic material such as a metal include stainless steel and aluminum.

Alternatively, for the substrate 102, an organic material such as a resin, a resin film, or plastic may be used. Examples of the resin film include polyester, polyolefin, polyamide (e.g., nylon or aramid), polyimide, polycarbonate, polyurethane, an acrylic resin, an epoxy resin, polyethylene terephthalate (PET), polyethylene naphthalate (PEN), polyether sulfone (PES), and a resin having a siloxane bond.

For the substrate 102, a composite material of an inorganic material and an organic material may be used. Examples of the composite material include a resin film to which a metal plate or a thin glass plate is bonded, a resin film into which a fibrous or particulate metal or a fibrous or particulate glass is dispersed, and an inorganic material into which a fibrous or particulate resin is dispersed.

The substrate 102 can at least support films or layers formed thereover or thereunder and may be one or more of an insulating film, a semiconductor film, and a conductive film.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single-layer structure or stacked-layer structure of an oxide insulating film and/or a nitride insulating film. To improve the properties of the interface with the oxide semiconductor film 108, at least a region of the insulating film 104 which is in contact with the oxide semiconductor film 108 is preferably formed using an oxide insulating film. When the insulating film 104 is formed using an oxide insulating film from which oxygen is released by heating, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and interface states at the interface between the insulating film 104 and the oxide semiconductor film 108 and oxygen vacancies included in the channel region 108$i$ of the oxide semiconductor film 108 can be reduced.

For example, the insulating film 104 can be formed to have a single-layer structure or stacked-layer structure of a silicon oxide film, a silicon oxynitride film, a silicon nitride oxide film, a silicon nitride film, an aluminum oxide film, a hafnium oxide film, a gallium oxide film, a Ga—Zn oxide film, or the like. In this embodiment, the insulating film 104 has a stacked-layer structure of a silicon nitride film and a silicon oxynitride film. With the insulating film 104 having such a layered structure including a silicon nitride film as a lower layer and a silicon oxynitride film as an upper layer, oxygen can be efficiently introduced into the oxide semiconductor film 108.

[Oxide Semiconductor Film]

As the oxide semiconductor film 108, the metal oxide film described in Embodiment 1 can be used.

It is suitable to form the oxide semiconductor film 108 by a sputtering method because the film density can be high. In the case where the oxide semiconductor film 108 is formed by a sputtering method, a rare gas (argon, as a typical example), oxygen, or a mixed gas of a rare gas and oxygen is used as a sputtering gas, as appropriate. In addition, increasing the purity of a sputtering gas is necessary. For example, as an oxygen gas or an argon gas used for a sputtering gas, a gas that is highly purified to have a dew point of −60° C. or lower, preferably −100° C. or lower, is used, whereby entry of moisture or the like into the oxide semiconductor film 108 can be minimized.

In the case where the oxide semiconductor film 108 is formed by a sputtering method, a chamber in a sputtering apparatus is preferably evacuated to be a high vacuum state (to the degree of about $5×10^7$ Pa to $1×10^7$ Pa) with an adsorption vacuum evacuation pump such as a cryopump in order to remove water or the like, which serves as an impurity for the oxide semiconductor film 108, as much as possible. In particular, the partial pressure of gas molecules corresponding to $H_2O$ (gas molecules corresponding to m/z=18) in the chamber in the standby mode of the sputtering apparatus is preferably lower than or equal to $1×10^{-4}$ Pa, further preferably lower than or equal to $5×10^{-5}$ Pa.

[Second Insulating Film]

The insulating film 110 functions as a gate insulating film of the transistor 100. In addition, the insulating film 110 has a function of supplying oxygen to the oxide semiconductor film 108, particularly to the channel region 108$i$. The insulating film 110 can be formed to have a single-layer structure or a stacked-layer structure of an oxide insulating film or a nitride insulating film, for example. To improve the interface properties with the oxide semiconductor film 108, a region which is in the insulating film 110 and in contact with the oxide semiconductor film 108 is preferably formed using at least an oxide insulating film. For example, a silicon oxide film, a silicon oxynitride film, a silicon nitride oxide film, or a silicon nitride film may be used as the insulating film 110.

The thickness of the insulating film 110 can be greater than or equal to 5 nm and less than or equal to 400 nm, greater than or equal to 5 nm and less than or equal to 300 nm, or greater than or equal to 10 nm and less than or equal to 250 nm.

It is preferable that the insulating film 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 110, a silicon oxide film or a silicon oxynitride film whose spin density of a signal due to the E' center is lower than or equal to $3×10^{17}$ spins/cm$^3$ and preferably lower than or equal to $5×10^{16}$ spins/cm$^3$ may be used.

In addition to the above-described signal, a signal due to nitrogen dioxide ($NO_2$) might be observed in the insulating film 110. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating film whose spin density of a signal due to nitrogen dioxide ($NO_2$) is higher than or equal to $1 \times 10^{17}$ spins/cm$^3$ and lower than $1 \times 10^{18}$ spins/cm$^3$ as the insulating film 110, for example.

Note that a nitrogen oxide ($NO_x$) such as nitrogen dioxide ($NO_2$) forms a state in the insulating film 110. The state is positioned in the energy gap of the oxide semiconductor film 108. Thus, when nitrogen oxide ($NO_x$) is diffused to the interface between the insulating film 110 and the oxide semiconductor film 108, an electron might be trapped by the state on the insulating film 110 side. As a result, the trapped electron remains in the vicinity of the interface between the insulating film 110 and the oxide semiconductor film 108, leading to a positive shift of the threshold voltage of the transistor. Accordingly, the use of a film with a low nitrogen oxide content as the insulating film 110 can reduce a shift of the threshold voltage of the transistor.

As an insulating film that releases a small amount of nitrogen oxide ($NO_x$), for example, a silicon oxynitride film can be used. The silicon oxynitride film releases more ammonia than nitrogen oxide ($NO_x$) in thermal desorption spectroscopy (TDS); the typical released amount of ammonia is greater than or equal to $1 \times 10^{18}$/cm$^3$ and less than or equal to $5 \times 10^{19}$/cm$^3$. Note that the released amount of ammonia is the total amount of ammonia released by heat treatment in a range of 50° C. to 650° C. or 50° C. to 550° C. in TDS.

Since nitrogen oxide ($NO_x$) reacts with ammonia and oxygen in heat treatment, the use of an insulating film that releases a large amount of ammonia reduces nitrogen oxide ($NO_x$).

Note that in the case where the insulating film 110 is analyzed by SIMS, nitrogen concentration in the film is preferably lower than or equal to $6 \times 10^{20}$ atoms/cm$^3$.

The insulating film 110 may be formed using a high-k material such as hafnium silicate (HfSiO$_x$), hafnium silicate containing nitrogen (HfSi$_x$O$_y$N$_z$), hafnium aluminate containing nitrogen (HfAl$_x$O$_y$N$_z$) or hafnium oxide.

[Third Insulating Film]

The insulating film 116 contains nitrogen or hydrogen. The insulating film 116 may contain fluorine. As the insulating film 116, for example, a nitride insulating film can be used. The nitride insulating film can be formed using silicon nitride, silicon nitride oxide, silicon oxynitride, silicon nitride fluoride, silicon fluoronitride, or the like. The hydrogen concentration in the insulating film 116 is preferably higher than or equal to $1 \times 10^{22}$ atoms/cm$^3$. Furthermore, the insulating film 116 is in contact with the source region 108s and the drain region 108d of the oxide semiconductor film 108. Thus, the concentration of an impurity (nitrogen or hydrogen) in the source region 108s and the drain region 108d in contact with the insulating film 116 is increased, leading to an increase in the carrier density of the source region 108s and the drain region 108d.

[Fourth Insulating Film]

As the insulating film 118, an oxide insulating film can be used. Alternatively, a layered film of an oxide insulating film and a nitride insulating film can be used as the insulating film 118. The insulating film 118 can be formed using, for example, silicon oxide, silicon oxynitride, silicon nitride oxide, aluminum oxide, hafnium oxide, gallium oxide, or Ga—Zn oxide.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

[Conductive Film]

The conductive films 112, 120a, and 120b can be formed by a sputtering method, a vacuum evaporation method, a PLD method, a thermal CVD method, or the like. As each of the conductive films 112, 120a, and 120b, a conductive metal film, a conductive film that has a function of reflecting visible light, or a conductive film having a function of transmitting visible light may be used.

A material containing a metal element selected from aluminum, gold, platinum, silver, copper, chromium, tantalum, titanium, molybdenum, tungsten, nickel, iron, cobalt, palladium, and manganese can be used for the metal film having conductivity. Alternatively, an alloy containing any of the above metal elements may be used.

For the metal film having conductivity, specifically a two-layer structure in which a copper film is stacked over a titanium film, a two-layer structure in which a copper film is stacked over a titanium nitride film, a two-layer structure in which a copper film is stacked over a tantalum nitride film, a three-layer structure in which a titanium film, a copper film, and a titanium film are stacked in this order, or the like may be used. In particular, a conductive film containing a copper element is preferably used because the resistance can be reduced. As an example of the conductive film containing a copper element, an alloy film containing copper and manganese is given. The alloy film is favorable because it can be processed by a wet etching method.

Note that a tantalum nitride film is preferably used for the conductive films 112, 120a, and 120b. A tantalum nitride film has conductivity and a high barrier property against copper or hydrogen. Because a tantalum nitride film releases little hydrogen from itself, it can be favorably used as a metal film in contact with the oxide semiconductor film 108 or a metal film in the vicinity of the oxide semiconductor film 108.

As the conductive film having conductivity, a conductive macromolecule or a conductive polymer may be used.

For the conductive film having a function of reflecting visible light, a material containing a metal element selected from gold, silver, copper, and palladium can be used. In particular, a conductive film containing a silver element is preferably used because reflectance of visible light can be improved.

For the conductive film having a function of transmitting visible light, a material containing an element selected from indium, tin, zinc, gallium, and silicon can be used. Specifically, an In oxide, a Zn oxide, an In—Sn oxide (also referred to as ITO), an In—Sn—Si oxide (also referred to as ITSO), an In—Zn oxide, an In—Ga—Zn oxide, or the like can be used.

As the conductive film having a function of transmitting visible light, a film containing graphene or graphite may be used. The film containing graphene can be formed in the following manner: a film containing graphene oxide is formed and is reduced. As a reducing method, a method with application of heat, a method using a reducing agent, or the like can be employed.

The conductive films 112, 120a, and 120b can be formed by electroless plating. As a material that can be deposited by electroless plating, for example, one or more elements selected from Cu, Ni, Al, Au, Sn, Co, Ag, and Pd can be used. It is further favorable to use Cu or Ag because the resistance of the conductive film can be reduced.

When the conductive film is formed by electroless plating, a diffusion prevention film may be formed under the conductive film to prevent component elements of the conductive film from diffusing outward. A seed layer that can make the conductive film grow may be formed between the diffusion prevention film and the conductive film. The diffusion prevention film can be formed by sputtering, for example. For the diffusion prevention film, a tantalum nitride film or a titanium nitride film can be used, for example. The seed layer can be formed by electroless plating. For the seed layer, a material similar to the material for the conductive film that can be formed by electroless plating can be used.

Note that an oxide semiconductor typified by an In—Ga—Zn oxide may be used for the conductive film 112. The oxide semiconductor can have a high carrier density when nitrogen or hydrogen is supplied from the insulating film 116. In other words, the oxide semiconductor functions as an oxide conductor (OC). Accordingly, the oxide semiconductor can be used for a gate electrode.

The conductive film 112 can have, for example, a single-layer structure of an oxide conductor (OC), a single-layer structure of a metal film, or a stacked-layer structure of an oxide conductor (OC) and a metal film.

Note that it is suitable that the conductive film 112 has a single-layer structure of a light-shielding metal film or a stacked-layer structure of an oxide conductor (OC) and a light-shielding metal film because the channel region 108i formed under the conductive film 112 can be shielded from light. In the case where the conductive film 112 has a stacked-layer structure of an oxide semiconductor or an oxide conductor (OC) and a light-shielding metal film, formation of a metal film (e.g., a titanium film or a tungsten film) over the oxide semiconductor or the oxide conductor (OC) produces any of the following effects: the resistance of the oxide semiconductor or the oxide conductor (OC) is reduced by the diffusion of the constituent element of the metal film to the oxide semiconductor or oxide conductor (OC) side, the resistance is reduced by damage (e.g., sputtering damage) during the deposition of the metal film, and the resistance is reduced when oxygen vacancies are formed by the diffusion of oxygen in the oxide semiconductor or the oxide conductor (OC) to the metal film.

The thickness of the conductive films 112, 120a, and 120b can be greater than or equal to 30 nm and less than or equal to 500 nm, or greater than or equal to 100 nm and less than or equal to 400 nm.

[Structure Example 2 of Transistor]

Next, a structure of a transistor different from that in FIGS. 34A to 34C is described with reference to FIGS. 35A to 35C.

Figure 35A:
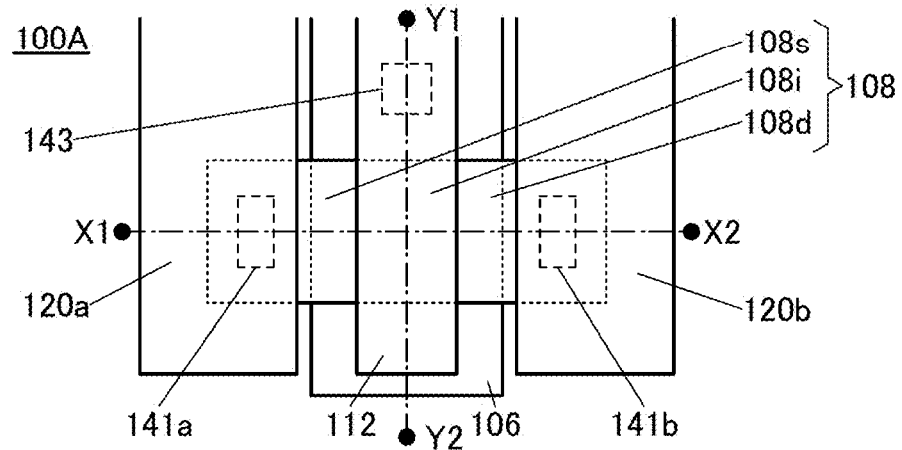
FIGS. 35A to 35C are a top view and cross-sectional views illustrating a semiconductor device.

FIG. 35A is a top view of a transistor 100A. FIG. 35B is a cross-sectional view taken along dashed-dotted line X1-X2 in FIG. 35A. FIG. 35C is a cross-sectional view taken along dashed-dotted line Y1-Y2 in FIG. 35A.

Figure 35B:
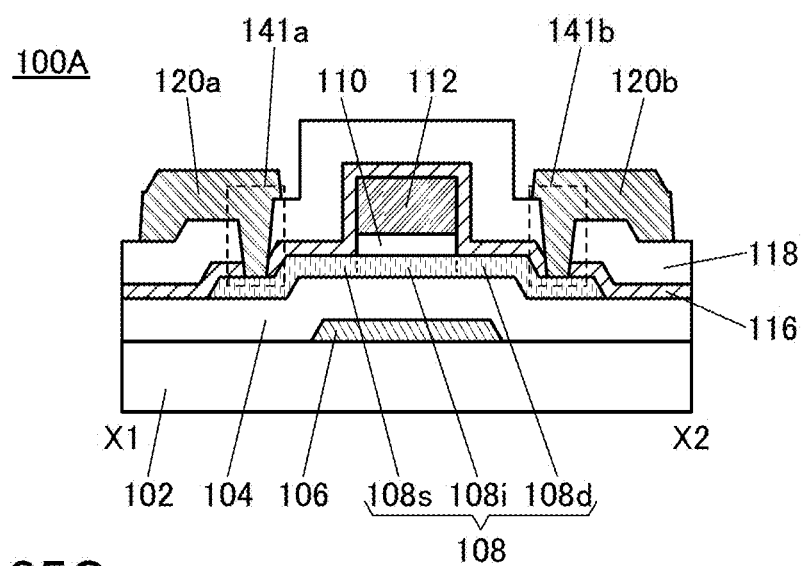
Figure 35C:
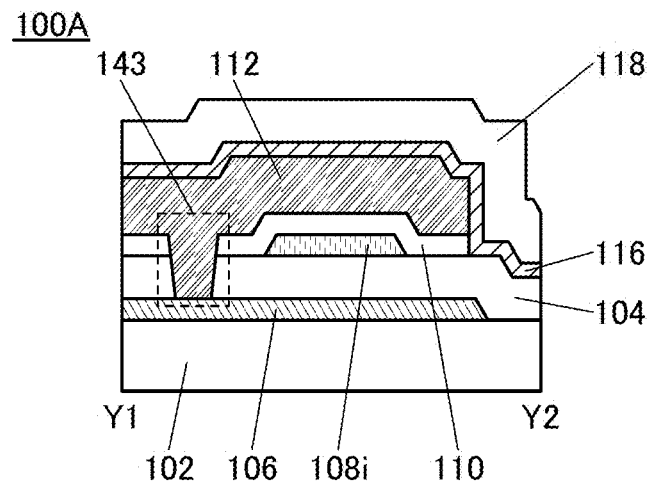

The transistor 100A illustrated in FIGS. 35A to 35C includes a conductive film 106 over the substrate 102, the insulating film 104 over the conductive film 106, the oxide semiconductor film 108 over the insulating film 104, the insulating film 110 over the oxide semiconductor film 108, the conductive film 112 over the insulating film 110, and the insulating film 116 over the insulating film 104, the oxide semiconductor film 108, and the conductive film 112. The oxide semiconductor film 108 includes the channel region 108i overlapping with the conductive film 112, the source region 108s in contact with the insulating film 116, and the drain region 108d in contact with the insulating film 116.

The transistor 100A includes the conductive film 106 and an opening 143 in addition to the components of the transistor 100 described above.

Note that the opening 143 is provided in the insulating films 104 and 110. The conductive film 106 is electrically connected to the conductive film 112 through the opening 143. Thus, the same potential is applied to the conductive film 106 and the conductive film 112. Note that different potentials may be applied to the conductive film 106 and the conductive film 112 without providing the opening 143. Alternatively, the conductive film 106 may be used as a light-shielding film without providing the opening 143. When the conductive film 106 is formed using a light-shielding material, for example, light irradiating the channel region 108i from the bottom can be reduced.

In the case of the structure of the transistor 100A, the conductive film 106 functions as a first gate electrode (also referred to as a bottom-gate electrode), the conductive film 112 functions as a second gate electrode (also referred to as a top-gate electrode), the insulating film 104 functions as a first gate insulating film, and the insulating film 110 functions as a second gate insulating film.

The conductive film 106 can be formed using a material similar to the above-described materials of the conductive films 112, 120a, and 120b. It is particularly suitable to use a material containing copper as the conductive film 106 because the resistance can be reduced. It is favorable that, for example, each of the conductive films 106, 120a, and 120b has a stacked-layer structure in which a copper film is over a titanium nitride film, a tantalum nitride film, or a tungsten film. In that case, by using the transistor 100A as a pixel transistor and/or a driving transistor of a display device, parasitic capacitance generated between the conductive films 106 and 120a and between the conductive films 106 and 120b can be reduced. Thus, the conductive films 106, 120a, and 120b can be used not only as the first gate electrode, the source electrode, and the drain electrode of the transistor 100A, but also as power source supply wirings, signal supply wirings, connection wirings, or the like of the display device.

In this manner, unlike the transistor 100 described above, the transistor 100A in FIGS. 35A to 35C has a structure in which a conductive film functioning as a gate electrode is provided over and under the oxide semiconductor film 108. As in the transistor 100A, a semiconductor device of one embodiment of the present invention may have a plurality of gate electrodes.

As illustrated in FIGS. 35B and 35C, the oxide semiconductor film 108 faces the conductive film 106 functioning as a first gate electrode and the conductive film 112 functioning as a second gate electrode and is positioned between the two conductive films functioning as the gate electrodes.

Furthermore, the length of the conductive film 112 in the channel width direction is larger than the length of the oxide semiconductor film 108 in the channel width direction. In the channel width direction, the whole oxide semiconductor film 108 is covered with the conductive film 112 with the insulating film 110 placed therebetween. Since the conductive film 112 is connected to the conductive film 106 through the opening 143 provided in the insulating films 104 and 110, a side surface of the oxide semiconductor film 108 in the channel width direction faces the conductive film 112 with the insulating film 110 placed therebetween.

In other words, in the channel width direction of the transistor 100A, the conductive films 106 and 112 are connected to each other through the opening 143 provided in the insulating films 104 and 110, and the conductive films 106 and 112 surround the oxide semiconductor film 108 with the insulating films 104 and 110 positioned therebetween.

Such a structure enables the oxide semiconductor film 108 included in the transistor 100A to be electrically surrounded by electric fields of the conductive film 106 functioning as a first gate electrode and the conductive film 112 functioning as a second gate electrode. A device structure of a transistor, like that of the transistor 100A, in which electric fields of a first gate electrode and a second gate electrode electrically surround the oxide semiconductor film 108 in which a channel region is formed can be referred to as a surrounded channel (S-channel) structure.

Since the transistor 100A has the S-channel structure, an electric field for inducing a channel can be effectively applied to the oxide semiconductor film 108 by the conductive film 106 or the conductive film 112; thus, the current drive capability of the transistor 100A can be improved and high on-state current characteristics can be obtained. As a result of the high on-state current, it is possible to reduce the size of the transistor 100A. Furthermore, since the transistor 100A has a structure in which the oxide semiconductor film 108 is surrounded by the conductive film 106 and the conductive film 112, the mechanical strength of the transistor 100A can be increased.

When seen in the channel width direction of the transistor 100A, an opening different from the opening 143 may be formed on the side of the oxide semiconductor film 108 on which the opening 143 is not formed.

When a transistor has a pair of gate electrodes between which a semiconductor film is positioned as in the transistor 100A, one of the gate electrodes may be supplied with a signal A, and the other gate electrode may be supplied with a fixed potential Vb. Alternatively, one of the gate electrodes may be supplied with the signal A, and the other gate electrode may be supplied with a signal B. Alternatively, one of the gate electrodes may be supplied with a fixed potential Va, and the other gate electrode may be supplied with the fixed potential Vb.

The signal A is, for example, a signal for controlling the on/off state. The signal A may be a digital signal with two kinds of potentials, a potential V1 and a potential V2 (V1>V2). For example, the potential V1 can be a high power supply potential, and the potential V2 can be a low power supply potential. The signal A may be an analog signal.

The fixed potential Vb is, for example, a potential for controlling a threshold voltage VthA of the transistor. The fixed potential Vb may be the potential V1 or the potential V2. In that case, a potential generator circuit for generating the fixed potential Vb is not necessary, which is preferable. The fixed potential Vb may be different from the potential V1 or the potential V2. When the fixed potential Vb is low, the threshold voltage VthA can be high in some cases. As a result, the drain current flowing when the gate-source voltage Vgs is 0 V can be reduced, and leakage current in a circuit including the transistor can be reduced in some cases. The fixed potential Vb may be, for example, lower than the low power supply potential. Meanwhile, a high fixed potential Vb can lower the threshold voltage VthA in some cases. As a result, the drain current flowing when the gate-source voltage Vgs is a high power supply potential and the operating speed of the circuit including the transistor can be increased in some cases. The fixed potential Vb may be, for example, higher than the low power supply potential.

The signal B is, for example, a signal for controlling the on/off state. The signal B may be a digital signal with two kinds of potentials, a potential V3 and a potential V4 (V3>V4). For example, the potential V3 can be a high power supply potential, and the potential V4 can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential V1 and the potential V2 of the signal A may be different from the potential V3 and the potential V4 of the signal B. For example, if a gate insulating film for the gate to which the signal B is input is thicker than a gate insulating film for the gate to which the signal A is input, the potential amplitude of the signal B (V3-V4) may be larger than the potential amplitude of the signal A (V1-V2). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor which is, for example, an n-channel transistor can function by itself as a NAND circuit, a NOR circuit, or the like in the following case: the transistor is turned on only when the signal A has the potential V1 and the signal B has the potential V3, or the transistor is turned off only when the signal A has the potential V2 and the signal B has the potential V4. The signal B may be a signal for controlling the threshold voltage VthA. For example, the potential of the signal B in a period in which the circuit including the transistor operates may be different from the potential of the signal B in a period in which the circuit does not operate. The potential of the signal B may vary depending on the operation mode of the circuit. In this case, the potential of the signal B is not changed as frequently as the potential of the signal A in some cases.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential Va or the fixed potential Vb is high (low). When both the fixed potential Va and the fixed potential Vb are high (low), the effective resistance can be lower (higher) than that of a transistor with only one gate in some cases.

The other components of the transistor 100A are similar to those of the transistor 100 described above and have similar effects.

An insulating film may further be formed over the transistor 100A. An example of such a case is illustrated in FIGS. 36A and 36B. FIGS. 36A and 36B are cross-sectional views of the transistor 100B. A top view of the transistor 100B is not illustrated because it is similar to that of the transistor 100A in FIG. 35A.

The transistor 100B illustrated in FIGS. 36A and 36B includes an insulating film 122 over the conductive films 120a and 120b and the insulating film 122. The other components of the transistor 100B are similar to those of the transistor 100A and have similar effects.

The insulating film 122 has a function of covering unevenness and the like caused by the transistor or the like. The insulating film 122 has an insulating property and is formed using an inorganic material or an organic material. Examples of the inorganic material include silicon oxide, silicon oxynitride, silicon nitride oxide, silicon nitride, aluminum oxide, and aluminum nitride. Examples of the organic material include photosensitive resin materials such as an acrylic resin and a polyimide resin.

[Structure Example 3 of Transistor]

Next, structures of transistors different from the structure of the transistor illustrated in FIGS. 35A to 35C will be described with reference to FIGS. 37A and 37B, FIGS. 38A and 38B, and FIGS. 39A and 39B.

Figure 37A:
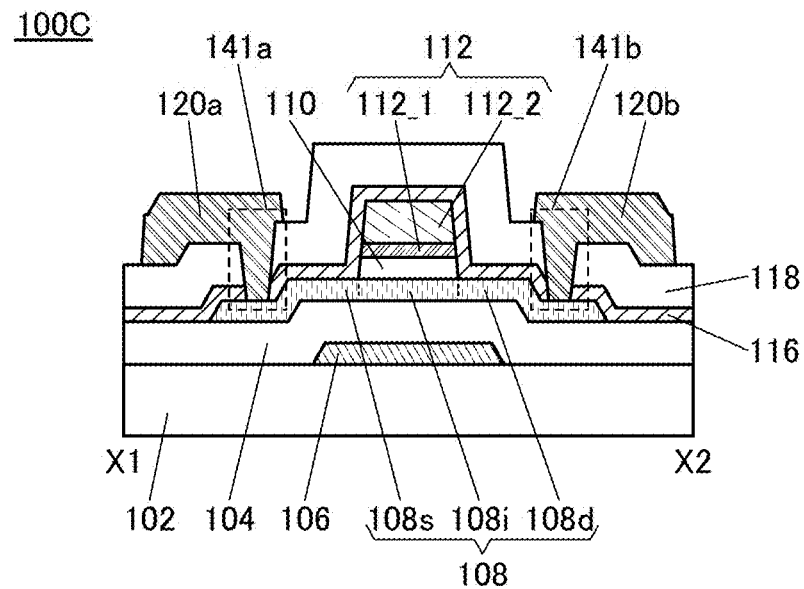
FIGS. 37A and 37B are cross-sectional views illustrating a semiconductor device.
Figure 37B:
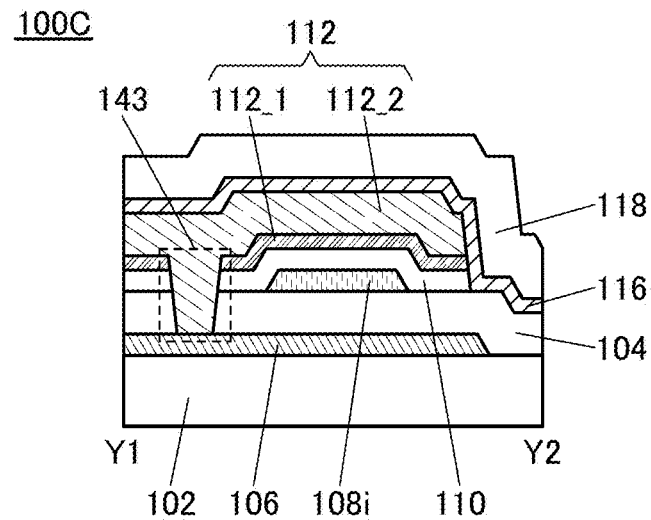
Figure 38A:
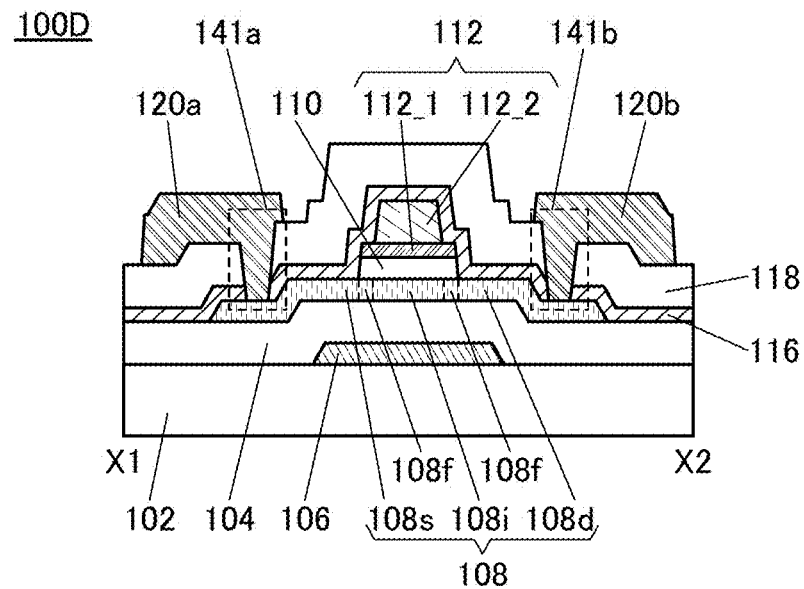
FIGS. 38A and 38B are cross-sectional views illustrating a semiconductor device.
Figure 38B:
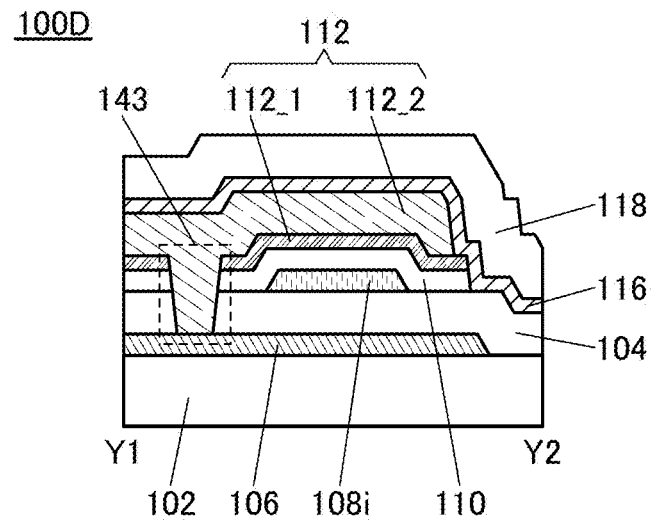
Figure 39A:
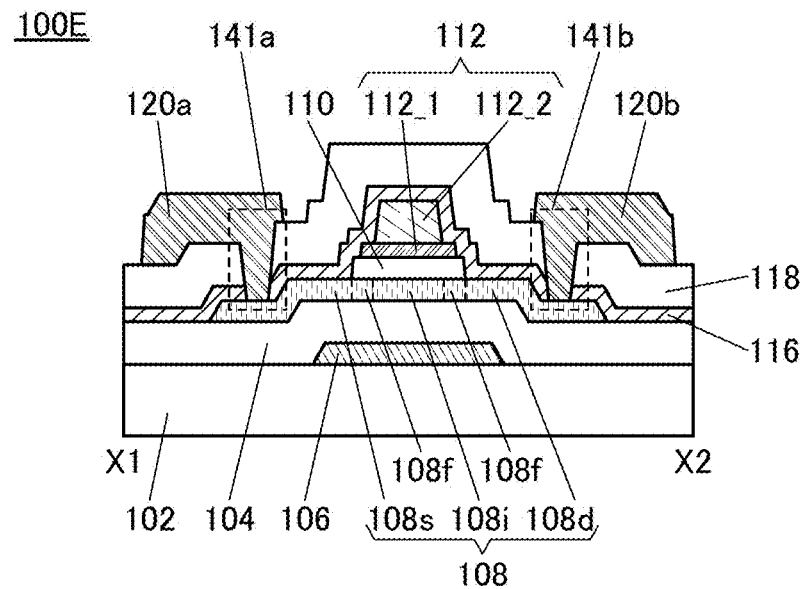
FIGS. 39A and 39B are cross-sectional views illustrating a semiconductor device.
Figure 39B:
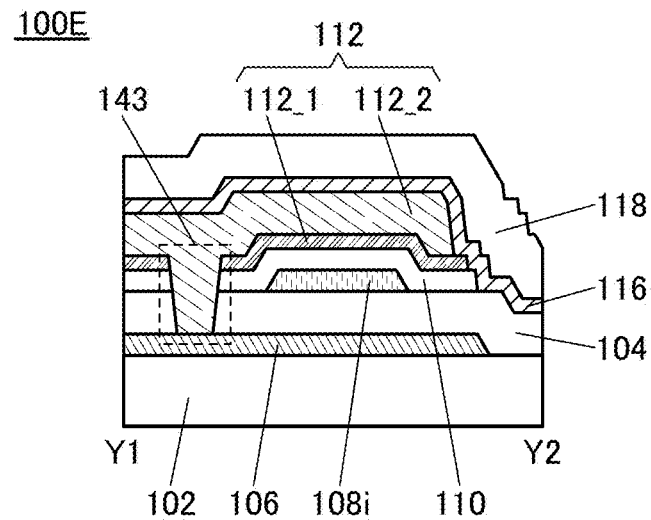

FIGS. 37A and 37B are cross-sectional views of a transistor 100C. FIGS. 38A and 38B are cross-sectional views of a transistor 100D. FIGS. 39A and 39B are cross-sectional views of a transistor 100E. The top views of the transistors 100C, 100D, and 100E are not illustrated because they are similar to the top view of the transistor 100A in FIG. 35A.

The transistor 100C illustrated in FIGS. 37A and 37B is different from the transistor 100A in the layered structure of the conductive film 112, the shape of the conductive film 112, and the shape of the insulating film 110.

The conductive film 112 in the transistor 100C includes a conductive film 112_1 over the insulating film 110 and the conductive film 112_2 over the conductive film 112_1. For example, an oxide conductive film is used as the conductive film 112_1, so that excess oxygen can be added to the insulating film 110. The oxide conductive film can be formed by a sputtering method in an atmosphere containing an oxygen gas. As the oxide conductive film, an oxide film containing indium and tin, an oxide film containing tungsten and indium, an oxide film containing tungsten, indium, and zinc, an oxide film containing titanium and indium, an oxide film containing titanium, indium, and tin, an oxide film containing indium and zinc, an oxide film containing silicon, indium, and tin, or an oxide film containing indium, gallium, and zinc can be used, for example.

As illustrated in FIG. 37B, the conductive film 112_2 is connected to the conductive film 106 through the opening 143. By forming the opening 143 after a conductive film to be the conductive film 112_1 is formed, the shape illustrated in FIG. 37B can be obtained. In the case where an oxide conductive film is used as the conductive film 112_1, the structure in which the conductive film 112_2 is connected to the conductive film 106 can decrease the contact resistance between the conductive film 112 and the conductive film 106.

The conductive film 112 and the insulating film 110 in the transistor 100C have a tapered shape. More specifically, the lower edge portion of the conductive film 112 is positioned outside the upper edge portion of the conductive film 112. The lower edge portion of the insulating film 110 is positioned outside the upper edge portion of the insulating film 110. In addition, the lower edge portion of the conductive film 112 is formed in substantially the same position as that of the upper edge portion of the insulating film 110.

It is suitable that the conductive film 112 and the insulating film 110 have tapered shapes as in the transistor 100C, because the coverage with the insulating film 116 can be high as compared with the case of the transistor 100A in which the conductive film 112 and the insulating film 110 are rectangular.

The other components of the transistor 100C are similar to those of the transistor 100A described above and have similar effects.

The transistor 100D illustrated in FIGS. 38A and 38B is different from the transistor 100A in the layered structure of the conductive film 112, the shape of the conductive film 112, and the shape of the insulating film 110.

The conductive film 112 in the transistor 100D includes the conductive film 112_1 over the insulating film 110 and the conductive film 112_2 over the conductive film 112_1. A lower end portion of the conductive film 112_1 is located outward from a lower end portion of the conductive film 112_2. The conductive film 112_1, the conductive film 112_2, and the insulating film 110 can be formed by processing with the same mask. To obtain the above structure, for example, the conductive film 112_2 is processed by a wet etching method and the conductive film 112_1 and the insulating film 110 are processed by a dry etching method.

With the structure of the transistor 100D, regions 108f are formed in the oxide semiconductor film 108 in some cases. The regions 108f are formed between the channel region 108i and the source region 108s and between the channel region 108i and the drain region 108d.

The regions 108f function as high-resistance regions or low-resistance regions. The high-resistance regions have the same level of resistance as the channel region 108i and do not overlap with the conductive film 112 functioning as a gate electrode. In the case where the regions 108f are high-resistance regions, the regions 108f function as offset regions. To suppress a decrease in the on-state current of the transistor 100D, the regions 108f functioning as offset regions may each have a length of 1 µm or less in the channel length (L) direction.

The low-resistance regions have a resistance that is lower than that of the channel region 108i and higher than that of the source region 108s and the drain region 108d. In the case where the regions 108f are low-resistance regions, the regions 108f function as lightly doped drain (LDD) regions. The regions 108f functioning as LDD regions can relieve an electric field in the drain region, thereby reducing a change in the threshold voltage of the transistor due to the electric field in the drain region.

Note that in the case where the regions 108f serve as LDD regions, for example, the regions 108f are formed by supplying one or more of nitrogen, hydrogen, and fluorine from the insulating film 116 to the regions 108f or by adding an impurity element from above the conductive film 112_1 using the insulating film 110 and the conductive film 112_1 as a mask so that the impurity element is added to the oxide semiconductor film 108 through the conductive film 112_1 and the insulating film 110.

As illustrated in FIG. 38B, the conductive film 112_2 is connected to the conductive film 106 through the opening 143.

The other components of the transistor 100D are similar to those of the transistor 100A described above and have similar effects.

The transistor 100E illustrated in FIGS. 39A and 39B is different from the transistor 100A in the layered structure of the conductive film 112, the shape of the conductive film 112, and the shape of the insulating film 110.

The conductive film 112 in the transistor 100E includes the conductive film 112_1 over the insulating film 110 and the conductive film 112_2 over the conductive film 112_1. A lower end portion of the conductive film 112_1 is located outward from a lower end portion of the conductive film 112_2. Furthermore, a lower end portion of the insulating film 110 is located outward from the lower end portion of the conductive film 112_1. The conductive film 112_1, the conductive film 112_2, and the insulating film 110 can be formed by processing with the same mask. To obtain the above structure, for example, the conductive film 112_2 and the conductive film 112_1 are processed by a wet etching method and the insulating film 110 is processed by a dry etching method.

Like the transistor 100D, regions 108f are formed in the oxide semiconductor film 108 in the transistor 100E, in some cases. The regions 108f are formed between the channel region 108i and the source region 108s and between the channel region 108i and the drain region 108d.

As illustrated in FIG. 39B, the conductive film 112_2 is connected to the conductive film 106 through the opening 143.

The other components of the transistor 100E are similar to those of the transistor 100A described above and have similar effects.

[Structure Example 4 Transistor]

Next, structures of transistors different from the structure of the transistor 100A illustrated in FIGS. 35A to 35C will be described with reference to FIGS. 40A and 40B, FIGS. 41A and 41B, FIGS. 42A and 42B, FIGS. 43A and 43B, and FIGS. 44A and 44B.

Figure 40A:
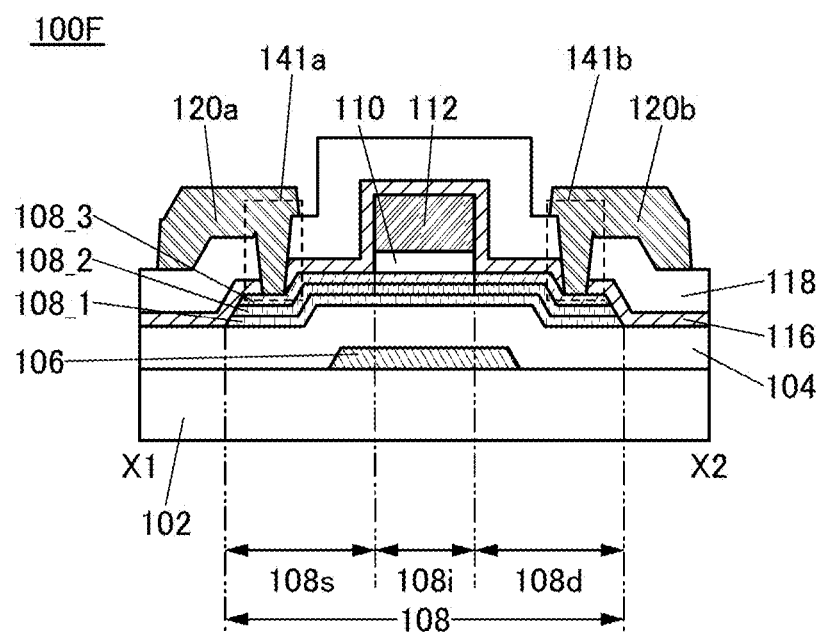
FIGS. 40A and 40B are cross-sectional views illustrating a semiconductor device.
Figure 40B:
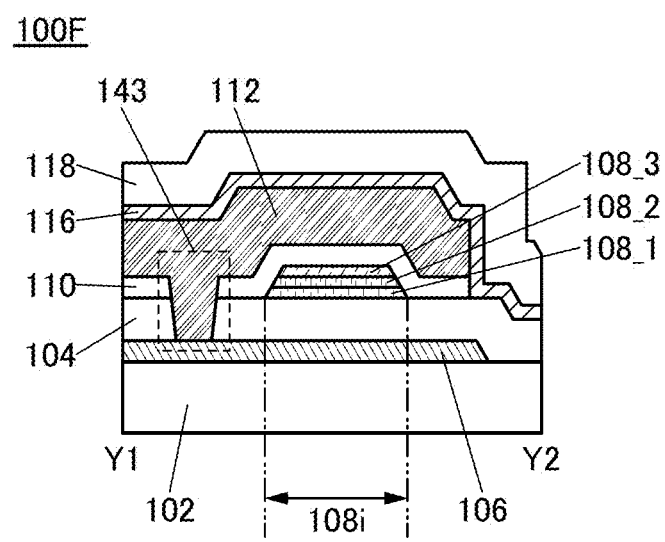
Figure 41A:
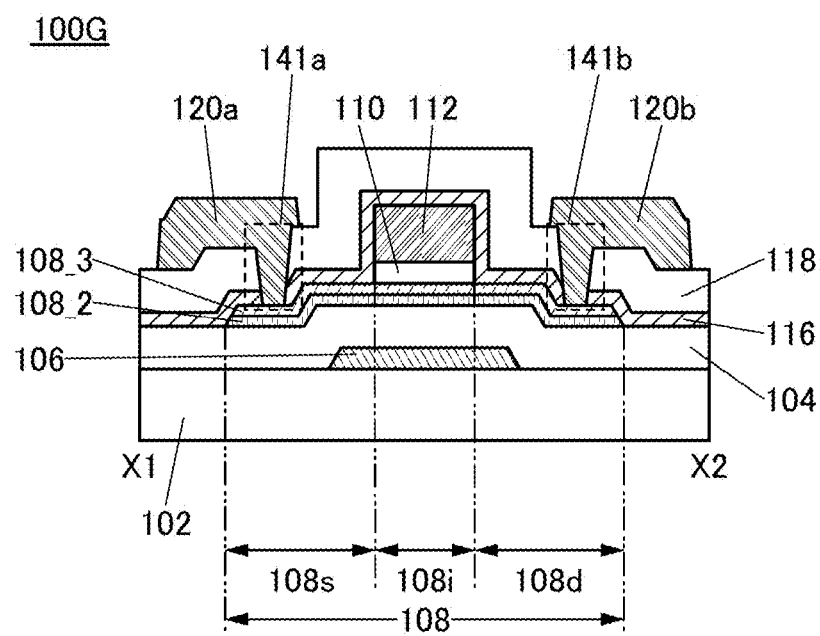
FIGS. 41A and 41B are cross-sectional views illustrating a semiconductor device.
Figure 41B:
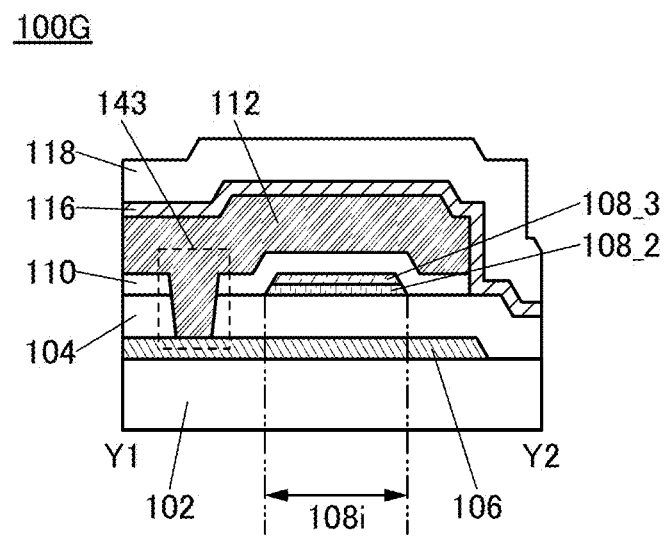
Figure 42A:
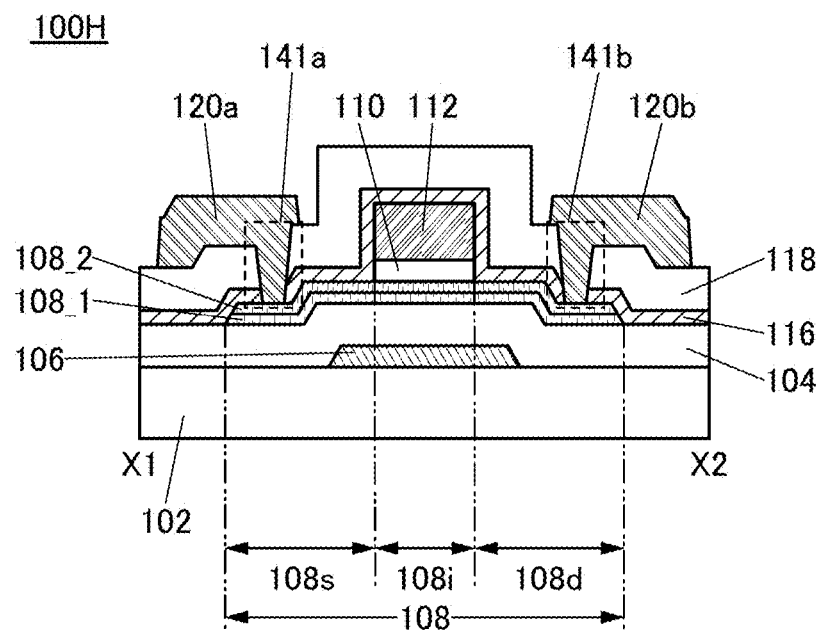
FIGS. 42A and 42B are cross-sectional views illustrating a semiconductor device.
Figure 42B:
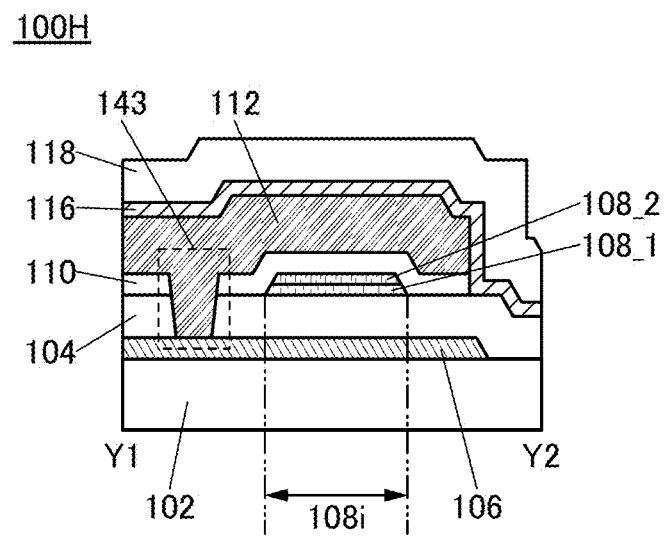
Figure 43A:
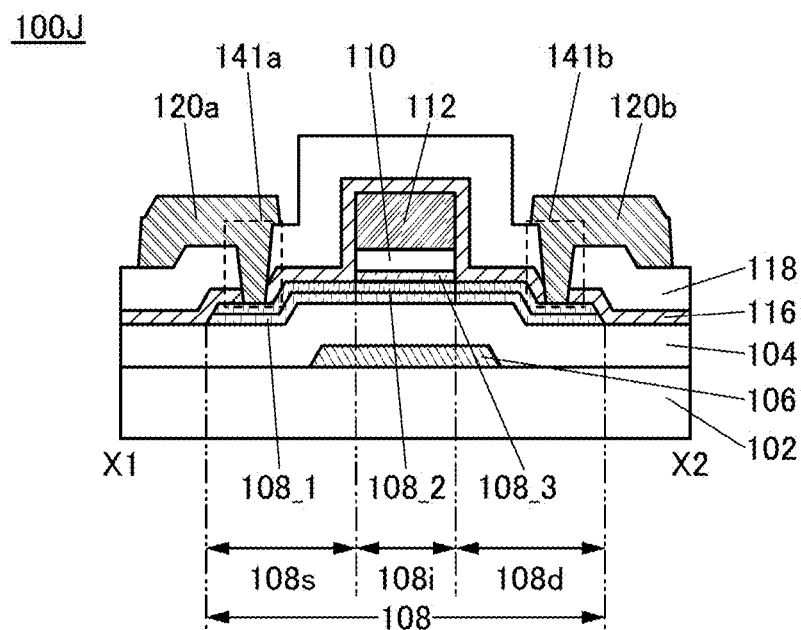
FIGS. 43A and 43B are cross-sectional views illustrating a semiconductor device.
Figure 43B:
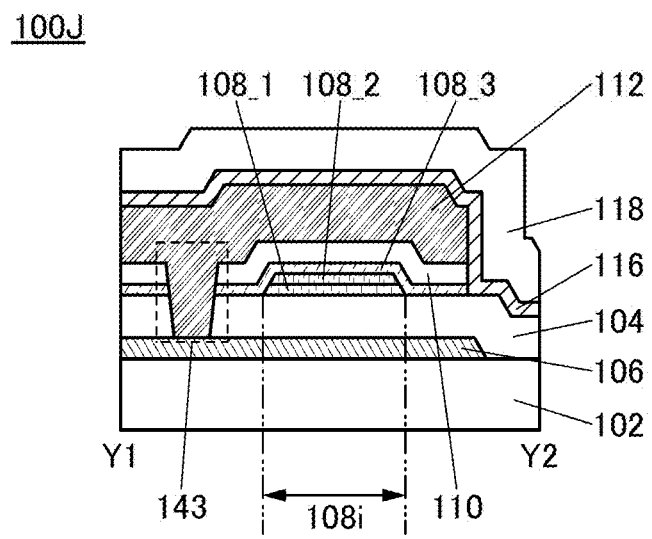
Figure 44A:
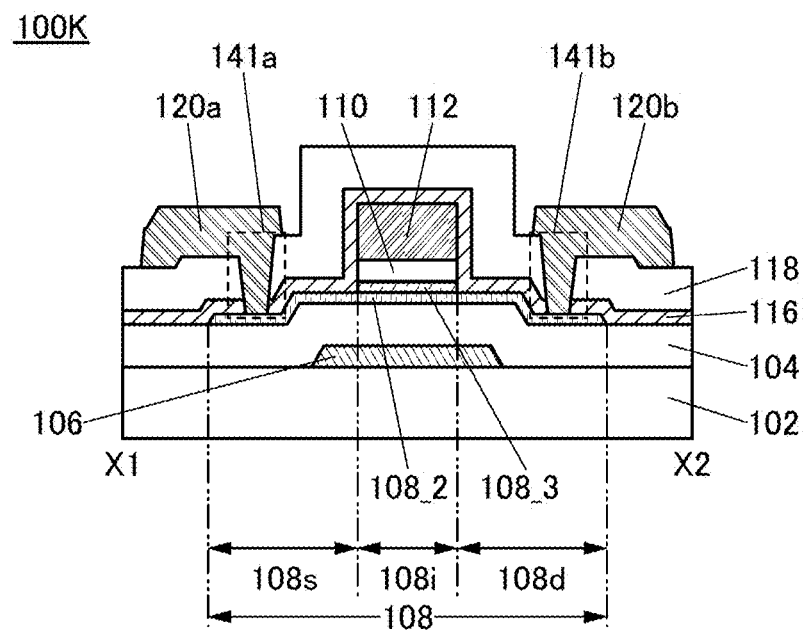
FIGS. 44A and 44B are cross-sectional views illustrating a semiconductor device.
Figure 44B:
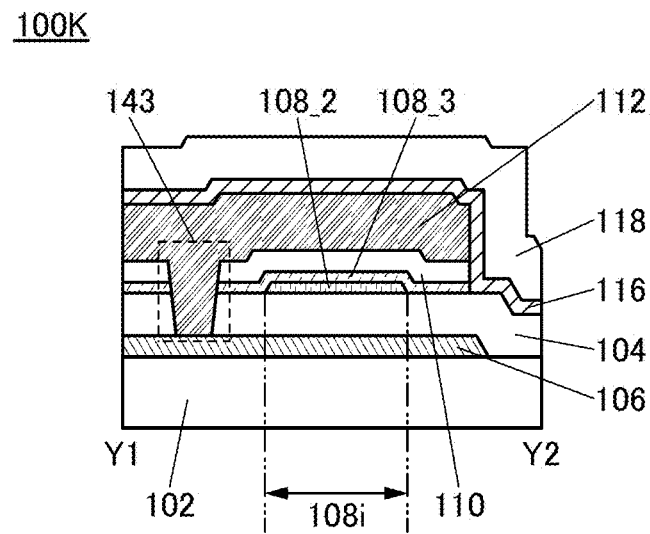

FIGS. 40A and 40B are cross-sectional views of a transistor 100F. FIGS. 41A and 41B are cross-sectional views of a transistor 100G. FIGS. 42A and 42B are cross-sectional views of a transistor 100H. FIGS. 43A and 43B are cross-sectional views of a transistor 100J. FIGS. 44A and 44B are cross-sectional views of a transistor 100K. The top views of the transistors 100F, 100G, 100H, 100J, and 100K are not illustrated because they are similar to the top view of the transistor 100A in FIG. 35A.

The transistors 100F, 100G, 100H, 100J, and 100K are different from the above-described the transistor 100A in the structure of the oxide semiconductor film 108. The other components are similar to those of the transistor 100A and have similar effects.

The oxide semiconductor film 108 of the transistor 100F illustrated in FIGS. 40A and 40B includes an oxide semiconductor film 108_1 over the insulating film 104, an oxide semiconductor film 108_2 over the oxide semiconductor film 108_1, and an oxide semiconductor film 108_3 over the oxide semiconductor film 108_2. The channel region 108i, the source region 108s, and the drain region 108d each have a three-layer structure of the oxide semiconductor film 108_1, the oxide semiconductor film 108_2, and the oxide semiconductor film 108_3.

The oxide semiconductor film 108 of the transistor 100G illustrated in FIGS. 41A and 41B includes the oxide semiconductor film 108_2 over the insulating film 104, and the oxide semiconductor film 108_3 over the oxide semiconductor film 108_2. The channel region 108i, the source region 108s, and the drain region 108d each have a two-layer structure of the oxide semiconductor film 108_2 and the oxide semiconductor film 108_3.

The oxide semiconductor film 108 of the transistor 100H illustrated in FIGS. 42A and 42B includes the oxide semiconductor film 108_1 over the insulating film 104, and the oxide semiconductor film 108_2 over the oxide semiconductor film 108_1. The channel region 108i, the source region 108s, and the drain region 108d each have a two-layer structure of the oxide semiconductor film 108_1 and the oxide semiconductor film 108_2.

The oxide semiconductor film 108 of the transistor 100J illustrated in FIGS. 43A and 43B includes the oxide semiconductor film 108_1 over the insulating film 104, the oxide semiconductor film 108_2 over the oxide semiconductor film 108_1, and the oxide semiconductor film 108_3 over the oxide semiconductor film 108_2. The channel region 108i has a three-layer structure of the oxide semiconductor film 108_1, the oxide semiconductor film 108_2, and the oxide semiconductor film 108_3. The source region 108s and the drain region 108d each have a two-layer structure of the oxide semiconductor film 108_1 and the oxide semiconductor film 108_2. Note that in the cross section of the transistor 100J in the channel width (W) direction, the oxide semiconductor film 108_3 covers side surfaces of the oxide semiconductor film 108_1 and the oxide semiconductor film 108_2.

The oxide semiconductor film 108 of the transistor 100K illustrated in FIGS. 44A and 44B includes the oxide semiconductor film 108_2 over the insulating film 104, and the oxide semiconductor film 108_3 over the oxide semiconductor film 108_2. The channel region 108i has a two-layer structure of the oxide semiconductor film 108_2 and the oxide semiconductor film 108_3. The source region 108s and the drain region 108d each have a single-layer structure of the oxide semiconductor film 108_2. Note that in the cross section of the transistor 100K in the channel width (W) direction, the oxide semiconductor film 108_3 covers side surfaces of the oxide semiconductor film 108_2.

A side surface of the channel region 108i in the channel width (W) direction or a region in the vicinity of the side surface is easily damaged by processing, resulting in a defect (e.g., oxygen vacancy), or easily contaminated by an impurity attached thereto. Therefore, even when the channel region 108i is substantially intrinsic, stress such as an electric field applied thereto activates the side surface of the channel region 108i in the channel width (W) direction or the region in the vicinity of the side surface and turns it into a low-resistance (n-type) region easily. Moreover, if the side surface of the channel region 108i in the channel width (W) direction or the region in the vicinity of the side surface is an n-type region, a parasitic channel may be formed because the n-type region serves as a carrier path.

Thus, in the transistor 100J and the transistor 100K, the channel region 108i has a stacked-layer structure and side surfaces of the channel region 108i in the channel width (W) direction are covered with one layer of the stacked layers. With such a structure, defects on or in the vicinity of the side surfaces of the channel region 108i can be suppressed or adhesion of an impurity to the side surfaces of the channel region 108i or to regions in the vicinity of the side surfaces can be reduced.

[Band Structure]

Here, a band structure of the insulating film 104, the oxide semiconductor films 108_1, 108_2, and 108_3, and the insulating film 110, a band structure of the insulating film 104, the oxide semiconductor films 108_2 and 108_3, and the insulating film 110, and a band structure of the insulating film 104, the oxide semiconductor films 108_1 and 108_2, and the insulating film 110 will be described with reference to FIGS. 45A to 45C. Note that FIGS. 45A to 45C are each a band structure of the channel region 108i.

Figure 45A:
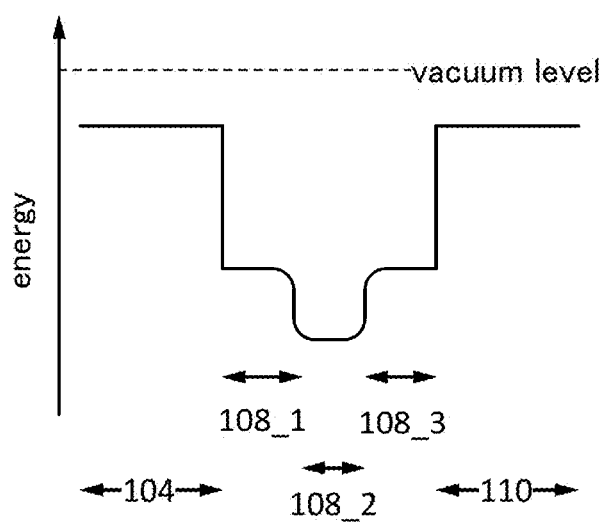
FIGS. 45A to 45C are band diagrams.

FIG. 45A shows an example of a band structure in the thickness direction of a stack including the insulating film 104, the oxide semiconductor films 108_1, 108_2, and 108_3, and the insulating film 110. FIG. 45B shows an example of a band structure in the thickness direction of a stack including the insulating film 104, the oxide semiconductor films 108_2 and 108_3, and the insulating film 110. FIG. 45C shows an example of a band structure in the thickness direction of a stack including the insulating film 104, the oxide semiconductor films 108_1 and 108_2, and the insulating film 110. For easy understanding, the band structures show the conduction band minimum ($E_c$) of the insulating film 104, the oxide semiconductor films 108_1, 108_2, and 108_3, and the insulating film 110.

In the band structure of FIG. 45A, a silicon oxide film is used as each of the insulating films 104 and 110, an oxide semiconductor film formed using a metal oxide target whose atomic ratio of In to Ga and Zn is 1:3:2 is used as the oxide semiconductor film 108_1, an oxide semiconductor film formed using a metal oxide target whose atomic ratio of In to Ga and Zn is 4:2:4.1 is used as the oxide semiconductor film 108_2, and an oxide semiconductor film formed using a metal oxide target whose atomic ratio of In to Ga and Zn is 1:3:2 is used as the oxide semiconductor film 108_3.

Figure 45B:
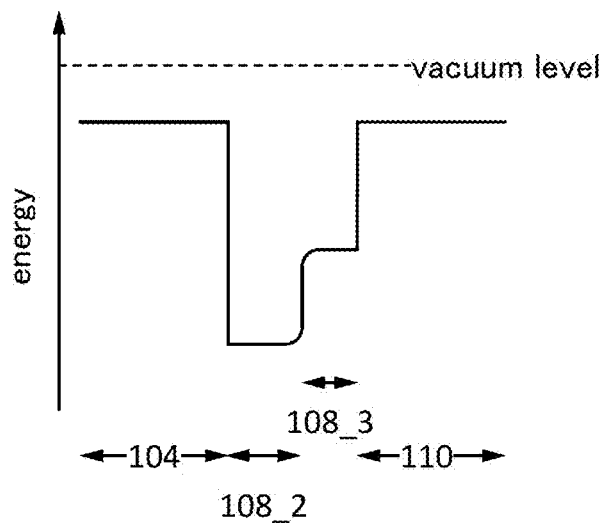
Figure 45C:
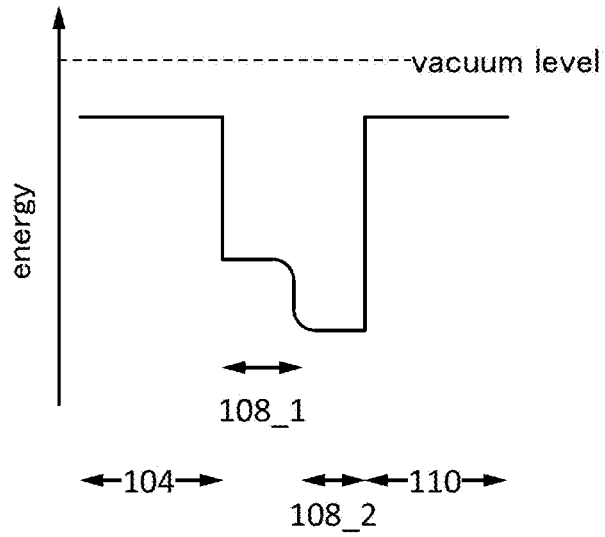

In the band structure of FIG. 45B, a silicon oxide film is used as each of the insulating films 104 and 110, an oxide semiconductor film formed using a metal oxide target whose atomic ratio of In to Ga to Zn is 4:2:4.1 is used as the oxide semiconductor film 108_2, and an oxide semiconductor film formed using a metal oxide target whose atomic ratio of In to Ga to Zn is 1:3:2 is used as the oxide semiconductor film 108_3.

In the band structure of FIG. 45C, a silicon oxide film is used as each of the insulating films 104 and 110, an oxide semiconductor film formed using a metal oxide target whose atomic ratio of In to Ga and Zn is 1:3:2 is used as the oxide semiconductor film 108_1, and an oxide semiconductor film formed using a metal oxide target whose atomic ratio of In to Ga and Zn is 4:2:4.1 is used as the oxide semiconductor film 108_2.

As illustrated in FIG. 45A, the conduction band minimum gradually varies between the oxide semiconductor films 108_1, 108_2, and 108_3. As illustrated in FIG. 45B, the conduction band minimum gradually varies between the oxide semiconductor films 108_2 and 108_3. As illustrated in FIG. 45C, the conduction band minimum gradually varies between the oxide semiconductor films 108_1 and 108_2. In other words, the conduction band minimum is continuously changed or continuously connected. To obtain such a band structure, there exists no impurity, which forms a defect state such as a trap center or a recombination center, at the interface between the oxide semiconductor films 108_1 and 108_2 or the interface between the oxide semiconductor films 108_2 and 108_3.

To form a continuous junction between the oxide semiconductor films 108_1, 108_2, and 108_3, it is necessary to form the films successively without exposure to the air with a multi-chamber deposition apparatus (sputtering apparatus) provided with a load lock chamber.

With the band structure of FIG. 45A, FIG. 45B, or FIG. 45C, the oxide semiconductor film 108_2 serves as a well, and a channel region is formed in the oxide semiconductor film 108_2 in the transistor with the stacked-layer structure. By providing the oxide semiconductor films 108_1 and 108_3, the oxide semiconductor film 108_2 can be distanced away from defect states.

In addition, the defect states might be more distant from the vacuum level than the conduction band minimum ($E_c$) of the oxide semiconductor film 108_2 functioning as a channel region, so that electrons are likely to be accumulated in the defect states. When the electrons are accumulated in the defect states, the electrons become negative fixed electric charge, so that the threshold voltage of the transistor is shifted in the positive direction. Therefore, it is preferable that the defect states be closer to the vacuum level than the conduction band minimum ($E_c$) of the oxide semiconductor film 108_2. Such a structure inhibits accumulation of electrons in the defect states. As a result, the on-state current and the field-effect mobility of the transistor can be increased.

The conduction band minimum of each of the oxide semiconductor films 108_1 and 108_3 is closer to the vacuum level than that of the oxide semiconductor film 108_2. A typical difference between the conduction band minimum of the oxide semiconductor film 108_2 and the conduction band minimum of each of the oxide semiconductor films 108_1 and 108_3 is 0.15 eV or more or 0.5 eV or more and 2 eV or less or 1 eV or less. That is, the difference between the electron affinity of each of the oxide semiconductor films 108_1 and 108_3 and the electron affinity of the oxide semiconductor film 108_2 is 0.15 eV or more or 0.5 eV or more and 2 eV or less or 1 eV or less.

In such a structure, the oxide semiconductor film 108_2 serves as a main path of a current. In other words, the oxide semiconductor film 108_2 serves as a channel region, and the oxide semiconductor films 108_1 and 108_3 serve as oxide insulating films. It is preferable that the oxide semiconductor films 108_1 and 108_3 each include one or more metal elements constituting a part of the oxide semiconductor film 108_2 in which a channel region is formed. With such a structure, interface scattering hardly occurs at the interface between the oxide semiconductor film 108_1 and the oxide semiconductor film 108_2 or at the interface between the oxide semiconductor film 108_2 and the oxide semiconductor film 108_3. Thus, the transistor can have high field-effect mobility because the movement of carriers is not hindered at the interface.

To prevent each of the oxide semiconductor films 108_1 and 108_3 from functioning as part of a channel region, a material having sufficiently low conductivity is used for the oxide semiconductor films 108_1 and 108_3. Thus, the oxide semiconductor films 108_1 and 108_3 can be referred to as oxide insulating films for such properties and/or functions. Alternatively, a material that has a smaller electron affinity (a difference between the vacuum level and the conduction band minimum) than the oxide semiconductor film 108_2 and has a difference in the conduction band minimum from the oxide semiconductor film 108_2 (band offset) is used for the oxide semiconductor films 108_1 and 108_3. Furthermore, to inhibit generation of a difference in threshold voltage due to the value of the drain voltage, it is preferable to form the oxide semiconductor films 108_1 and 108_3 using a material whose conduction band minimum is closer to the vacuum level than that of the oxide semiconductor film 108_2. For example, a difference between the conduction band minimum of the oxide semiconductor film 108_2 and the conduction band minimum of each of the oxide semiconductor films 108_1 and 108_3 is preferably greater than or equal to 0.2 eV, more preferably greater than or equal to 0.5 eV.

It is preferable that the oxide semiconductor films 108_1 and 108_3 not have a spinel crystal structure. This is because if the oxide semiconductor films 108_1 and 108_3 have a spinel crystal structure, constituent elements of the conductive films 120a and 120b might be diffused into the oxide semiconductor film 108_2 at the interface between the spinel crystal structure and another region. Note that each of the oxide semiconductor films 108_1 and 108_3 is preferably a CAAC-OS film described later, in which case a higher blocking property against constituent elements of the conductive films 120a and 120b, for example, copper elements, can be obtained.

Although the example where an oxide semiconductor film formed using a metal oxide target whose atomic ratio of In to Ga and Zn is 1:3:2, is used as each of the oxide semiconductor films 108_1 and 108_3 is described in this embodiment, one embodiment of the present invention is not limited thereto. For example, an oxide semiconductor film formed using a metal oxide target whose atomic ratio of In to Ga and Zn is 1:1:1, 1:1:1.2, 1:3:4, 1:3:6, 1:4:5, 1:5:6, or 1:10:1 may be used as each of the oxide semiconductor films 108_1 and 108_3. Alternatively, oxide semiconductor films formed using a metal oxide target whose atomic ratio of Ga to Zn is 10:1 may be used as the oxide semiconductor films 108_1 and 108_3. It is suitable that an oxide semiconductor film formed using a metal oxide target whose atomic ratio of In to Ga and Zn is 1:1:1 is used as the oxide semiconductor film 108_2 and an oxide semiconductor film formed using a metal oxide target whose atomic ratio of Ga to Zn is 10:1 is used as each of the oxide semiconductor films 108_1 and 108_3 because the difference between the conduction band minimum of the oxide semiconductor film 108_2 and the conduction band minimum of the oxide semiconductor film 108_1 or 108_3 can be 0.6 eV or more.

When the oxide semiconductor films 108_1 and 108_3 are formed using a metal oxide target whose atomic ratio of In to Ga and Zn is 1:1:1, the atomic ratio of In to Ga and Zn in the oxide semiconductor films 108_1 and 108_3 might be $1:\beta1:\beta2$ ($0<\beta1\leq2$, $0<\beta2\leq2$). When the oxide semiconductor films 108_1 and 108_3 are formed using a metal oxide target whose atomic ratio of In to Ga and Zn is 1:3:4, the atomic ratio of In to Ga and Zn in the oxide semiconductor films 108_1 and 108_3 might be $1:\beta3:\beta4$ ($1\leq\beta3\leq5$, $2\leq\beta4\leq6$). When the oxide semiconductor films 108_1 and 108_3 are formed using a metal oxide target whose atomic ratio of In to Ga and Zn is 1:3:6, the atomic ratio of In to Ga and Zn in the oxide semiconductor films 108_1 and 108_3 might be $1:\beta5:\beta6$ ($1\leq\beta5$, $4\leq\beta6\leq8$).

At least part of this embodiment can be implemented in combination with any of the other embodiments described in this specification as appropriate.

Embodiment 3

In this embodiment, a transistor that can be used as the semiconductor device of one embodiment of the present invention will be described.

In this embodiment, bottom-gate transistors will be described with reference to FIGS. 46A to 46C to FIGS. 52A to 52C.

[Structure Example 1 of Transistor]

Figure 46A:
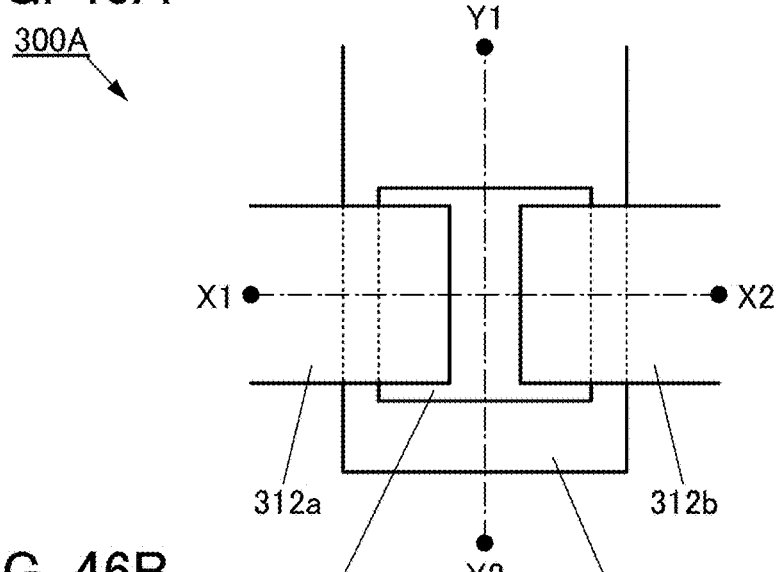
FIGS. 46A to 46C are a top view and cross-sectional views illustrating a semiconductor device.
Figure 46B:
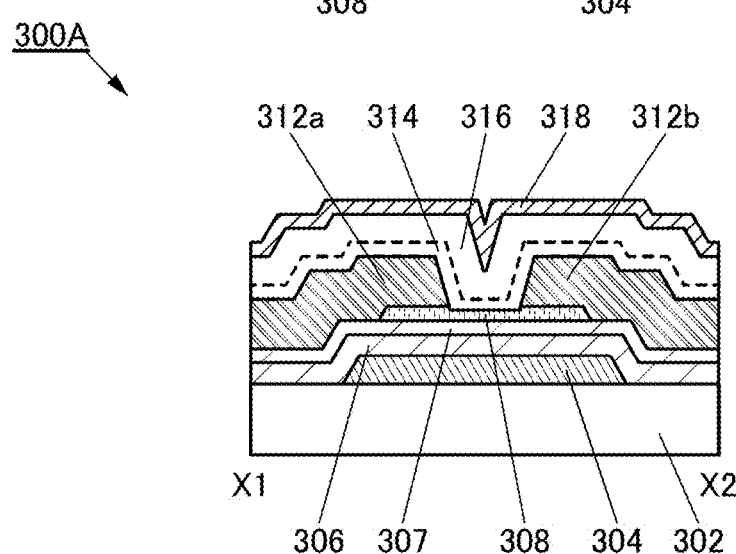
Figure 46C:
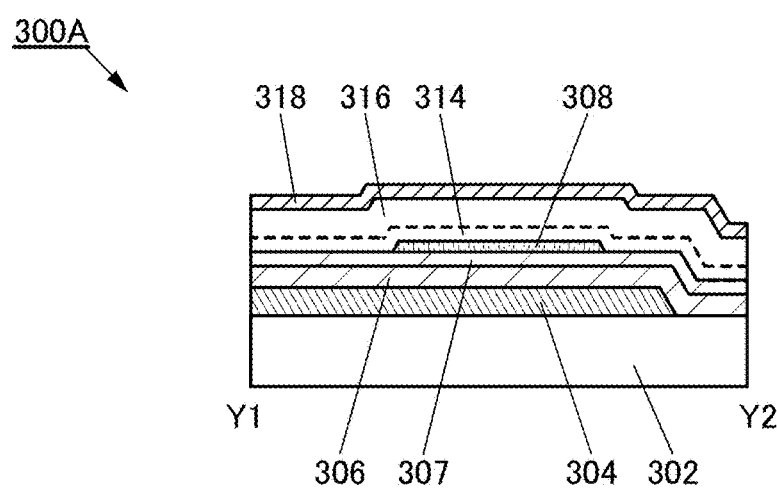

FIG. 46A is a top view of a transistor 300A. FIG. 46B is a cross-sectional view taken along dashed-dotted line X1-X2 in FIG. 46A. FIG. 46C is a cross-sectional view taken along dashed-dotted line Y1-Y2 in FIG. 46A. Note that in FIG. 46A, some components of the transistor 300A (e.g., an insulating film functioning as a gate insulating film) are not illustrated to avoid complexity. The direction of dashed-dotted line X1-X2 may be referred to as a channel length direction, and the direction of dashed-dotted line Y1-Y2 may be referred to as a channel width direction. As in FIG. 46A, some components are not illustrated in some cases in top views of transistors described below.

The transistor 300A illustrated in FIGS. 46A to 46C includes a conductive film 304 over a substrate 302, an insulating film 306 over the substrate 302 and the conductive film 304, an insulating film 307 over the insulating film 306, an oxide semiconductor film 308 over the insulating film 307, a conductive film 312a over the oxide semiconductor film 308, and a conductive film 312b over the oxide semiconductor film 308. Over the transistor 300A, specifically, over the conductive films 312a and 312b and the oxide semiconductor film 308, an insulating film 314, an insulating film 316, and an insulating film 318 are provided.

In the transistor 300A, the insulating films 306 and 307 function as the gate insulating films of the transistor 300A, and the insulating films 314, 316, and 318 functions as protective insulating films of the transistor 300A. Furthermore, in the transistor 300A, the conductive film 304 functions as a gate electrode, the conductive film 312a functions as a source electrode, and the conductive film 312b functions as a drain electrode.

In this specification and the like, the insulating films 306 and 307 may be referred to as a first insulating film, the insulating films 314 and 316 may be referred to as a second insulating film, and the insulating film 318 may be referred to as a third insulating film.

The transistor 300A illustrated in FIGS. 46A to 46C is a channel-etched transistor. The oxide semiconductor film of one embodiment of the present invention is suitable for a channel-etched transistor.

[Structure Example 2 of Transistor]

Figure 47A:
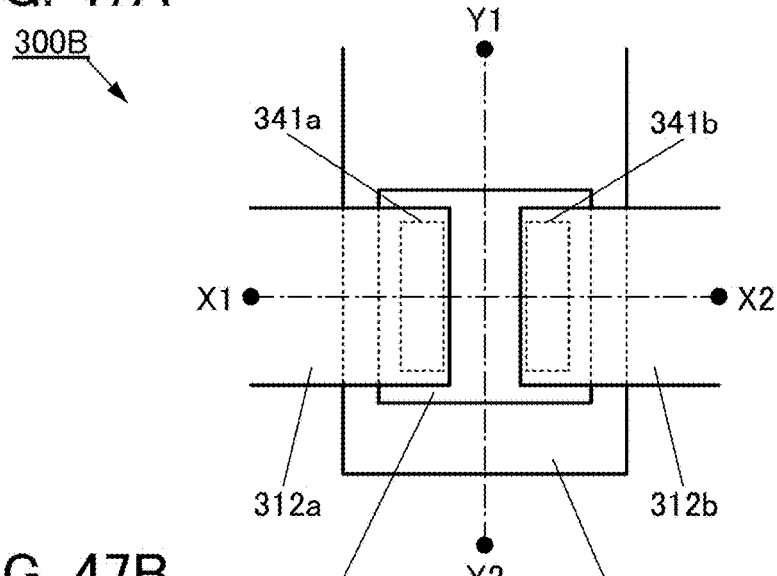
FIGS. 47A to 47C are a top view and cross-sectional views illustrating a semiconductor device.
Figure 47B:
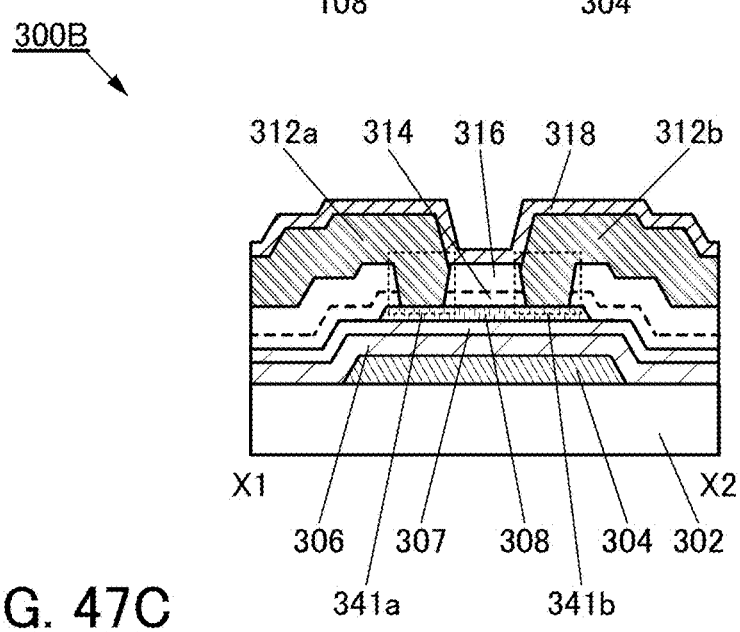
Figure 47C:
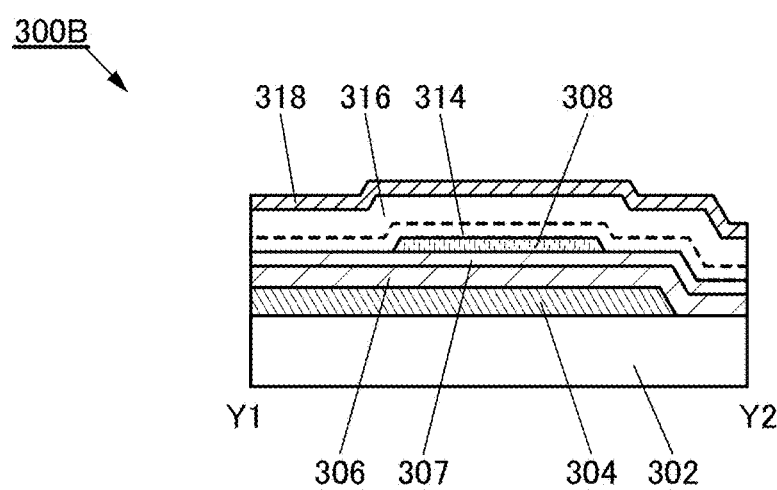

FIG. 47A is a top view of a transistor 300B. FIG. 47B is a cross-sectional view taken along dashed-dotted line X1-X2 in FIG. 47A. FIG. 47C is a cross-sectional view taken along dashed-dotted line Y1-Y2 in FIG. 47A.

The transistor 300B illustrated in FIGS. 47A to 47C includes the conductive film 304 over the substrate 302, the insulating film 306 over the substrate 302 and the conductive film 304, the insulating film 307 over the insulating film 306, the oxide semiconductor film 308 over the insulating film 307, the insulating film 314 over the oxide semiconductor film 308, the insulating film 316 over the insulating film 314, the conductive film 312a electrically connected to the oxide semiconductor film 308 through an opening 341a provided in the insulating films 314 and 316, and the conductive film 312b electrically connected to the oxide semiconductor film 308 through an opening 341b provided in the insulating films 314 and 316. Over the transistor 300B, specifically, over the conductive films 312a and 312b and the insulating film 316, the insulating film 318 is provided.

In the transistor 300B, the insulating films 306 and 307 function as gate insulating films of the transistor 300B, the insulating films 314 and 316 function as protective insulating films of the oxide semiconductor film 308, and the insulating film 318 functions as a protective insulating film of the transistor 300B. Furthermore, in the transistor 300B, the conductive film 304 functions as a gate electrode, the conductive film 312a functions as a source electrode, and the conductive film 312b functions as a drain electrode.

The transistor 300A illustrated in FIGS. 46A to 46C has a channel-etched structure, whereas the transistor 300B in FIGS. 47A to 47C has a channel-protective structure. The oxide semiconductor film of one embodiment of the present invention is suitable for a channel-protective transistor as well.

[Structure Example 3 of Transistor]

Figure 48A:
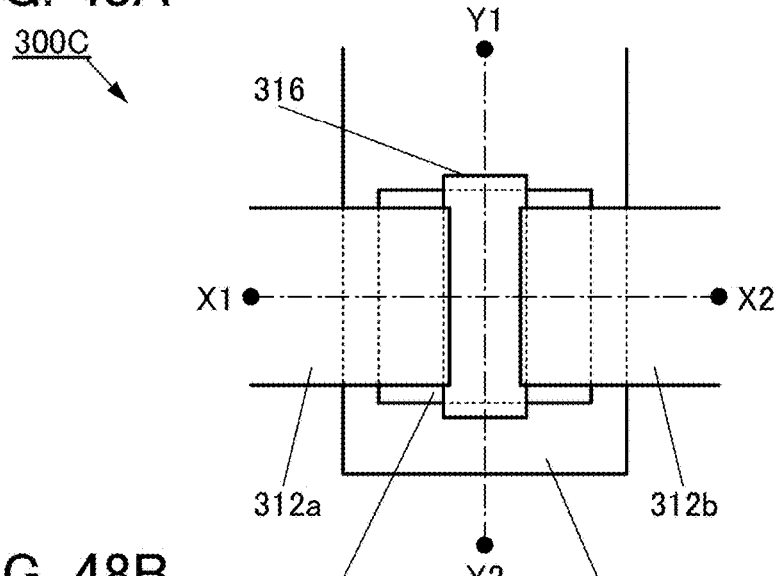
FIGS. 48A to 48C are a top view and cross-sectional views illustrating a semiconductor device.
Figure 48B:
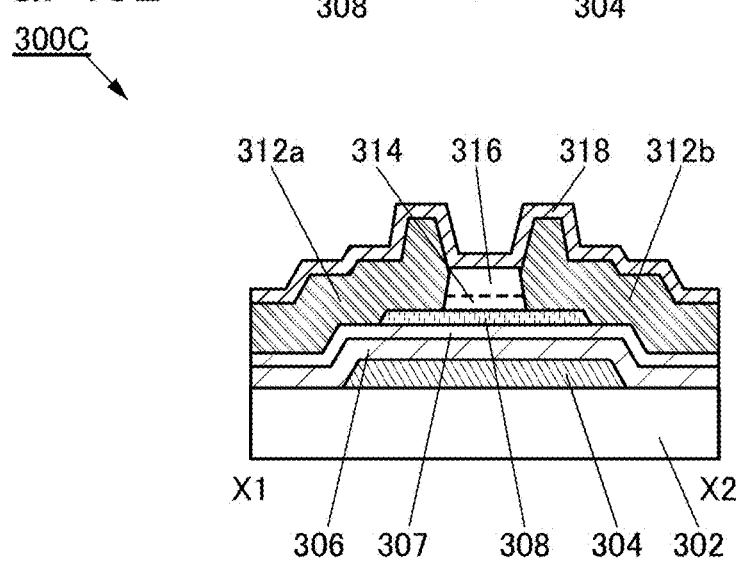
Figure 48C:
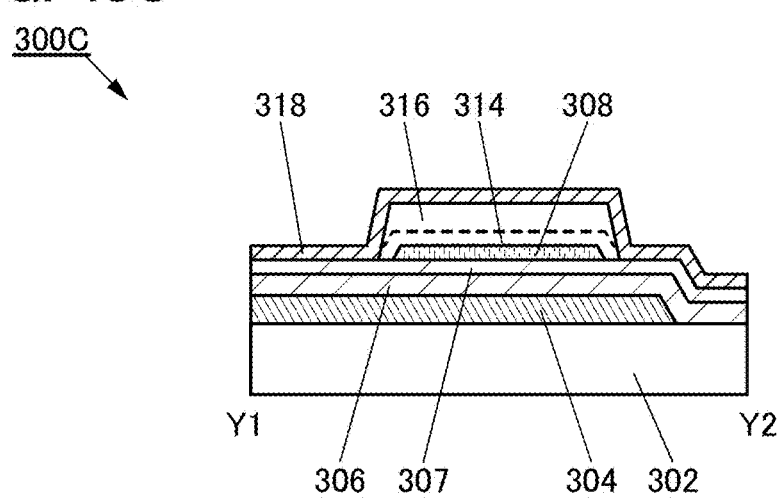

FIG. 48A is a top view of a transistor 300C. FIG. 48B is a cross-sectional view taken along dashed-dotted line X1-X2 in FIG. 48A. FIG. 48C is a cross-sectional view taken along dashed-dotted line Y1-Y2 in FIG. 48A.

The transistor 300C illustrated in FIGS. 48A to 48C is different from the transistor 300B in FIGS. 47A to 47C in the shapes of the insulating films 314 and 316. Specifically, the insulating films 314 and 316 of the transistor 300C have island shapes and are provided over a channel region of the oxide semiconductor film 308. Other components are similar to those of the transistor 300B.

[Structure Example 4 of Transistor]

Figure 49A:
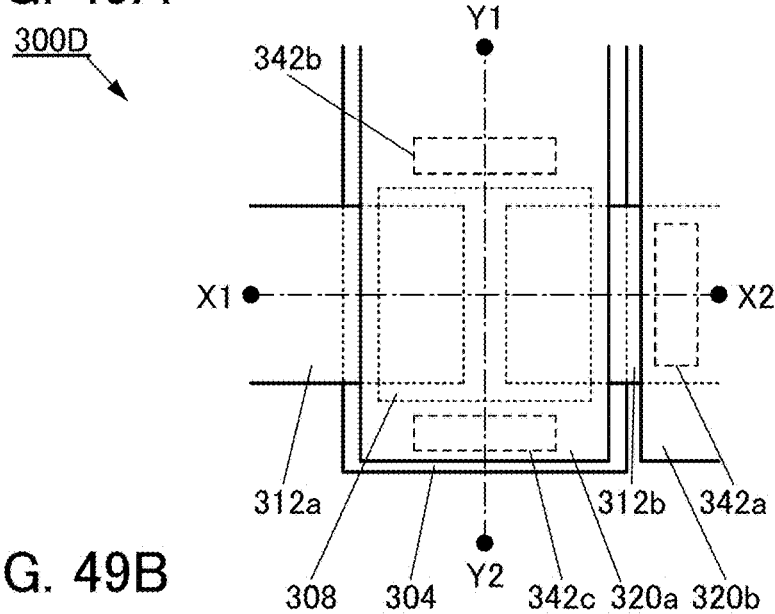
FIGS. 49A to 49C are a top view and cross-sectional views illustrating a semiconductor device.
Figure 49B:
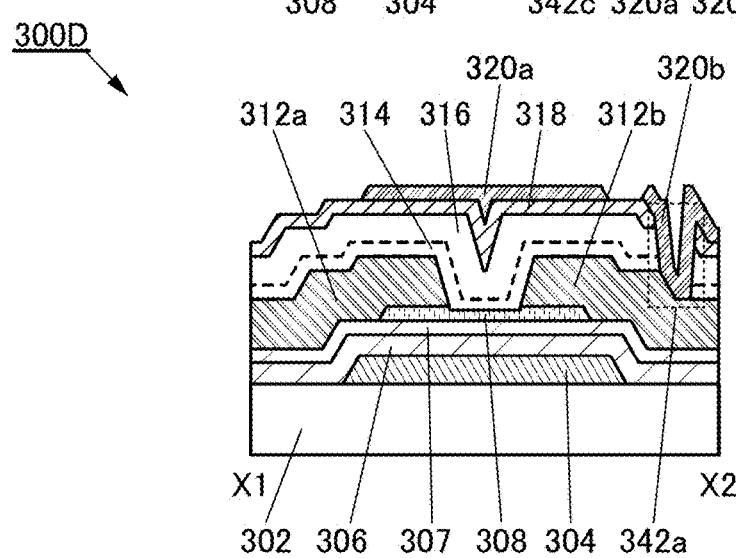
Figure 49C:
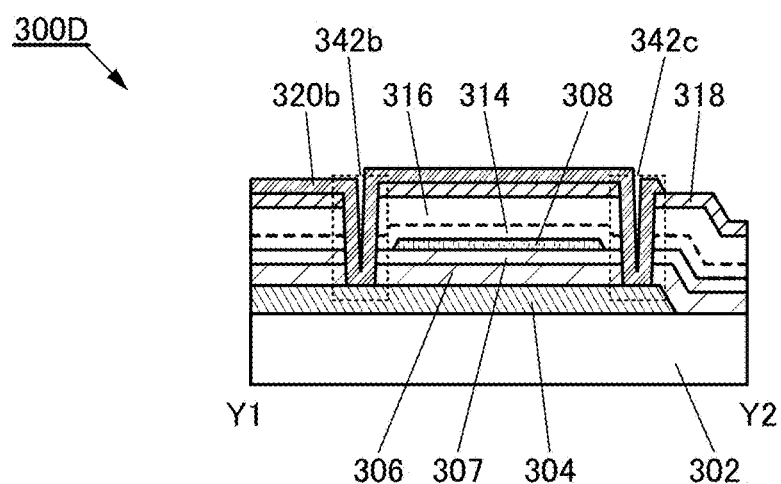

FIG. 49A is a top view of a transistor 300D. FIG. 49B is a cross-sectional view taken along dashed-dotted line X1-X2 in FIG. 49A. FIG. 49C is a cross-sectional view taken along dashed-dotted line Y1-Y2 in FIG. 49A.

The transistor 300D illustrated in FIGS. 49A to 49C includes the conductive film 304 over the substrate 302, the insulating film 306 over the substrate 302 and the conductive film 304, the insulating film 307 over the insulating film 306, the oxide semiconductor film 308 over the insulating film 307, the conductive film 312a over the oxide semiconductor film 308, the conductive film 312b over the oxide semiconductor film 308, the insulating film 314 over the oxide semiconductor film 308 and the conductive films 312a and 312b, the insulating film 316 over the insulating film 314, the insulating film 318 over the insulating film 316, and conductive films 320a and 320b over the insulating film 318.

In the transistor 300D, the insulating films 306 and 307 function as first gate insulating films of the transistor 300D, and the insulating films 314, 316, and 318 function as second gate insulating films of the transistor 300D. Furthermore, in the transistor 300D, the conductive film 304 functions as a first gate electrode, the conductive film 320a functions as a second gate electrode, and the conductive film 320b functions as a pixel electrode used for a display device. The conductive film 312a functions as a source electrode, and the conductive film 312b functions as a drain electrode.

As illustrated in FIG. 49C, the conductive film 320a is connected to the conductive film 304 in an opening 342b and an opening 342c provided in the insulating films 306, 307, 314, 316, and 318. Thus, the same potential is applied to the conductive film 320a and the conductive film 304.

The structure of the transistor 300D is not limited to that described above, in which the openings 342b and 342c are provided so that the conductive film 320a is connected to the conductive film 304. For example, a structure in which only one of the openings 342b and 342c is provided so that the conductive film 320a is connected to the conductive film 304, or a structure in which the conductive film 320a is not connected to the conductive film 304 without providing the openings 342b and 342c may be employed. Note that in the case where the conductive film 320a is not connected to the conductive film 304, it is possible to apply different potentials to the conductive film 320a and the conductive film 304.

The conductive film 320b is connected to the conductive film 312b through an opening 342a provided in the insulating films 314, 316, and 318.

Note that the transistor 300D has the S-channel structure described above.

[Structure Example 5 Transistor]

The oxide semiconductor film 308 included in the transistor 300A in FIGS. 31A to 31C may have a stacked-layer structure. FIGS. 50A and 50B and FIGS. 51A and 51B illustrate examples of such a case.

Figure 50A:
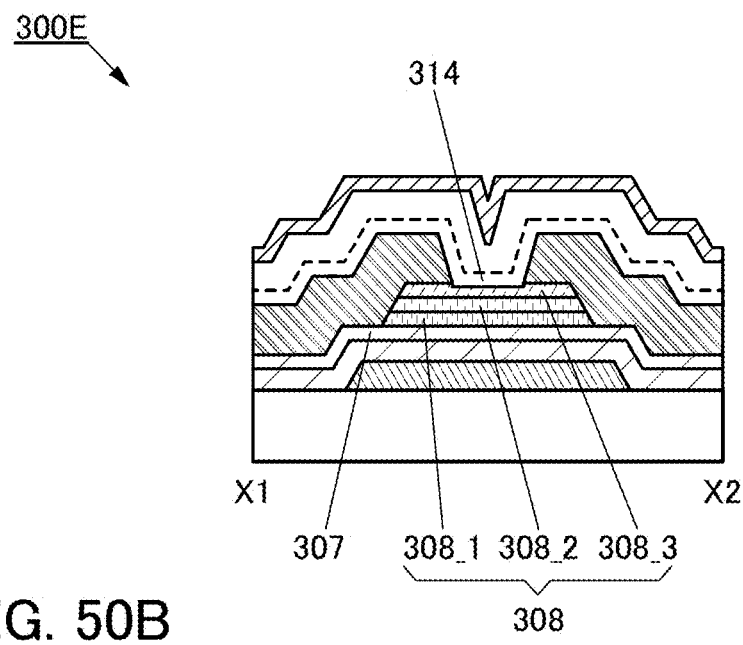
FIGS. 50A and 50B are cross-sectional views illustrating a semiconductor device.
Figure 50B:
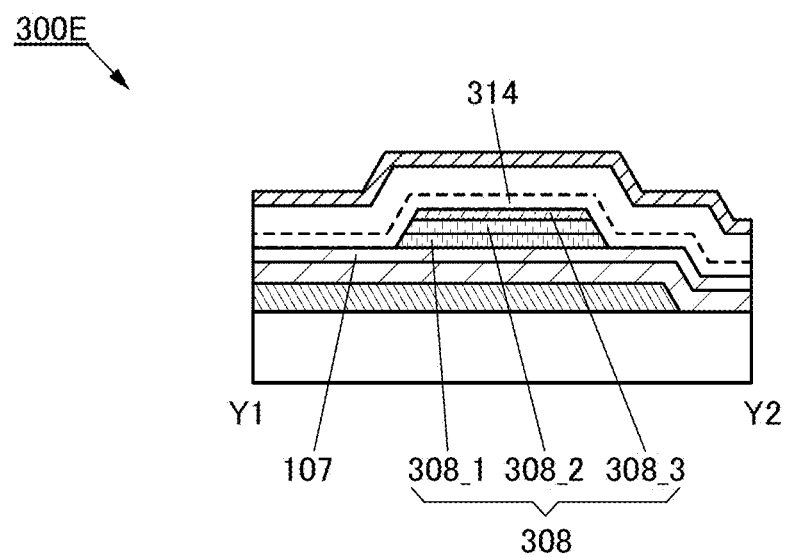
Figure 51A:
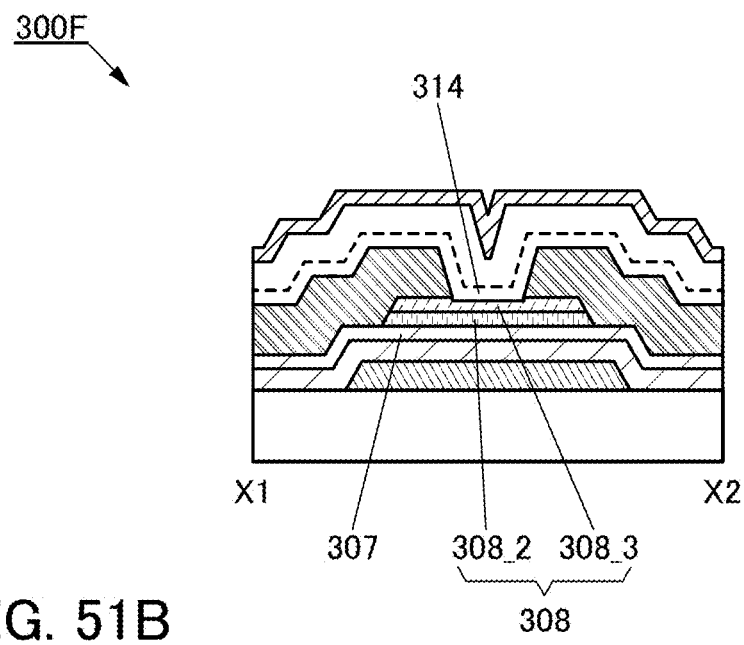
FIGS. 51A and 51B are cross-sectional views illustrating a semiconductor device.
Figure 51B:
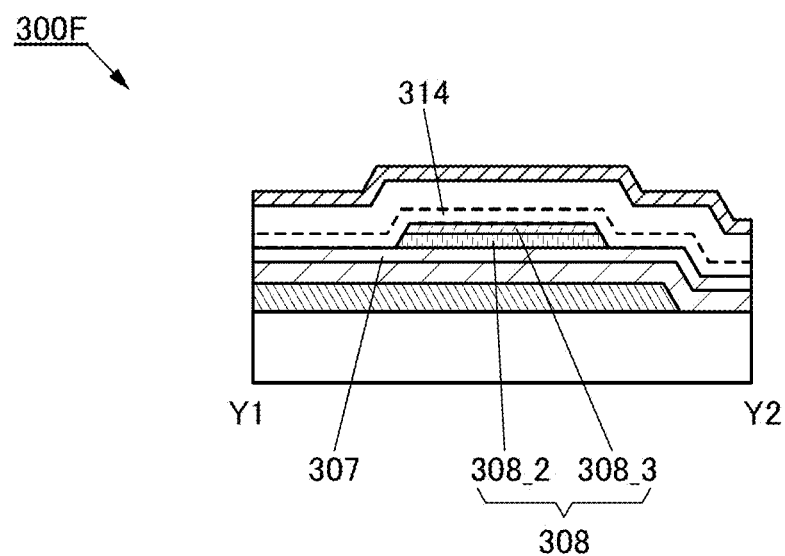

FIGS. 50A and 50B are cross-sectional views of a transistor 300E and FIGS. 51A and 51B are cross-sectional views of a transistor 300F. The top views of the transistors 300E and 300F are similar to that of the transistor 300A illustrated in FIG. 46A.

The oxide semiconductor film 308 of the transistor 300E illustrated in FIGS. 50A and 50B includes an oxide semiconductor film 308_1, an oxide semiconductor film 308_2, and an oxide semiconductor film 308_3. The oxide semiconductor film 308 of the transistor 300F illustrated in FIGS. 51A and 51B includes the oxide semiconductor film 308_2 and the oxide semiconductor film 308_3.

Note that the conductive film 304, the insulating film 306, the insulating film 307, the oxide semiconductor film 308, the oxide semiconductor film 308_1, the oxide semiconductor film 308_2, the oxide semiconductor film 308_3, the conductive films 312a and 312b, the insulating film 314, the insulating film 316, the insulating film 318, and the conductive films 320a and 320b can be formed using the materials of the conductive film 106, the insulating film 116, the insulating film 114, the oxide semiconductor film 108, the oxide semiconductor film 108_1, the oxide semiconductor film 108_2, the oxide semiconductor film 108_3, the conductive films 120a and 120b, the insulating film 104, the insulating film 118, the insulating film 116, and the conductive film 112, respectively, described in the above embodiments.

[Structure Example 6 Transistor]

Figure 52A:
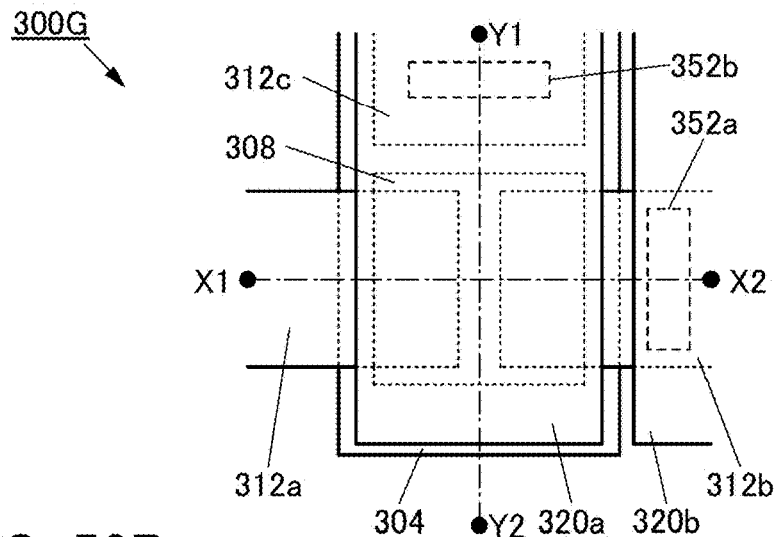
FIGS. 52A to 52C are a top view and cross-sectional views illustrating a semiconductor device.
Figure 52B:
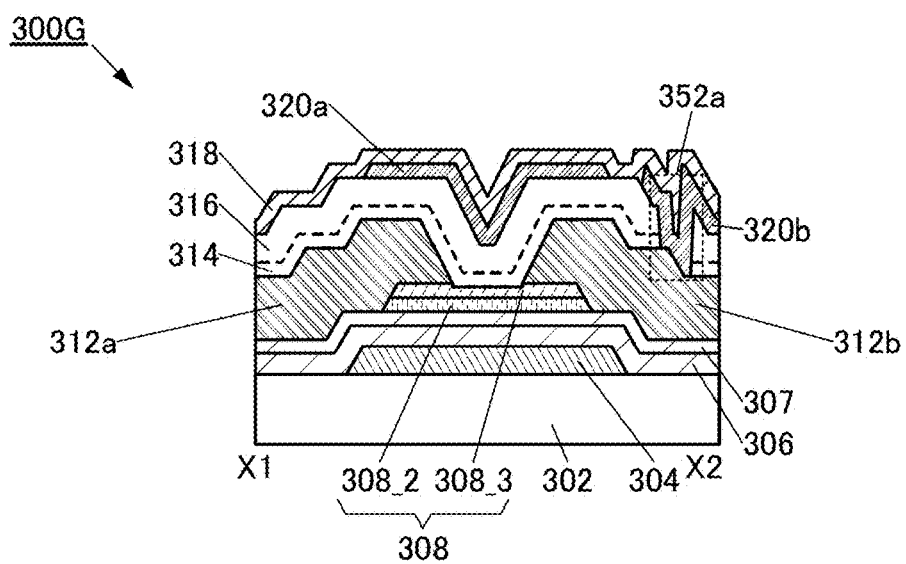
Figure 52C:
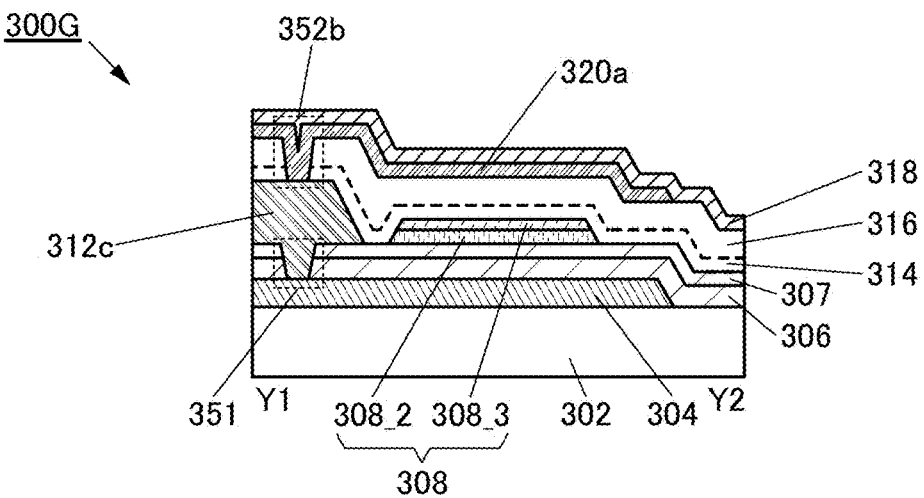

FIG. 52A is a top view of a transistor 300G. FIG. 52B is a cross-sectional view taken along dashed-dotted line X1-X2 in FIG. 52A. FIG. 52C is a cross-sectional view taken along dashed-dotted line Y1-Y2 in FIG. 52A.

The transistor 300G illustrated in FIGS. 52A to 52C includes the conductive film 304 over the substrate 302, the insulating film 306 over the substrate 302 and the conductive film 304, the insulating film 307 over the insulating film 306, the oxide semiconductor film 308 over the insulating film 307, the conductive film 312a over the oxide semiconductor film 308, the conductive film 312b over the oxide semiconductor film 308, the insulating film 314 over the oxide semiconductor film 308 and the conductive films 312a and 312b, the insulating film 316 over the insulating film 314, the conductive film 320a over the insulating film 316, and the conductive film 320b over the insulating film 316.

The insulating films 306 and 307 have an opening 351. A conductive film 312c, which is electrically connected to the conductive film 304 through the opening 351, is formed over the insulating films 306 and 307. The insulating films 314 and 316 have an opening 352a that reaches the conductive film 312b and an opening 352b that reaches the conductive film 312c.

The oxide semiconductor film 308 includes the oxide semiconductor film 308_2 on the conductive film 304 side and the oxide semiconductor film 308_3 over the oxide semiconductor film 308_2.

The insulating film 318 is provided over the transistor 300G. The insulating film 318 is formed to cover the insulating film 316, the conductive film 320a, and the conductive film 320b.

In the transistor 300G, the insulating films 306 and 307 function as first gate insulating films of the transistor 300G, and the insulating films 314 and 316 function as second gate insulating films of the transistor 300G, and the insulating film 318 functions as a protective insulating film of the transistor 300G. Furthermore, in the transistor 300G, the conductive film 304 functions as a first gate electrode, the conductive film 320a functions as a second gate electrode, and the conductive film 320b functions as a pixel electrode used for a display device. Moreover, in the transistor 300G, the conductive film 312a functions as a source electrode, the conductive film 312b functions as a drain electrode, and the conductive film 312c functions as a connection electrode.

Note that the transistor 300G has the S-channel structure described above.

The structures of the transistors 300A to 300G can be freely combined with each other.

At least part of this embodiment can be implemented in combination with any of the other embodiments described in this specification as appropriate.

Embodiment 4

In this embodiment, a semiconductor device including the metal oxide film of one embodiment of the present invention is described with reference to FIG. 53, FIG. 54, and FIG. 55.

<Structural Example 1 of Semiconductor Device>

Figure 53:
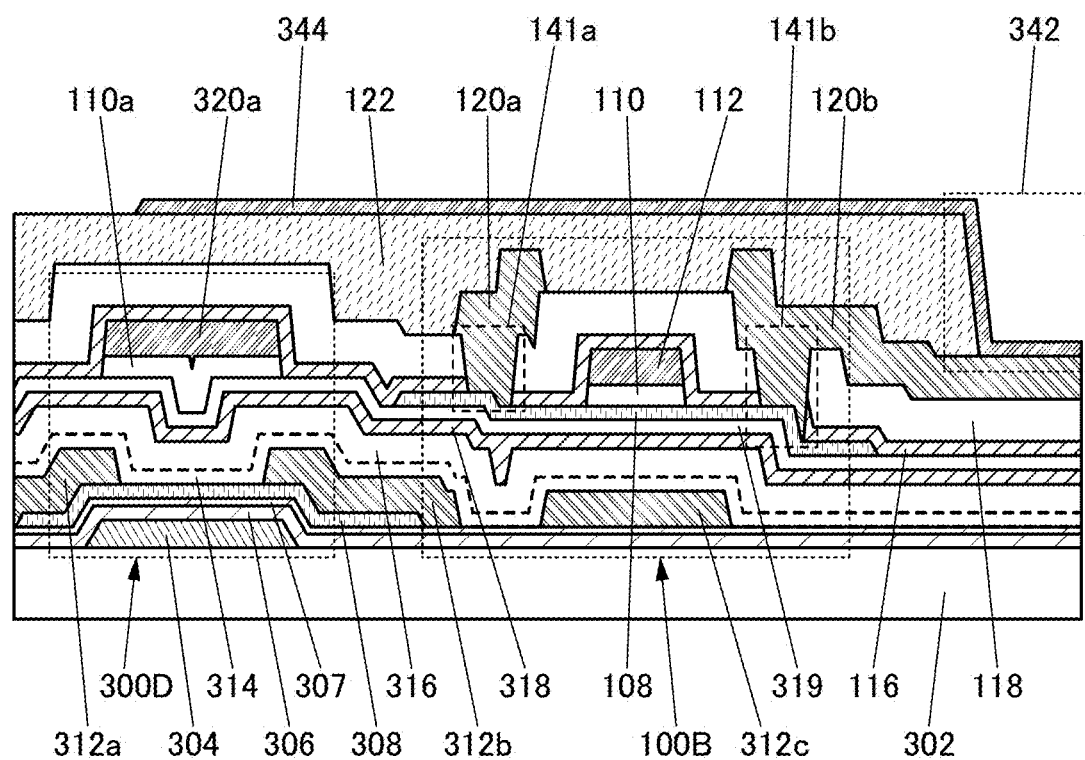
FIG. 53 is a cross-sectional view illustrating a semiconductor device.

FIG. 53 is a cross-sectional view in the channel length (L) direction when the transistor 300D described in Embodiment 3 and the transistor 100B described in Embodiment 2 are stacked.

With the stacked structure of the transistor 300D and the transistor 100B, the area of a region where the transistors are disposed can be reduced.

For example, the structure in FIG. 53 is used for a pixel portion of a display device, whereby the pixel density of the display device can be increased. The arrangement of the transistors in FIG. 53 can increase the aperture ratio of pixels even in the case where the pixel density of the display device is greater than 1000 pixels per inch (ppi) or the pixel density of the display device is greater than 2000 ppi. Note that ppi is a unit indicating the number of pixels per inch.

The structure in this embodiment is different from the above structure in that the transistor 300D and the transistor 100B are stacked.

For example, the structure of transistor 300D in FIG. 53 is different from the above structure as follows.

The transistor 300D in FIG. 53 includes an insulating film 319 and an insulating film 110a between an insulating film 318 and a conductive film 320a.

The material of the insulating film 314 or the insulating film 316 can be used for the insulating film 319. The insulating film 319 is provided so that the oxide semiconductor film 108 is not in contact with the insulating film 318. The insulating film 110a is formed by processing the same insulating film as the insulating film 110. Note that the conductive film 320a included in the transistor 330D and the conductive film 112 included in the transistor 100B are formed by processing the same conductive film.

The transistor 100B in FIG. 53 includes the conductive film 312c instead of the conductive film 106. In addition, the transistor 100B in FIG. 53 includes the insulating films 314, 316, 318, and 319 instead of the insulating film 104. Since the transistor 300D includes the insulating films 314, 316, 318, and 319 instead of the insulating film 104, the number of manufacturing steps of the transistor can be reduced.

In FIG. 53, the conductive film 120b of the transistor 300D is connected to a conductive film 344. The conductive film 344 is electrically connected to the conductive film 120b in the opening 342 provided in the insulating film 122. The material of the conductive film 320a can be used for the conductive film 344. Note that the conductive film 344 serves as a pixel electrode of the display device.

FIG. 53 illustrates the case where the transistor 300D and the transistor 100B are stacked; however, the present invention is not limited thereto. For example, structures illustrated in FIG. 54 and FIG. 55 may be used.

<Structural Example 2 of Semiconductor Device>

Figure 54:
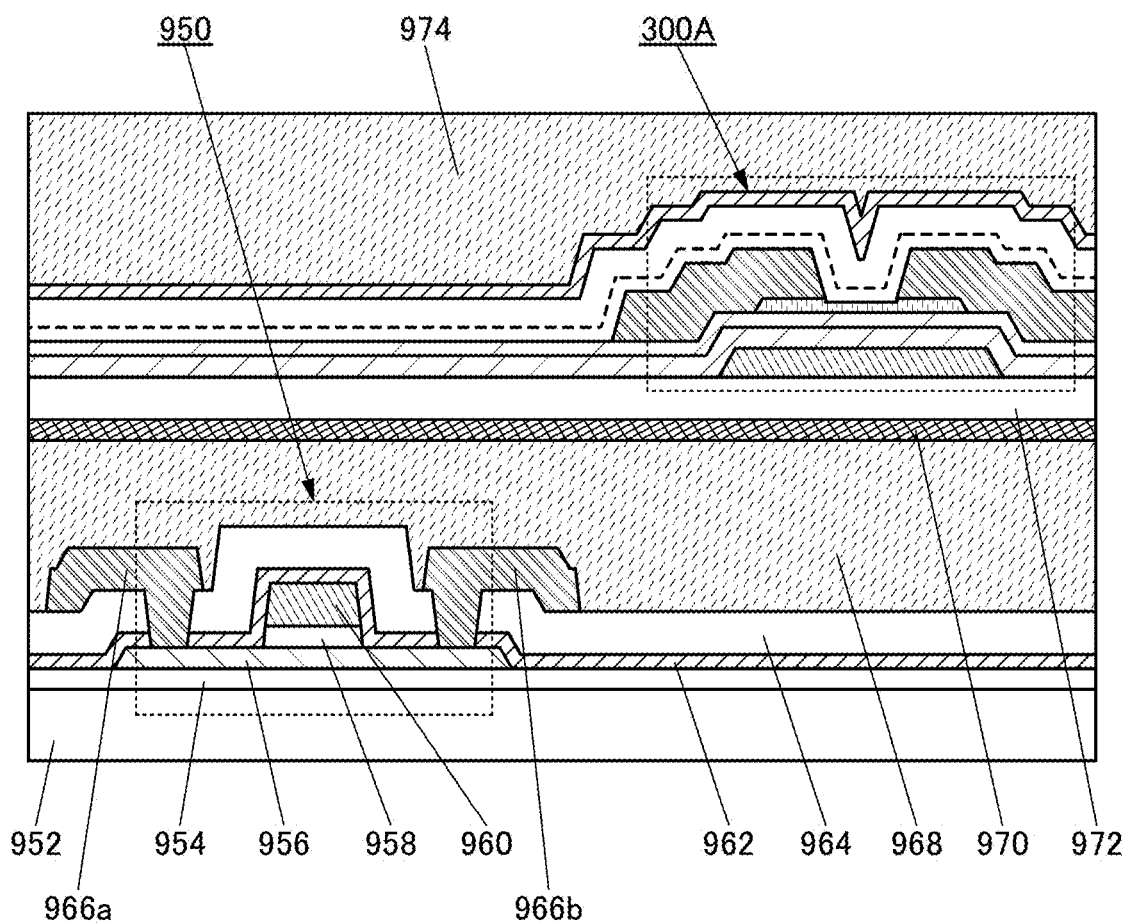
FIG. 54 is a cross-sectional view illustrating a semiconductor device.
Figure 55:
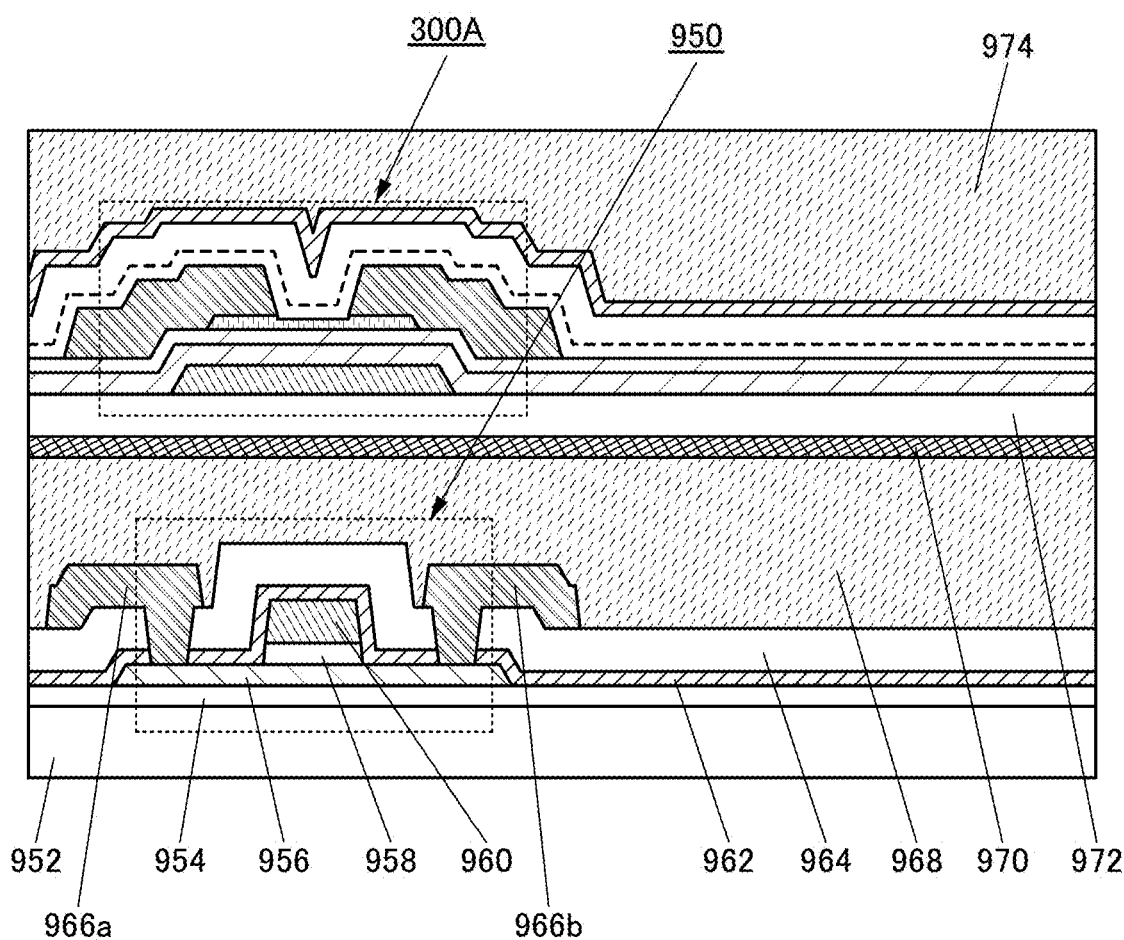
FIG. 55 is a cross-sectional view illustrating a semiconductor device.

FIG. 54 is a cross-sectional view in the channel length (L) direction when the transistor 950 and the transistor 100A described in Embodiment 2 are stacked.

The transistor 950 illustrated in FIG. 54 includes a substrate 952; an insulating film 954 over the substrate 952; a semiconductor film 956 over the insulating film 954; an insulating film 958 over the semiconductor film 956; a conductive film 960 over the insulating film 958, an insulating film 962 over the insulating film 954, the semiconductor film 956, and the conductive film 960; an insulating film 964 over the insulating film 962; and a conductive film 966a and a conductive film 966b which are electrically connected to the semiconductor film 956. An insulating film 968 is provided over the transistor 950.

The semiconductor film 956 includes silicon. In particular, the semiconductor film 956 preferably includes crystalline silicon. The transistor 950 is a transistor that uses low-temperature polysilicon. It is preferable to use the transistor using low-temperature polysilicon in the driver circuit portion of the display device because high field-effect mobility can be obtained. Furthermore, the transistor 300A is preferably used in a pixel portion of the display device to reduce power consumption.

A glass substrate, a plastic substrate, or the like can be used for the substrate 952. The insulating film 954 serves as a base insulating film of the transistor 950. For example, a silicon oxide film, a silicon nitride film, a silicon oxynitride film, a silicon nitride oxide film, or the like can be used as the insulating film 954. The insulating film 958 functions as a gate insulating film of the transistor 950. The materials described above for the insulating film 954 can be used for the insulating film 958. The conductive film 960 functions as a gate electrode of the transistor 950. The material of the conductive films 312a, 312b, 120a, 120b, and the like in the above embodiments can be used for the conductive film 960. The insulating films 962, 964, and 968 serve as a protective insulating film of the transistor 950. The conductive films 966a and 966b serve as a source electrode and a drain electrode of the transistor 950. The same material as the conductive films 312a, 312b, 120a, 120b, and the like in the above embodiments can be used for the conductive films 966a and 966b.

An insulating film 970 and an insulating film 972 are provided between the transistor 950 and the transistor 300A. The insulating film 970 serves as a barrier film. Specifically, the insulating film 970 is formed so that impurities such as hydrogen contained in the transistor 950 do not enter the transistor 300A side. The insulating film 972 serves as a base insulating film of the transistor 300A.

For the insulating film 970, a material which releases a small amount of hydrogen and can inhibit diffusion of hydrogen, such as silicon nitride and aluminum oxide, is preferably used. The insulating film 972 preferably contains excess oxygen. The materials of the insulating films 314 and 316 can be used for the insulating film 972.

Although the transistor 950 is not overlapped with the transistor 300A in FIG. 54, the present invention is not limited thereto. For example, the channel region of the transistor 950 may overlap with the channel region of the transistor 300A as illustrated in FIG. 55. FIG. 55 is a cross-sectional view in the channel length (L) direction when the transistor 950 and the transistor 300A are stacked. With the structure in FIG. 55, the area of a region where the transistors are disposed can be reduced.

Although not illustrated, the transistor 950 and other transistors in Embodiment 2 and Embodiment 3 (e.g., the transistors 100A to 100K and the transistors 300A to 300G) may be stacked.

In this manner, the metal oxide film of one embodiment of the present invention can be favorably used for the structure in which transistors of various shape are stacked.

At least part of this embodiment can be implemented in combination with any of the other embodiments described in this specification as appropriate.

Embodiment 5

In this embodiment, an example of a display device that includes any of the transistors described in the embodiment above will be described below with reference to FIG. 56, FIG. 57, FIG. 58, FIG. 59, FIGS. 60A to 60D, FIG. 61, FIG. 62, and FIG. 63.

Figure 56:
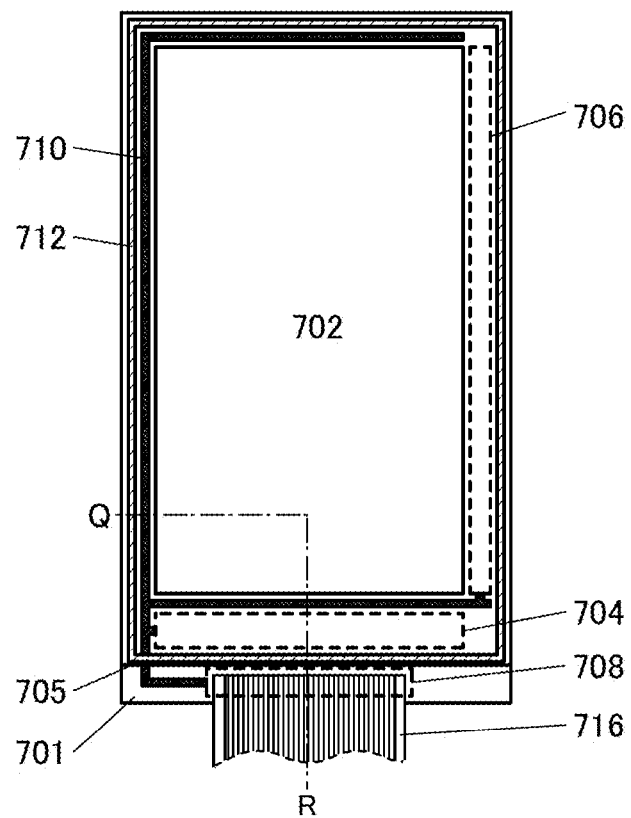
FIG. 56 is a top view illustrating one embodiment of a display device.

FIG. 56 is a top view illustrating an example of a display device. A display device 700 illustrated in FIG. 56 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 56, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. The variety of signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be formed on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a plurality of transistors.

The display device 700 can include any of a variety of elements. As examples of the elements, electroluminescent (EL) element (e.g., an EL element containing organic and inorganic materials, an organic EL element, an inorganic EL element, or an LED), a light-emitting transistor element (a transistor which emits light depending on current), an electron emitter, a liquid crystal element, an electronic ink display, an electrophoretic element, an electrowetting element, a plasma display panel (PDP), a micro electro mechanical systems (MEMS) display (e.g., a grating light valve (GLV), a digital micromirror device (DMD), a digital micro shutter (DMS) element, or an interferometric modulator display (IMOD) element), and a piezoelectric ceramic display can be given.

An example of a display device including an EL element is an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Display devices having electronic ink or electrophoretic elements include electronic paper and the like. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Furthermore, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used to obtain a full-color display device in which white light (W) is used for a backlight (e.g., an organic EL element, an inorganic EL element, an LED, or a fluorescent lamp). As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 57:
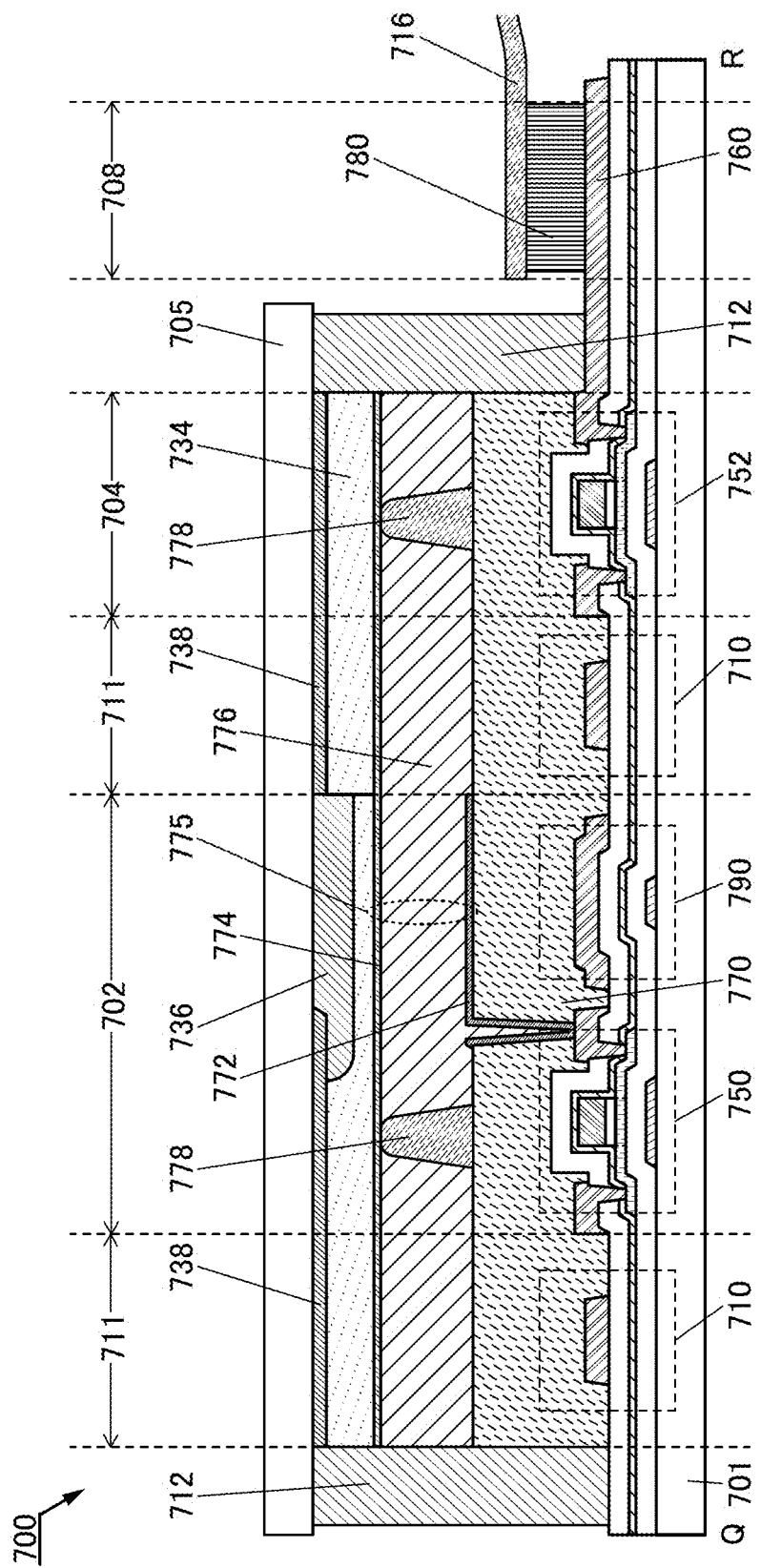
FIG. 57 is a cross-sectional view of one embodiment of a display device.
Figure 58:
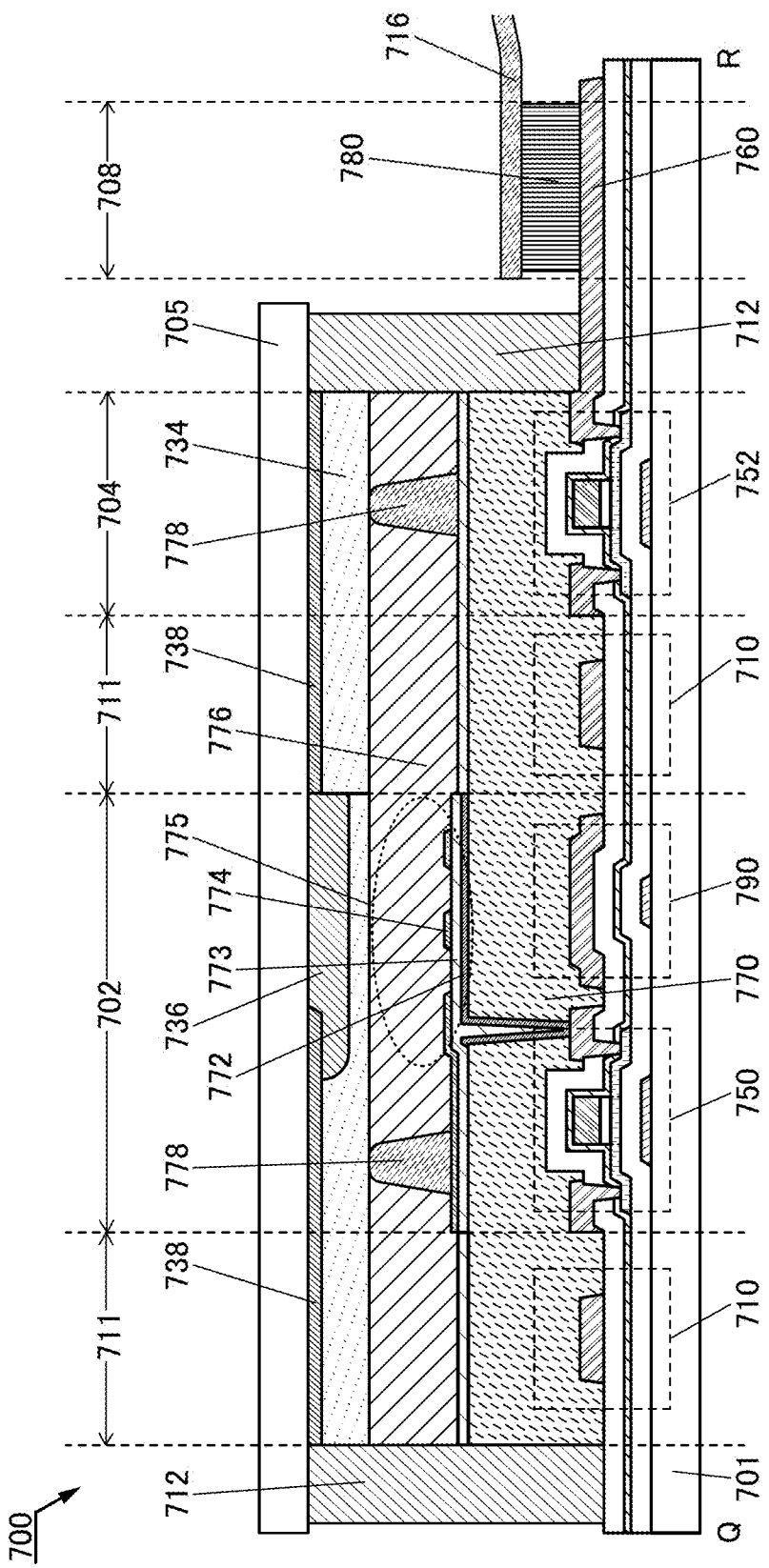
FIG. 58 is a cross-sectional view of one embodiment of a display device.
Figure 59:
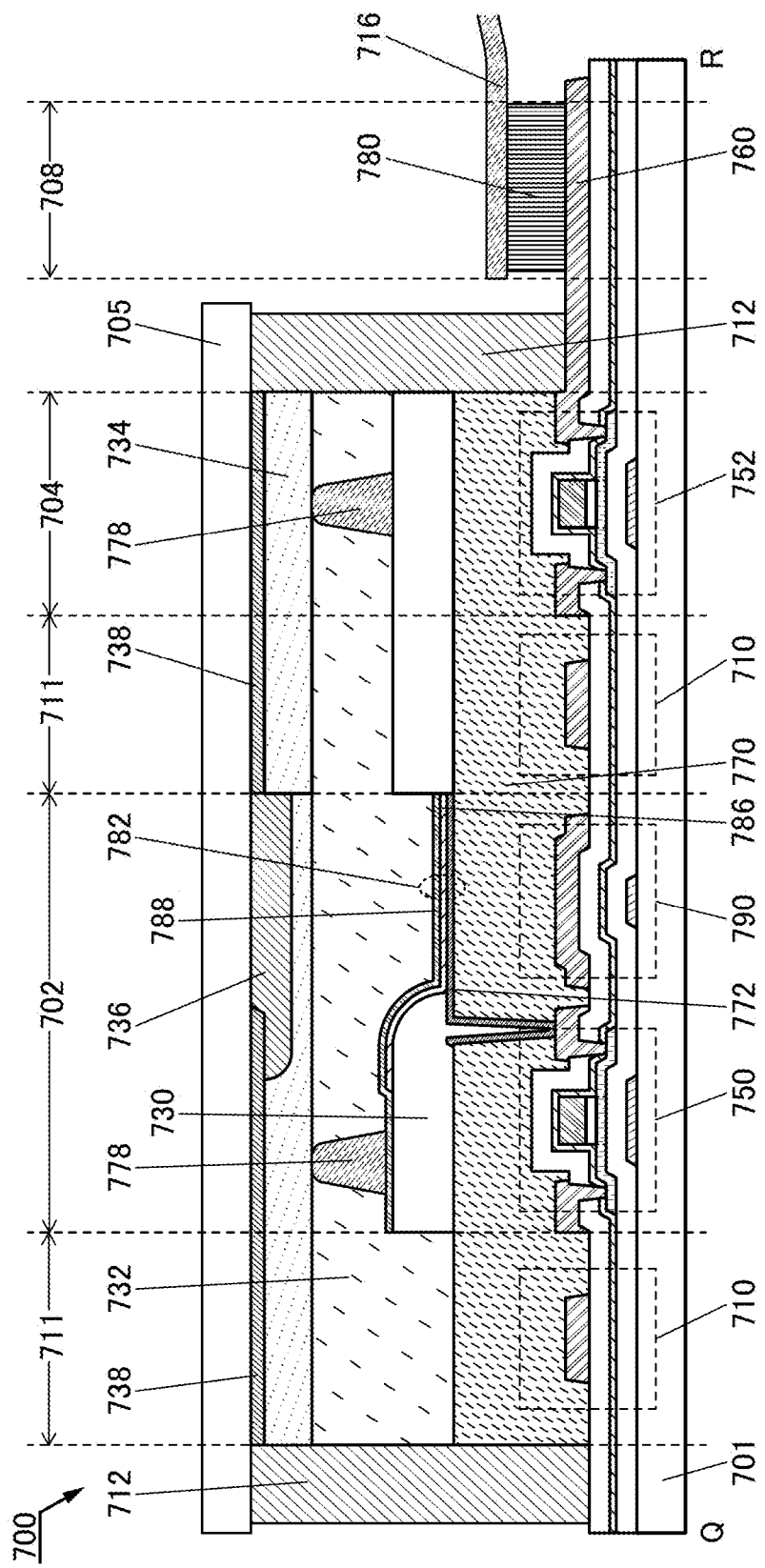
FIG. 59 is a cross-sectional view of one embodiment of a display device.

In this embodiment, a structure including a liquid crystal element and an EL element as display elements is described with reference to FIG. 57, FIG. 58, and FIG. 59. Note that FIG. 57 and FIG. 58 are each a cross-sectional view taken along the dashed-dotted line Q-R shown in FIG. 56 and show a structure including a liquid crystal element as a display element. FIG. 59 is a cross-sectional view taken along dashed-dotted line Q-R in FIG. 56 and illustrates the structure including an EL element as a display element.

Portions common to FIG. 57, FIG. 58, and FIG. 59 are described first, and then different portions are described.

[Common Portions in Display Devices]

The display device 700 illustrated in FIG. 57, FIG. 58, and FIG. 59 include a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100B described above. Note that the transistor 750 and the transistor 752 may each have the structure of any of the other transistors described in the above embodiments.

The transistors used in this embodiment each include an oxide semiconductor film which is highly purified and in which formation of oxygen vacancies is suppressed. The transistor can have low off-state current. Accordingly, an electrical signal such as an image signal can be held for a longer period, and a writing interval can be set longer in an on state. Accordingly, the frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

A capacitor 790 includes a lower electrode that is formed through a step of processing the same conductive film as a conductive film functioning as a first gate electrode of the transistor 750 and an upper electrode that is formed through a step of processing the same conductive film as a conductive film functioning as a source electrode or a drain electrode of the transistor 750. Furthermore, between the lower electrode and the upper electrode, an insulating film that is formed through a step of forming the same insulating film as an insulating film functioning as a first gate insulating film of the transistor 750 and an insulating film that is formed through a step of forming the same insulating film as an insulating film functioning as a protective insulating film of the transistor 750 are provided. That is, the capacitor 790 has a stacked-layer structure in which the insulating films functioning as a dielectric film are positioned between a pair of electrodes.

In FIG. 57, FIG. 58, and FIG. 59, a planarization insulating film 770 is provided over the transistor 750, the transistor 752, and the capacitor 790.

Although FIG. 57, FIG. 58, and FIG. 59 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a top-gate transistor is used in the pixel portion 702 and a bottom-gate transistor is used in the source driver circuit portion 704, or a structure in which a bottom-gate transistor is used in the pixel portion 702 and a top-gate transistor is used in the source driver circuit portion 704 may be employed. Note that the term "source driver circuit portion 704" can be replaced by the term "gate driver circuit portion".

The signal line 710 is formed through the same process as the conductive films functioning as source electrodes and drain electrodes of the transistors 750 and 752. In the case where the signal line 710 is formed using a material including a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

[Structure Example of Display Device Using Liquid Crystal Element]

The display device 700 illustrated in FIG. 57 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 illustrated in FIG. 57 can display an image in such a manner that transmission or non-transmission of light is controlled by the alignment state in the liquid crystal layer 776 which is changed depending on the voltage applied to between the conductive film 772 and the conductive film 774.

The conductive film 772 is electrically connected to the conductive film that functions as a source electrode and a drain electrode included in the transistor 750. The conductive film 772 is formed over the planarization insulating film 770 to function as a pixel electrode, i.e., one electrode of the display element.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver may be used for the conductive film that reflects visible light.

In the case where a conductive film that reflects visible light is used as the conductive film 772, the display device 700 becomes a reflective-type liquid crystal display device. In the case where a conductive film that transmits visible light is used as the conductive film 772, the display device 700 becomes a transmissive liquid crystal display device.

When a structure over the conductive film 772 is changed, a driving method of the liquid crystal element can be changed. An example of this case is illustrated in FIG. 58. The display device 700 illustrated in FIG. 58 is an example of employing a transverse electric field mode (e.g., an FFS mode) as a driving mode of the liquid crystal element. In the structure illustrated in FIG. 58, an insulating film 773 is provided over the conductive film 772 and the conductive film 774 is provided over the insulating film 773. In such a structure, the conductive film 774 functions as a common electrode, and an electric field generated between the conductive film 772 and the conductive film 774 through the insulating film 773 can control the alignment state of the liquid crystal layer 776.

Although not illustrated in FIG. 57 and FIG. 58, the conductive film 772 and/or the conductive film 774 may be provided with an alignment film on a side in contact with the liquid crystal layer 776. Although not illustrated in FIG. 57 and FIG. 58, an optical member (optical substrate) or the like, such as a polarizing member, a retardation member, or an anti-reflection member, may be provided as appropriate. For example, circular polarization may be employed by using a polarizing substrate and a retardation substrate. In addition, a backlight, a side light, or the like may be used as a light source.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy, which makes the alignment process unneeded. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Moreover, the liquid crystal material which exhibits a blue phase has a small viewing angle dependence.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Furthermore, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

[Display Device Including Light-Emitting Element]

The display device 700 illustrated in FIG. 59 includes a light-emitting element 782. The light-emitting element 782 includes a conductive film 772, an EL layer 786, and a conductive film 788. The display device 700 shown in FIG. 59 is capable of displaying an image by light emission from the EL layer 786 included in the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. The quantum dot containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

The EL layer 786 can be formed using the above-described organic compound and the inorganic compound by a method such as an evaporation method (including a vacuum evaporation method), a droplet discharging method (also referred to as an ink-jet method), a coating method, or a gravure printing method. A low molecular material, a middle molecular material (including an oligomer and a dendrimer), or a high molecular material may be included in the EL layer 786.

Here, a method for forming the EL layer 786 by a droplet discharge method is described with reference to FIGS. 60A to 60D. FIGS. 60A to 60D are cross-sectional views illustrating the method for forming the EL layer 786.

Figure 60A:
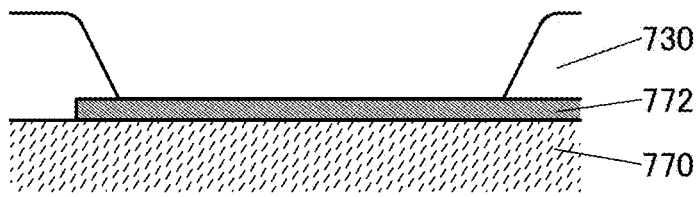
FIGS. 60A to 60D are cross-sectional views illustrating a method for forming an EL layer.
Figure 60B:
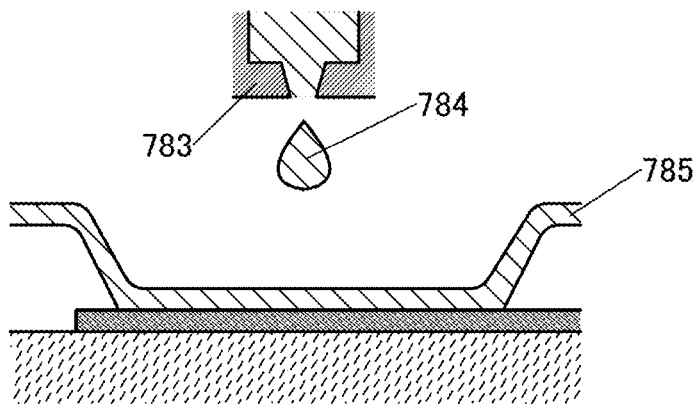

First, the conductive film 772 is formed over the planarization insulating film 770, and an insulating film 730 is formed to cover part of the conductive film 772 (see FIG. 60A).

Next, a droplet 784 is discharged to an exposed portion of the conductive film 772, which is an opening of the insulating film 730, from a droplet discharge apparatus 783, so that a layer 785 containing a composition is formed. The droplet 784 is a composition containing a solvent and is attached over the conductive film 772 (see FIG. 60B).

Note that the method for discharging the droplet 784 may be performed under reduced pressure.

Figure 60C:
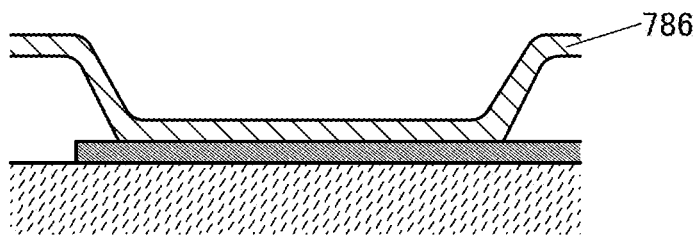

Then, the solvent is removed from the layer 785 containing the composition, and the resulting layer is solidified to form the EL layer 786 (see FIG. 60C).

The solvent may be removed by drying or heating.

Figure 60D:
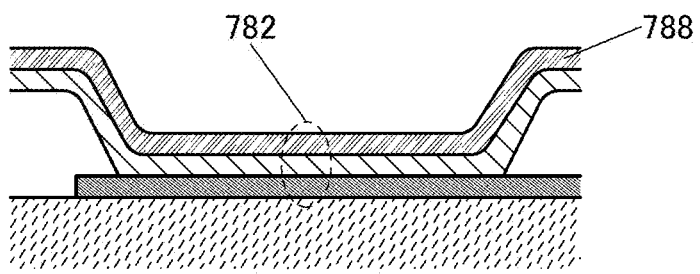

Next, the conductive film 788 is formed over the EL layer 786; thus, the light-emitting element 782 is formed (see FIG. 60D)

When the EL layer 786 is formed by a droplet discharging method as described above, the composition can be selectively discharged; accordingly, waste of material can be reduced. Furthermore, a lithography process or the like for shaping is not needed, and thus, the process can be simplified and cost reduction can be achieved.

The droplet discharge method described above is a general term for a means including a nozzle equipped with a composition discharge opening or a means to discharge droplets such as a head having one or a plurality of nozzles.

Figure 61:
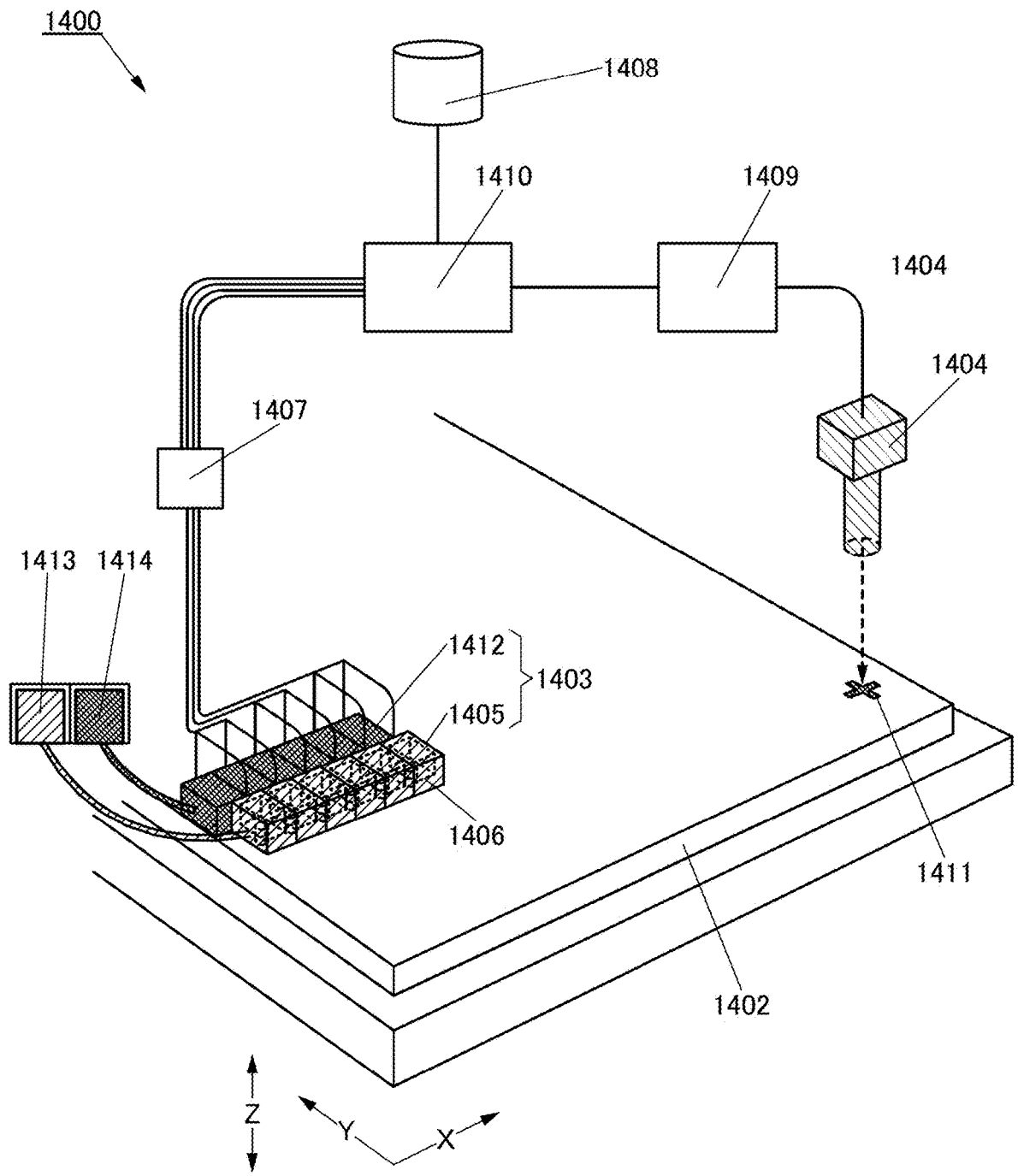
FIG. 61 is a conceptual diagram illustrating a droplet discharge apparatus.

Next, a droplet discharge apparatus used for the droplet discharge method is described with reference to FIG. 61. FIG. 61 is a conceptual diagram illustrating a droplet discharge apparatus 1400.

The droplet discharge apparatus 1400 includes a droplet discharge means 1403. In addition, the droplet discharge means 1403 is equipped with a head 1405 and a head 1412.

The heads 1405 and 1412 are connected to a control means 1407, and this control means 1407 is controlled by a computer 1410; thus, a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409. Then, the digital signal is recognized by the computer 1410, and then, a control signal is generated and transmitted to the control means 1407.

An image sensor or the like using a charge coupled device (CCD) or a complementary metal oxide semiconductor (CMOS) can be used as the imaging means 1404. Data about a pattern to be formed over the substrate 1402 is stored in a storage medium 1408, and the control signal is transmitted to the control means 1407 based on the data, so that each of the heads 1405 and 1412 of the droplet discharging means 1403 can be individually controlled. The heads 1405 and 1412 are supplied with a material to be discharged from material supply sources 1413 and 1414 through pipes, respectively.

Inside the head 1405, a space as indicated by a dotted line 1406 to be filled with a liquid material and a nozzle which is a discharge outlet are provided. Although it is not shown, an inside structure of the head 1412 is similar to that of the head 1405. When the nozzle sizes of the heads 1405 and 1412 are different from each other, different materials with different widths can be discharged simultaneously. Each head can discharge and draw a plurality of light emitting materials. In the case of drawing over a large area, the same material can be simultaneously discharged to be drawn from a plurality of nozzles in order to improve throughput. When a large substrate is used, the heads 1405 and 1412 can freely scan the substrate in directions indicated by arrows X, Y, and Z in FIG. 61, and a region in which a pattern is drawn can be freely set. Thus, a plurality of the same patterns can be drawn over one substrate.

Further, a step of discharging the composition may be performed under reduced pressure. Also, a substrate may be heated when the composition is discharged. After discharging the composition, either drying or baking or the both is performed. Both the drying and baking are heat treatments but different in purpose, temperature, and time period. The steps of drying and baking are performed under normal pressure or under reduced pressure by laser irradiation, rapid thermal annealing, heating using a heating furnace, or the like. Note that the timing of the heat treatment and the number of times of the heat treatment are not particularly limited. The temperature for performing each of the steps of drying and baking in a favorable manner depends on the materials of the substrate and the properties of the composition.

In the above manner, the EL layer 786 can be formed with the droplet discharge apparatus.

The display device 700 shown in FIG. 59 is described again.

In the display device 700 in FIG. 59, an insulating film 730 is provided over the planarization insulating film 770 and the conductive film 772. The insulating film 730 covers part of the conductive film 772. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 772 side, or a dual-emission structure in which light is emitted to both the conductive film 772 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although a structure with the coloring film 736 is described as the display device 700 in FIG. 59, the structure is not limited thereto. In the case where the EL layer 786 is formed by a separate coloring method, the coloring film 736 is not necessarily provided.

[Structure Example of Display Device Provided with Input/Output Device]

An input/output device may be provided in the display device 700 illustrated in FIG. 58 and FIG. 59. As an example of the input/output device, a touch panel or the like can be given.

Figure 62:
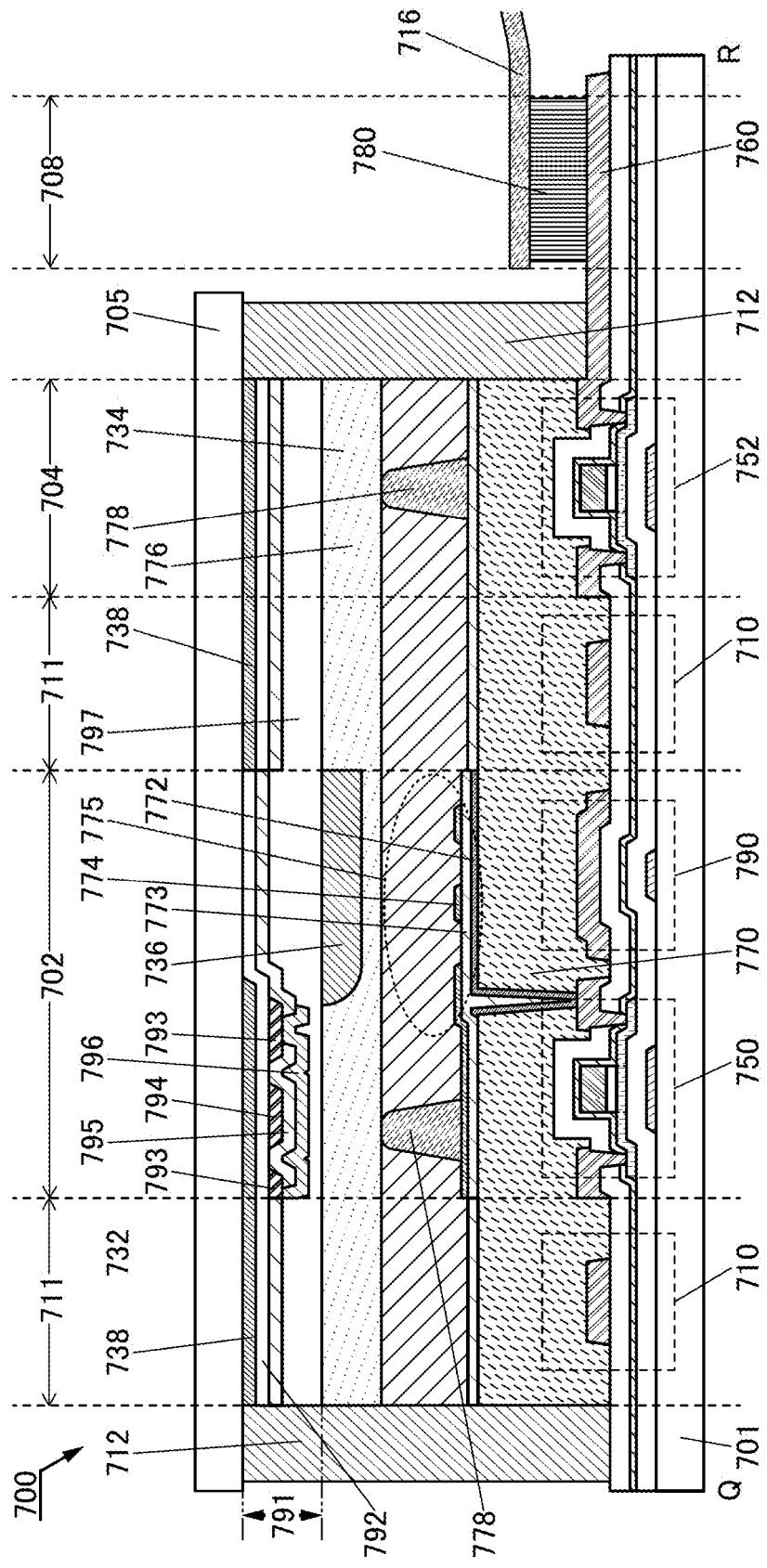
FIG. 62 is a cross-sectional view of one embodiment of a display device.
Figure 63:
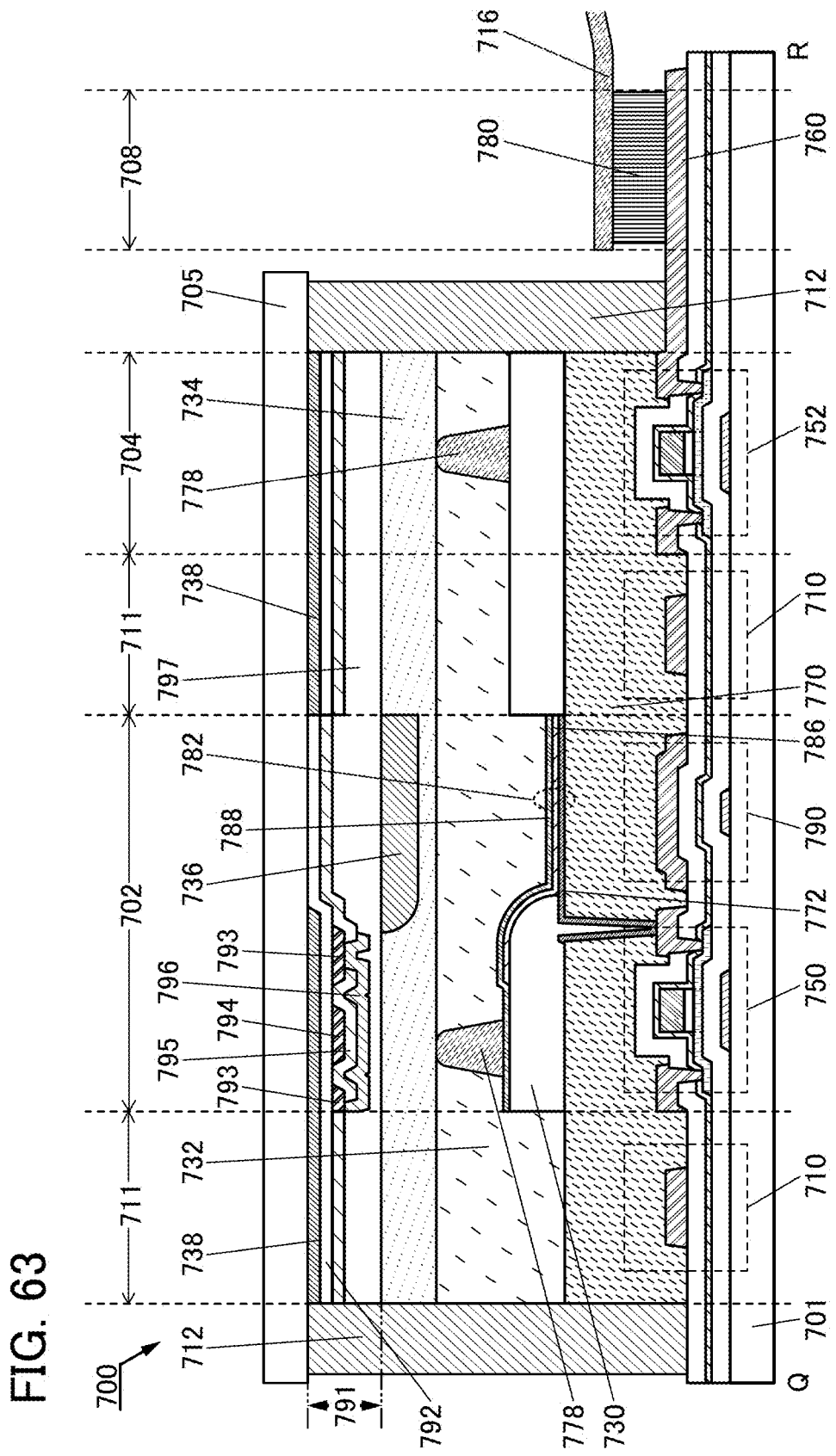
FIG. 63 is a cross-sectional view of one embodiment of a display device.

FIG. 62 illustrates a structure in which the display device 700 shown in FIG. 58 includes a touch panel 791. FIG. 63 illustrates a structure in which the display device 700 shown in FIG. 59 includes the touch panel 791.

FIG. 62 is a cross-sectional view of the structure in which the touch panel 791 is provided in the display device 700 illustrated in FIG. 58. FIG. 63 is a cross-sectional view of the structure in which the touch panel 791 is provided in the display device 700 illustrated in FIG. 59.

First, the touch panel 791 illustrated in FIG. 62 and FIG. 63 is described below.

The touch panel 791 illustrated in FIG. 62 and FIG. 63 is an in-cell touch panel provided between the substrate 705 and the coloring film 736. The touch panel 791 is formed on the substrate 705 side before the light-blocking film 738 and the coloring film 736 are formed.

The touch panel 791 includes the light-blocking film 738, an insulating film 792, an electrode 793, an electrode 794, an insulating film 795, an electrode 796, and an insulating film 797. A change in the mutual capacitance between the electrode 793 and the electrode 794 can be sensed when an object such as a finger or a stylus approaches, for example.

A portion in which the electrode 793 intersects with the electrode 794 is illustrated in the upper portion of the transistor 750 illustrated in FIG. 62 and FIG. 63. Through openings in the insulating film 795, the electrode 796 is electrically connected to the two electrodes 793 between which the electrode 794 is positioned. Note that a structure in which a region where the electrode 796 is provided is provided in the pixel portion 702 is illustrated in FIG. 62 and FIG. 63 as an example; however, one embodiment of the present invention is not limited thereto. For example, the region where the electrode 796 is provided may be provided in the source driver circuit portion 704.

The electrodes 793 and 794 are provided in a region overlapping with the light-blocking film 738. As illustrated in FIG. 62, it is preferable that the electrode 793 do not overlap with the light-emitting element 782. As illustrated in FIG. 63, it is preferable that the electrode 793 do not overlap with the liquid crystal element 775. In other words, the electrode 793 has an opening in its region overlapping with the light-emitting element 782 and the liquid crystal element 775. That is, the electrode 793 has a mesh shape. With this structure, the electrode 793 does not block light emitted from the light-emitting element 782. Alternatively, the electrode 793 can have a structure which does not block light transmitted through the liquid crystal element 775. Thus, since luminance is hardly reduced even when the touch panel 791 is placed, a display device with high visibility and low power consumption can be achieved. Note that the electrode 794 can have a similar structure.

In addition, since the electrodes 793 and 794 do not overlap with the light-emitting element 782, the electrodes 793 and 794 can be formed using a metal material with low visible light transmittance. In the case where the electrode 793 and the electrode 794 do not overlap with the liquid crystal element 775, a metal material having low transmittance with respect to visible light can be used for the electrode 793 and the electrode 794.

Accordingly, the resistance of the electrodes 793 and 794 can be reduced as compared with an electrode using an oxide material with high visible light transmittance, so that the sensitivity of the touch panel can be increased.

For example, conductive nanowires may be used for the electrodes 793, 794, and 796. The nanowires may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where a Ag nanowire is used for any one of or all of the electrodes 664, 665, and 667, the transmittance of visible light can be greater than or equal to 89% and the sheet resistance can be greater than or equal to 40 Ω/square and less than or equal to 100 Ω/square.

Although the structure of the in-cell touch panel is illustrated in FIG. 62 and FIG. 63, one embodiment of the present invention is not limited thereto. For example, a touch panel formed over the display device 700 (an on-cell touch panel), or a touch panel attached to the display device 700 (an out-cell touch panel) may be used.

In this manner, the display device of one embodiment of the present invention can be combined with various types of touch panels.

At least part of this embodiment can be implemented in combination with any of the other embodiments described in this specification as appropriate.

Embodiment 6

In this embodiment, an example of a semiconductor device of one embodiment of the present invention will be described. A transistor in this embodiment is suitable for miniaturization.

Figure 64A:
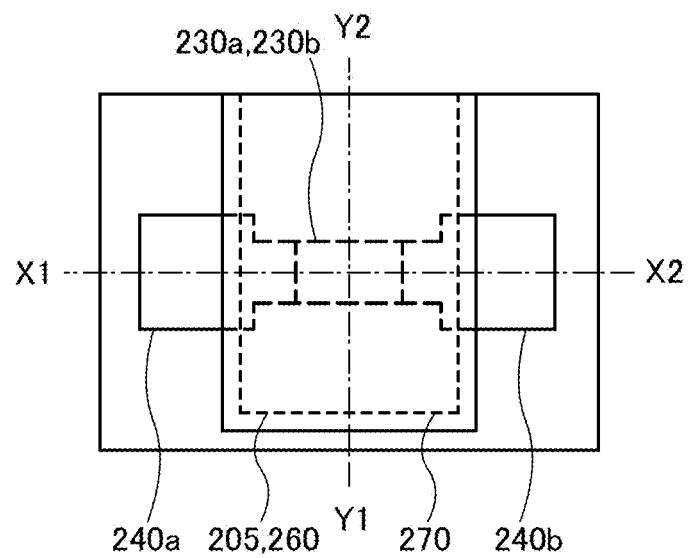
FIGS. 64A to 64C are a top view and cross-sectional views illustrating a semiconductor device.
Figure 64B:
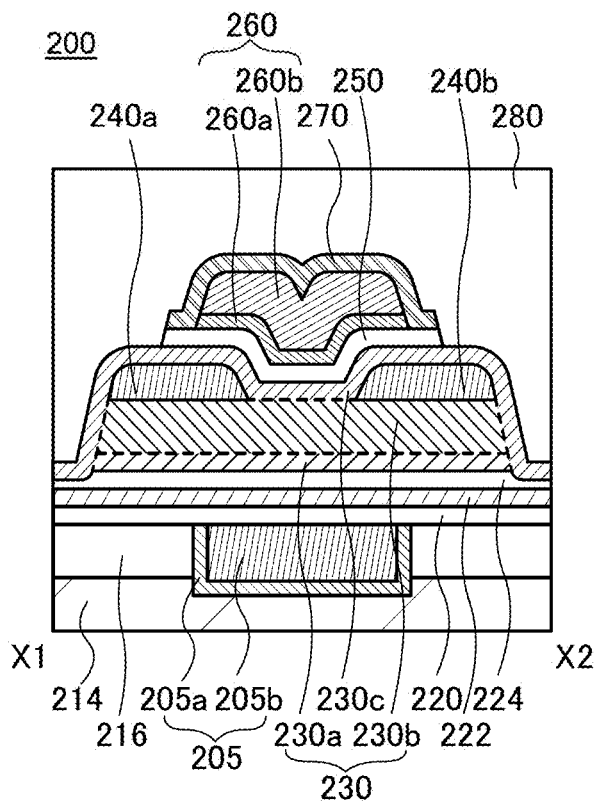
Figure 64C:
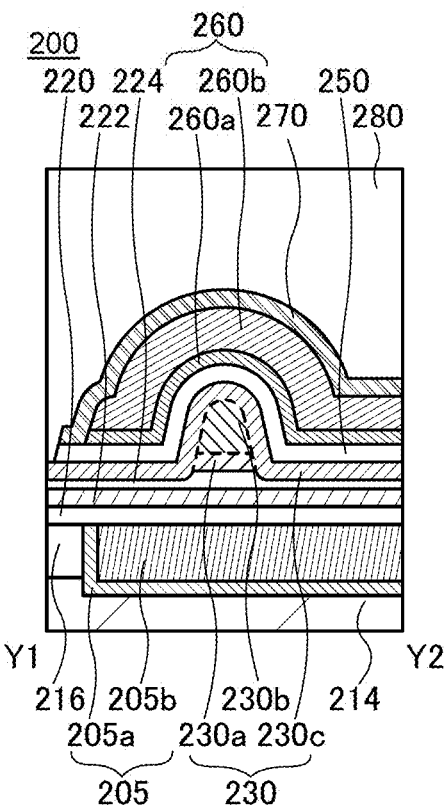

FIGS. 64A to 64C illustrate a top surface of a transistor 200. FIG. 64A illustrates a top surface of the transistor 200. For simplification of the figure, some films are omitted in FIG. 64A. FIG. 64B is a cross-sectional view taken along dashed-dotted line X1-X2 in FIG. 64A. FIG. 64C is a cross-sectional view taken along dashed-dotted line Y1-Y2 in FIG. 64A.

The transistor 200 includes a conductor 205 (a conductor 205a and a conductor 205b) and a conductor 260 (a conductor 260a and a conductor 260b) that function as gate electrodes; an insulator 220, an insulator 222, an insulator 224, and an insulator 250 that function as gate insulating layers; an oxide semiconductor 230 (an oxide semiconductor 230a, an oxide semiconductor 230b, and an oxide semiconductor 230c) that includes a region where a channel is formed; a conductor 240a that functions as one of a source and a drain; a conductor 240b that functions as the other of the source and the drain; and an insulator 280 that includes excess oxygen.

The oxide semiconductor 230 includes the oxide semiconductor 230a, the oxide semiconductor 230b over the oxide semiconductor 230a, and the oxide semiconductor 230c over the oxide semiconductor 230b. When the transistor 200 is turned on, a current flows (a channel is formed) mainly in the oxide semiconductor 230b. Although current sometimes flows through a region in the vicinity of the interface (a mixed region in some cases) between the oxide semiconductor 230b and the oxide semiconductors 230a and 230c, the oxide semiconductors 230a and 230c function as insulators at the other region.

FIGS. 64A to 64C illustrate a stacked-layer structure in which the conductor 260 serving as a gate electrode includes the conductor 260a and the conductor 260b. The insulator 270 is provided over the conductor 260 serving as a gate electrode.

The conductor 205 is formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

For example, a conductor having a barrier property with respect to hydrogen, e.g., tantalum nitride, may be used as the conductor 205a, and tungsten, which has high conductivity, may be stacked thereover as the conductor 205b. The use of the combination of the materials can prevent diffusion of hydrogen into the oxide semiconductor 230 while conductivity of a wiring is ensured. A two-layer structure of a conductor 205a and a conductor 205b is shown in FIGS. 64A and 64B, but the structure of the conductor 205 is not limited thereto, and a single-layer structure or a stacked-layer structure of three or more layers may be used.

Each of the insulators 220 and 224 is preferably an insulator containing oxygen, such as a silicon oxide film or a silicon oxynitride film. In particular, the insulator 224 is preferably an insulator containing excess oxygen (containing oxygen in excess of that in the stoichiometric composition). In the case where such an insulator containing excess oxygen is provided in contact with an oxide in the transistor 200, oxygen vacancies in the oxide can be compensated. Note that the insulators 220 and 224 are not necessarily formed of the same material.

The insulator 222 preferably has a single-layer structure or a stacked-layer structure formed using an insulator containing a high-k material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Note that the insulator 222 may have a stacked-layer structure of two or more layers. In this case, the stacked layers are not necessarily formed of the same material but may be formed of different materials.

In the case where the insulator 222 including a high-k material is provided between the insulator 220 and the insulator 224, electrons can be trapped in the insulator 222 under specific conditions, and the threshold voltage can be increased. As a result, the insulator 222 is negatively charged in some cases.

For example, in the case where the insulator 220 and the insulator 224 are formed using silicon oxide and the insulator 222 is formed using a material having a lot of electron trap states such as hafnium oxide, aluminum oxide, or tantalum oxide, the state where the potential of the conductor 205 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide in the transistor 200 to the conductor 205. At this time, some of the moving electrons are trapped by the electron trap states of the insulator 222.

In the transistor in which a necessary amount of electrons is trapped by the electron trap states of the insulator 222, the threshold voltage is shifted in the positive direction. By controlling the voltage of the conductor 205, the amount of electrons to be trapped can be controlled, and thus the threshold voltage can be controlled. The transistor 200 having the structure is a normally-off transistor which is in a non-conduction state (also referred to as an off state) even when the gate voltage is 0 V.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging.

The threshold voltages can be controlled by appropriate adjustment of the thicknesses of the insulator 220, the insulator 222, and the insulator 224. A transistor having a low leakage current in an off state can be provided. A transistor with stable electrical characteristics can be provided. A transistor having a high on-state current can be provided. A transistor with a small subthreshold swing value can be provided. A highly reliable transistor can be provided.

The oxide semiconductor 230a, the oxide semiconductor 230b, and the oxide semiconductor 230c are formed using metal oxide such as In-M-Zn oxide (M is Al, Ga, Y, or Sn). In—Ga oxide or In—Zn oxide may be used as the oxide semiconductor 230.

The insulator 250 can have a single-layer structure or a stacked-layer structure using, for example, one or more of an insulator containing a high-k material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), and $(Ba,Sr)TiO_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

As the insulator 250, like the insulator 224, an oxide insulator that contains oxygen in excess of the stoichiometric composition is preferably used. When such an insulator containing excess oxygen is provided in contact with the oxide semiconductor 230, oxygen vacancies in the oxide semiconductor 230 can be reduced.

As the insulator 250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties with respect to oxygen and hydrogen, can be used. The insulator formed of such a material functions as a layer that prevents release of oxygen from the oxide semiconductor 230 or entry of an impurity such as hydrogen from the outside.

Note that the insulator 250 may have a stacked-layer structure similar to that of the insulator 220, the insulator 222, and the insulator 224. When the insulator 250 includes an insulator in which a necessary amount of electrons is trapped by electron trap states, the threshold voltage of the transistor 200 can be shifted in the positive direction. The transistor 200 having the structure is a normally-off transistor which is in a non-conduction state (also referred to as an off state) even when the gate voltage is 0 V.

In addition to the insulator 250, a barrier film may be provided between the oxide semiconductor 230 and the conductor 260 in the semiconductor device illustrated in FIGS. 64A and 64B. The oxide semiconductor 230c may have a barrier property.

For example, an insulating film containing excess oxygen is provided in contact with the oxide semiconductor 230 and covered by a barrier film, whereby the composition of the oxide can be almost the same as the stoichiometric composition or can be in a supersaturated state containing more oxygen than that in the stoichiometric composition. It is also possible to prevent entry of impurities such as hydrogen into the oxide semiconductor 230.

One of a pair of the conductor 240a and the conductor 240b functions as a source electrode, and the other pair functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 240a and 240b. Although a single layer structure is shown in figures, a stacked-layer structure of two or more layers may be used.

For example, a titanium film and an aluminum film are may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

The conductor 260 functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. Furthermore, one or both of manganese and zirconium may be used. Alternatively, a semiconductor typified by polycrystalline silicon doped with an impurity element such as phosphorus, or a silicide such as nickel silicide may be used.

For example, a two-layer structure in which a titanium film is stacked over an aluminum film. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. Alternatively, an alloy film or a nitride film that contains aluminum and one or more elements selected from titanium, tantalum, tungsten, molybdenum, chromium, neodymium, and scandium may be used.

The conductor 260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

The conductor 260a is formed by a thermal CVD method, an MOCVD method, and an ALD method. In particular, the conductor 260a is preferably formed by an atomic layer deposition (ALD) method. Plasma damage to the insulator 250 can be reduced by using an ALD method and the like. In addition, the ALD method is preferable because coverage can be improved. Accordingly, a highly reliable transistor 200 can be provided.

The conductor 260b is formed by a material with high conductivity such as tantalum, tungsten, copper, or aluminum.

The insulator 270 may be provided to cover the conductor 260. In the case where the insulator 280 is formed using an oxide material from which oxygen is released, the insulator 270 is formed using a substance having a barrier property with respect to oxygen to prevent the conductor 260 from being oxidized by the released oxygen.

For example, the insulator 270 can be formed using metal oxide such as aluminum oxide. The insulator 270 is formed to a thickness with which the oxidation of the conductor 260 is prevented. For example, the thickness of the insulator 270 is set greater than or equal to 1 nm and less than or equal to 10 nm, preferably greater than or equal to 3 nm and less than or equal to 7 nm.

Thus, the oxidation of the conductor 260 can be prevented, and oxygen released from the insulator 280 can be supplied to the oxide semiconductor 230 efficiently.

An insulator 280 is provided over the transistor 200. The insulator 280 preferably includes oxide containing oxygen in excess of that in the stoichiometric composition. That is, in the insulator 280, a region containing oxygen in excess of that in the stoichiometric composition (hereinafter also referred to as excess-oxygen region) is preferably formed. In particular, in the case of using an oxide semiconductor in the transistor 200, when an insulator including an excess-oxygen region is provided as an interlayer film or the like in the vicinity of the transistor 200, oxygen vacancies in the transistor 200 are reduced, whereby the reliability can be improved.

As the insulator including the excess-oxygen region, specifically, an oxide material that releases part of oxygen by heating is preferably used. Oxide that releases part of oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, silicon oxynitride refers to a material that contains oxygen at a higher proportion than nitrogen, and silicon nitride oxide refers to a material that contains nitrogen at a higher proportion than oxygen.

The insulator 280 covering the transistor 200 may function as a planarization film that covers a roughness thereunder.

APPLICATION EXAMPLE

An example of stacking transistors with different compositions is described below.

Figure 65:
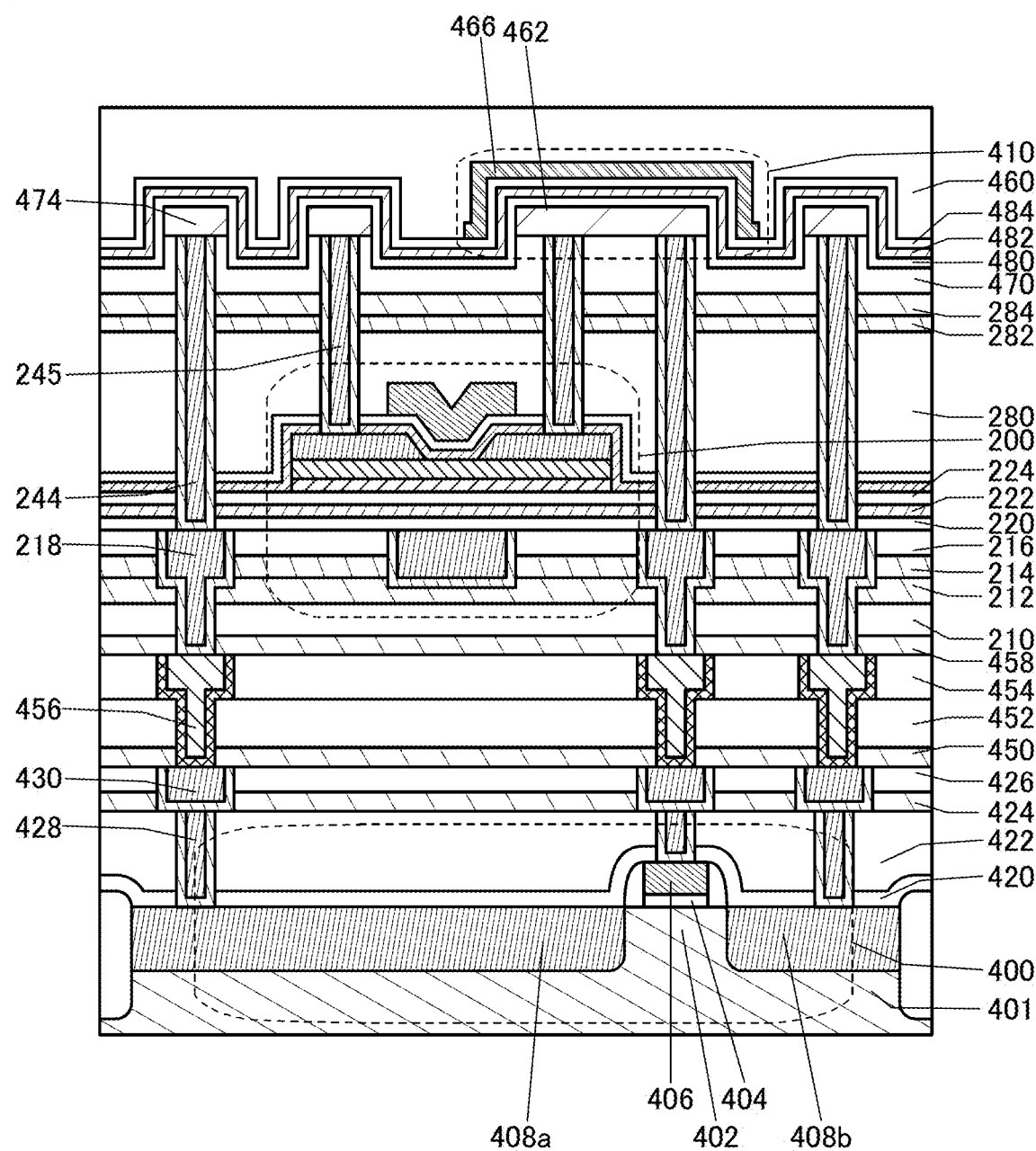
FIG. 65 is a cross-sectional view illustrating a semiconductor device.

A semiconductor device shown in FIG. 65 includes a transistor 400, a transistor 200, and a capacitor 410.

The transistor 200 is a transistor in which a channel is formed in a semiconductor layer including an oxide semiconductor. Since the off-state current of the transistor 200 is small, by using the transistor 200 in the semiconductor device (memory device), stored data can be held for a long time. In other words, it is possible to obtain a semiconductor device (memory device) which does not require refresh operation or has an extremely low frequency of the refresh operation, which leads to a sufficient reduction in power consumption.

The semiconductor device includes the transistor 400, the transistor 200, and the capacitor 410 as shown in FIG. 65. The transistor 200 is provided over the transistor 400, and the capacitor 410 is provided over the transistor 400 and the transistor 200.

The transistor 400 is provided over a substrate 401 and includes a conductor 406, an insulator 404, a semiconductor region 402 that is a part of the substrate 401, and low-resistance regions 408a and 408b functioning as a source region and a drain region.

The transistor 400 may be a p-channel transistor or an n-channel transistor.

It is preferable that a region of the semiconductor region 402 where a channel is formed, a region in the vicinity thereof, the low-resistance regions 408a and 408b functioning as a source region and a drain region, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 400 may be a high-electron-mobility transistor (HEMT) with GaAs and GaAlAs or the like.

The low-resistance regions 408a and 408b contain an element which imparts n-type conductivity, such as arsenic or phosphorus, or an element which imparts p-type conductivity, such as boron, in addition to a semiconductor material used for the semiconductor region 402.

The conductor 406 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a material of the conductor determines the work function, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

Note that the transistor 400 shown in FIG. 65 is just an example and is not limited to the structure shown therein; an appropriate transistor may be used in accordance with a circuit configuration or a driving method.

An insulator 420, an insulator 422, an insulator 424, and an insulator 426 are stacked sequentially and cover the transistor 400.

As the insulator 420, the insulator 422, the insulator 424, and the insulator 426, for example, silicon oxide, silicon oxynitride, silicon nitride oxide, silicon nitride, aluminum oxide, aluminum oxynitride, aluminum nitride oxide, or aluminum nitride may be used.

The insulator 422 functions as a planarization film for eliminating a level difference caused by the transistor 400 or the like underlying the insulator 422. A top surface of the insulator 422 may be planarized by planarization treatment using a chemical mechanical polishing (CMP) method or the like to increase the level of planarity.

The insulator 424 is preferably formed using, for example, a film having a barrier property that prevents hydrogen or impurities from diffusing from the substrate 401, the transistor 400, or the like into a region where the transistor 200 is formed.

As an example of the film having a barrier property with respect to hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 400. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 424 that is converted into hydrogen atoms per area of the insulator 424 is less than or equal to $10 \times 10^{15}$ atoms/cm$^2$, preferably less than or equal to $5 \times 10^{15}$ atoms/cm$^2$ in TDS analysis in the range of 50° C. to 500° C., for example.

Note that the dielectric constant of the insulator 426 is preferably lower than that of the insulator 424. For example, the relative dielectric constant of the insulator 426 is preferably lower than 4, more preferably lower than 3. For example, the relative dielectric constant of the insulator 424 is preferably 0.7 times or less that of the insulator 426, more preferably 0.6 times or less that of the insulator 426. In the case where a material with a low dielectric constant is used as an interlayer film, the parasitic capacitance between wirings can be reduced.

A conductor 428, a conductor 430, and the like that are electrically connected to the capacitor 410 or the transistor 200 are embedded in the insulator 420, the insulator 422, the insulator 424, and the insulator 426. Note that the conductor 428 and the conductor 430 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductor 428 and the conductor 430), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

Furthermore, the conductor 428 and the conductor 430 preferably include a conductor having a barrier property with respect to hydrogen. The conductor having a barrier property with respect to hydrogen is formed particularly in an opening portion of the insulator 424 having a barrier property with respect to hydrogen. In such a structure, the transistor 400 and the transistor 200 can be separated by a layer having a barrier property, so that diffusion of hydrogen from the transistor 400 to the transistor 200 can be prevented.

Note that as the conductor having a barrier property with respect to hydrogen, tantalum nitride may be used, for example. By stacking tantalum nitride and tungsten, which has high conductivity, diffusion of hydrogen from the transistor 400 can be prevented while the conductivity of a wiring is ensured. In this case, a tantalum nitride layer having a barrier property with respect to hydrogen is preferably in contact with the insulator 424 having a barrier property with respect to hydrogen.

A wiring layer may be provided over the insulator 426 and the conductor 430. For example, in FIG. 65, an insulator 450, an insulator 452, and an insulator 454 are stacked sequentially. The conductor 456 is formed in the insulator 450, the insulator 452, and the insulator 454. The conductor 456 functions as a plug or a wiring. Note that the conductor 456 can be formed using a material similar to that used for forming the conductor 428 and the conductor 430.

In addition, the conductor 456 is preferably formed using a low-resistance conductive material such as aluminum or copper. The use of a low-resistance conductive material can reduce wiring resistance. When copper is used as the conductor 456, the conductor 456 is preferably stacked with the conductor which inhibits diffusion of copper. As the conductor which inhibits diffusion of copper, for example, tantalum, an alloy containing tantalum such as tantalum nitride, ruthenium, an alloy containing ruthenium, or the like is preferably used.

Furthermore, an insulator which inhibits diffusion of copper or has a barrier property against oxygen and hydrogen is preferably used as the insulator 450. For example, a silicon nitride film can be used as a film which inhibits diffusion of copper. Therefore, the insulator 450 can be formed using a material similar to that used for forming the insulator 424.

In particular, it is preferable to provide the conductor which inhibits diffusion of copper in contact with an opening of the insulator 450 which inhibits diffusion of copper. Copper is preferably stacked over the conductor which inhibits diffusion of copper. In such a structure, diffusion of copper around wirings can be prevented.

An insulator 458, an insulator 210, an insulator 212, and an insulator 214 are stacked in this order over the insulator 454. A material inhibiting diffusion of copper or a material having a barrier property against oxygen or hydrogen is preferably used for one or all of the insulator 458, the insulator 210, the insulator 212, and the insulator 214.

The insulator 458 and the insulator 212 are preferably formed using, for example, a film inhibiting diffusion of copper or a film having a barrier property that prevents hydrogen or impurities from diffusing from a region where the substrate 401 or the transistor 400 is formed or the like into a region where the transistor 200 is formed. Therefore, the insulator 458 and the insulator 212 can be formed using a material similar to that used for forming the insulator 424.

The insulator 210 can be formed using a material similar to that of the insulator 420. For example, a silicon oxide film, a silicon oxynitride film, or the like can be used as the insulator 210.

As the insulator 214, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from oxide in the transistor 200 can be prevented. Therefore, aluminum oxide is suitably used as a protective film for the transistor 200.

An insulator 216 is provided over the insulator 214. The insulator 216 can be formed using a material similar to that used for forming the insulator 420. For example, a silicon oxide film, a silicon oxynitride film, or the like can be used as the insulator 216.

A conductor 218, a conductor 205 forming the transistor 200, and the like are embedded in the insulator 458, the insulator 210, the insulator 212, the insulator 214, and the insulator 216. Note that the conductor 218 functions as a plug or a wiring that is electrically connected to the capacitor 410 or the transistor 400. The conductor 218 can be formed using a material similar to that used for forming the conductor 428 and the conductor 430.

In particular, the conductor 218 in contact with the insulator 458, the insulator 212, and the insulator 214 is preferably a conductor inhibiting diffusion of copper or having a barrier property against oxygen, hydrogen, and water. In this structure, the transistor 400 and the transistor 200 can be completely separated by a layer inhibiting diffusion of copper or having a barrier property against oxygen, hydrogen, and water. In other words, diffusion of copper from the conductor 456 can be inhibited and diffusion of hydrogen from the transistor 400 to the transistor 200 can be prevented.

The transistor 200 and the insulator 280 are provided over the insulator 214. Note that the transistor 200 shown in FIG. 65 is just an example and is not limited to the structure shown therein; an appropriate transistor may be used in accordance with a circuit configuration or a driving method.

An insulator 282, an insulator 284, and an insulator 470 are stacked sequentially over the insulator 280. A conductor 244 and the like are embedded in an insulator 220, an insulator 222, an insulator 224, the insulator 280, the insulator 282, the insulator 284, and the insulator 470. A conductor 245 and the like which connect a conductor in an above layer are provided over the conductor such as the conductor 240a and the conductor 240b included in the transistor 200. Note that the conductor 244 functions as a plug or a wiring that is electrically connected to the capacitor 410, the transistor 200, or the transistor 400. The conductor 244 can be formed using a material similar to that used for forming the conductor 428 and the conductor 430.

A material having a barrier property against oxygen or hydrogen is preferably used for one or both of the insulator 282 and the insulator 284. Thus, the insulator 282 can be formed using a material similar to that used for forming the insulator 214. The insulator 284 can be formed using a material similar to that used for forming the insulator 212.

As the insulator 282, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from oxide in the transistor 200 can be prevented. Therefore, aluminum oxide is suitably used as a protective film for the transistor 200.

The insulator 284 is preferably formed using, for example, a film having a barrier property that prevents hydrogen or impurities from diffusing from a region where the capacitor 410 is formed into a region where the transistor 200 is formed. Therefore, the insulator 284 can be formed using a material similar to that used for forming the insulator 424.

As an example of the film having a barrier property against hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 400. Specifically, the film that prevents hydrogen diffusion is a film from which hydrogen is less likely to be released.

Therefore, a structure can be obtained in which the transistor 200 and the insulator 280 including the excess-oxygen region are positioned between a stacked-layer structure of the insulator 210, the insulator 212, and the insulator 214 and a stacked-layer structure of the insulator 282 and the insulator 284. The insulator 210, the insulator 212, the insulator 214, the insulator 282 and the insulator 284 have a barrier property that prevents diffusion of oxygen or impurities such as hydrogen and water.

Accordingly, oxygen released from the insulator 280 and the transistor 200 can be prevented from diffusing into the layer where the capacitor 410 is formed or the layer where the transistor 400 is formed. Furthermore, impurities such as hydrogen and water can be prevented from diffusing from a layer over the insulator 282 and a layer under the insulator 214 into the transistor 200.

That is, oxygen can be efficiently supplied from the excess-oxygen region of the insulator 280 to oxide where a channel is formed in the transistor 200, so that oxygen vacancies can be reduced. Moreover, oxygen vacancies can be prevented from being formed by impurities in the oxide where a channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

The capacitor 410 and a conductor 474 are provided over the insulator 470. The capacitor 410 is provided over the insulator 470 and includes the conductor 462, the insulator 480, the insulator 482, the insulator 484, and the conductor 466. Note that the conductor 474 functions as a plug or a wiring that is electrically connected to the capacitor 410, the transistor 200, or the transistor 400.

The conductor 462 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 462 is formed concurrently with another component such as a conductor, Cu (copper), Al (aluminum), or the like which is a low-resistance metal material may be used.

Note that the conductor 474 can be formed using a material similar to that used for forming the conductor 462 functioning as an electrode of the capacitor.

The insulator 480, the insulator 482, the insulator 484 are provided over the conductor 474 and the conductor 462. As the insulator 480, the insulator 482, and the insulator 484, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like may be used. Although a three-layer structure is shown in the drawings, a single layer, two-layer, or stacked-layer structure of four or more layers may be used.

For example, a material with high dielectric strength such as silicon oxynitride is preferably used as the insulator 480 and the insulator 484. In addition, as the insulator 484, a high dielectric constant (high-k) material such as aluminum oxide is preferably stacked with a material with high dielectric strength such as silicon oxynitride. With this structure, the capacitor 410 can have a sufficient capacitance owing to a high dielectric constant (high-k) insulator and can have a higher dielectric strength owing to an insulator with high dielectric strength for avoiding electrostatic breakdown.

The conductor 466 is provided over the conductor 462 with the insulator 480, the insulator 482, and the insulator 484 provided therebetween. Note that the conductor 466 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 466 is formed concurrently with another component such as a conductor, Cu (copper), Al (aluminum), or the like which is a low-resistance metal material may be used.

For example, the insulator 480, the insulator 482, and the insulator 484 are provided to cover the top surface and the side surface of the conductor 462 as illustrated in FIG. 65. Furthermore, the conductor 466 is provided to cover the top surface and the side surface of the conductor 462 with the insulator 480, the insulator 482, and the insulator 484 provided therebetween.

That is, a capacitance is formed also on the side surface of the conductor 462, so that a capacitance per projected area of a capacitor can be increased. Thus, the semiconductor device can be reduced in area, highly integrated, and miniaturized.

An insulator 460 is provided over the conductor 466 and the insulator 484. The insulator 460 can be formed using a material similar to that used for forming the insulator 420. The insulator 460 covering the capacitor 410 may function as a planarization film that covers a roughness thereunder.

The above is the description of the application example.

At least part of this embodiment can be implemented in combination with any of the other embodiments described in this specification as appropriate.

Embodiment 7

In this embodiment, a display device that includes the semiconductor device of one embodiment of the present invention is described with reference to FIGS. 66A to 66C.
[Circuit Configuration of Display Device]

The display device illustrated in FIG. 66A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (image signal) from which a data signal is derived, as well as a signal for driving the shift register, through the terminal portion 507. The source driver 504b has a function of generating a data signal to be written to the pixel circuit 501 which is based on the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches, for example. The source driver 504b can output, as the data signals, signals obtained by time-dividing the image signal by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to Y), a pulse signal is input from the gate driver 504a through the scan line GL_m, and a data signal is input from the source driver 504b through the data line DL_n in accordance with the potential of the scan line GL_m.

Figure 66A:
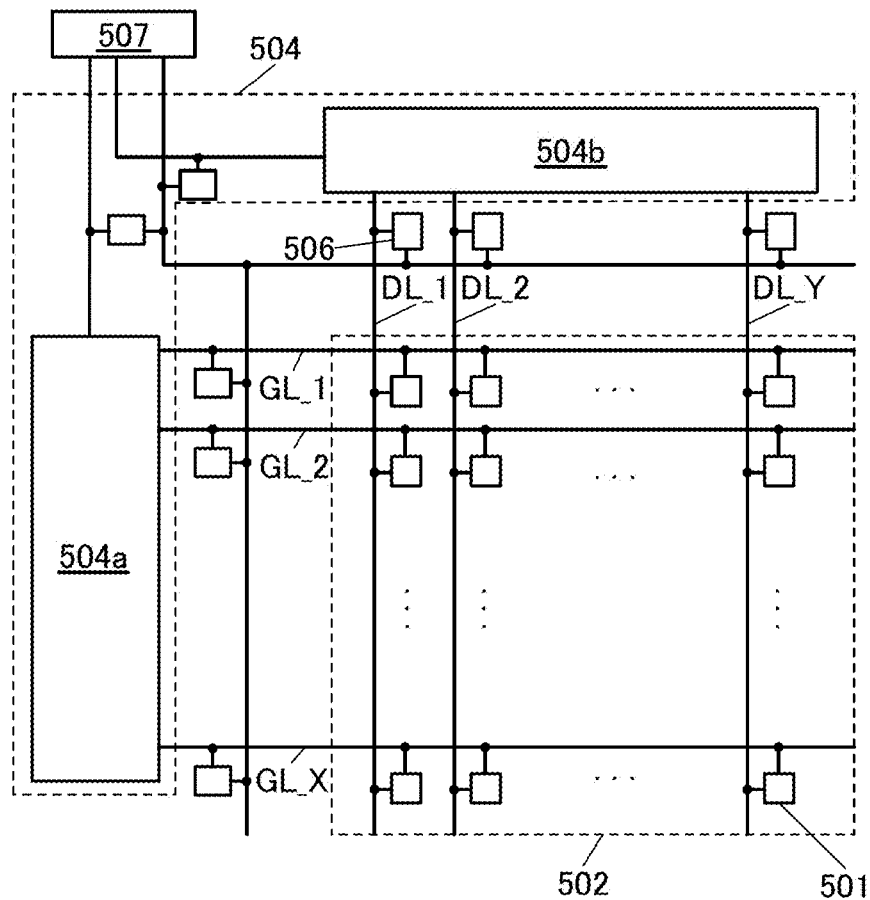
FIGS. 66A to 66C are a block diagram and circuit diagrams illustrating a display device.

The protection circuit 506 in FIG. 66A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and image signals to the display device from external circuits.

The protection circuit 506 is a circuit that electrically connects a wiring connected to the protection circuit to another wiring when a potential out of a certain range is applied to the wiring connected to the protection circuit.

As shown in FIG. 66A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 66A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 66B:
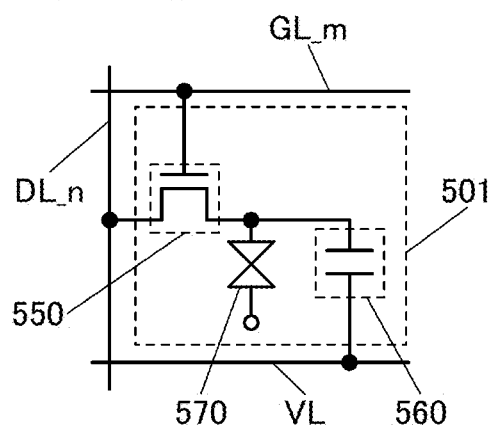

Each of the plurality of pixel circuits 501 in FIG. 66A can have the structure illustrated in FIG. 66B, for example.

The pixel circuit 501 in FIG. 66B includes a liquid crystal element 570, a transistor 550, and a capacitor 560. As the transistor 550, any of the transistors described in the above embodiment, for example, can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like.

Other examples of the method of driving the display device include an electrically controlled birefringence (ECB) mode, a polymer-dispersed liquid crystal (PDLC) mode, a polymer network liquid crystal (PNLC) mode, and a guest-host mode. A variety of liquid crystal elements and the driving methods thereof can be used.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 66B, the pixel circuits 501 are sequentially selected row by row by the gate driver 504a illustrated in FIG. 66A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 66C:
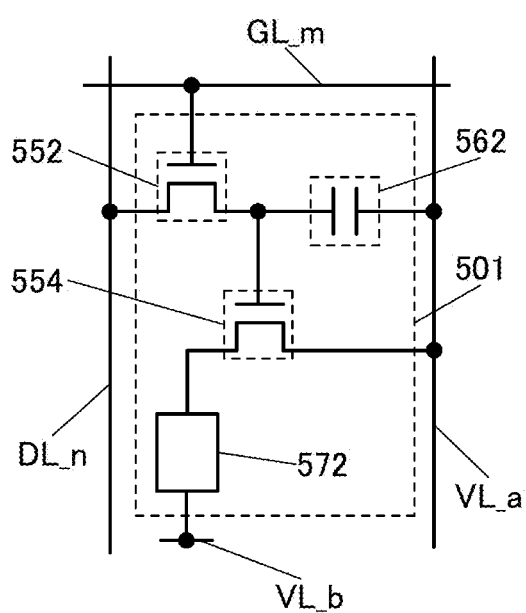

Alternatively, each of the plurality of pixel circuits 501 in FIG. 66A can have the structure illustrated in FIG. 66C, for example.

The pixel circuit 501 illustrated in FIG. 66C includes transistors 552 and 554, a capacitor 562, and a light-emitting element 572. Any of the transistors described in the above embodiment, for example, can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) can be used, for example. Note that the light-emitting element 572 is not limited to an organic EL element; an inorganic EL element including an inorganic material may be used.

Note that a high power supply potential VDD is supplied to one of the potential supply line VL_a and the potential supply line VL_b, and a low power supply potential VSS is supplied to the other.

For example, in the display device including the pixel circuit 501 in FIG. 66C, the pixel circuits 501 are sequentially selected row by row by the gate driver 504a illustrated in FIG. 66A, whereby the transistor 552 is turned on and a data signal is written.

When the transistor 552 is turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with luminance corresponding to the amount of flowing current. This operation is sequentially performed row by row; thus, an image is displayed.

At least part of this embodiment can be implemented in combination with any of the other embodiments described in this specification as appropriate.

Embodiment 8

In this embodiment, circuit configuration examples to which the transistors described in the above embodiments can be applied will be described with reference to FIGS. 67A to 67C, FIGS. 68A to 68C, FIGS. 69A and 69B, and FIGS. 70A and 70B.

[Configuration Example of Inverter Circuit]

Figure 67A:
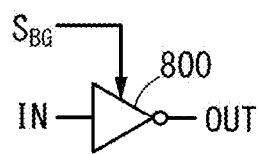
FIGS. 67A to 67C are circuit diagrams and a timing chart for describing one embodiment of the present invention.

FIG. 67A is a circuit diagram of an inverter which can be used for a shift register, a buffer, or the like included in the driver circuit. An inverter 800 outputs a signal whose logic is inverted from the logic of a signal supplied to an input terminal IN to an output terminal OUT. The inverter 800 includes a plurality of OS transistors. A signal $S_{BG}$ can switch electrical characteristics of the OS transistors.

Figure 67B:
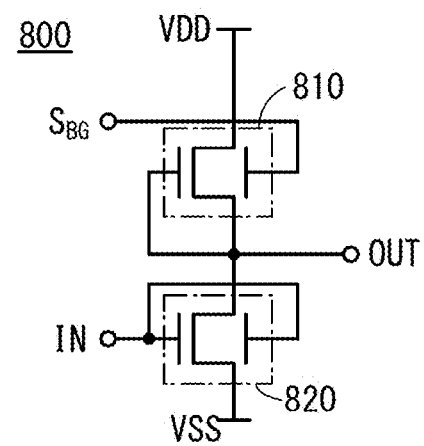

FIG. 67B illustrates an example of the inverter 800. The inverter 800 includes OS transistors 810 and 820. The inverter 800 can be formed using only n-channel transistors; thus, the inverter 800 can be formed at lower cost than an inverter formed using a complementary metal oxide semiconductor (i.e., a CMOS inverter).

Note that the inverter 800 including the OS transistors can be provided over a CMOS circuit including Si transistors. Since the inverter 800 can be provided so as to overlap with the CMOS circuit, no additional area is required for the inverter 800, and thus, an increase in the circuit area can be suppressed.

Each of the OS transistors 810 and 820 includes a first gate functioning as a front gate, a second gate functioning as a back gate, a first terminal functioning as one of a source and a drain, and a second terminal functioning as the other of the source and the drain.

The first gate of the OS transistor 810 is connected to its second terminal. The second gate of the OS transistor 810 is connected to a wiring that supplies the signal $S_{BG}$. The first terminal of the OS transistor 810 is connected to a wiring which supplies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring which supplies a voltage VSS.

Figure 67C:
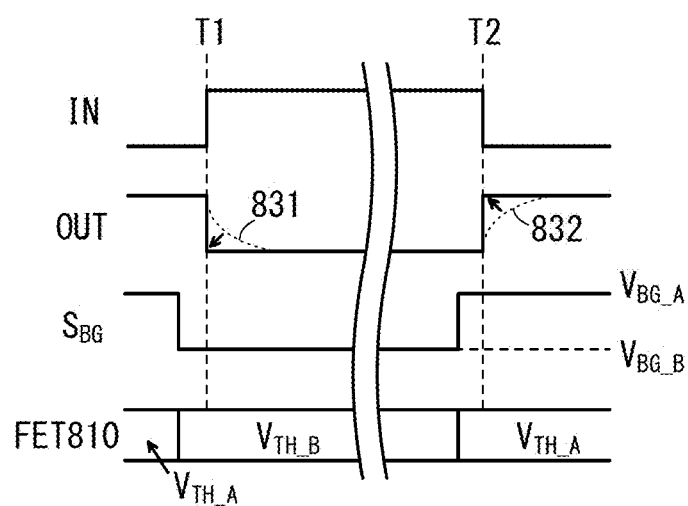

FIG. 67C is a timing chart illustrating the operation of the inverter 800. The timing chart in FIG. 67C illustrates changes of a signal waveform of the input terminal IN, a signal waveform of the output terminal OUT, a signal waveform of the signal $S_{BG}$, and the threshold voltage of the OS transistor 810.

The signal $S_{BG}$ can be supplied to the second gate of the OS transistor 810 to control the threshold voltage of the OS transistor 810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 810 can be shifted in the negative direction to be a threshold voltage $V_{TH\_A}$ when the voltage $V_{BG\_A}$ is applied to the second gate. The threshold voltage of the OS transistor 810 can be shifted in the positive direction to be a threshold voltage $V_{TH\_B}$ when the voltage $V_{BG\_B}$ is applied to the second gate.

Figure 68A:
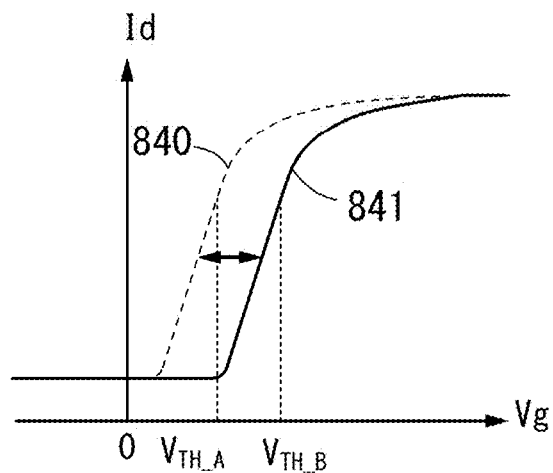
FIGS. 68A to 68C are a graph and circuit diagrams illustrating one embodiment of the present invention.

To visualize the above description, FIG. 68A shows an Id-Vg curve, which is one of indicators of the transistor's electrical characteristics.

When a high voltage such as the voltage $V_{BG\_A}$ is applied to the second gate, the electrical characteristics of the OS transistor 810 can be shifted to match a curve shown by a dashed line 840 in FIG. 68A. When a low voltage such as the voltage $V_{BG\_B}$ is applied to the second gate, the electrical characteristics of the OS transistor 810 can be shifted to match a curve shown by a solid line 841 in FIG. 68A. As shown in FIG. 68A, switching the signal $S_{BG}$ between the voltage $V_{BG\_A}$ and the voltage $V_{BG\_B}$ enables the threshold voltage of the OS transistor 810 to be shifted in the positive direction or the negative direction.

Figure 68B:
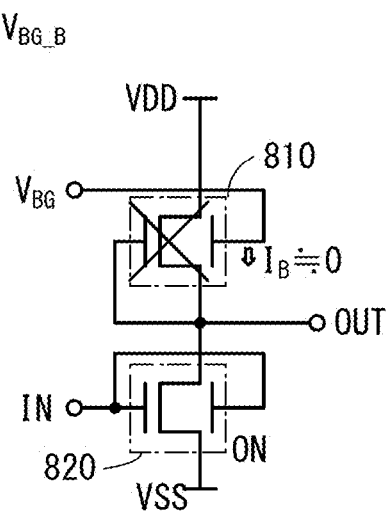

The shift of the threshold voltage in the positive direction toward the threshold voltage $V_{TH\_B}$ can make current less likely to flow in the OS transistor 810. FIG. 68B visualizes the state.

As illustrated in FIG. 68B, a current $I_B$ that flows in the OS transistor 810 can be extremely low. Thus, when a signal supplied to the input terminal IN is at a high level and the OS transistor 820 is on (ON), the voltage of the output terminal OUT can drop sharply.

Since a state in which a current is less likely to flow in the OS transistor 810 as illustrated in FIG. 68B can be obtained, a signal waveform 831 of the output terminal in the timing chart in FIG. 67C can be made steep. Shoot-through current between the wiring that supplies the voltage VDD and the wiring that supplies the voltage VSS can be low, leading to low-power operation.

Figure 68C:
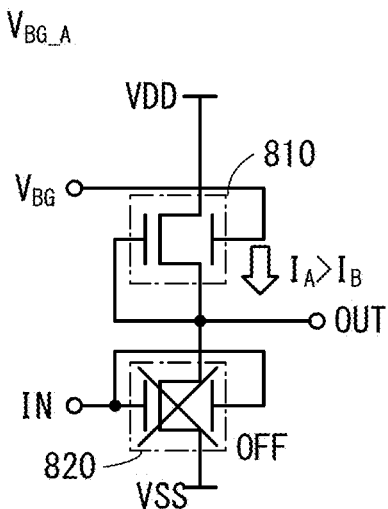

The shift of the threshold voltage in the negative direction toward the threshold voltage $V_{TH\_A}$ can make current flow easily in the OS transistor 810. FIG. 68C visualizes the state. As illustrated in FIG. 68C, a current IA flowing at this time can be higher than at least the current $I_B$. Thus, when a signal supplied to the input terminal IN is at a low level and the OS transistor 820 is off (OFF), the voltage of the output terminal OUT can be increased sharply. Since a state in which current is likely to flow in the OS transistor 810 as shown in FIG. 68C can be obtained, a signal waveform 832 of the output terminal in the timing chart in FIG. 67C can be made steep.

Note that the threshold voltage of the OS transistor 810 is preferably controlled by the signal $S_{BG}$ before the state of the OS transistor 820 is switched, i.e., before Time T1 or T2. For example, as in FIG. 67C, it is preferable that the threshold voltage of the OS transistor 810 be switched from the threshold voltage $V_{TH\_A}$ to the threshold voltage $V_{TH\_B}$ before time T1 at which the level of the signal supplied to the input terminal IN is switched to a high level. Moreover, as in FIG. 67C, it is preferable that the threshold voltage of the OS transistor 810 be switched from the threshold voltage $V_{TH\_B}$ to the threshold voltage $V_{TH\_A}$ before time T2 at which the level of the signal supplied to the input terminal IN is switched to a low level.

Figure 69A:
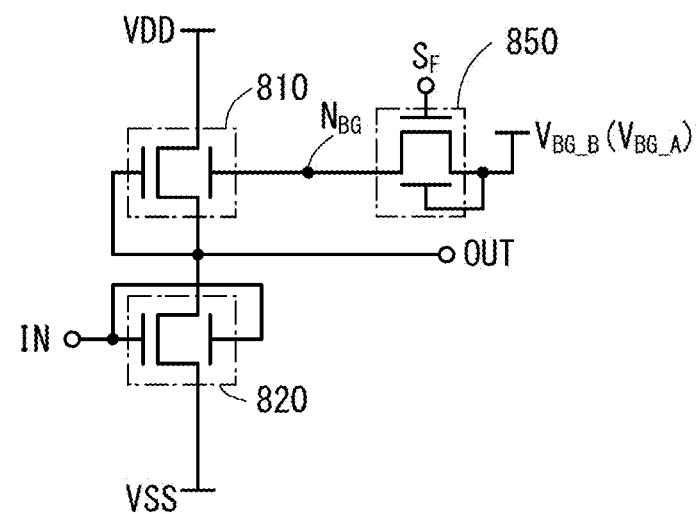
FIGS. 69A and 69B are a circuit diagram and a timing chart illustrating one embodiment of the present invention.

Although the timing chart in FIG. 67C shows the structure in which the level of the signal $S_{BG}$ is switched in accordance with the signal supplied to the input terminal IN, a different structure may be employed in which voltage for controlling the threshold voltage is held by the second gate of the OS transistor 810 in a floating state, for example. FIG. 69A illustrates an example of such a circuit configuration.

The circuit configuration in FIG. 69A is the same as that in FIG. 67B, except that an OS transistor 850 is added. A first terminal of the OS transistor 850 is connected to the second gate of the OS transistor 810. A second terminal of the OS transistor 850 is connected to a wiring which supplies the voltage $V_{BG\_B}$ (or the voltage $V_{BG\_A}$). A first gate of the OS transistor 850 is connected to a wiring which supplies a signal $S_F$. A second gate of the OS transistor 850 is connected to the wiring which supplies the voltage $V_{BG\_B}$ (or the voltage $V_{BG\_A}$).

Figure 69B:
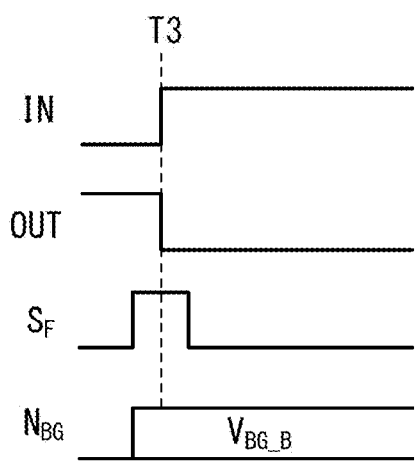

The operation with the circuit configuration in FIG. 69A will be described with reference to a timing chart in FIG. 69B.

The voltage for controlling the threshold voltage of the OS transistor 810 is supplied to the second gate of the OS transistor 810 before Time T3 at which the level of the signal supplied to the input terminal IN is changed to a high level. The signal $S_F$ is set to a high level and the OS transistor 850 is turned on, so that the voltage $V_{BG\_B}$ for controlling the threshold voltage is supplied to a node $N_{BG}$.

The OS transistor 850 is turned off after the voltage of the node $N_{BG}$ becomes $V_{BG\_B}$. Since the off-state current of the OS transistor 850 is extremely low, the voltage $V_{BG\_B}$ held by the node $N_{BG}$ can be retained while the OS transistor 850 remains off. Therefore, the number of times of operation of supplying the voltage $V_{BG\_B}$ to the second gate of the OS transistor 850 can be reduced and accordingly the power consumed to rewrite the voltage $V_{BG\_B}$ can be reduced.

Figure 70A:
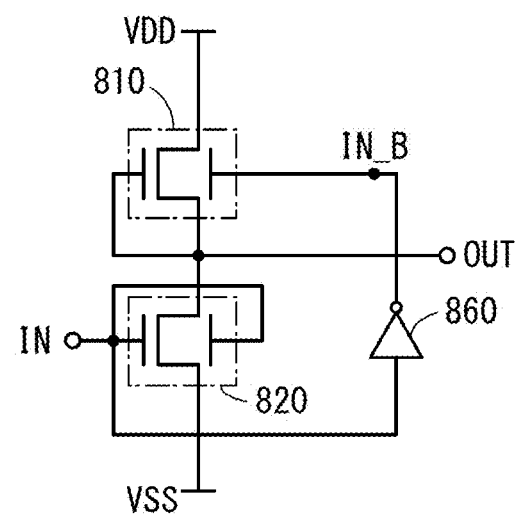
FIGS. 70A and 70B are a circuit diagram and a timing chart illustrating one embodiment of the present invention.

Although FIGS. 67B and 69A illustrate the case where the voltage is supplied to the second gate of the OS transistor 810 by control from the outside, a different configuration in which voltage for controlling the threshold voltage is generated on the basis of the signal supplied to the input terminal IN and supplied to the second gate of the OS transistor 810 may be employed, for example. FIG. 70A illustrates an example of such a circuit structure.

The circuit configuration in FIG. 70A is the same as that in FIG. 67B, except that a CMOS inverter 860 is provided between the input terminal IN and the second gate of the OS transistor 810. An input terminal of the CMOS inverter 860 is connected to the input terminal IN. An output terminal of the CMOS inverter 860 is connected to the second gate of the OS transistor 810.

The operation with the circuit structure in FIG. 70A will be described with reference to a timing chart in FIG. 70B. The timing chart in FIG. 70B illustrates changes of a signal waveform of the input terminal IN, a signal waveform of the output terminal OUT, an output waveform IN_B of the CMOS inverter 860, and a threshold voltage of the OS transistor 810.

The output waveform IN_B which corresponds to a signal whose logic is inverted from the logic of the signal supplied to the input terminal IN can be used as a signal that controls the threshold voltage of the OS transistor 810. Therefore, the threshold voltage of the OS transistor 810 can be controlled as described with reference to FIGS. 68A to 68C. For example, the signal supplied to the input terminal IN is at a high level and the OS transistor 820 is turned on at time T4 in FIG. 70B. At this time, the output waveform IN_B is at a low level. Accordingly, current can be made less likely to flow in the OS transistor 810; thus, the voltage of the output terminal OUT can be sharply decreased.

Figure 70B:
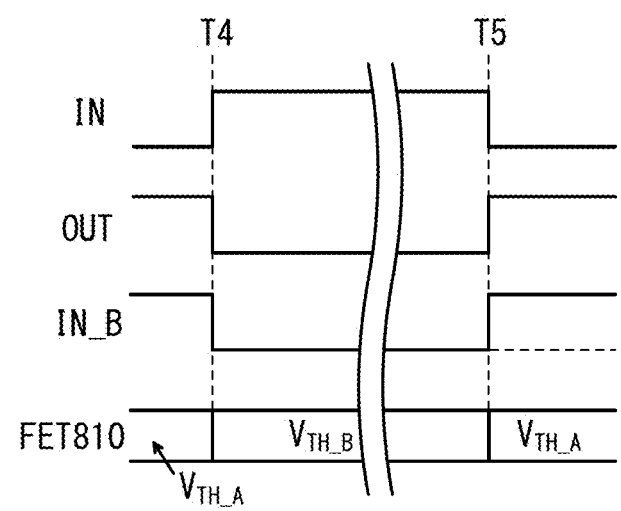

Moreover, the signal supplied to the input terminal IN is at a low level and the OS transistor 820 is turned off at Time T5 in FIG. 70B. At this time, the output waveform IN_B is at a high level. Accordingly, current can easily flow in the OS transistor 810; thus, a rise in the voltage of the output terminal OUT can be made steep.

As described above, in the structure of the inverter including the OS transistor in this embodiment, the voltage of the back gate is switched in accordance with the logic of the signal supplied to the input terminal IN. In such a structure, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

At least part of this embodiment can be implemented in combination with any of the other embodiments described in this specification as appropriate.

Embodiment 9

In this embodiment, examples of a semiconductor device in which the transistor including an oxide semiconductor (OS transistor) described in any of the above embodiments is used in a plurality of circuits will be described with reference to FIGS. 71A to 71E, FIGS. 72A and 72B, FIGS. 73A and 73B, and FIGS. 74A to 74C.

[Circuit Configuration Example of Semiconductor Device]

Figure 71A:
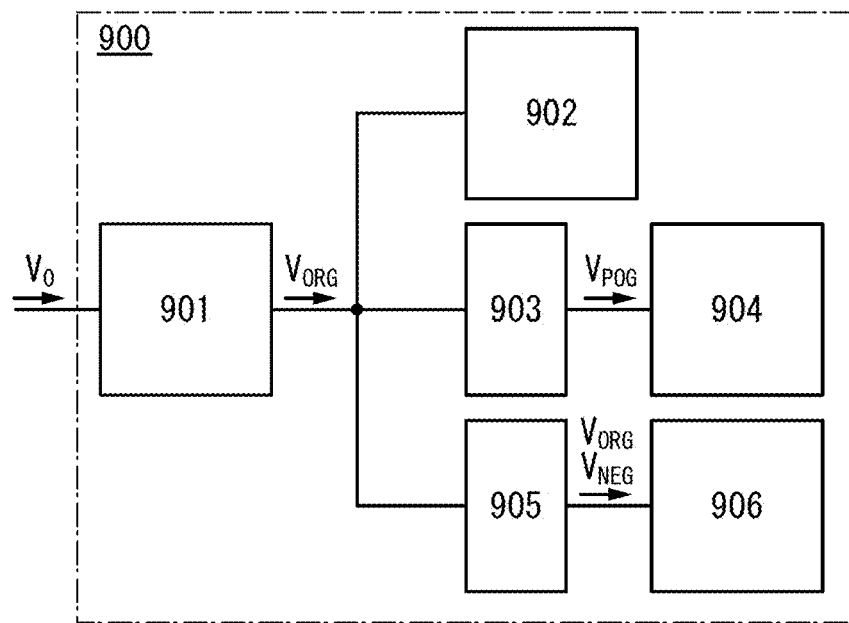
FIGS. 71A to 71E are a block diagram, circuit diagrams, and a waveform diagrams illustrating one embodiment of the present invention.

FIG. 71A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Thus, the semiconductor device 900 can operate without supply of a plurality of power supply voltages from the outside.

The circuits 902, 904, and 906 operate with different power supply voltages. For example, the power supply voltage of the circuit 902 is a voltage applied on the basis of the voltage $V_{ORG}$ and the voltage $V_{SS}$ ($V_{ORG}>V_{SS}$). For example, the power supply voltage of the circuit 904 is a voltage applied on the basis of the voltage $V_{POG}$ and the voltage $V_{SS}$ ($V_{POG}>V_{SS}$). For example, the power supply voltages of the circuit 906 are voltages applied on the basis of the voltage $V_{ORG}$, the voltage $V_{SS}$, and a voltage $V_{NEG}$ ($V_{ORG}>V_{SS}>V_{NEG}$). When the voltage $V_{SS}$ is equal to a ground potential (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 71B:
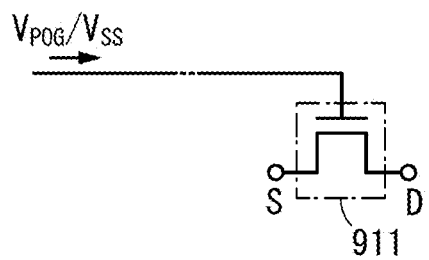
Figure 71C:
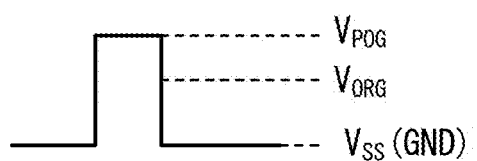

FIG. 71B illustrates an example of the circuit 904 that operates with the voltage $V_{POG}$ and FIG. 71C illustrates an example of a waveform of a signal for operating the circuit 904.

FIG. 71B illustrates a transistor 911. A signal supplied to a gate of the transistor 911 is generated on the basis of, for example, the voltage $V_{POG}$ and the voltage $V_{SS}$. The signal is generated on the basis of the voltage $V_{POG}$ to turn on the transistor 911 and on the basis of the voltage $V_{SS}$ to turn off the transistor 911. As illustrated in FIG. 71C, the voltage $V_{POG}$ is higher than the voltage $V_{ORG}$. Thus, a source (S) and a drain (D) of the transistor 911 can be electrically connected to each other surely. As a result, the frequency of malfunction of the circuit 904 can be reduced.

Figure 71D:
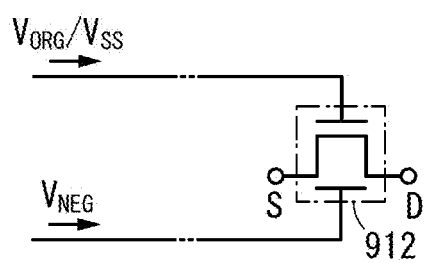
Figure 71E:
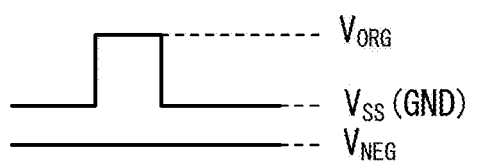

FIG. 71D illustrates an example of the circuit 906 that operates with the voltage $V_{NEG}$ and FIG. 71E illustrates an example of a waveform of a signal for operating the circuit 906.

FIG. 71D illustrates a transistor 912 having a back gate. A signal supplied to a gate of the transistor 912 is generated on the basis of, for example, the voltage $V_{ORG}$ and the voltage $V_{SS}$. The signal is generated on the basis of the voltage $V_{ORG}$ to turn on the transistor 912 and on the basis of the voltage $V_{SS}$ to turn off the transistor 912. A signal supplied to the back gate of the transistor 912 is generated on the basis of the voltage $V_{NEG}$. As illustrated in FIG. 71E, the voltage $V_{NEG}$ is lower than the voltage $V_{SS}$ (GND). Thus, the threshold voltage of the transistor 912 can be controlled to shift in the positive direction. Thus, the transistor 912 can be surely turned off and the amount of current flowing between the source (S) and the drain (D) can be small. As a result, the frequency of malfunction of the circuit 906 can be reduced and the power consumption thereof can be reduced.

The voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the generated signal may also be supplied to the back gate of the transistor 912.

Figure 72A:
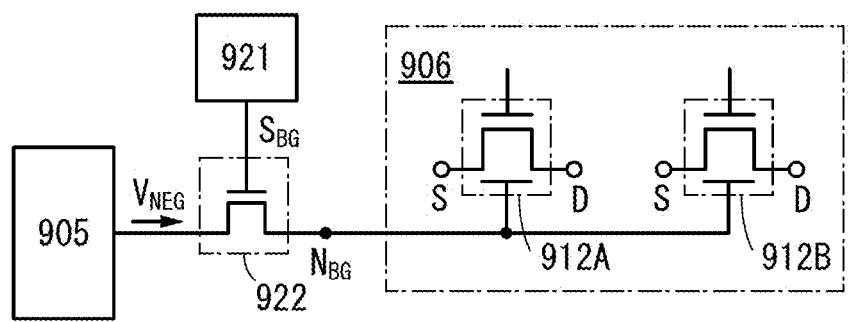
FIGS. 72A and 72B are a circuit diagram and a timing chart illustrating one embodiment of the present invention.
Figure 72B:
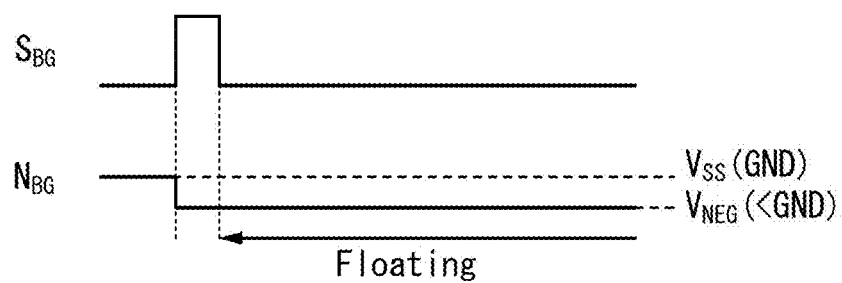

FIGS. 72A and 72B illustrate a modification example of FIGS. 71D and 71E.

In a circuit diagram illustrated in FIG. 72A, a transistor 922 whose conduction state can be controlled by a control circuit 921 is provided between the voltage generation circuit 905 and the circuit 906. The transistor 922 is an n-channel OS transistor. A control signal $S_{BG}$ output from the control circuit 921 is a signal for controlling the conduction state of the transistor 922. Transistors 912A and 912B included in the circuit 906 are OS transistors like the transistor 922.

A timing chart in FIG. 72B shows changes in the potential of the control signal $S_{BG}$ and the potential of a node $N_{BG}$. The potential of the node $N_{BG}$ indicates the states of potentials of back gates of the transistors 912A and 912B. When the control signal $S_{BG}$ is at a high level, the transistor 922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 922 is an OS transistor, its off-state current is small. Accordingly, even when the node $N_{BG}$ is in an electrically floating state, the voltage $V_{NEG}$ which has been supplied can be held.

Figure 73A:
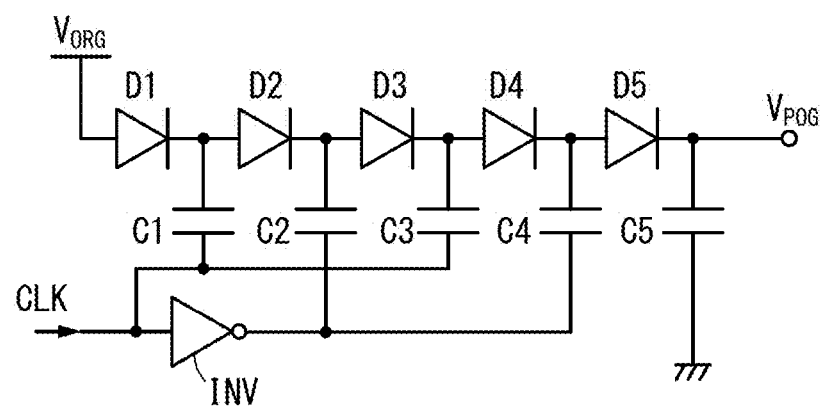
FIGS. 73A and 73B are circuit diagrams each illustrating one embodiment of the present invention.

FIG. 73A illustrates an example of a circuit configuration applicable to the above-described voltage generation circuit 903. The voltage generation circuit 903 illustrated in FIG. 73A is a five-stage charge pump including diodes D1 to D5, capacitors C1 to C5, and an inverter INV. A clock signal CLK is supplied to the capacitors C1 to C5 directly or through the inverter INV. When the power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by application of the clock signal CLK, can be obtained. Note that a forward voltage of the diodes D1 to D5 is 0 V. A desired voltage $V_{POG}$ can be obtained when the number of stages of the charge pump is changed.

Figure 73B:
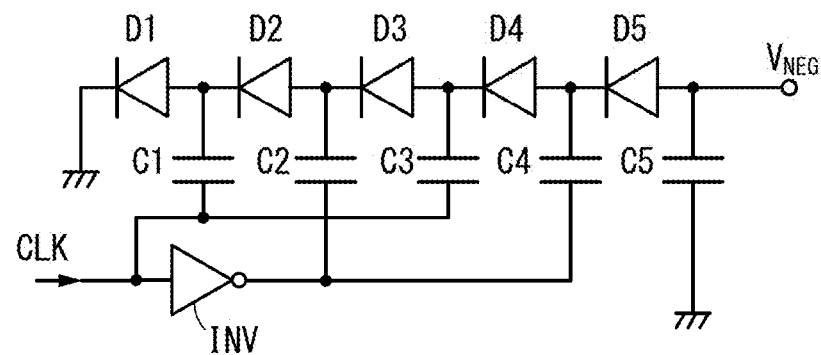

FIG. 73B illustrates an example of a circuit configuration applicable to the above-described voltage generation circuit 905. The voltage generation circuit 905 illustrated in FIG. 73B is a four-stage charge pump including the diodes D1 to D5, the capacitors C1 to C5, and the inverter INV. A clock signal CLK is supplied to the capacitors C1 to C5 directly or through the inverter INV. When the power supply voltage of the inverter INV is a voltage applied on the basis of the voltage $V_{ORG}$ and the voltage $V_{SS}$, the voltage $V_{NEG}$, which has been reduced from the ground voltage, i.e., the voltage $V_{SS}$ to a negative voltage having a negatively quadrupled value of the voltage $V_{ORG}$ by application of the clock signal CLK, can be obtained. Note that a forward voltage of the diodes D1 to D5 is 0 V. A desired voltage $V_{NEG}$ can be obtained when the number of stages of the charge pump is changed.

Figure 74A:
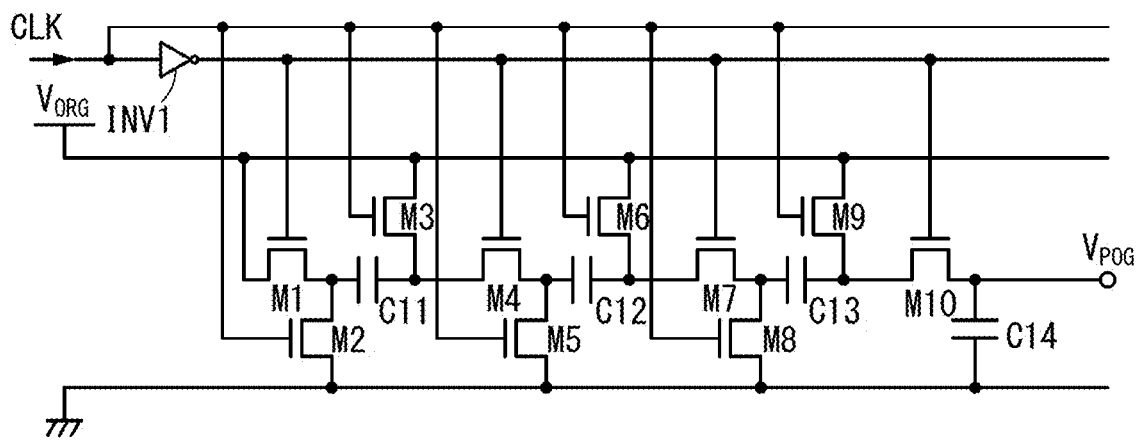
FIGS. 74A to 74C are circuit diagrams each illustrating one embodiment of the present invention.
Figure 74B:
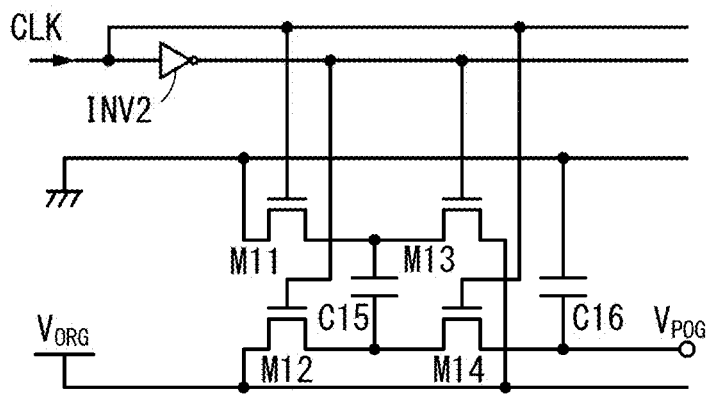
Figure 74C:
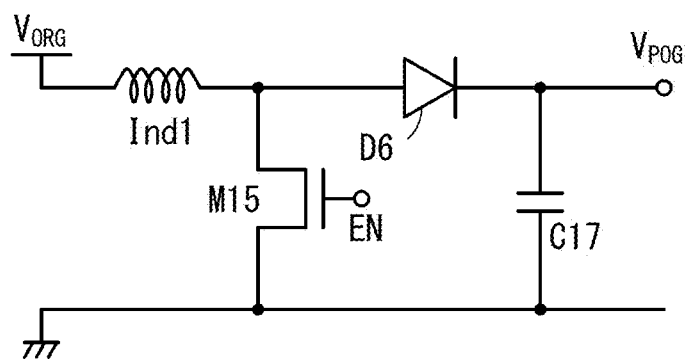

The circuit configuration of the voltage generation circuit 903 is not limited to the configuration in the circuit diagram illustrated in FIG. 73A. Modification examples of the voltage generation circuit 903 are illustrated in FIGS. 74A to 74C. Note that further modification examples of the voltage generation circuit 903 can be realized by changing voltages supplied to wirings or arrangement of elements in voltage generation circuits 903A to 903C illustrated in FIGS. 74A to 74C.

A voltage generation circuit 903A illustrated in FIG. 74A includes transistors M1 to M10, capacitors C11 to C14, and an inverter INV1. The clock signal CLK is supplied to gates of the transistors M1 to M10 directly or through the inverter INV1. The voltage $V_{POG}$ can be obtained by increasing the voltage $V_{ORG}$ by a voltage four times the potential difference between the voltage $V_{ORG}$ and the voltage $V_{SS}$ with the application of the clock signal CLK. A desired voltage $V_{POG}$ can be obtained when the number of stages is changed. In the voltage generation circuit 903A in FIG. 74A, off-state current of each of the transistors M1 to M10 can be low when the transistors M1 to M10 are OS transistors, and leakage of charge held in the capacitors C11 to C14 can be suppressed. Accordingly, raising from the voltage $V_{ORG}$ to the voltage $V_{POG}$ can be efficiently performed.

The voltage generation circuit 903B illustrated in FIG. 74B includes transistors M11 to M14, capacitors C15 and C16, and an inverter INV2. The clock signal CLK is supplied to gates of the transistors M11 to M14 directly or through the inverter INV2. The voltage $V_{POG}$ can be obtained by increasing the voltage $V_{ORG}$ by a voltage twice the potential difference between the voltage $V_{ORG}$ and the voltage $V_{SS}$ with the application of the clock signal CLK. In the voltage generation circuit 903B in FIG. 74B, off-state current of each of the transistors M11 to M14 can be low when the transistors M11 to M14 are OS transistors, and leakage of charge held in the capacitors C15 and C16 can be suppressed. Accordingly, raising from the voltage $V_{ORG}$ to the voltage $V_{POG}$ can be efficiently performed.

A voltage generation circuit 903C shown in FIG. 74C includes an inductor Ind1, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 903C in FIG. 74C increases the voltage using the inductor Ind1, the voltage can be efficiently increased.

As described above, in any of the structures of this embodiment, a voltage required for circuits included in a semiconductor device can be internally generated. Thus, in the semiconductor device, the number of power supply voltages supplied from the outside can be reduced.

At least part of this embodiment can be implemented in combination with any of the other embodiments described in this specification as appropriate.

Embodiment 10

In this embodiment, a display module and electronic devices, each of which includes a semiconductor device of one embodiment of the present invention, will be described with reference to FIG. 75, FIGS. 76A to 76E, FIGS. 77 to 77G, and FIGS. 78A and 78B.

[Display Module]

Figure 75:
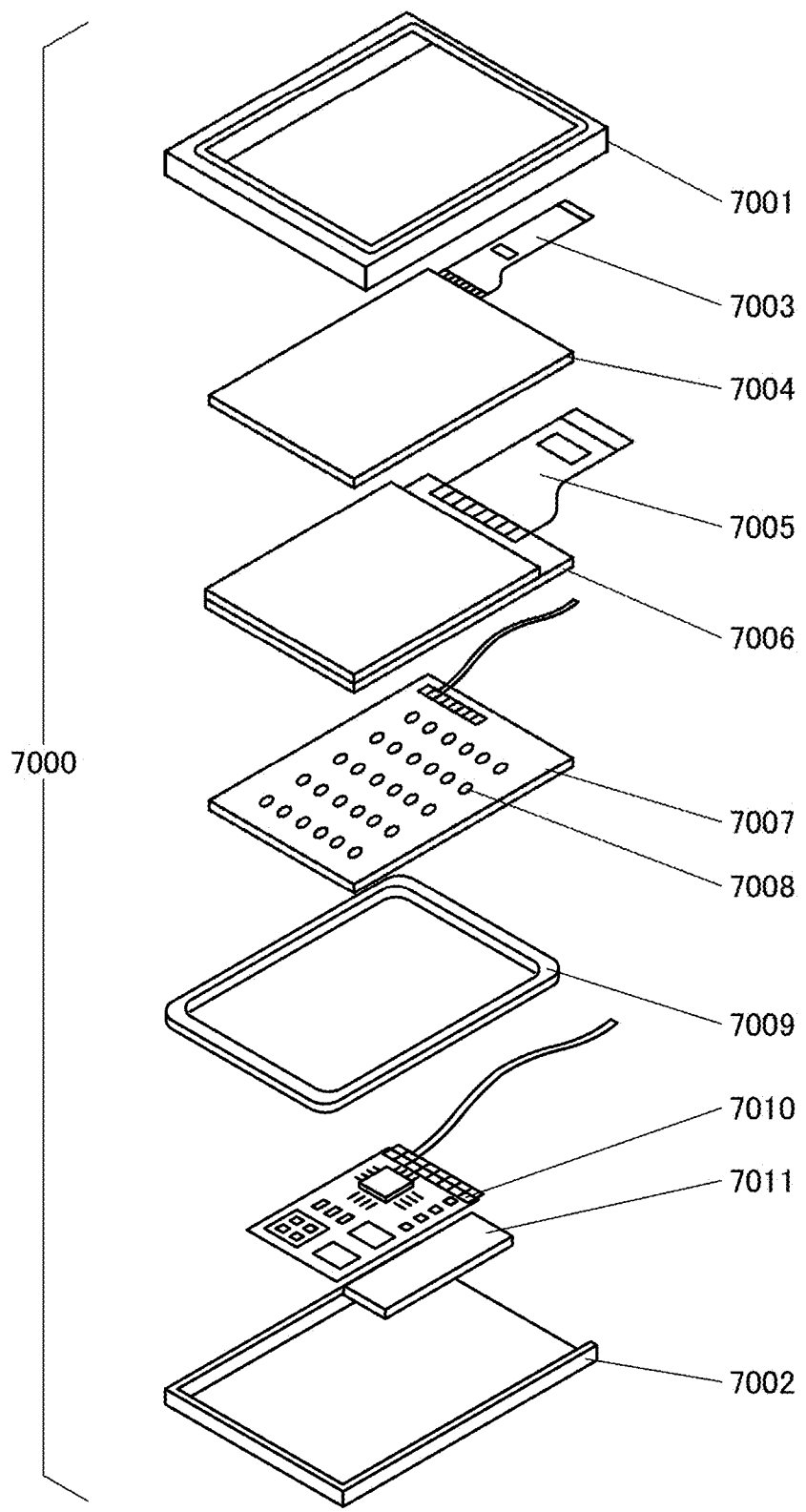
FIG. 75 illustrates a display module.

In a display module 7000 illustrated in FIG. 75, a touch panel 7004 connected to an FPC 7003, a display panel 7006 connected to an FPC 7005, a backlight 7007, a frame 7009, a printed board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 75, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed board 7010. The frame 7009 may also function as a radiator plate.

The printed board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

[Electronic Device 1]

Next, FIGS. 76A to 76E illustrate examples of electronic devices.

Figure 76A:
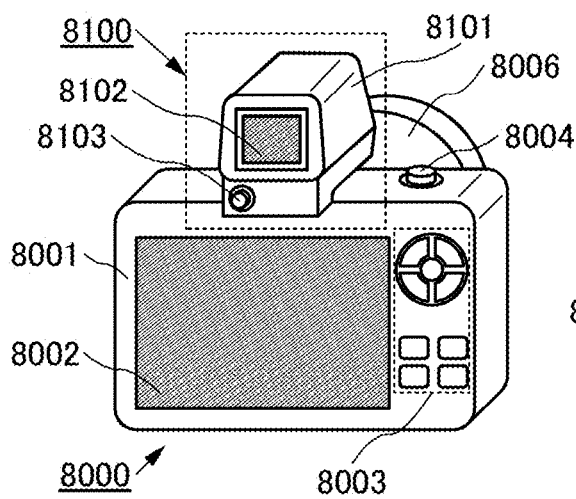
FIGS. 76A to 76E illustrate electronic devices.

FIG. 76A is an external view of a camera 8000 to which a finder 8100 is attached.

The camera 8000 includes a housing 8001, a display portion 8002, operation buttons 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 which serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 functions as a power supply button. With the button 8103, the display portion 8102 can be turned on and off.

A display device of one embodiment of the present invention can be used in the display portion 8002 of the camera 8000 and the display portion 8102 of the finder 8100.

Although the camera 8000 and the finder 8100 are separate and detachable electronic devices in FIG. 76A, the housing 8001 of the camera 8000 may include a finder having a display device.

Figure 76B:
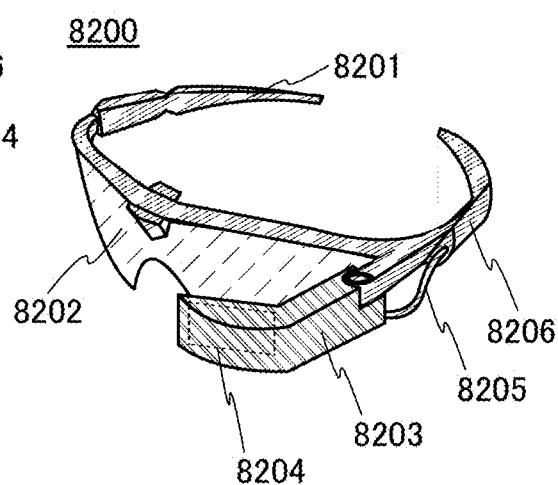

FIG. 76B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 76C:
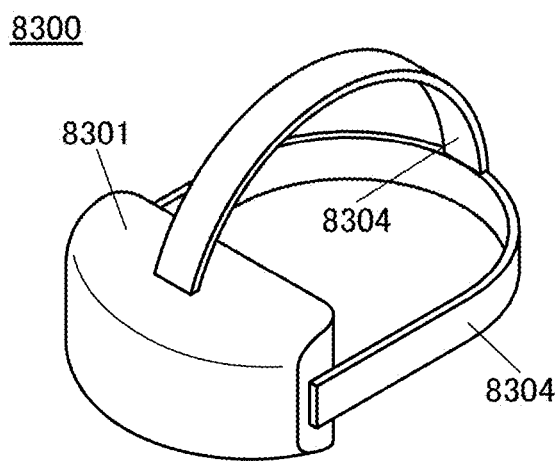
Figure 76D:
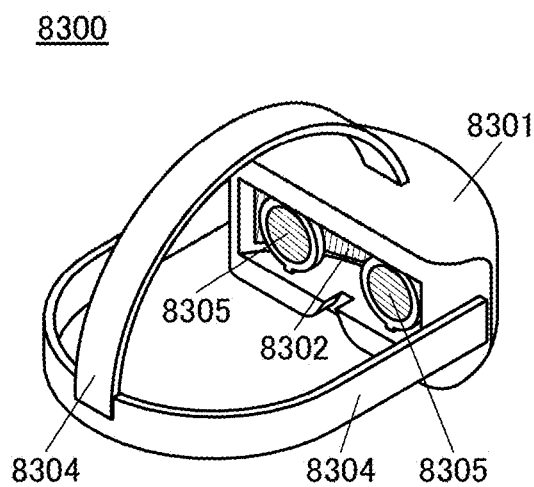
Figure 76E:
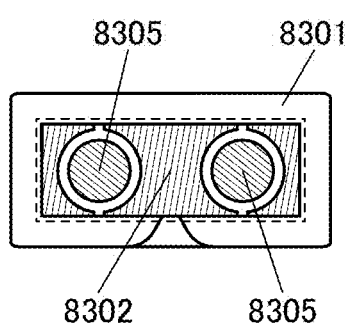

FIGS. 76C to 76E are external views of a head-mounted display 8300. The head-mounted display 8300 includes a housing 8301, a display portion 8302, fixing bands 8304, and a pair of lenses 8305.

A user can see display on the display portion 8302 through the lenses 8305. It is favorable that the display portion 8302 be curved. When the display portion 8302 is curved, a user can feel high realistic sensation of images. Although the structure described in this embodiment as an example has one display portion 8302, the number of display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 76E, the user does not perceive pixels, and thus a more realistic image can be displayed.

[Electronic Device 2]

Next, FIGS. 76A to 76E illustrate examples of electronic devices that are different from those illustrated in FIGS. 77A to 77G.

Electronic devices illustrated in FIGS. 77A to 77G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 77A to 77G can have a variety of functions. For example, a function of displaying a lot of information (e.g., a still image, a moving image, and a text image) on a display portion; a touch panel function; a function of displaying a calendar, date, time, and the like; a function of controlling processing with a lot of software (programs); a wireless communication function; a function of being connected to a variety of computer networks with a wireless communication function; a function of transmitting and receiving a lot of data with a wireless communication function; a function of reading a program or data stored in a memory medium and displaying the program or data on a display portion. Note that functions which can be provided for the electronic devices illustrated in FIGS. 77A to 77G are not limited them, and the electronic devices can have a variety of functions. Although not illustrated in FIGS. 77A to 77G, the electronic devices may each have a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 77A to 77G will be described in detail below.

Figure 77A:
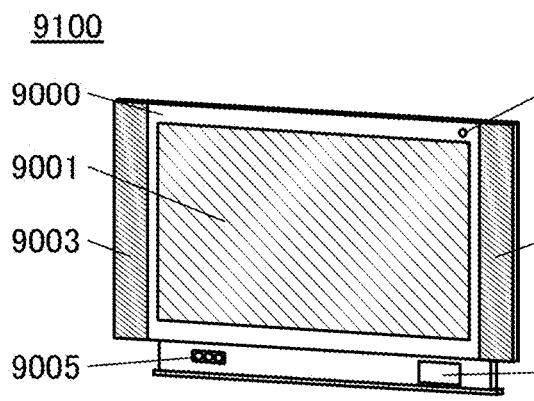
FIGS. 77A to 77G illustrate electronic devices.

FIG. 77A is a perspective view illustrating a television device 9100. The television device 9100 can include the display portion 9001 having a large screen size of, for example, 50 inches or more, or 100 inches or more.

Figure 77D:
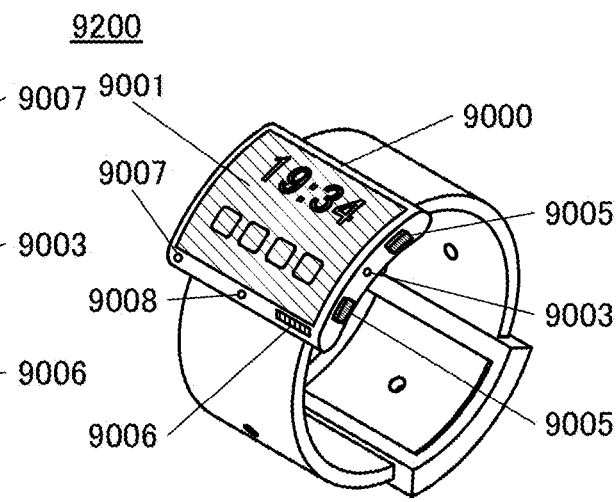
Figure 77B:
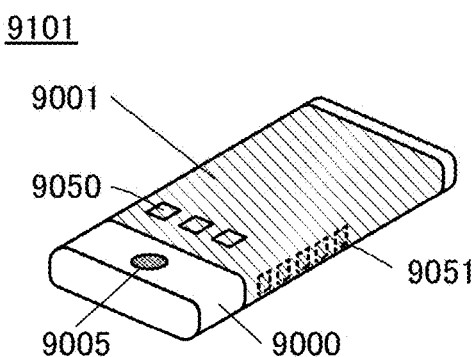

FIG. 77B is a perspective view of a portable information terminal 9101. The portable information terminal 9101 functions as, for example, one or more of a telephone set, a notebook, an information browsing system, and the like. Specifically, the portable information terminal can be used as a smartphone. Note that the portable information terminal 9101 may include the speaker 9003, the connection terminal 9006, the sensor 9007, or the like. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 77C:
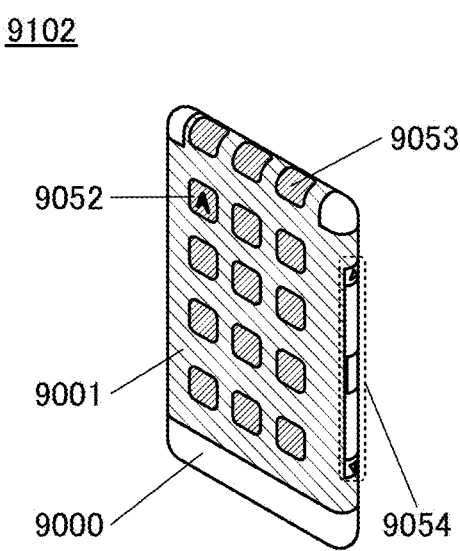

FIG. 77C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 77D is a perspective view illustrating a wrist-watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 77E:
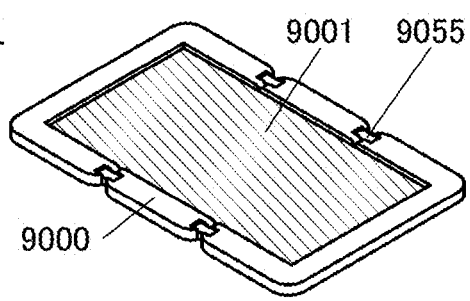
Figure 77F:
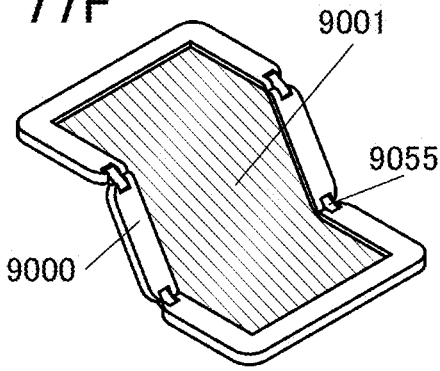
Figure 77G:
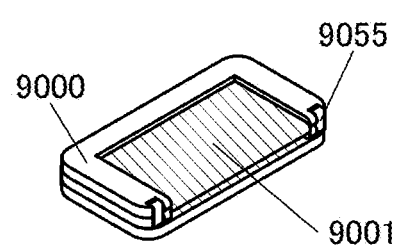

FIGS. 77E to 77G are perspective views of a foldable portable information terminal 9201. FIG. 77E is a perspective view of the foldable portable information terminal 9201 that is opened. FIG. 77F is a perspective view of the foldable portable information terminal 9201 that is being opened or being folded. FIG. 77G is a perspective view of the foldable portable information terminal 9201 that is folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

Figure 78A:
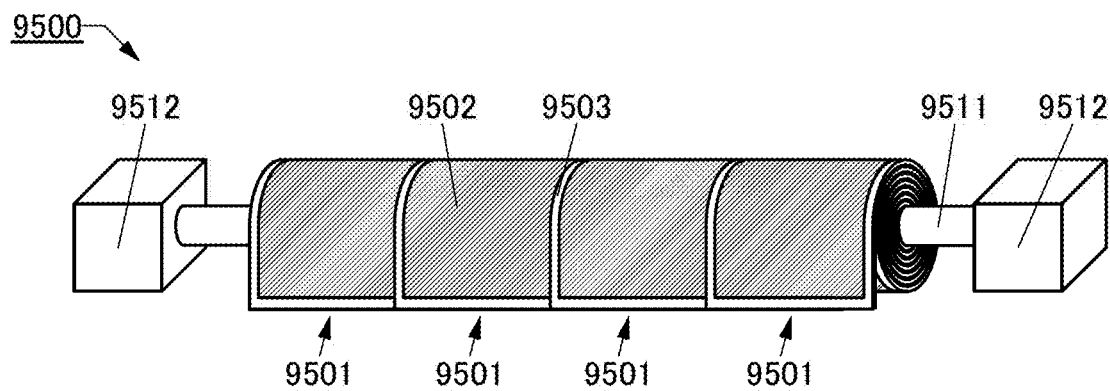
FIGS. 78A and 78B are perspective views illustrating a display device.
Figure 78B:
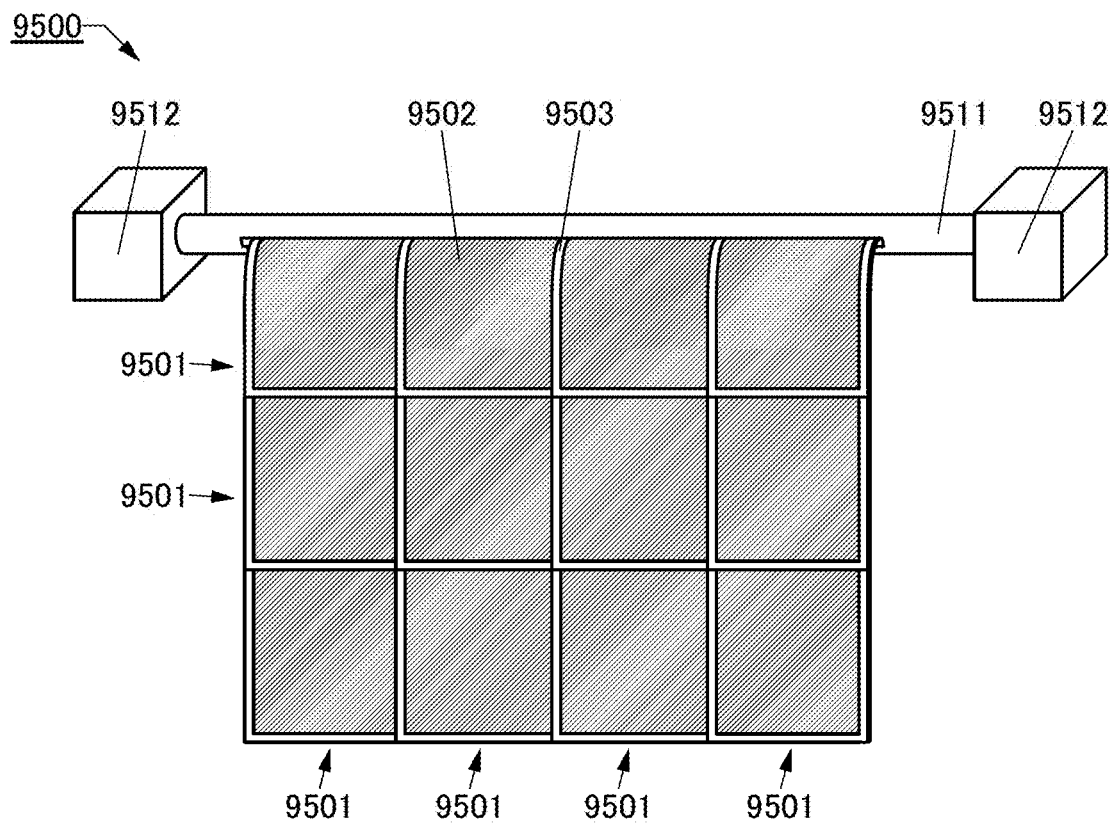

Next, FIGS. 78A and 78B illustrate examples of electronic devices that are different from those illustrated in FIGS. 76A to 76E and FIGS. 77A to 77G. FIGS. 78A and 78B are perspective views of a display device including a plurality of display panels. Note that the plurality of display panels are wound in the perspective view in FIG. 78A and are unwound in the perspective view in FIG. 78B.

A display device 9500 illustrated in FIGS. 78A and 78B includes a plurality of display panels 9501, a hinge 9511, and a bearing 9512. The plurality of display panels 9501 each includes a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the plurality of display panels 9501. The display device is highly versatile because the display panels 9501 can be wound depending on its use.

Moreover, although the display regions 9502 of the adjacent display panels 9501 are separated from each other in FIGS. 78A and 78B, without limitation to this structure, the display regions 9502 of the adjacent display panels 9501 may overlap with each other without any space so that a continuous display region 9502 is obtained, for example.

The electronic devices described in this embodiment each include the display portion for displaying some sort of data. Note that the semiconductor device of one embodiment of the present invention can also be used for an electronic device that does not have a display portion.

At least part of this embodiment can be implemented in combination with any of the other embodiments described in this specification as appropriate.

EXPLANATION OF REFERENCE

100: transistor, 100A: transistor, 100B: transistor, 100C: transistor, 100D: transistor, 100E: transistor, 100F: transistor, 100G: transistor, 100H: transistor, 100J: transistor, 100K: transistor, 102: substrate, 104: insulating film, 106: conductive film, 108: oxide semiconductor film, 108_1: oxide semiconductor film, 108_2: oxide semiconductor film, 108_3: oxide semiconductor film, 108*d*: drain region, 108*f*: regions, 108*i*: channel region, 108*s*: source region, 110: insulating film, 110*a* insulating film, 112: conductive film, 112_1: conductive film, 112_2: conductive film, 114: insulating film, 116: insulating film, 118: insulating film, 120*a*: conductive film, 120*b*: conductive film, 122: insulating film, 141*a*: opening, 141*b*: opening, 143: opening, 200: transistor, 205: conductor, 205*a*: conductor, 205*b*: conductor, 210: insulator, 212: insulator, 214: insulator, 216: insulator, 218: conductor, 220: insulator, 222: insulator, 224: insulator, 230: oxide semiconductor, 230*a*: oxide semiconductor, 230*b*: oxide semiconductor, 230*c*: oxide semiconductor, 240*a*: conductor, 240*b*: conductor, 244: conductor, 245: conductor, 250: insulator, 260: conductor, 260*a*: conductor, 260*b*: conductor, 270: insulator, 280: insulator, 282: insulator, 284: insulator, 300A: transistor, 300B: transistor, 300C: transistor, 300D: transistor, 300E: transistor, 300F: transistor, 300G: transistor, 302: substrate, 304: conductive film, 306: insulating film, 307: insulating film, 308: oxide semiconductor film, 308_1: oxide semiconductor film, 308_2: oxide semiconductor film, 308_3: oxide semiconductor film, 312*a*: conductive film, 312*b*: conductive film, 312*c*: conductive film, 314: insulating film, 316: insulating film, 318: insulating film, 319: insulating film, 320*a*: conductive film, 320*b*: conductive film, 330D: transistor, 341*a*: opening, 341*b*: opening, 342: opening, 342*a*: opening, 342*b*: opening, 342*c*: opening, 344: conductive film, 351: opening, 352*a*: opening, 352*b*: opening, 400: transistor, 401: substrate, 402: semiconductor region, 404: insulator, 406: conductor, 408*a*: low-resistance region, 408*b*: low-resistance region, 410: capacitor, 420: insulator, 422: insulator, 424: insulator, 426: insulator, 428: conductor, 430: conductor, 450: insulator, 452: insulator, 454: insulator, 456: conductor, 458: insulator, 460: insulator, 462: conductor, 466: conductor, 470: insulator, 474: conductor, 480: insulator, 482: insulator, 484: insulator, 501: pixel circuit, 502: pixel portion, 504: driver circuit portion, 504*a*: gate driver, 504*b*: source driver, 506: protection circuit, 507: terminal portion, 550: transistor, 552: transistor, 554: transistor, 560: capacitor, 562: capacitor, 570: liquid crystal element, 572: light-emitting element, 664: electrode, 665: electrode, 667: electrode, 700: display device, 701: substrate, 702: pixel portion, 704: source driver circuit portion, 705: substrate, 706: gate driver circuit portion, 708: terminal portion, 710: signal line, 711: lead wiring portion, 712: sealant, 716: FPC, 730: insulating film, 732: sealing film, 734: insulating film, 736: coloring film, 738: light-blocking film, 750: transistor, 752: transistor, 760: connection electrode, 770: planarization insulating film, 772: conductive film, 773: insulating film, 774: conductive film, 775: liquid crystal element, 776: liquid crystal layer, 778: structure body, 780: anisotropic conductive film, 782: light-emitting element, 783: droplet discharge apparatus, 784: droplet, 785: layer, 786: EL layer, 788: conductive film, 790: capacitor, 791: touch panel, 792: insulating film, 793: electrode, 794: electrode, 795: insulating film, 796: electrode, 797: insulating film, 800: inverter, 810: OS transistor, 820: OS transistor, 831: signal waveform, 832: signal waveform, 840: dashed line, 841: solid line, 850: OS transistor, 860: CMOS inverter, 900: semiconductor device, 901: power supply circuit, 902: circuit, 903: voltage generation circuit, 903A: voltage generation circuit, 903B: voltage generation circuit, 903C: voltage generation circuit, 904: circuit, 905: voltage generation circuit, 906: circuit, 911: transistor, 912: transistor, 912A: transistor, 912B: transistor, 921: control circuit, 922: transistor, 950: transistor, 952: substrate, 954: insulating film, 956: semiconductor film, 958: insulating film, 960: conductive film, 962: insulating film, 964: insulating film, 966*a*: conductive film, 966*b*: conductive film, 968: insulating film, 970: insulating film, 972: insulating film, 1400: droplet discharge apparatus, 1402: substrate, 1403: droplet discharge means, 1404: imaging means, 1405: head, 1406: dotted line, 1407: control means, 1408: storage medium, 1409: image processing means, 1410: computer, 1411: marker, 1412: head, 1413: material supply source, 1414: material supply source, 7000: display module, 7001: upper cover, 7002: lower cover, 7003: FPC, 7004: touch panel, 7005: FPC, 7006: display panel, 7007: backlight, 7008: light source, 7009: frame, 7010: printed board, 7011: battery, 8000: camera, 8001: housing, 8002: display portion, 8003: operation buttons, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing bands, 8305: lenses, 9000: housing, 9001: display portion, 9003: speaker, 9005: operation key, 9006: connection terminal, 9007: sensor, 9008: microphone, 9050: operation buttons, 9051: information, 9052: information, 9053: information, 9054: information, 9055: hinges, 9100: television device, 9101: portable information terminal, 9102: portable information terminal, 9200: portable information terminal, 9201: portable information terminal, 9500: display device, 9501: display panels, 9502: display region, 9503: region, 9511: hinge, 9512: bearing.

This application is based on Japanese Patent Application serial No. 2015-257710 filed with Japan Patent Office on Dec. 29, 2015 and Japanese Patent Application serial No. 2016-125478 filed with Japan Patent Office on Jun. 24, 2016, the entire contents of which are hereby incorporated by reference.

The invention claimed is:
1. A semiconductor device comprising:
a first conductive film over a substrate;
a first insulating film over the first conductive film;
an oxide semiconductor layer over the first insulating film;
a second insulating film over the oxide semiconductor layer;
a second conductive film over the second insulating film;
a third conductive film over the second conductive film; and
a third insulating film over the third conductive film,
wherein the oxide semiconductor layer comprises indium, an element M, and zinc,
wherein the element M is Al, Ga, Y, or Sn,
wherein a plurality of crystal parts is observed in a transmission electron microscope image in a direction perpendicular to a surface of the oxide semiconductor layer,
wherein a proportion of a region other than the plurality of crystal parts is higher than or equal to 20% and lower than or equal to 60%, and
wherein the third insulating film has a region in contact with a top surface of the oxide semiconductor layer and a top surface of the first insulating film.
2. The semiconductor device according to claim 1,
wherein the plurality of crystal parts has a higher proportion of crystal parts in which c-axes are aligned in a thickness direction of the oxide semiconductor layer than crystal parts aligned in other directions.

3. The semiconductor device according to claim 1,
wherein a first image is an image obtained by subjecting a cross-sectional TEM image to fast Fourier transform,
wherein a second image is obtained by subjecting the first image to inverse fast Fourier transform after mask treatment by which a periodic region remains,
wherein in the second image, the proportion of the remaining area subtracted from an original image is more than or equal to 20% and less than 60%.

4. The semiconductor device according to claim 1, wherein the proportion of the region other than the plurality of crystal parts is higher than or equal to 30% and lower than or equal to 50%.

5. The semiconductor device according to claim 1,
wherein when electron diffraction with a probe diameter of 50 nm or more is performed on a slice of the oxide semiconductor layer having a thickness of greater than or equal to 10 nm and less than or equal to 50 nm in the direction perpendicular to its cross section, a first electron diffraction pattern that includes a ring-like diffraction pattern and two first spots overlapping with the ring-like diffraction pattern is observed, and
wherein when electron diffraction with a probe diameter of greater than or equal to 0.3 nm and less than or equal to 5 nm is performed thereon, a second electron diffraction pattern that includes the two first spots and a plurality of second spots distributed in a circumferential direction is observed.

6. The semiconductor device according to claim 5,
wherein the two first spots are symmetric with respect to a center,
wherein an angle between a first straight line and the direction of a normal vector of the surface of the oxide semiconductor layer is more than or equal to 0° and less than or equal to 10°, and
wherein the first straight line passes through the center and a point at which a luminance of the two first spots is the highest.

7. The semiconductor device according to claim 6,
wherein in the first electron diffraction pattern, the luminance of the ring-like diffraction pattern is lower than that of the two first spots at a point of intersection of the ring-like diffraction pattern and a second straight line that intersects with the first straight line.

8. The semiconductor device according to claim 7,
wherein the luminance of the two first spots is greater than 1 time and less than or equal to 9 times the luminance of the ring-like diffraction pattern at the point of intersection of the ring-like diffraction pattern and the second straight line.

9. A semiconductor device comprising:
a first conductive film over a substrate;
a first insulating film over the first conductive film;
an oxide semiconductor layer over the first insulating film;
a second insulating film over the oxide semiconductor layer;
a second conductive film over the second insulating film;
a third conductive film over the second conductive film; and
a third insulating film over the third conductive film,
wherein the oxide semiconductor layer comprises indium, an element M, and zinc,
wherein the element M is Al, Ga, Y, or Sn,
wherein a plurality of crystal parts is observed in a transmission electron microscope image in a direction perpendicular to a surface of the oxide semiconductor layer,
wherein a proportion of a region other than the plurality of crystal parts is higher than or equal to 20% and lower than or equal to 60%,
wherein the third insulating film has a region in contact with a top surface of the oxide semiconductor layer and a top surface of the first insulating film, and
wherein a length of the second insulating film is longer than a length of the second conductive film in a cross sectional view of the semiconductor device.

10. The semiconductor device according to claim 9,
wherein the plurality of crystal parts has a higher proportion of crystal parts in which c-axes are aligned in a thickness direction of the oxide semiconductor layer than crystal parts aligned in other directions.

11. The semiconductor device according to claim 9,
wherein a first image is an image obtained by subjecting a cross-sectional TEM image to fast Fourier transform,
wherein a second image is obtained by subjecting the first image to inverse fast Fourier transform after mask treatment by which a periodic region remains,
wherein in the second image, the proportion of the remaining area subtracted from an original image is more than or equal to 20% and less than 60%.

12. The semiconductor device according to claim 9, wherein the proportion of the region other than the plurality of crystal parts is higher than or equal to 30% and lower than or equal to 50%.

13. The semiconductor device according to claim 9,
wherein when electron diffraction with a probe diameter of 50 nm or more is performed on a slice of the oxide semiconductor layer having a thickness of greater than or equal to 10 nm and less than or equal to 50 nm in the direction perpendicular to its cross section, a first electron diffraction pattern that includes a ring-like diffraction pattern and two first spots overlapping with the ring-like diffraction pattern is observed, and
wherein when electron diffraction with a probe diameter of greater than or equal to 0.3 nm and less than or equal to 5 nm is performed thereon, a second electron diffraction pattern that includes the two first spots and a plurality of second spots distributed in a circumferential direction is observed.

14. The semiconductor device according to claim 13,
wherein the two first spots are symmetric with respect to a center,
wherein an angle between a first straight line and the direction of a normal vector of the surface of the oxide semiconductor layer is more than or equal to 0° and less than or equal to 10°, and
wherein the first straight line passes through the center and a point at which a luminance of the two first spots is the highest.

15. The semiconductor device according to claim 14,
wherein in the first electron diffraction pattern, the luminance of the ring-like diffraction pattern is lower than that of the two first spots at a point of intersection of the ring-like diffraction pattern and a second straight line that intersects with the first straight line.

16. The semiconductor device according to claim 15,
wherein the luminance of the two first spots is greater than 1 time and less than or equal to 9 times the luminance of the ring-like diffraction pattern at the point of intersection of the ring-like diffraction pattern and the second straight line.

* * * * *